(12) United States Patent
Deliwala

(10) Patent No.: US 7,409,327 B2
(45) Date of Patent: Aug. 5, 2008

(54) SIMULATION PROGRAM FOR INTEGRATED OPTICAL/ELECTRONIC CIRCUIT

(75) Inventor: Shrenik Deliwala, Orefield, PA (US)

(73) Assignee: SiOPTICAL Inc., Allentown, PA (US)

( * ) Notice: Subject to any disclaimer, the term of this patent is extended or adjusted under 35 U.S.C. 154(b) by 1428 days.

(21) Appl. No.: 10/076,920

(22) Filed: Feb. 15, 2002

(65) Prior Publication Data
US 2003/0054639 A1  Mar. 20, 2003

Related U.S. Application Data

(60) Division of application No. 09/991,542, filed on Nov. 10, 2001, now Pat. No. 6,912,330, which is a continuation-in-part of application No. 09/859,693, filed on May 17, 2001, now Pat. No. 6,748,125.

(60) Provisional application No. 60/293,615, filed on May 25, 2001, provisional application No. 60/297,208, filed on Jun. 8, 2001.

(51) Int. Cl.
*G06F 17/50* (2006.01)
(52) U.S. Cl. .......................... 703/14; 716/20
(58) Field of Classification Search .............. 703/14; 385/14; 716/20
See application file for complete search history.

(56) References Cited

U.S. PATENT DOCUMENTS

| | | | |
|---|---|---|---|
| 3,883,221 A | 5/1975 | Rigrod | |
| 4,422,088 A | 12/1983 | Gfeller | 385/37 |
| 4,677,783 A | 7/1987 | Cratsa | 45/15 |
| 4,695,120 A | 9/1987 | Holder | 385/14 |
| 4,758,092 A | 7/1988 | Heinrich et al. | 356/364 |
| 4,761,620 A | 8/1988 | Bar-Joseph et al. | 359/263 |
| 4,865,427 A | 9/1989 | Kingston et al. | 359/276 |
| 4,871,224 A | 10/1989 | Karstensen | 385/14 |
| 4,904,039 A | 2/1990 | Soref | |
| 4,917,450 A | 4/1990 | Pocholle | 385/10 |
| 4,939,793 A | 7/1990 | Stewart | 398/170 |

(Continued)

FOREIGN PATENT DOCUMENTS

JP  61-11708  1/1986

(Continued)

OTHER PUBLICATIONS

Vonsovici, A. et al., "Numerical simulation of a silicon-on-insulator waveguideFabry-Perot interferometer for intensity light modulators at 1.3 μm", Lightwave Technology, Journal of,vol. 15, issue 11, 1997, pp. 2124-2129.*

(Continued)

*Primary Examiner*—Paul L Rodriguez
*Assistant Examiner*—Luke Osborne
(74) *Attorney, Agent, or Firm*—Wendy W. Koba

(57) ABSTRACT

A method for forming a hybrid active electronic and optical circuit using a lithography mask. The hybrid active electronic and optical circuit comprising an active electronic device and at least one optical device on a Silicon-On-Insulator (SOI) wafer. The SOI wafer including an insulator layer and an upper silicon layer. The upper silicon layer including at least one component of the active electronic device and at least one component of the optical device. The method comprising projecting the lithography mask onto the SOI wafer in order to simultaneously pattern the component of the active electronic device and the component of the optical device on the SOI wafer.

6 Claims, 55 Drawing Sheets

U.S. PATENT DOCUMENTS

| | | | |
|---|---|---|---|
| 4,966,430 A | 10/1990 | Weidel | 385/14 |
| 5,061,027 A | 10/1991 | Richard | 385/14 |
| 5,140,651 A | 8/1992 | Soref et al. | |
| 5,153,770 A | 10/1992 | Harris | 359/245 |
| 5,159,700 A | 10/1992 | Reid et al. | 385/14 |
| 5,198,684 A | 3/1993 | Sudo | 257/79 |
| 5,355,237 A | 10/1994 | Lang et al. | |
| 5,400,419 A | 3/1995 | Heinen | 385/14 |
| 5,432,630 A | 7/1995 | Lebby et al. | 398/116 |
| 5,434,434 A | 7/1995 | Kasahara et al. | 257/84 |
| 5,459,799 A | 10/1995 | Weber | |
| 5,485,021 A | 1/1996 | Abe | 257/84 |
| 5,502,779 A | 3/1996 | Magel | 385/1 |
| 5,514,885 A | 5/1996 | Myrick | |
| 5,559,912 A | 9/1996 | Agahi et al. | |
| 5,568,574 A | 10/1996 | Tanguay, Jr. et al. | 385/14 |
| 5,605,856 A | 2/1997 | Goosen et al. | 438/24 |
| 5,625,636 A | 4/1997 | Bryan et al. | 372/50.124 |
| 5,625,729 A | 4/1997 | Brown | 385/31 |
| 5,629,838 A | 5/1997 | Knight et al. | 361/782 |
| 5,638,469 A | 6/1997 | Feldman et al. | 385/14 |
| 5,696,862 A | 12/1997 | Hauer et al. | 385/88 |
| 5,835,646 A | 11/1998 | Yishimura et al. | 385/14 |
| 5,838,870 A | 11/1998 | Soref | |
| 5,844,822 A | 12/1998 | Yoshida | |
| 5,864,642 A | 1/1999 | Chun et al. | 385/14 |
| 5,872,360 A | 2/1999 | Paniccia et al. | 250/341.4 |
| 5,878,175 A | 3/1999 | Sonoda et al. | |
| 6,016,374 A | 1/2000 | Adams et al. | |
| 6,075,908 A | 6/2000 | Paniccia et al. | 385/14 |
| 6,108,472 A | 8/2000 | Rickman et al. | |
| 6,122,419 A | 9/2000 | Kurokawa | 385/31 |
| 6,166,846 A | 12/2000 | Maloney | 359/247 |
| 6,177,685 B1 | 1/2001 | Teraguchi et al. | 257/20 |
| 6,188,818 B1 | 2/2001 | Han et al. | 385/24 |
| 6,208,773 B1 | 3/2001 | Wickham et al. | |
| 6,221,565 B1 | 4/2001 | Jain et al. | |
| 6,222,951 B1 | 4/2001 | Huang | |
| 6,242,324 B1 | 6/2001 | Kub et al. | |
| 6,268,953 B1 | 7/2001 | Maloney | |
| 6,316,281 B1 | 11/2001 | Lee et al. | |
| 2001/0031112 A1 | 10/2001 | Frish et al. | |
| 2001/0031113 A1 | 10/2001 | Frish et al. | |
| 2002/0048422 A1 | 4/2002 | Cotteverte et al. | |

FOREIGN PATENT DOCUMENTS

| | | |
|---|---|---|
| JP | 2000-304956 | 11/2000 |

OTHER PUBLICATIONS

Jalali, B. et al., "Advances in silicon-on-insulator optoelectronics", Selected Topics in Quantum Electronics, IEEE Journal of, vol. 4, Issue 6, 1998, pp. 938-947.*

P.D. Trinh, et al., "Integrated optical directional couplers in silicon-on-insulator", Electronics Letters, vol. 31, No. 24, 1995, pp. 2097-2098.*

Hewitt, P.D.; Reed, G.T., "Improving the response of optical phase modulators in SOI by computer simulation," Lightwave Technology, Journal of, vol. 18, No. 3, pp. 443-450, Mar. 2000.*

* cited by examiner

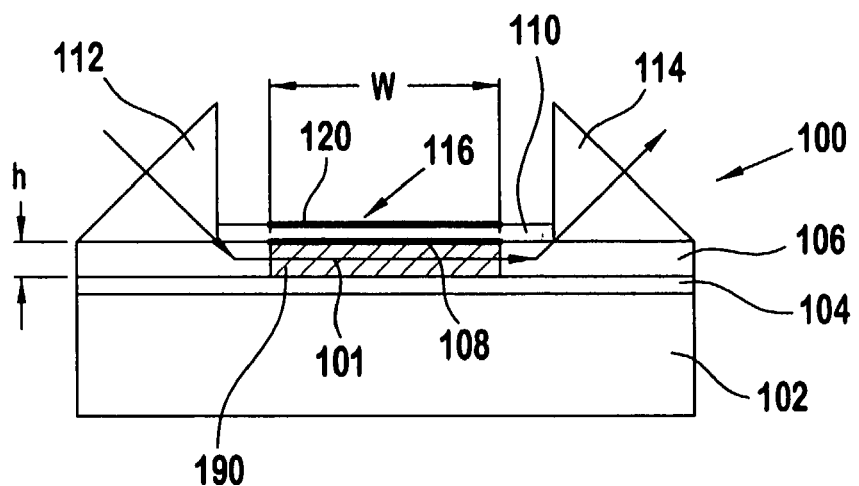
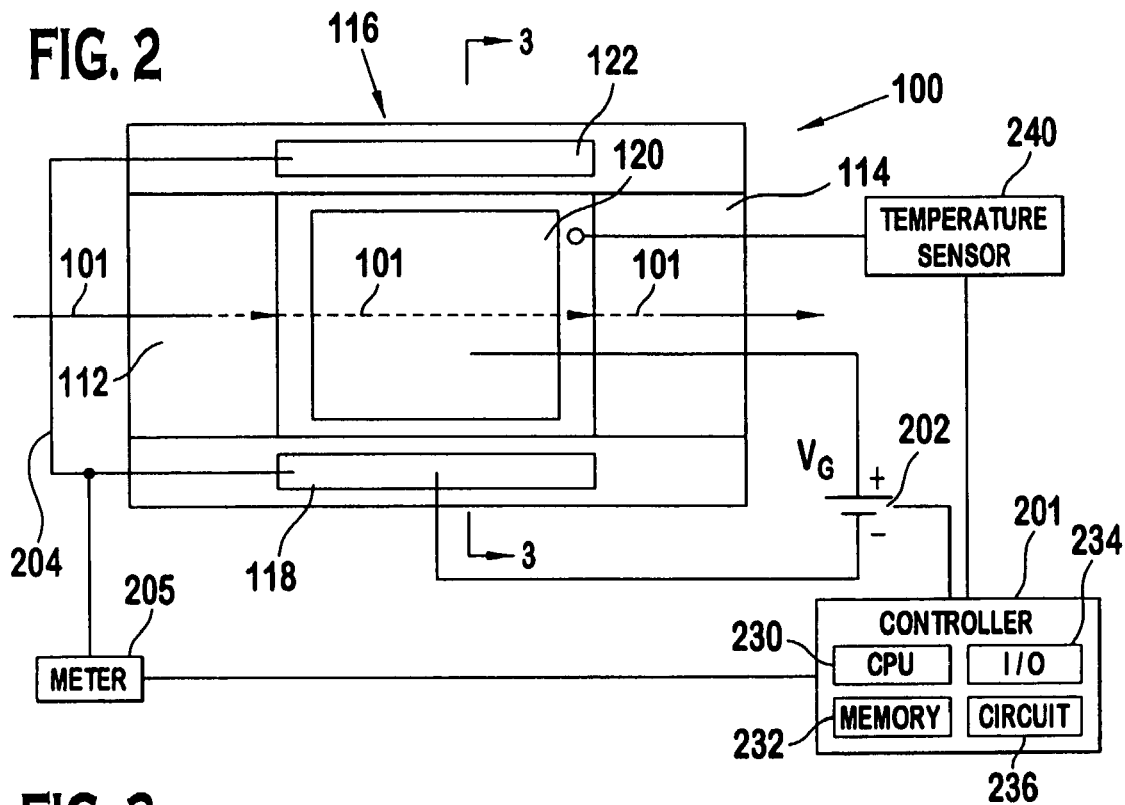
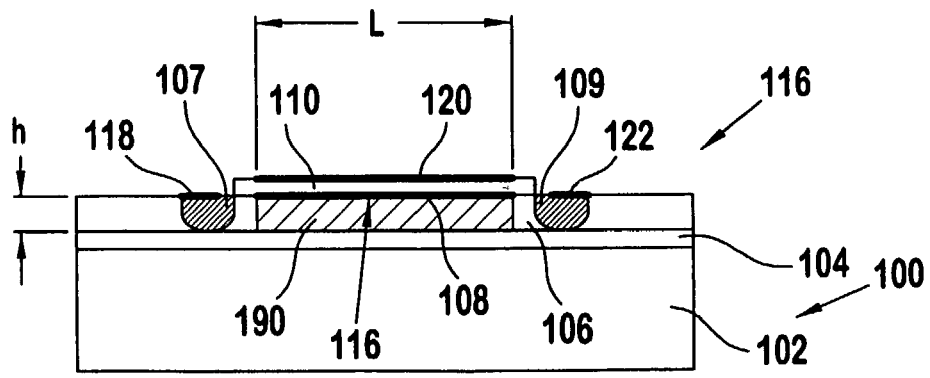

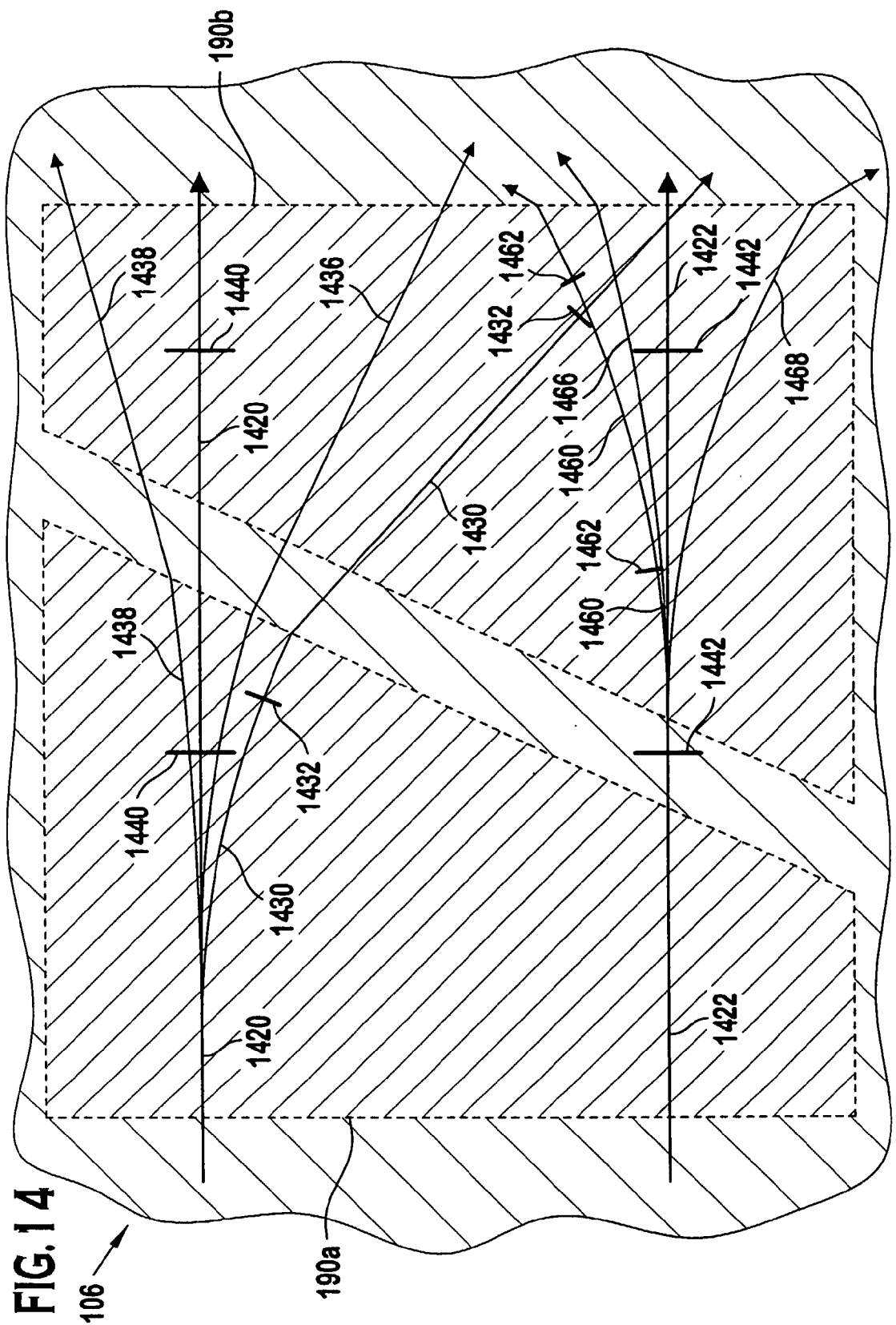

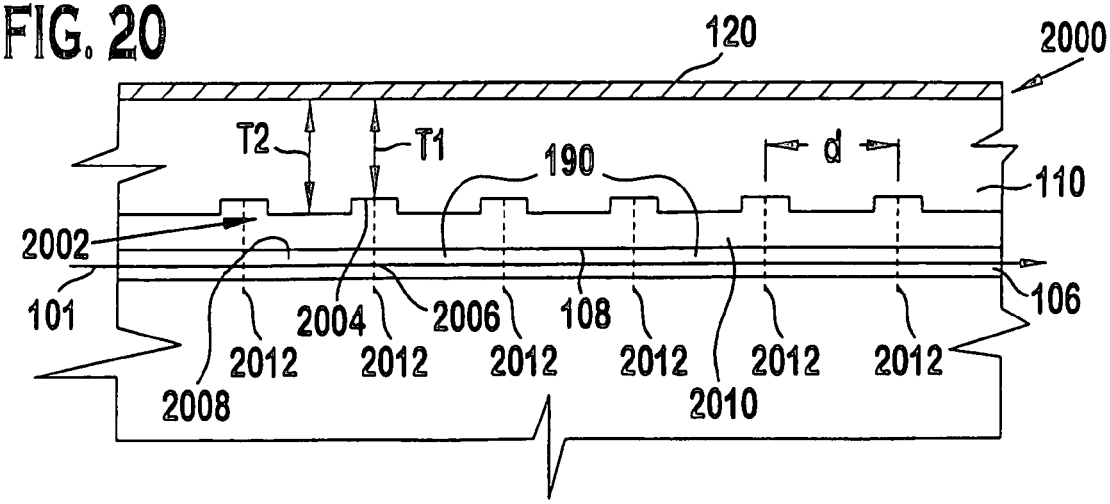
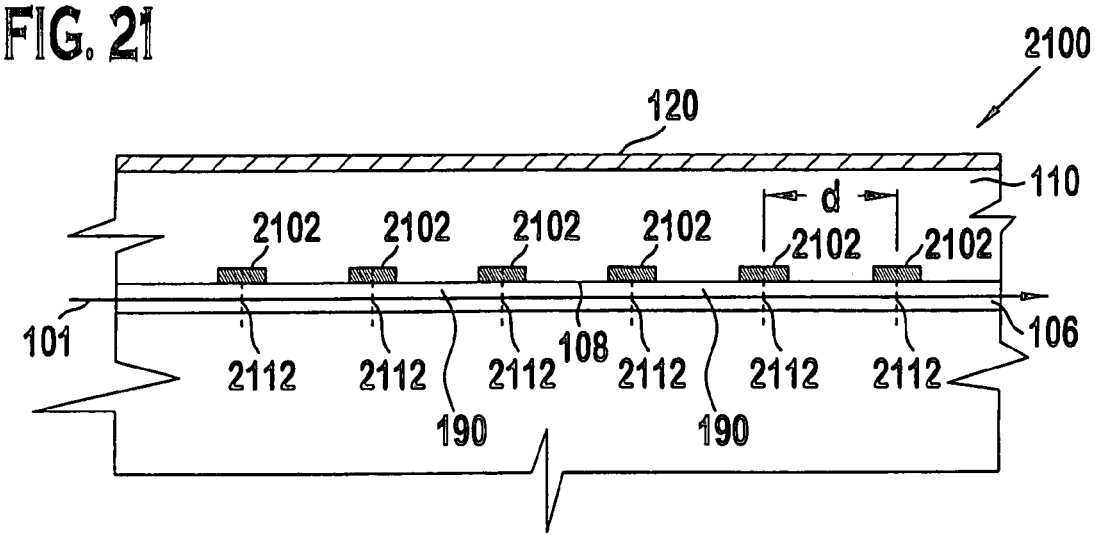
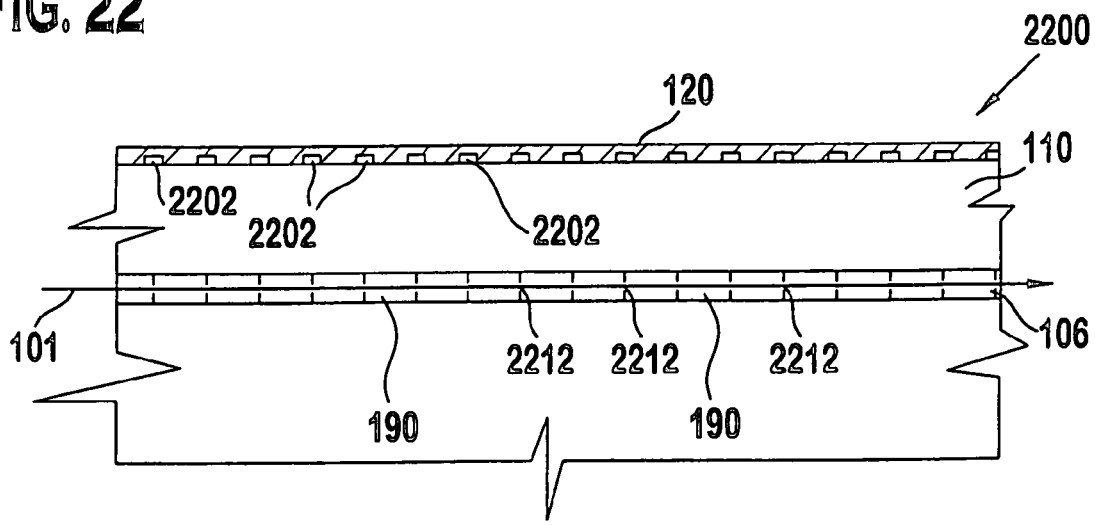

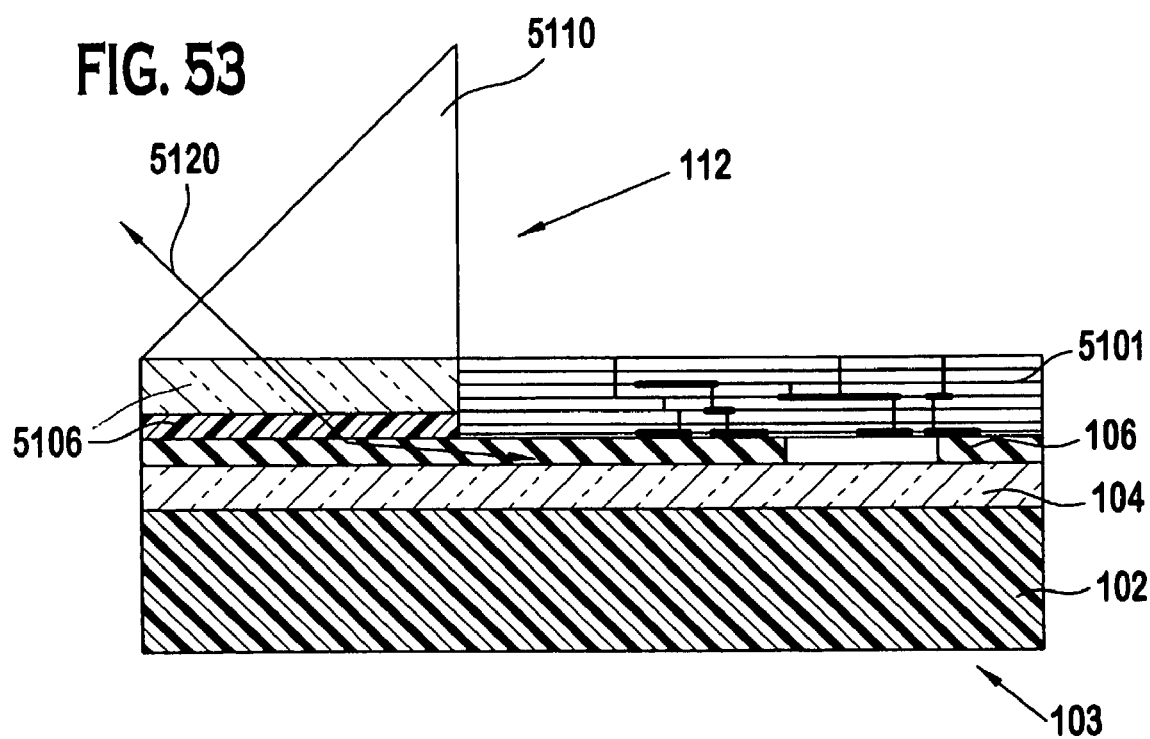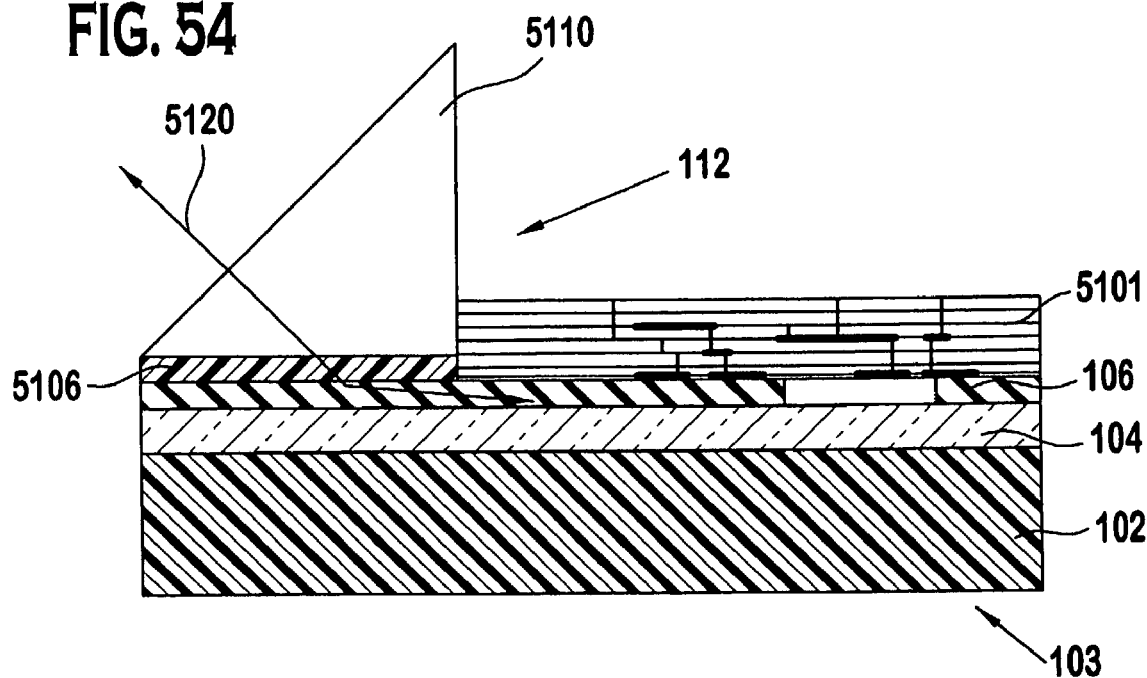

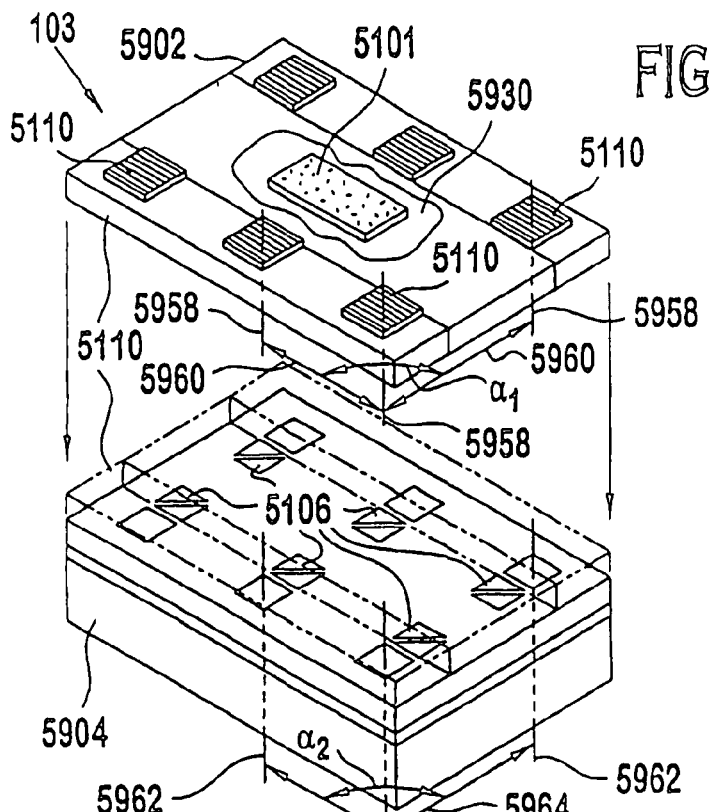
FIG. 59
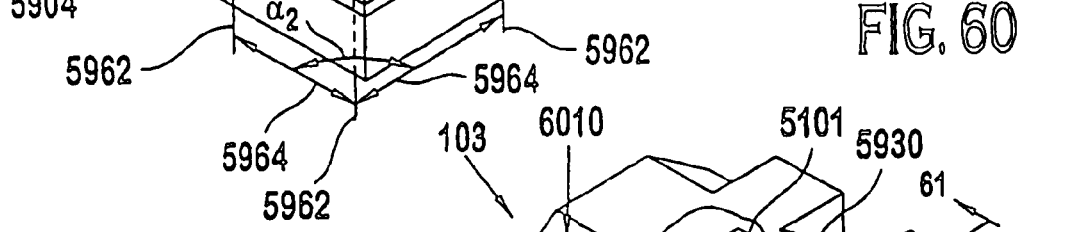
FIG. 60
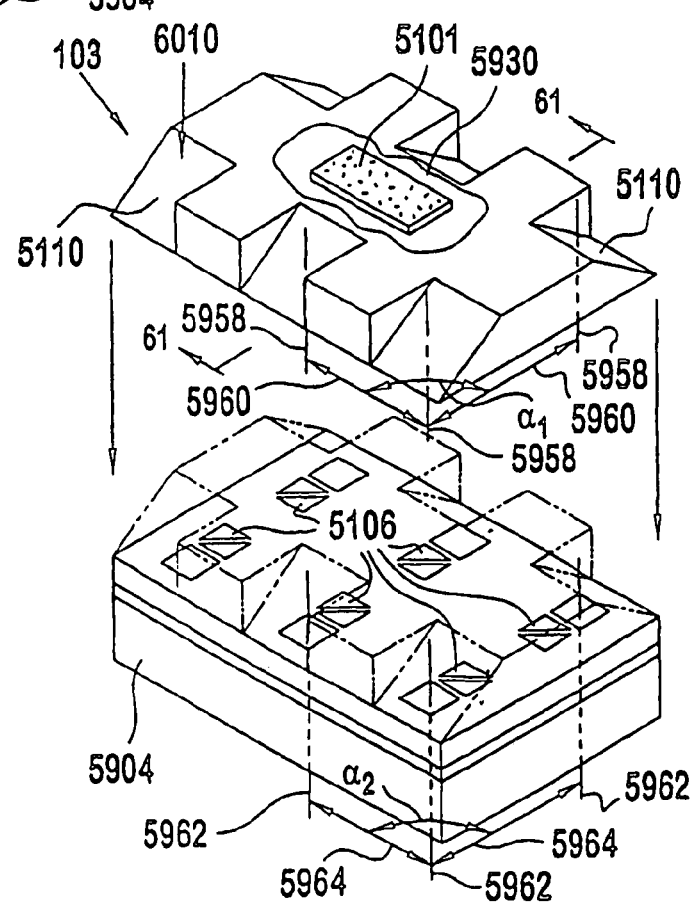
FIG. 61
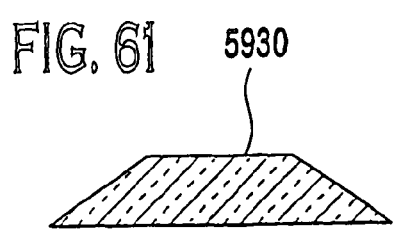
FIG. 62
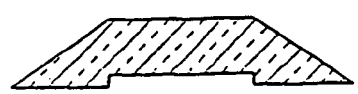

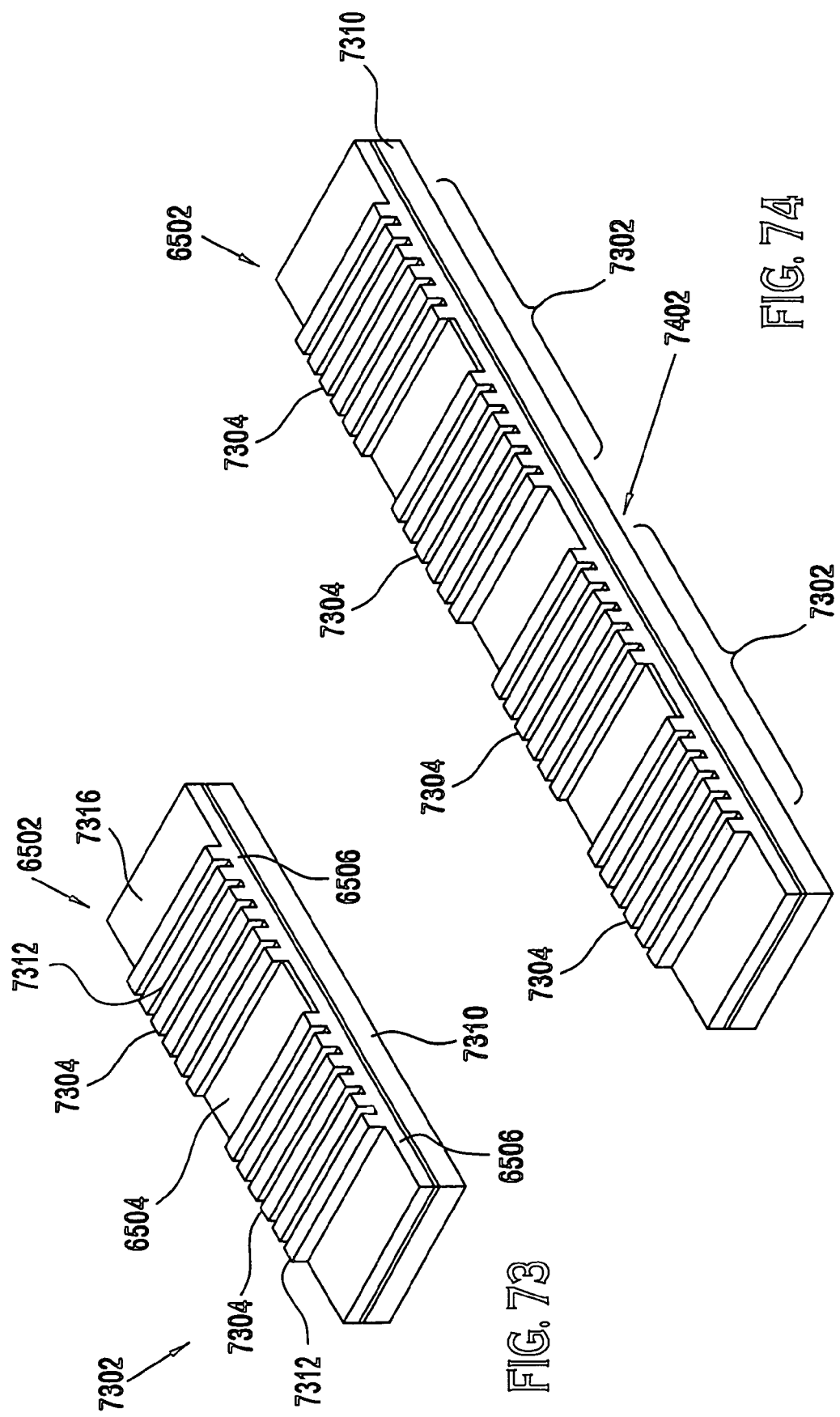

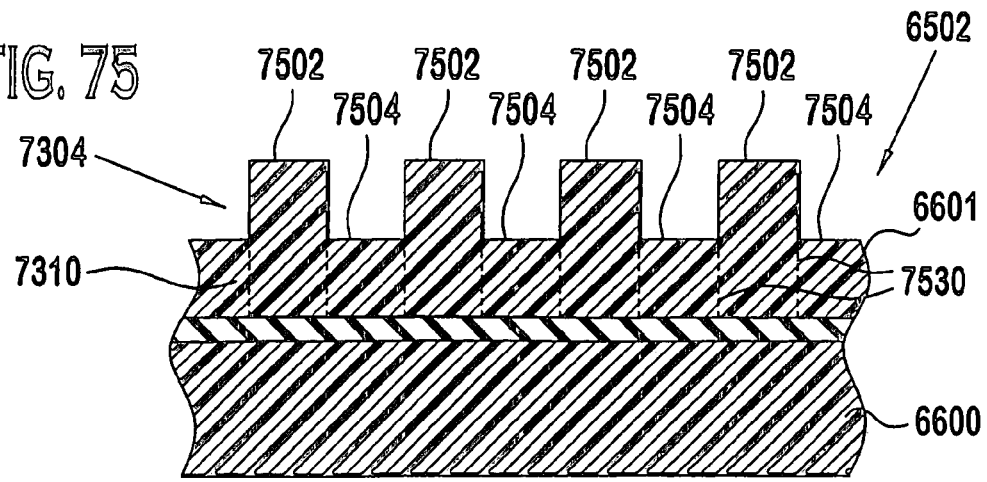
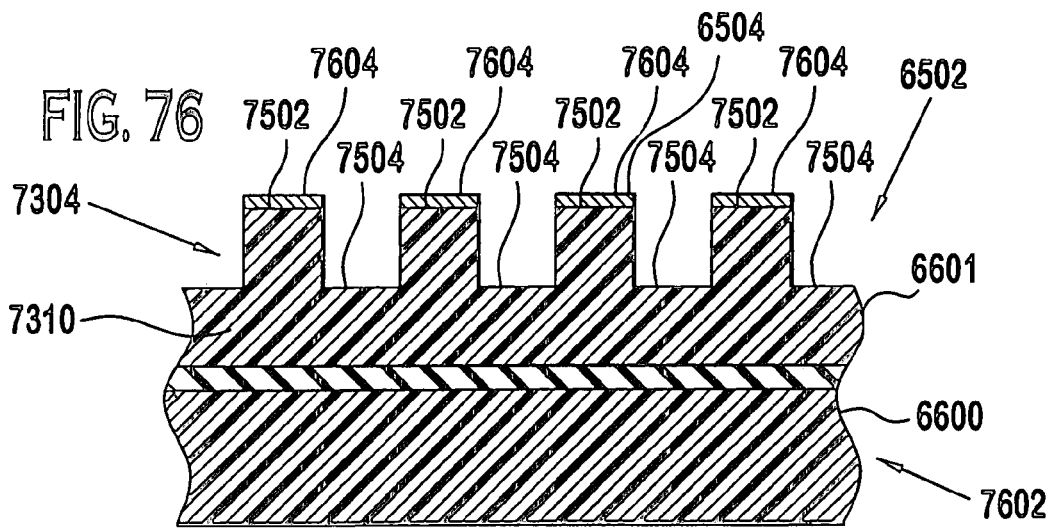
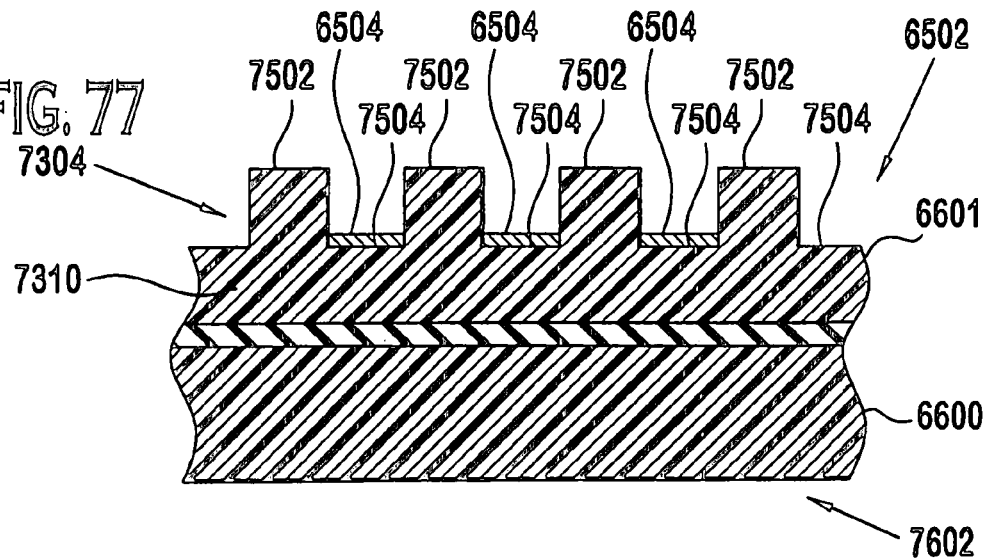

SIMULATION PROGRAM FOR INTEGRATED OPTICAL/ELECTRONIC CIRCUIT

CROSS REFERENCE TO RELATED APPLICATIONS

This application is a divisional of U.S. patent application Ser. No. 09/991,542, filed Nov. 10, 2001, now U.S. Pat. No. 6,914,330 which is a continuation-in-part to U.S. patent application Ser. No. 09/859,693, filed May 17, 2001, now U.S. Pat. No. 6,748,125. U.S. patent application Ser. No. 09/991,542 claims priority to U.S. Provisional Patent Application No. 60/293,615, filed May 25, 2001 and U.S. Provisional Patent Application No. 60/297,208, filed Jun. 8, 2001.

FIELD OF THE INVENTION

This invention relates to integrated circuits, and more particularly to integrated circuits including both optical and electronic aspects.

BACKGROUND OF THE INVENTION

In the electronic integrated circuit industry, there is a continuing effort to increase device speed and increase device densities. Optical systems are a technology that promise to increase the speed and current density of integrated circuits. Various components of optical and electronic integrated circuits can be discrete elements made from glass or clear plastic or alternatively can be formed from a semiconductor material, such as silicon.

The majority of the semiconductor industry efforts, including a massive number of person-hours of research and development, has focused its efforts on silicon-based electronic circuits in attempting to make electronic circuits faster and more reliable. While other semiconductor technologies such as Ga—As have shown great promise, the emphasis on the research in development in Silicon has reduced the rate of development of the other semiconductors. This concentration on silicon devices has been rewarded by quicker and more reliable silicon devices, however the rate of improvement of silicon-based device speed has decreased in recent years.

While optical integrated circuits show much promise, there are certain inherent benefits to optical circuits. For instance, at a single level, two electrical conductors cannot be made to cross each other. By comparison, one ray of photonic radiation (light) may be made to cross at an angle another ray of photonic radiation without interference there between. Light can travel faster between locations that are separated by a great distance than electricity. Fiber-optic systems have thus been applied to backbone-type applications such as SONET, that relies on a fiber-optic ring technology to provide high bandwidth, high speed data transfer. Providing frequent conversion between electrical and optical signals slows down the data transfer rate and increases the potential of error in interpreting data levels (differentiating between a digital high and a digital low value). For smaller distance optical communication distances, the benefits of optical communications are not quite as evident and the acceptance of optical systems has been less than overwhelming. It is at least years in the future until the optical industry appears able to be realize a commercially viable "last mile" connection between the communication backbone or computer network backbone and the end user that is necessary for optical systems to be fully accepted. Optical computers are even further in the future. One uphill battle of optical systems is that electronic systems have been developed so much earlier and are already implemented in many regions. The development of large-scale optical systems have shown It would be desirable to provide a variety of silicon-based optical circuits to compensate for variations in the operating parameters such as temperature and device age. In one aspect, it would be very desirable to provide systems that could provide end-user to end-user optical signal transfer for communication systems or computer network systems.

SUMMARY OF THE INVENTION

The present invention is directed to a method for forming a hybrid active electronic and optical circuit using a lithography mask. The hybrid active electronic and optical circuit comprising an active electronic device and at least one optical device on a Silicon-On-Insulator (SOI) wafer. The SOI wafer including an insulator layer and an upper silicon layer. The upper silicon layer including at least one component of the active electronic device and at least one component of the optical device. The method comprising projecting the lithography mask onto the SOI wafer in order to simultaneously pattern the component of the active electronic device and the component of the optical device on the SOI wafer.

BRIEF DESCRIPTION OF THE DRAWINGS

The accompanying drawings, which are incorporated herein and constitute part of this specification, illustrate the presently preferred embodiment of the invention, and, together with the general description given above and the detailed description given below, serve to explain features of the invention.

FIG. 1 shows a front cross sectional view of one embodiment of an optical waveguide device including a field effect transistor (FET);

FIG. 2 shows a top view of the optical waveguide device shown in FIG. 1;

FIG. 3 shows a section view as taken through sectional lines 3-3 of FIG. 2;

FIG. 14 shows a top cross sectional view of the waveguide of the embodiment of the light coupler-shaped gate array of FIG. 13 including dotted lines representing a region of changeable propagation constant. The solid light rays are shown passing through the regions of changeable propagation constant corresponding to the light coupler-shaped gate array;

FIG. 15A shows both gate electrodes 1304, 1306 being deactivated, FIG. 15B shows the gate electrode 1304 being actuated as the gate electrode 1306 is deactivated, FIG. 15C shows the gate electrode 1304 being deactuated as the gate electrode 1306 is activated, and FIG. 15D shows both gate electrodes 1304 and 1306 being actuated;

FIG. 20 shows one embodiment of a grating formed in one of the optical waveguide devices shown in FIGS. 1-3 and 5;

FIG. 21 shows another embodiment of a grating formed in one of the optical waveguide devices shown in FIGS. 1-3 and 5;

FIG. 22 shows yet another embodiment of a grating formed in one of the optical waveguide devices shown in FIGS. 1-3 and 5;

FIG. 53 shows a cross-sectional view of one embodiment of integrated optical/electronic circuit;

FIG. 54 shows a cross-sectional view of another embodiment of integrated optical/electronic circuit;

FIG. 59 shows an expanded perspective view of an embodiment of integrated optical/electronic circuit using flip chip circuits;

FIG. 60 shows a perspective expanded view of an alternate embodiment of integrated optical/electronic circuit;

FIG. 61 shows a side cross-sectional view of one embodiment of an optical/electronic I/O;

FIG. 62 shows another cross-sectional view as taken through a cross-sectional lines 61-61 of FIG. 60, in accordance with an alternative embodiment in which a lower surface is etched;

FIG. 73 shows a perspective view of an embodiment of hybrid active electronic and optical circuit that is configured as a simple Fabry-Perot cavity;

FIG. 74 shows a perspective view of an embodiment of hybrid active electronic and optical circuit that is configured as a coupled Fabry-Perot cavity;

FIG. 75 shows a side view of one embodiment of grating similar to as included in the simple Fabry-Perot cavity of FIG. 73;

FIG. 76 shows a side view of another embodiment of grating from FIG. 75 that is configured as a hybrid active electronic and optical circuit;

FIG. 77 shows a side view of yet another embodiment of hybrid active electronic and optical circuit that is configured as a hybrid active electronic and optical circuit;

DETAILED DESCRIPTION

Figure 4:
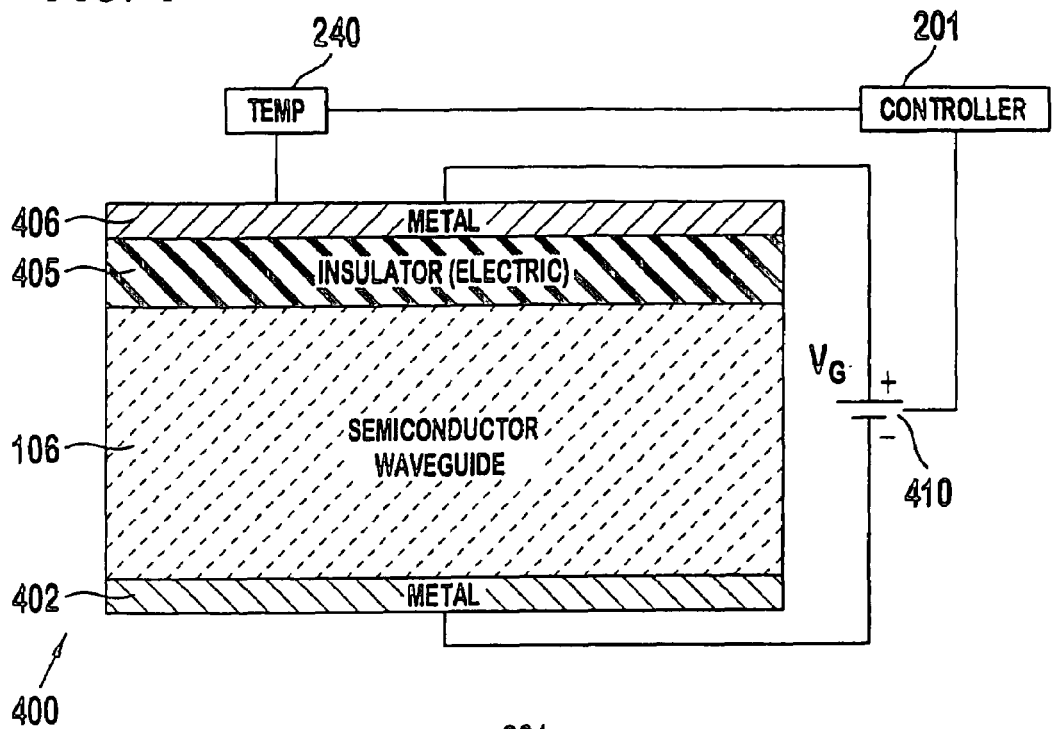
FIG. 4 shows a front cross sectional view of one embodiment of an optical waveguide device including a metal oxide semiconductor capacitor (MOSCAP)

The present disclosure describes many aspects of multiple embodiments of an integrated optical/electronic circuit 103. This disclosure describes to the structural features of the integrated optical/electronic circuit 103. Different embodiments of the integrated optical/electronic circuit include so-called silicon-on-insulator (SOI) technology, silicon on sapphire, and other technologies. SOI technology has become prevalent in the electronics industry, and is utilized in such large-production processors as the POWER PC™, and such major companies as IBM and MOTOROLA have devoted considerable research and development resources to SOI. Certain aspects of the integrated optical/electronic circuit 103 are described in the "Integrated Optical/Electronic Circuit" portion of this disclosure.

Another aspect of this disclosure relates to the optical functionality that may be provided by the integrated optical/electronic circuit 103. The integrated optical/electronic circuit 103 includes a plurality of varied optical waveguide devices 100 (that may be viewed as optical building blocks) that together perform the overall opto-electric functionality of the integrated optical/electronic circuit 103. One embodiment of the optical waveguide devices 100 includes a field effect transistor (FET) that is arranged to control the light flowing therethrough to perform the various functions.

The most basic function of one of the optical waveguide devices 100 is to act as an optical modulator. Other optical waveguide devices 100 may be configured as active or passive optical circuits to perform such optical functions as optical deflection, optical filtering, optical attenuation, optical focusing, optical path length adjustment, variable phase tuning, variable diffraction efficiency, optical coupling, and optical switching. The structure of the optical waveguide device 103 is described in the "optical waveguide device structure" portion of this disclosure. Certain physics aspects of the optical waveguide device is described in the "waveguide physics" portion of this disclosure.

Actual embodiments of discrete optical waveguide devices are described in the "Specific Embodiments of Optical Waveguide Device" portions of this disclosure. More complex optical circuits including a plurality of optical waveguide devices 100 are described in the "Optical Circuits Including Optical Waveguide Devices" portion of this disclosure.

Significant aspects of designing any optical waveguide devices 100 include being able to couple light from outside of the optical waveguide device to the inside of the waveguide, and conversely being able to couple light from the optical waveguide within the optical waveguide device to outside of the optical waveguide device. If the coupling is poor, then the optical waveguide device will be ineffective since the light cannot be effectively input into, or output from, the waveguide. In using relatively thin SOI waveguides, the options of coupling techniques are diminished. Certain embodiments of coupling techniques are disclosed in the "Input/Output Coupling Embodiments" portion of this disclosure.

Passive optical devices can be made active by the application of an active electronic circuit applying a voltage to a metallized or highly conductive, doped semiconductor portion proximate the passive optical waveguide, the thereby varying the effective mode index in the waveguide by changing the free-carrier concentration. Such devices and circuits are described in the hybrid active electronic and optical circuit portion of this disclosure.

Photonic Band Gap Devices are a promising technology by which such functions as modulation, reflection, and diffraction can be performed upon light traveling within a waveguide. Shallow photonic band gap devices are considered those devices that are formed from photonic crystals that do not fully extend through the waveguide. Certain aspects of the photonic band gap device, especially to hybrid active electronic and optical circuit and other integrated optical/electronics circuits, are described in the photonic band gap portion of this disclosure.

I. Integrated Optical/Electronic Circuit

Figure 51:
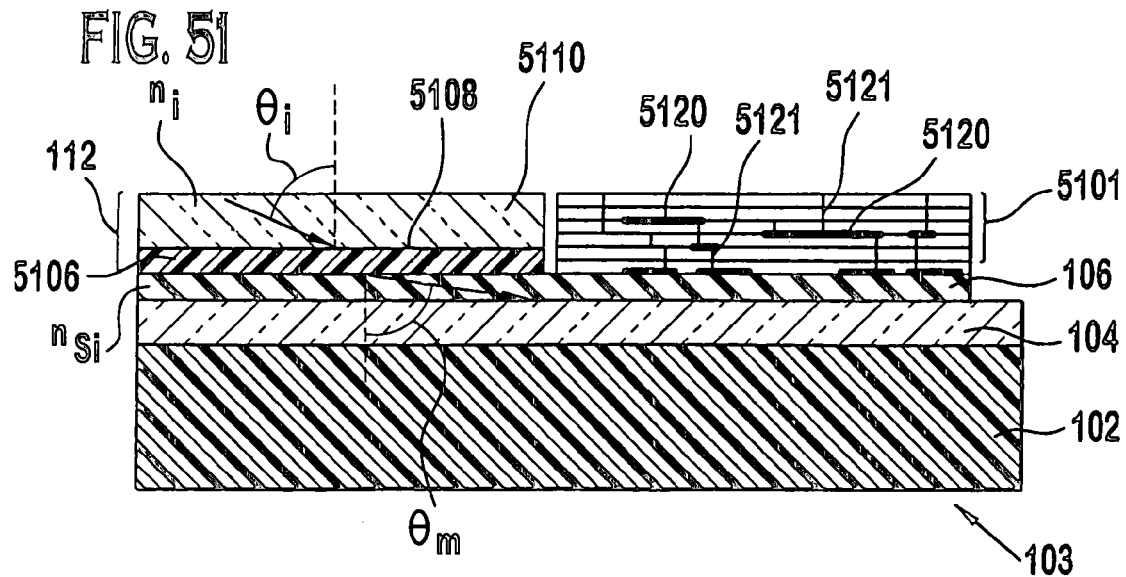
FIG. 51 shows a cross-sectional view of one embodiment of integrated optical/electrical circuit.
Figure 52:
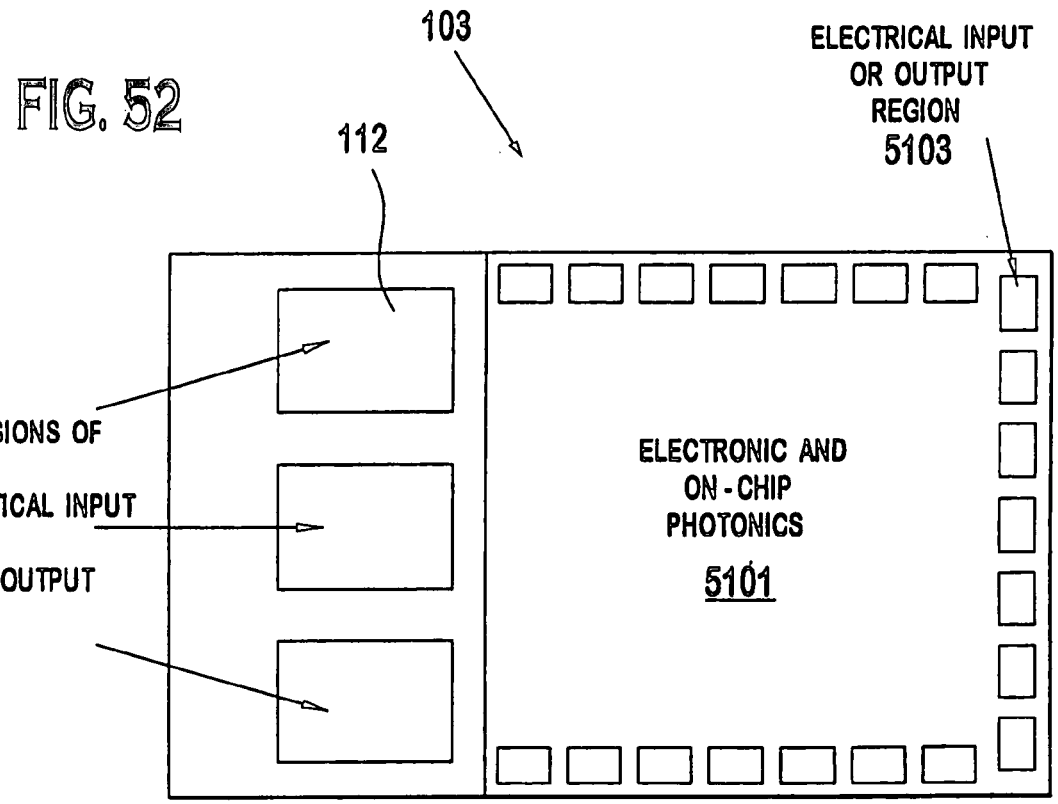
FIG. 52 shows a top view of the embodiment of integrated optical/electronic circuit of FIG. 51.

FIGS. 51 to 52 shows one embodiment of an integrated optical/electric circuit 103. Multiple embodiments of integrated optical/electric circuit 103 are described herein as being formed using SOI devices, etc. The integrated optical/electric circuit can be configured with and combination of active optical, passive optical, active electronics, and passive components circuit. SOI technology is highly promising for integrated optical/electronic circuits, and using relatively thin SOI devices (having an upper silicon layer less than 10µ) has many benefits. Using thin SOI devices for waveguides limits the vertical locations in which light can diffract, and therefor acts to localize the light to a relatively narrow waveguide. Thin SOI devices can be formed using planar lithography techniques including deposition and etching processes.

SOI is a commonly-used, heavily researched, and highly accepted technology for electronics using semiconductors. Modifying the already-accepted SOI platform for optical circuits instead of developing an entirely new technology makes sense. Additionally, it is easier for the SOI engineers and practitioners to extend the SOI technology compared to developing, and becoming experienced with, a new technology. Finally, the SOI simulation tools have been refined to such a level that the industry trusts the SOI tools. It is easier to modify, and use trusted output from, the SOI simulation tools than going through the effort and expense of developing new simulation tools. In case of active devices, the detailed topology and material profile output from the process simulation and free carrier concentration profile output from the device simulator is sued to predict the optical characteristics of the active device.

II. Optical Waveguide Device Structure

Figure 5:
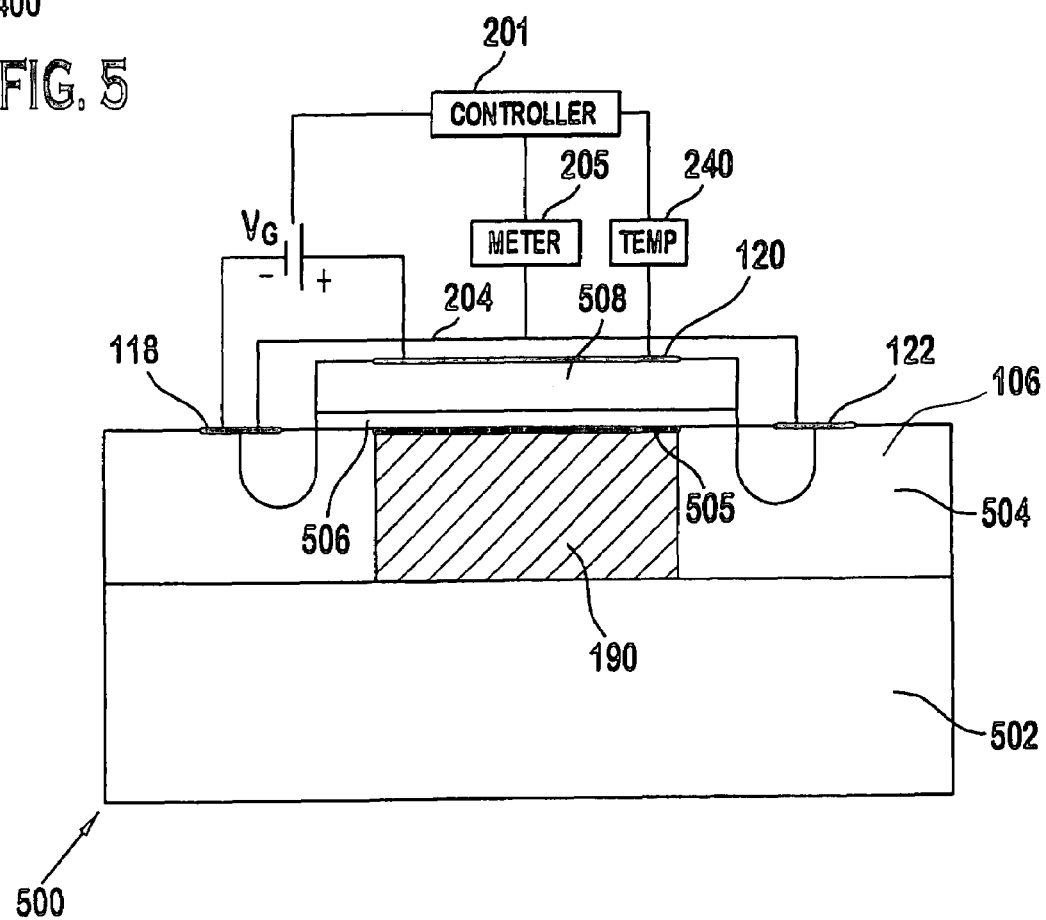
FIG. 5 shows a front view of another embodiment of an optical waveguide device including a high electron mobility transistor (HEMT)

There are a variety of optical waveguide devices 100 that are described in this disclosure in which light travels within, and is contained within, a waveguide. Different embodiments of optical waveguide devices are described that perform different functions to the light contained in the waveguide. Altering the shape or structure of an electrode(s) can modify the function of the optical waveguide device 100. Embodiments of optical waveguide devices include a waveguide located in a Field Effect Transistor (FET) structure as shown in FIGS. 1 to 3; a waveguide associated with metal oxide semiconductor capacitor (MOSCAP) structure is shown in FIG. 4; and a waveguide located in the High Electron Mobility Transistor (HEMT) as shown in FIG. 5. In MOSCAPs, one or more body contact(s) is/are separated from the gate electrode by a semiconductor waveguide and an electrical insulator. MOSCAPs and MOSFETs and other similar structures are understood by the type of dopings in contact with the electrodes; which in turn controls the electrical characteristics of the structures. To make the description for the above embodiments more uniform, the term "body contact electrodes" is used to describe either the body contact at the base of the MOSCAP or the substantially common potential source electrode and drain electrode in the FET-like structure.

The application of the voltage between the gate and body contact(s) predominantly changes the distribution of free-carriers (either electrons or holes) near the semiconductor/electrical insulator boundary. These essentially surface localized changes in free carrier distributions are referred to as two-dimensional electron gas or 2DEG included in MOSCAPs. In a FET structure, for example an increase in the application of the bias leads consecutively to accumulation of charges (of the same type as the semiconductor i.e. holes in a p-type and electrons in n-type, depletion, and finally inversion, In 2DEGs, the polarity of semiconductor is opposite the type of the predominant free carriers, i.e., electrons in p-type or holes in n-type). In a High Electron Mobility Transistor (HEMT), the electron (hole) distribution formed just below the surface of the electrical insulator is referred to as 2DEG because of particularly low scattering rates of charge carriers. At any rate, for the purposes of clarity, all of the above shall be referred to as 2DEG signifying a surface localized charge density change due to application of an external bias.

The term "semiconductor" is used through this disclosure in particular reference to the waveguides of the particular optical waveguide devices. The semiconductor waveguide is intended to represent a class of semiconductor materials. Silicon and Germanium are natural single element semiconductors at room temperature. GaAs and InP are examples of binary compound semiconductors. There are semiconductors made from three element semiconductors such as AlGaAs. The salient feature of all semiconductors is the existence of a band-gap between the valence and the conduction band. Multiple layers of semiconductors may also be used in the construction of a waveguide as well as to create an optical waveguide device including a MOSCAP, a FET, or a HEMT. For the purpose of this disclosure, the semiconductor provides the ability to control the density of the 2DEG by the application of the gate voltage. Any description of a specific semiconductor in this disclosure is intended to be enabling, exemplary, and not limiting in scope. The concepts described herein are intended to apply to semiconductors in general.

These concepts relating to the optical waveguide device apply equally well to any mode of light within a waveguide. Therefore, different modes of light can be modulated using multi-mode waveguides. Therefore, different modes of light can be modulated using multi-mode waveguides. The physical phenomena remains as described above for multi-mode waveguides.

The embodiments of optical waveguide device 100 shown in multiple figures including FIGS. 1-3, and 5, etc. include a field effect transistor (FET) portion 116 that is electrically coupled to a waveguide 106. One embodiment of the waveguide is fabricated proximate to, and underneath, the gate electrode of the FET portion 116. The waveguide 106 is typically made from silicon or another one or plurality of III-V semiconductors. The FET portion 116 includes a first body contact electrode 118, a gate electrode 120, and a second body contact electrode 122. A voltage can be applied by e.g., a voltage source 202 to one of the electrodes. The gate electrode 120 is the most common electrode in which the voltage level is varied to control the optical waveguide device. If the first body contact portion 118 and the second body contact portion are held at the same voltage by placing an electrical connector 204 there between, then the optical waveguide device 100 operates as a diode. If there is not an electrical connector between the first body contact portion 118 and the second body contact portion 122, then the optical waveguide device 100 acts as a transistor. This is true for each of the following FET/diode configurations. Whether any FET optical waveguide device 100 is biased to act as a transistor or diode, the optical waveguide device 100 is within the intended scope of the present invention since either a diode or a transistor is capable of altering the effective mode index in the waveguide as described herein.

The variation in voltage level changes the propagation constant of at least a portion of the waveguide 106. The changes in the index profile of the waveguide are determined by the location and shapes of all the electrodes. The density of the 2DEG generally follows the shape of the gate electrode 120. Therefore, the shape of the gate electrode may be considered as being projected into a region of changeable propagation constant 190 (the value of the propagation constant may vary at different locations on the waveguide 106). The region of changeable propagation constant 190 is considered to be that region through the height of the waveguide in which the value of the propagation constant is changed by application of voltage to the gate electrode 120. Gate electrodes 120 are shaped in non-rectangular shapes (as viewed from above or the side depending on the embodiment) in the different embodiments of optical waveguide device. The different embodiments of the optical waveguide device perform such differing optical functions as optical phase/amplitude modulation, optical filtering, optical deflection, optical dispersion, etc. Multiple ones of the optical waveguide devices can be integrated into a single integrated optical/electronic circuit as an arrays waveguide (AWG), a dynamic gain equalizer, and a large variety of integrated optical/electronic circuits. Such optical waveguide device and integrated optical/electronic circuits can be produced using largely existing CMOS and other semiconductor technologies.

FIGS. 1 to 3 will now be described in more detail, and respectively show a front, top, and side view of one embodiment of an optical waveguide device 100. FIG. 1 shows a planar semiconductor waveguide bounded by low-index insulating materials to which the light is coupled using a light coupler 112. Other well-known types of coupling include gratings, tapers, and butt-coupling that are each coupled to the end of the waveguide. The "gate" electrode 120 is positioned directly above the light path in the semiconductor waveguide. The gate electrode is separated from the semiconductor by the low-index dielectric acting as an electrical insulator. The body contact electrodes are electrically coupled to the semiconductor. This embodiment may be considered to be a FET structure with the body contact electrodes 118, 122 forming a symmetric structure typically referred to as "source" and "drain" in FET terminology. A substantially constant potential conductor 204 equalizes the voltage level between the first body contact electrode 118 and the second body contact electrode 122. The first body contact electrode and the second body contact electrode can thus be viewed as providing symmetrical body contact electrodes to the semiconductor. In another embodiment, the body contact is placed directly underneath the light path and underneath the waveguide.

In yet another embodiment, the body contact is positioned symmetrically laterally of both sides of, and underneath, the incident light path within the waveguide. The body contact in each of these embodiments is designed to change a free-carrier distribution region in a two dimensional electron gas (2DEG) 108 near the semiconductor/electrical insulator boundary of the waveguide along the light travel path. This change in free-carrier distribution results from application of the potential between the insulated gate electrode and the one or plurality of body contact electrodes connected to the body of the semiconductor.

The FIG. 1 embodiment shows the optical waveguide device 100 including an integrated field effect transistor (FET) portion 116. The field effect transistor (FET) portion 116 includes the gate electrode 120, the first body contact electrode 118, and the second body contact electrode 122, but the channel normally associated with a FET is either replaced by, or considered to be, the waveguide 106. Examples of FETs that can be used in their modified form as FET portions 116 (by using the waveguide instead of the traditional FET channel) include a metal-oxide-semiconductor FET (MOSFET), a metal-electrical insulator-semiconductor FET (MISFET), metal semiconductor FET (MESFET), a modulation doped FET (MODFET), a high electron mobility transistor (HEMT), and other similar transistors. In addition, a metal-oxide-silicon capacitor (MOSCAP) may also be similarly modified to form a FET portion.

FIGS. 1, 2 and 3 shows one embodiment of optical waveguide device 100 that includes a substrate 102, a first electrical insulator layer 104, a waveguide 106, a first body contact well 107, a second body contact well 109, the 2DEG 108, a second electrical insulator layer 110, an input light coupler 112m an output light coupler 114, and the field effect transistor (FET) portion 116. The 2DEG 108 is formed at the junction between the silicon waveguide 106 and the second electrical insulator layer 110 of the waveguide 106. Multiple embodiments of optical waveguide devices are described that, upon bias of the gate electrode 120 relative to the combined first body contact electrode 118 and second body contact electrode 122, effect the passage of light through the waveguide 106 to perform a variety of functions.

Figure 12:
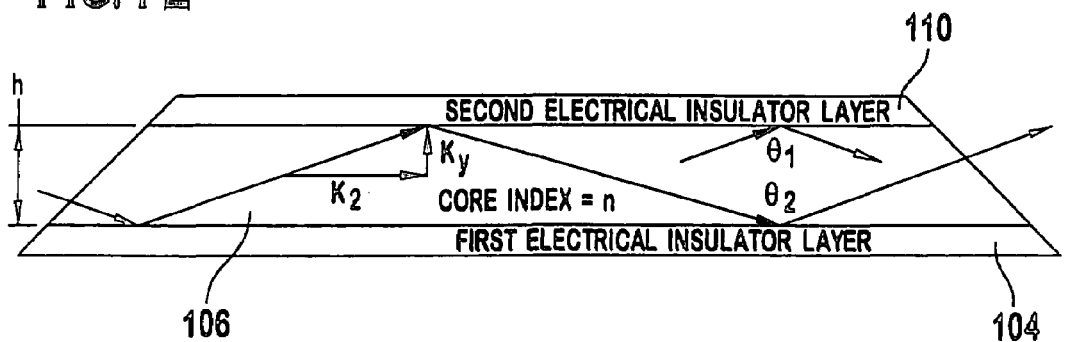
FIG. 12 shows one embodiment of a wave passing through a dielectric slab waveguide.

The FIG. 12 embodiment of semiconductor waveguide (which may be doped) 106 has a thickness h, and is sandwiched between the first electrical insulator layer 104 and the second electrical insulator layer 110. The first electrical insulator layer 104 and the second electrical insulator layer 110 are each typically formed from silicon dioxide (glass) or any other electrical insulator commonly used in semiconductors, for example SiN. The electrical insulator layers 104, 110 confine the light using total internal reflection of the light traversing the waveguide 106.

Light is injected into the waveguide 106 via the input light coupler 112 and light exits from the waveguide 106 via the output light coupler 114, although any light-coupling device can be used to respectively inject or remove the light from the waveguide 106. Examples of light-coupling devices include prisms, gratings, tapers, and butt-couplings. Light passing from the input light coupler (or other input port) to the output light coupler (or other output port) follows optical path 101 as shown in FIG. 1. The optical path 101 may be defined based upon the function of the optical waveguide device 100. For example, if the optical waveguide device functions as an optical modulator, optical deflector, or an optical filter, the optical path 101 can be respectively considered to be an optical modulation region, an optical deflection region, or an optical filtering region, etc.

As described earlier, application of voltage on the gate electrode 120 relative to the combined first body contact electrode 118 and second body contact electrode 122 leads to a change in the propagation constant via changes induced in the free-carrier density distribution 108. In a MOSCAP, the capacitance of the device is controlled by the voltage due to presence (or absence) of 2DEG. In case of a FET, changes in the free carrier distribution also control the conductance between the first body contact electrode and the second body contact electrode. The free-carriers are responsible for changing the optical phase or the amplitude of the guided wave depending on their density which in turn is controlled by the gate voltage. The basis of field-effect transistor action, i.e., rapid change in 2DEG as a function of gate voltage, is also responsible for the control of the light wave and enables integration of electronic and optical functions on the same substrate. Thus traditional FET electronic concepts can be applied to provide active optical functionality in the optical waveguide device 100. The FET portion 116 is physically located above, and affixed to, the waveguide 106 using such semiconductor manufacturing techniques as epitaxial growth, chemical vapor deposition, physical vapor deposition, etc.

The propagation constant (and therefore the effective mode index) of at least a portion of the waveguide in the optical waveguide device 100 is changed as the free carrier distribution 108 changes. Such changing of the propagation constant results in phase modulation of the light passing through that device. The phase modulation occurs in a regions of changeable propagation constant, indicated in cross-hatching in FIGS. 1 and 3 as 190, that closely follows the two-dimensional planar shape of the gate electrode through the height of the waveguide to form a three dimensional shape.

FIG. 2 shows one embodiment of a voltage source configuration that biases the voltage of the optical waveguide device 100 by using a voltage source 202 and a substantially constant potential conductor 204. The substantially constant potential conductor 204 acts to the voltage level of the first body contact electrode 118 to the voltage level of the second body contact electrode 122. The voltage source 202 biases the voltage level of the gate electrode 120 relative to the combined voltage level of the first body contact electrode 118 and the second body contact electrode 122.

To apply a voltage to the gate electrode, a voltage source 202 applies an AC voltage $v_g$ from the gate electrode 120 to the combined first body contact electrode 118 and second body contact electrode 122. The AC voltage $v_g$ may be configured either as a substantially regular (e.g. sinusoidal) signal or as an irregular signal such as a digital data transmission.

In one embodiment, the AC voltage $v_g$ may be considered as the information carrying portion of the signal. The voltage source 202 can also apply a DC bias $V_g$ to the gate electrode 120 relative to the combined first body contact electrode 118 and second body contact electrode 122. Depending on the instantaneous value of the $V_g$, the concentration of the 2DEG will accumulate, deplete, or invert as shown by the different regions in FIG. 6. In one embodiment, the DC bias $V_g$ is the signal that compensates for changes in device parameters. The combined DC bias $V_g$ and AC voltage $v_g$ equals the total voltage $V_G$ applied to the gate electrode by the voltage source 202. It will be understood from the description above that modulation of $v_g$ can thus be used to effect, for example, a corresponding modulation of light passing through the waveguide 106.

The voltage potential of the first body contact electrode 118 is tied to the voltage potential of the second body contact electrode 122 by the substantially constant potential conductor 204. Certain embodiments of the substantially constant potential conductor 204 include a meter 205 (e.g. a micrometer) to measure the electrical resistance of the gate electrode from the first body contact electrode to the second body contact electrode. The term "substantially" is used when referring to the constant potential conductor because the meter 205 may generate some relatively minor current levels in comparison to the operating voltage and current levels applied to the optical waveguide device. The minor current levels are used to measure the resistance of the gate electrode. The current level produced by the meter is relatively small since the voltage (typically in the microvolt range) of the meter is small, and the waveguide resistance is considerable (typically in tens of ohms).

The electrical resistance of the gate electrode is a function of such parameters as gate voltage, temperature, pressure, device age, and device characteristics. As such, the voltage (e.g. the Ac voltage or the DC voltage) applied to the gate electrode can be varied to adjust the electrical resistance of the gate electrode to compensate for such parameters as temperature, pressure, device age, and/or device characteristics. Therefore, the voltage applied to the gate electrode can be adjusted to compensate for variations in the operating parameters of the optical waveguide device.

As the temperature of the optical waveguide device varies, the DC bias $V_g$ applied to the gate electrode 120 of the optical waveguide device is adjusted to compensate for the changed temperature. Other parameters (pressure, device age, device characteristics, etc.) can be compensated for in a similar manner as described for temperature (e.g. using a pressure sensor to sense variations in pressure). This disclosure is not limited to discussing the sensing and compensating for temperature since the other parameters can be compensated for in a similar manner. Different meter 205 and/or controller 201 embodiments may be provided to compensate for the different temperatures.

Figure 7:
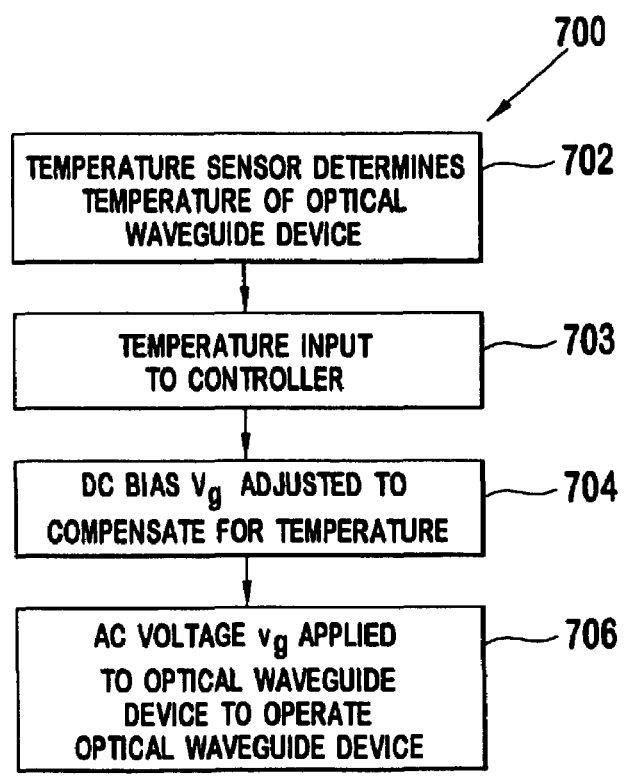
FIG. 7 shows one embodiment of a method to compensate for variations in temperature, or other such parameters, in an optical waveguide device.

FIG. 7 shows an embodiment of method 700 that compensates for temperature variations in an optical waveguide device. The method 700 starts with step 702 in which the temperature sensor 240 determines the temperature of the optical waveguide device. the temperature sensor 240 can be located either on the substrate or off the substrate. the temperature sensor inputs the temperature determined by the temperature sensor to the controller 201 in step 703. The method 700 continues to step 704 in which the DC bias $V_g$ that is applied to the gate electrode is adjusted to compensate for variations in the temperature. The controller 201 includes stored information that indicates the required change in DC bias $\Delta V_g$ that is necessary to compensate for variations in temperature, for each value of DC bias $V_g$ for each temperature within the operating range of the optical waveguide device. The method 700 continues to step 706 in which the AC voltage $v_g$ is applied to operate the optical waveguide device as desired in the waveguide.

The amount of AC voltage $v_g$ is then superimposed on the DC bias $V_g$ that is applied to the gate electrode to provide for the desired operation of the optical waveguide device 200 (e.g. the voltage necessary for optical modulation, optical filtering, optical focusing, etc.). The AC voltage $v_g$ superimposed on the combined DC bias $V_g$ and the DC bias change ADC yields the total signal $V_G$ applied to the gate electrode.

Another embodiment of compensation circuit, that compensates for the change in temperature or other operating parameter(s) of the optical waveguide device, measures the electrical resistance of the gate between the first body contact electrode 118 and the second body contact 122, The electrical resistance of the waveguide is a function of temperature, device age, device characteristics, and other such parameters. The meter 205 measures the electrical resistance of the waveguide. For a given waveguide, the same resistance corresponds to the same electron density and the same hole density in the waveguide. Therefore, if the same electrical resistance of the waveguide is maintained, the optical waveguide will behave similarly to cause a similar amount of such optical action as optical modulation, optical filtering, optical focusing, or optical deflection.

Figure 8:
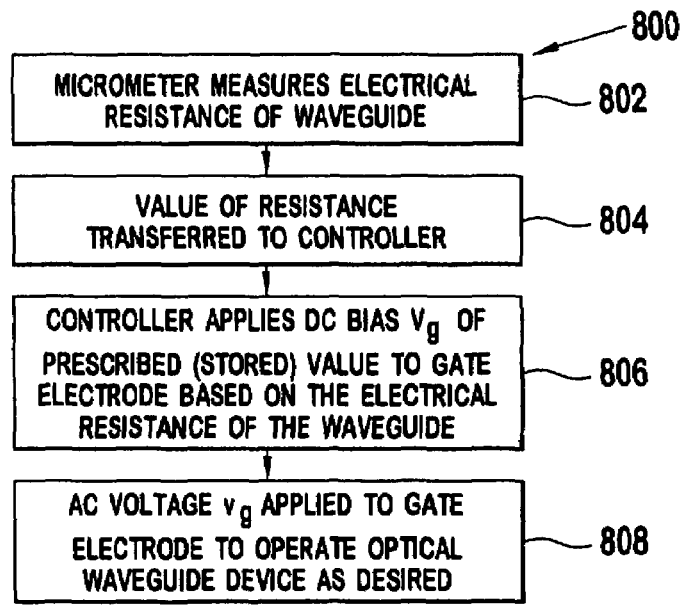
FIG. 8 shows another embodiment of a method to compensate for variations in temperature, or other such parameters, in an optical waveguide device.

FIG. 8 shows another method 800 used by the controller 201 to compensate for temperature variations of the optical waveguide device. The method 800 starts with step 802 in which the meter 205 measures the electrical resistance of the waveguide. the method 800 continues to step 804 in which the measured electrical resistance of the waveguide is transferred to the controller 201. The method continues to step 806 in which the controller applies the amount of DC bias $V_g$ required to be applied to the gate electrode for that particular value of electrical resistance of the waveguide. Such parameters as temperature and device age that together may change the electric resistance of the waveguide can thus be compensated for together. Therefore, after measuring the electrical resistance of the waveguide, a feedback loop applies the voltage for that measured resistance. The method 800 continues to step 808 in which the AC voltage $v_g$ is applied to operate the optical waveguide device (i.e. modulate, filter, focus and/or deflect light) as desired in the waveguide.

In both of these temperature compensating embodiments shown in FIGS. 7 and 8, the controller 201 allows the DC bias voltage $V_g$ to drift slowly as the temperature varies to maintain the average resistance of the waveguide from the source electrode to the drain electrode substantially constant. These temperature-compensating embodiments make the optical waveguide device exceedingly stable. As such, the required complexity and the associated expense to maintain the temperature and other parameters over a wide range of temperatures are reduced considerably.

Suitably changing the voltages applied between the gate electrode 120, and the combined first body contact electrode 118 and second body contact electrode 122 results in a corresponding change in the free carrier distribution in the 2DEG 108. In the FIG. 1 embodiment of optical waveguide device 100, altering the voltage applied to the gate electrode 120 of the FET portion 110 changes the density of free carriers in the 2DEG 108. Changing free carriers distribution in the 2DEG 108 changes the effective mode index of the 2DEG 108 in the waveguide. Changing the free carrier distribution similarly changes the instantaneous propagation constant level of the region of changeable propagation constant 190 (e.g., the area generally underneath the gate electrode 120 in the FIG. 1 embodiment) within the waveguide 106.

Effective mode index, and equivalently propagation constant, both measure the rate of travel of light at a particular location within the waveguide taken in the direction parallel to the waveguide. For a light beam traveling over some distance in some medium at a velocity V, the velocity V divided by the speed of light in vacuum is the index for that medium. Glass has a propagation constant of 1.5, which means light travels 1.5 times slower in glass then it does in a vacuum. For the silicon in the waveguide the propagation constant is about 3.5. Since a portion of the light path travels in silicon and part of the light path is in the glass, the propagation constant is some value between 1.5 and 3.5. Therefore, the light is travelling at some effective speed measured in a direction parallel to the axial direction of the waveguide. That number, or speed, is called effective index of the waveguide. Each mode of light has a distinct effective index (referred to as the effective mode index) since different modes of the waveguide will effectively travel at different speeds.

The effective mode index is the same thing as the propagation constant for any specific mode of light. The term effective mode index indicates that the different modes of light within a waveguide travel at different velocities. Therefore there are a plurality of effective indexes for a multi-mode waveguide, each effective index corresponds to a different mode of light. The propagation constant (or the effective index) measures the average velocity for a phase of light for specific mode travel parallel to the axis of the waveguide as shown in FIG. 12. The propagation constant multiplied by the length would indicate how long it takes to go that length. Through this disclosure, the effective index for a mode (the effective mode index) is considered to be the same measure as the propagation constant for that mode of light. The term propagation constant is primarily used throughout the remainder of the disclosure for uniformity.

Changing the propagation constant of the waveguide 106 by varying the 2DEG 108 can phase modulate or amplitude modulate the light in the waveguide. Within the waveguide, the degree of modulation is local in that it depends on the density of 2DEG at a particular location. The shape of the electrode, or other arrangements of body contact electrodes, can impose a spatially varying phase or amplitude pattern to the light beam in the waveguide. This in turn can be used to accomplish a wide variety of optical applications such as variable attenuators, optical programmable filters, switches, etc. on the optical signals flowing through the waveguide 106.

A controller 201 controls the level of the total voltage $V_G$ applied to the voltage source 202. The optical waveguide device can be employed in a system that is controlled by the controller 201, that is preferably processor-based. The controller 201 includes a programmable central processing unit (CPU) 230 that is operable with a memory 232, an input/output (I/O) device 234, and such well-known support circuits 236 as power supplies, clocks, caches, displays, and the like. The I/O device receives, for example, electrical signals corresponding to a desired modulation to be imposed on light passing through the waveguide 106. The controller 201 is capable of receiving input from hardware in the form of temperature sensors and/or meters for monitoring parameters such as temperature, optical wavelength, light intensity, device characteristics, pressure, and the like. All of the above elements are coupled to a control system bus to provide for communication between the other elements in the controller 201 and other external elements.

The memory 232 contains instructions that the CPU 230 executes to facilitate the monitor and control of the optical waveguide device 100. The instructions in the memory 232 are in the form of program code. The program code may conform to any one of a number of different programming languages. For example, the program code can be written in C, C++, BASIC, Pascal, or a number of other languages. Additionally, the controller 201 can be fashioned as an application-specific integrated circuit (ASIC) to provide for quicker controller speed. The controller 201 can be attached to the same substrate as the optical waveguide device 100.

In the FIG. 1 embodiment of waveguide 106, electrons (hole) concentrate in the waveguide to form the 2DEG 108 that forms a very narrow channel near the boundary of the silicon waveguide 106 and the second electrical insulator layer 110. The surface inversion charge density $q_n$ in the 2DEG 108 is a direct function of the local surface potential $\phi_s$ applied to the waveguide 106. The local surface potential $\phi_s$ is, in turn, directly related to the total instantaneous voltage on the gate electrode 120. The total voltage of light in the waveguide $V_G$ satisfies the equation $V_G = V_g + v_g$, where $V_g$ is the DC bias and $v_g$ is the AC bias. The local surface potential $\phi_s$ is a function of the total voltage $V_G$, and is given by the equations:

$$\phi_s = \frac{Q}{C} + V_G + \frac{Q_{OX}}{C_{OX}} + \phi_{ms}$$

$$\phi_s \equiv \frac{Q}{C} + V'_G$$

Figure 6:
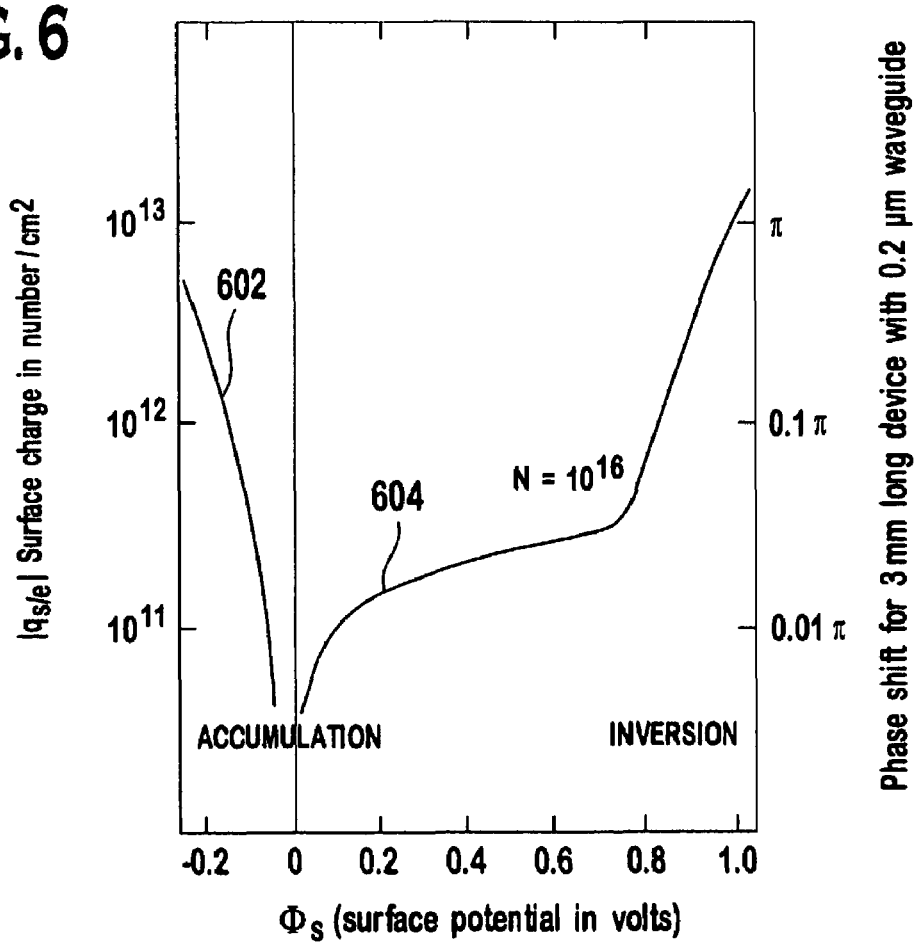
FIG. 6 shows a graph plotting surface charge density and the phase shift, both as a function of the surface potential.

The total potential $V_G$ that is applied to the waveguide 106 is thus a factor of the effective capacitance C of the optical waveguide device 100. The effective capacitance C itself depends on the distribution of the free-carriers. Thus, the capacitance in the MOS like device is a function of the applied voltage. The charges Q and capacitance C in the equation 1 above are measured per unit area. Since the 2DEG density depends only on $\phi_s$, dopant density, and temperature; 2DEG density q, can be plotted vs. $\phi_s$. FIG. 6 illustrates a curve 602 that plots surface charge density as a function of surface potential for an Si/SiO$_2$ MOSCAP where the uniform dopant density is assumed to be $10^{16}$ cm$^{-3}$ at room temperature. FIG. 6 also shows curve 604 that plots phase shift that is applied to the optical wave passing through waveguide 106 for a 3 mm long rectangular gate region. The phase shift is plotted as a function of surface potential $\phi_s$.

A side view of one embodiment of the optical waveguide device including a waveguide located in a MOSCAP is shown in FIG. 4. The optical waveguide device includes a MOSCAP 400 including a body contact 402, a waveguide 106, an electric insulator layer 405, and a gate electrode 406. In the embodiment of MOSCAP similar to as shown in FIG. 4, a voltage source 410 applies a voltage between the gate electrode 406 and the body contact 402 to alter a level of propagation constant in a region of changeable propagation constant 190 within the waveguide 106. The variations to the effective mode index and the propagation constant result occur similarly to in the FET embodiments of optical waveguide device 100 as described below.

In the MOSCAP embodiment of optical waveguide device shown in FIG. 4, the body contact 402 is positioned below the waveguide 106. Alternatively, body contacts may be located where the traditional source and drain electrodes exist on traditional FETs. The body contact in the FET embodiment of optical waveguide device shown in FIGS. 1 to 3 is formed from the first body contact electrode being electrically coupled at the same potential as the second body contact electrode. Application of the electric field due to the potential difference between the "gate" and the body contacts results in changes in the distribution of free charges as shown in the embodiment of FIG. 4.

FIG. 5 discloses one embodiment of high electron mobility transistor (HEMT) 500. The HEMT 500 comprises a semi-electric insulating substrate 502, an undoped buffer waveguide layer 106, an undoped spacer layer 506, a doped donor layer 508, a 2DEG 505, the first body contact electrode 118, the gate electrode 120, and the second body contact electrode 122. In one embodiment, the semi-insulating substrate 502 is formed from AlGaAs. The undoped buffer waveguide layer 106 is formed from GaAs. The undoped spacer layer 506 is formed from AlGaAs. The doped donor layer 508 is formed from a doped AlGaAs.

During operation of the optical waveguide device, the 2DEG 505 increases in height (taken vertically in FIG. 5) to approximately 290 angstroms. The 2DEG 505 is generated at the interface between the undoped spacer layer 506 and the undoped buffer waveguide layer 106 as a result of the negative biasing of the doped donor layer 508. Such negative biasing drives the electron carriers in a 2DEG 505 generally downward, thereby forming a p-type 2DEG 505. Application of voltage to the gate electrode tends to increase the free carrier distribution in those portions of the 2DEG 505 that are proximate the gate electrode. Such an increase in the free carrier distribution in the 2DEG increases the effective mode index in the waveguide 106 formed underneath the 2DEG 505. The gate electrode 120 is formed having a prescribed electrode shape. The shape of the effective mode index region within the waveguide 106 (i.e., the region having an effective mode index that is changed by the application of voltage to the gate electrode) generally mirrors the shape of the gate electrode 120 as viewed from above in FIG. 5. Additionally, the undoped spacer layer 506 acts as an insulative layer, several of which are described in U.S. Pat. No. 6,177,685 to Teraguchi et al. that issued on Jan. 23, 2001 (incorporated herein by reference in its entirety).

From semiconductor physics, the change in the distribution of free charges is most pronounced near the electrical insulator-semiconductor boundary. These changes in the free-carrier distribution change the index profile of the optical waveguide from a well-known relationship in plasma physics given by the Drude model in a region of changeable propagation constant 190 within the waveguide. The changes in the free-carrier distribution induced in the semiconductor by the application of electric fields between the gate electrode and the body contact electrode(s) modulates the phase and/or amplitude of the optical wave passing through the region of changeable propagation constant 190. Thus, local changes in the free carrier distribution induced by a change in applied voltage to the gate electrode are impressed on the local optical phase or the amplitude of light passing through the waveguide. The shape of the charge distribution, i.e., the region of changeable propagation constant 190, provides the appropriate optical function as described below. In multiple embodiments, the pattern of the gate electrode (i.e., the planar shape of the gate) controls the shape of the free carrier distribution. The change in free carrier distribution, in turn, changes the local effective mode index, or propagation constant, of the waveguide in the region of changeable propagation constant 190. The same phenomena of change in the refractive index profile of the waveguide may be ascribed by indicating that group delay or the group velocity of the light beam has been changed as the free carrier distribution varies.

Therefore, the effective mode index, the propagation constant, the group delay, or the group velocity relate to an equivalent concept, namely, parameterizing changes in the waveguide's refractive index profile on the optical beam passing through the region of changeable propagation constant 190 in the waveguide. This principle applies to all embodiments of optical waveguide devices, including those shown in FIGS. 1-3, 4, and 5.

The relationship between the effective mode index, the propagation constant, the group delay, or the group velocity apply to waveguides of all thickness' is now considered. In the case of "thick" waveguides, the light ray travels by bouncing between the two bounding planes defined by the insulator layers 110 and 104. The light ray can be easily identified, typically using the concept of phase or amplitude changes that are directly imposed on a beam that has directly undergone one or multiple interactions with free carriers. However, the concepts of effective mode index, propagation constant, group delay, or group velocity signify the same final result on the light beam. In this disclosure, the terms propagation constant, effective mode index, group delay, and group velocity are each used to describe the effects of changes in the free-carrier distribution due to electric field applied to a semiconductor in an optical waveguide device, whether the optical waveguide device uses FET, HEMT, MOSCAP, or any other type of optical waveguide device technology.

Controlling the 2DEG density provides the optical function of an optical waveguide device. As described, adjusting the gate voltage can control the 2DEG density. The density may be spatially varied to provide more complex functions. A triangular shaped density distribution (included in a region of changeable propagation constant) is capable of deflecting the light beam in a fashion similar to a prism in ordinary optics. An undulating pattern of 2DEG of a particular spatial period can reflect/deflect a specific wavelength to form a grating. The exact shape or the spatial density of the 2DEG is affected by placement of body contact electrodes relative to the gate electrode, the shape of the body contact electrodes and the gate electrode, and the applied voltages discussed herein. The electric field density between the gate electrode and the body contact electrode determines the shape of the 2DEF density. The properties or thickness of the insulator can be changed to affect the density distribution. For example, a grating may be constructed by patterning the gate electrode as a series of grooves having a constant spacing. In alternate embodiments, the gate electrode can have a consistent thickness, but the insulator thickness or shape can be altered to change the electrical resistance between the gate electrode and the waveguide. All of these embodiments provide an electrically switchable grating by controlling the 2DEG density. The 2DEG density pattern follows the surface potential at the waveguide/electric insulator boundary rather than the exact shape of the gate electrode.

Figure 9:
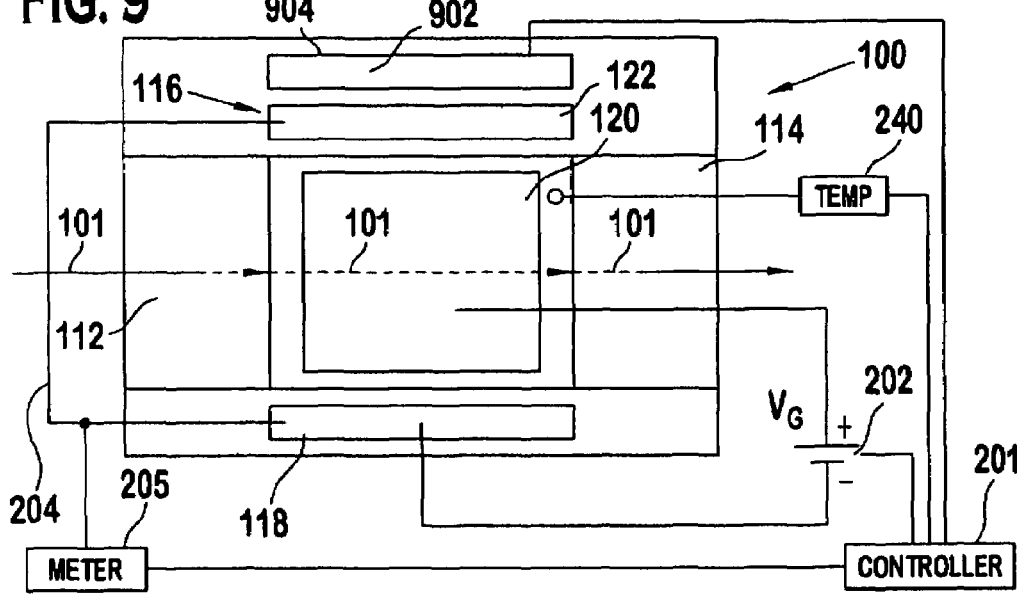
FIG. 9 shows a top view of another embodiment of optical waveguide device 100.

FIG. 9 shows a top view of another embodiment of optical waveguide device 100 that is similar to that shown in the embodiment of FIG. 2, except that the optical waveguide device includes an additional bank gate electrode 902 that is connected to a bank gate electrode well 904. The doping charge of the bank gate electrode well 904 (p++) in one embodiment is opposite the doping charge (n++) of the source electrode well and the drain electrode well. During operation, a voltage may be applied between the bank gate electrode 902 and the connected source electrode and drain electrode to establish a propagation constant gradient formed within the region of changeable propagation constant across the waveguide from the source electrode to the drain electrode. A variety of alternative embodiments may be provided to establish a propagation constant gradient formed within the region of changed propagation constant across the waveguide. For example the width of the second electrical insulator layer 110, or the resistance of the material used in the second electrical insulator layer 110 may be varied to establish a propagation constant gradient across the waveguide. since there are such a variety of FET, MOSCAP, HEMT, and other configurations, it is envisioned that those configurations are within the intended scope of optical waveguide device of the present invention.

Optical waveguide devices may be configured either as slab waveguides or channel waveguides. In channel waveguides, the guided light is bound in two directions (x and y) and is free to propagate in the axial direction. In slab waveguides, the guided light is bound in one direction and can propagate freely in two orthogonal directions. Channel waveguides are used in such applications as transmission, resonators, modulators, lasers and certain filters or gratings where the guided light is bound in two directions. Slab waveguides are used in such applications as deflectors, couplers, demultiplexers, and such filters or gratings where the guided light is bound only in one direction, and it may be desired to change the direction of propagation.

Figure 10:
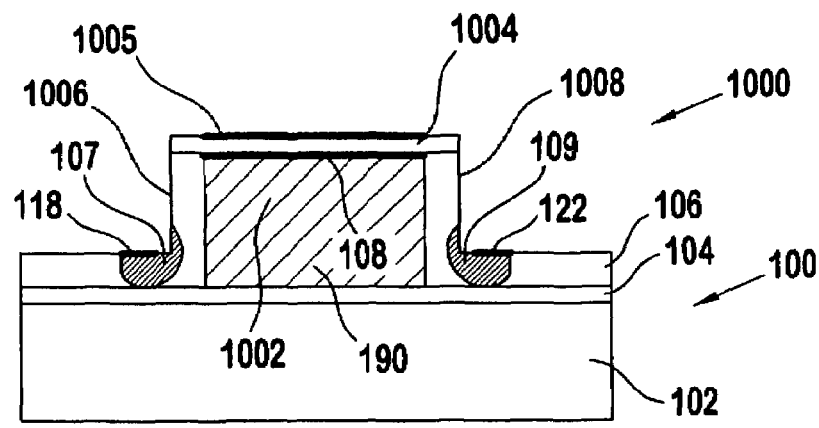
FIG. 10 shows a side cross sectional view of one embodiment of a ridge optical channel waveguide device.
Figure 11:
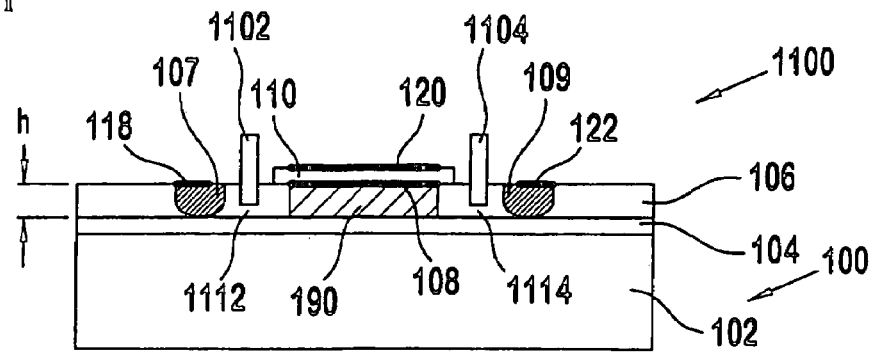
FIG. 11 shows a side cross sectional view of one embodiment of a trench optical channel waveguide device.

There are several embodiments of channel waveguides including the FIG. 10 embodiment of the ridge channel waveguide 1000 and the FIG. 11 embodiment trench channel waveguide 1100. The ridge channel waveguide 1000 includes a raised central substrate portion 1002, a electrical insulator layer 1004, and a metal gate electrode 1005. The raised substrate portion 1002 is n-doped more heavily than the main substrate 102. The raised substrate portion 1002 forms a channel defined by a pair of side walls 1006, m 1008 on the sides; the electrical insulator layer 1004 on the top and the n-doping differential between the raised substrate portion 1002 and the main substrate 102 on the bottom. The pair of side walls 1006, 1008 includes, or is coated with, a material having a similar index of refraction as the electrical insulator layers 104. Biasing the metal gate electrode 1005 forms a 2DEG 108 adjacent the electrical insulator layer 1004. The 2DEG 108 allows the carriers to pass between the first body contact well 107 and the second body contact well 109 as applied, respectively, by the respective first body contact electrode 118 and the second body contact electrode 122.

FIG. 11 shows one embodiment of trench channel waveguide 1100. The trench channel waveguide includes a plurality of electrical insulative blocks 1102, 1104 and the waveguide 106. The electrical insulative block 1102 partially extends into the waveguide 106 (from the upper surface of the optical waveguide device 100) at a lateral location between the first body contact well 107 and the gate electrode 120. The electrical insulative block 1104 partially extends into the waveguide 106 (from the upper surface of the optical waveguide device 100) at a later location between the second body contact well 109 and the gate electrode 120. The light passing through the waveguide 106 is restrained from travelling laterally by the addition of the electrical insulative blocks 1102, 1104. Spaces 1112, 1114 are defined within the waveguide between each one of the respective insulative blocks 1102, 1004 and the first electrical insulator layer 104. These spaces allow carriers to flow between the respective first body contact well 107 and the second body contact well 109 through the waveguide 106 formed under the gate electrode 120.

One embodiment of the optical waveguide devices 100 can be constructed on so-called silicon on insulator (SOI) technology that is used in the semiconductor electronics field. SOI technology is based on the understanding that the vast majority of electronic transistor action in SOI transistors occurs on the top few microns of the silicon. The silicon below the top few microns, in principal, could be formed from some electrical insulator such as glass. The SOI technology is based on providing a perfect silicon wafer formed on a layer of electrical insulator such as glass (silicon dioxide), that starts two to five microns below the upper surface of the silicon. The electrical insulator electrically isolates the upper two to five microns of silicon from the rest of the silicon.

The inclusion of the electrical insulator in SOI devices limit the large number of electric paths that can be created through a thicker silicon, thereby automatically making SOI transistors go faster and use less power consumption. SOI technology has developed over the past decade to be commercially competitive. For example, Power PC (a registered trademark of Apple Computer, Inc. of Cupertino, CS) has moved to SOI technology.

The embodiment of optical waveguide device 100 shown, for example, in FIGS. 1 to 3 may be configured using SOI technology such as processors and chips. The waveguide 106 of the optical waveguide device 100 may be fashioned as the upper SOI silicon layer. The first electrical insulator layer 104 may be fashioned as the SOI insulator layer. The substrate 102 may be fashioned as the SOI silicon substrate. As such, the SOI technology including the majority of processors and chips, can easily be used as an optical waveguide device.

III. Waveguide Physics

This section demonstrates that the propagation constant (or equivalently the effective mode index) of the waveguide is an instantaneous function of the 2DEG charge density $q_n$. An increase in the free carrier distribution in a region of the 2DEG 108 results in a corresponding increase in the propagation constant of the waveguide 106 at the corresponding region. The relationship between the volumetric density of free carriers and the refractive index was originally derived by Drude in his Model of Metals that indicates that metals provide both a dielectric and "free electron" response. The same model may be applied to semiconductors. The changes in the real part of the refractive index $\Delta n$ and the imaginary part of the refractive index $\Delta k$ (the imaginary part corresponds to absorption) from an increase in the free carrier distribution are a function of the change in the free-carrier density $\Delta N$, as indicated by the following equations:

$$\Delta n = \frac{e^2}{2\varepsilon_0 m_e n \omega^2} \Delta N \equiv \chi \Delta N$$

$$\Delta k = \frac{\Delta n}{\omega \tau_s}$$

where e is the electronic charge, $m_e$ is the effective mass of the carrier, $\tau_s$ is the mean scattering time and is related to the mobility, and $\Delta N$ is the change in the free-carrier density. For the semiconductor devices considered here, where the dominant change in the free-carriers is due to the 2DEG, $\Delta N$ is a function of $q_n$ and the thickness (t) of the 2DEG varies according to the equation:

$$\Delta N = \frac{\Delta q_n}{t_{2DEG}},$$

TABLE 1 shows the calculated values of the Drude coefficient $\chi$ and the effective mass $m_e$ for Silicon with n or p-type dopants, and Gallium Arsinide (GaAs) with n-type doping (at wavelengths of 1.3 and 1.55 microns). GaAs and InP both have a larger Drude Coefficient $\chi$ than silicon. This is in part due to the smaller effective mass of charge (electron or hole). Thus, a waveguide structure made from GaAs and InP will have larger changes in the propagation constant for the same changes in the density of 2DEG when compared to Silicon.

TABLE 1

| Wavelength | Material | $\chi$ | $m_e$ |
|---|---|---|---|
| 1.33 | Silicon-n | $-7 \times 10^{-22}$ | 0.33 |
| 1.55 | | $-9.4 \times 10^{-22}$ | |
| 1.33 | Silicon-p | $-4 \times 10^{-22}$ | 0.56 |
| 1.55 | | $-5.5 \times 10^{-22}$ | |
| 1.33 | GaAs-n | $-3.5 \times 10^{-21}$ | 0.068 |
| 1.55 | | $-4.8 \times 10^{-21}$ | |

To estimate the length requirements for a dielectric slab waveguide, the modes of the FIG. 12 embodiment of dielectric slab waveguide 106 formed between the cladding layers have to satisfy the equation:

$$2k_y h + \phi_1 + \phi_2 = 2m\pi$$

where h is the thickness of the waveguide 106, and the phase shifts $\phi_1$ and $\phi_2$ are due to the reflection of the light at the boundary and m is an integer multiple. The propagation constant $k_z$ and $k_y$ are related to k and the mode angle $\theta$ by the following equations:

$$k_y = k \cos \theta$$

$$k_z = k \sin \theta, \text{ and}$$

$$k = \left(\frac{2\pi}{\lambda}\right) n.$$

Solving equations 5 and 6 can derive the modes of the waveguide 106. The values of $\phi_1$ and $\phi_2$ are functions of angle $\theta$. The change in the propagation constant $k_z$ due to change in the waveguide index profile induced by the 2DEG is responsible for amplitude and phase modulation. The phase modulation of the light in the waveguide results from a change in the propagation constant of selected regions within the waveguide. The amplitude modulation of the light passing through the waveguide results from a change in the absorption of the light passing through selected regions within the waveguide.

The shape and type of the material through which light is passing plays an important role in determining the optical function of the optical waveguide device. For example, light passing through a rectangular slab waveguide device only travels axially along the optical path 101. Optical deflectors, for example, not only allow the light to travel axially, but can also deviate the light laterally. The amount of displacement and deviation of the light passing through the waveguide are both dependent on the propagation constant of the waveguide as well as the apex of the light coupler.

The shape of a region of changeable propagation constant 190 within a waveguide plays a role in determining how an application of voltage to the gate electrode will modify the optical characteristics of light passing through the waveguide. For example, a suitably-biased prism-shaped gate electrode projects a three dimensional prism-shaped region of changeable propagation constant 190 into the waveguide. The cross-sectional height of the region of changeable propagation constant 190 is projected through the entire height of the waveguide. As viewed from above, the region of changeable propagation constant 190 deflects light in similar propagation directions as light passing through a similarly shaped optical light coupler. In slab waveguides, the rays of light will deflect or bounce between the upper and lower surface of the waveguide while continuing in the same propagation direction as viewed from above.

Unlike actual optical circuits that are physically inserted in a path of light, any effects on light passing through the waveguide of the present invention due to the propagation constant within a region of changeable propagation constant 190 can be adjusted or eliminated by altering the voltage level applied to the gate electrode. For example, reducing the voltage applied to a deflector-shaped gate electrode sufficiently results in the propagation constant of the projected deflector-shaped region of changeable propagation constant 190 being reduced to the propagation constant value of the volume surrounding the region of changeable propagation constant 190. In effect, the region of changeable propagation constant 190 will be removed. Light travelling through the region of changeable propagation constant 190 will therefore not be effected by the region of changeable propagation constant 190 within the waveguide. Similarly, the strength of the propagation constant can be changed or reversed by varying the voltage applied to the gate electrode.

IV. Specific Embodiments of Optical Waveguide Devices

A variety of embodiments of optical waveguide devices are now described. Each optical waveguide device shares the basic structure and operation of the embodiments of optical waveguide device described relative to FIG. 1-3, 4 or 5. The optical waveguide device can be configured in either the channel waveguide or slab waveguide configuration. Each embodiment of optical waveguide device is an active device, and therefore, the voltage level applied to the electrode can control the degree that the light within the region of changeable propagation constant 190 in the waveguide will be affected. Since the optical waveguide device is active, the propagation constant in the region of changeable propagation constant 190 can be adjusted by varying the voltage applied to the gate electrode. Allowing for such adjustment using the controller 201 in combination with either the meter 205 or the temperature sensor 240 using the methods shown in FIG. 7 or 8 is highly desirable considering the variation effects that temperature, device age, pressure, etc. have on the optical characteristics of the optical waveguide device.

The embodiments of optical waveguide device 100 described relative to FIGS. 1 to 3, 4, and 5 can be modified to provide a considerable variation in its operation. For example, the optical waveguide device 100 can have a projected region of changeable propagation constant 190 within the waveguide to provide one or more of phase and/or amplitude modulation, optical deflection, optical filtering, optical attenuation, optical focusing, optical path length adjustment, variable phase tuning, variable diffraction efficiency, optical coupling, etc. As such, embodiments of many optical waveguide devices that perform different operations are described in the following sections along with the operations that they perform.

In each of the following embodiments of an optical waveguide device, the gate electrode is formed in a prescribed electrode shape to perform a desired optical operation. The projected region of changeable propagation constant 190 assumes a shape similar to, but not necessarily identical to, the gate electrode. The shape of the region of changeable propagation constant 190 within the waveguide can physically map extremely closely to, with a resolution down to 10 nm, the prescribed gate electrode shape. The construction and operation of different embodiments of optical waveguide devices, and the operation, and effects of various embodiments of regions of changeable propagation constant 190 are described in this section.

4A. Optical Modulator

This section describes an optical modulator, one embodiment of optical waveguide device 100 that modulates light passing through the waveguide. The embodiments of optical waveguide device as shown in FIG. 1-4, 4, or 5 can perform either phase modulation or amplitude modulation of light passing through the waveguide. The modulation of light by the optical waveguide device 100 can be optimized by reducing the losses in the gate electrode 120 as well as reducing the charges in the 2DEG 108, while increasing the interaction of the waveguide mode with the 2DEG. In general, reducing the waveguide thickness h reduces the necessary waveguide length $L_N$ to produce modulation. Limiting the modulation of the 2DEG 108 also limits the effects on the free-carriers resulting from absorption during modulation. The length required for a specific loss, such as a 10 dB loss $L_{10dB}$, can be experimentally determined for each device. Both $L_N$ and $L_{10dB}$ are functions of $\Delta q_n$. $\Delta q_n$ depends on both the DC bias $V_g$ as well peak-to-peak variation of the varying AC signal $v_g$.

To construct a high-speed modulator operating with bandwidth in excess of, for example 50 GHz, it is important to consider both the RF microwave interfaces and the transit time of the free-carriers. Since the carriers arrive in the 2DEG either from the bulk electrode (not shown), from the first body contact electrode 118, or from the second body contact electrode 122, as the voltage of the gate electrode 122 is changed, the time required for the voltage to equilibrate to supply a constant voltage is, $$\tau_e = \frac{(L/2)}{v_s}.$$

where $v_s$ is the maximum velocity of the carriers and L is the channel length illustrated in FIG. 1. Thus, the maximum length L of the MOS/HEMT structure of the optical waveguide device 100 is determined by the requirement that $\tau_e$ be less than some percentage of the bit period.

FIG. 6 shows an illustrative graph of the surface charge density and the phase shift, both plotted as a function of the surface potential for a planar dielectric waveguide. In the FIG. 6 plot, the waveguide is an exemplary planar Si waveguide that has an electrical insulator layer such as cladding on both the upper and lower surfaces. The waveguide is a single mode waveguide with the propagation constant of 14.300964 $\mu m^{-1}$. A change in the gate voltage by approximately 0.2-0.5 V results in a change to the surface charge density of the 2DEG by $8 \times 10^{12}$ cm$^{-2}$ which in turn will lead to a change of −0.01 in the propagation constant if the 2DEG was due to electrons. Further assume that this 2DEG region is effectively confined to within 5-50 nm adjacent the upper electrical insulator layer, as is typical for MOS device physics. Assuming that there is an index change over only a 10 nm distance, the new propagation constant is calculated to be 14.299792 $\mu m^{-1}$. The changes in the propagation constant result in an additional phase shift of 180 degrees for light travelling a length of 2.86 mm. Thus, gate voltage modulation leads to phase modulation of light in the waveguide. Similarly, free-carrier absorption occurs in the semiconductor locations where there are scattering centers (i.e. donor sites). Such free-carrier absorption acts to modulate the amplitude of the propagating mode of light. In general, amplitude modulation and phase shift modulation will occur simultaneously, but one type of modulation can be arranged to be predominant by controlling the doping profile of the waveguide.

In one embodiment, a channel waveguide is used to construct a high-speed modulator. With total internal reflection (TIR) using a channel waveguide, all the light within the waveguide is constrained to follow the direction parallel to the optical path 101 since the light that contacts the electrical insulator layers 104, 110 of the waveguide reflects off the electrical insulator layers. Electrical insulator layers 104, 110 have a lower refractive index than the waveguide. The channel waveguide should be dimensioned to match the mode(s) of the waveguide so the waveguide acts as a modulator for that mode.

The first body contact well 107 and the second body contact well 109, that respectively interact with the first body contact electrode 118 and the second body contact electrode 122, are both typically n-doped. This doping produces the body contact wells 107, 109 having a lower refractive index than the silicon waveguide 106 due to the presence of free-carriers. The body contact wells 107, 109 thus form a low-refractive index cladding that naturally confine the light mode(s) laterally within the waveguide 106. The body contact wells 107, 109 also absorb some light passing through the waveguide 106, but the absorption of light makes the waveguide lossy. Thus, it may be desired to use other refractive elements than the electrodes 118, 122 to confine the travel of the optical modes and limit the loss of the light.

For high speed modulation, the body contacts and the gate electrodes can be made to act like a waveguide that operates at radio frequencies. It is preferred, depending on the distance required, to produce the required modulation to match the group velocity of the optical wave to the microwave.

Variable optical attenuators are one additional embodiment of optical amplitude modulators. The description of constructing one embodiment of variable optical attenuator using optical waveguide devices is described later following a description of gratings.

4B. Optical Deflectors

Figure 13:
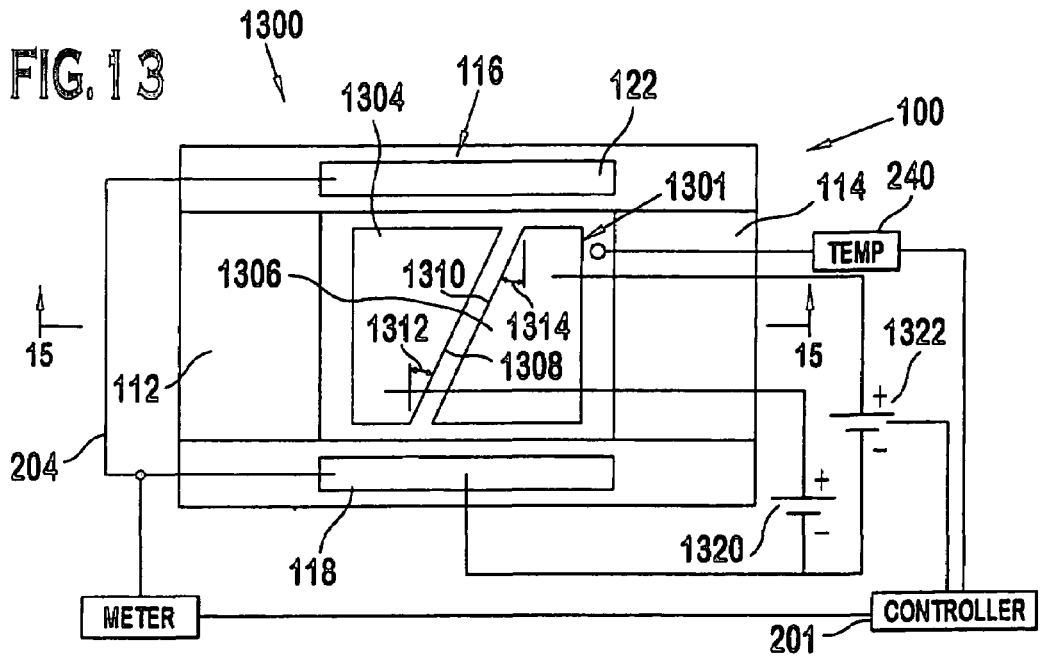
FIG. 13 shows a top view of another embodiment of an optical waveguide device from that shown in FIG. 2, including one embodiment of a light coupler-shaped gate array that provides for light deflection by the optical circuit.

The FIG. 13 embodiment of the optical waveguide device 100 is capable of acting as an optical deflector 1300 to controllably deflect light passing through the waveguide. In one embodiment of deflector 1300, the gate electrode 120 shown in the embodiments of FIGS. 1-3, 4, and 5 is physically and operationally divided into two electrodes including the input light coupler gate electrode 1304 and the output light coupler gate electrode 1306. Both the input light coupler gate electrode 1304 and the output light coupler gate electrode 1306 may be shaped in a trapezoidal or other prismatic) configuration, and are both substantially co-planar and physically positioned above the waveguide. When voltage of a first polarity is applied to one of the input light coupler gate electrodes 1304 or the output light coupler gate electrode 1306 (not simultaneously), light will be deflected from the incident axial direction of propagation into opposite lateral directions, e.g. respectively downwardly and upwardly within the waveguide of FIG. 13. When a voltage of one polarity is applied to one of the input light coupler gate electrode 1304, light will be deflected in the opposite lateral directions (upward or downward as shown in FIG. 13) as when voltage of the same polarity is applied to the output light coupler gate electrode 1306.

The input light coupler gate electrode 1304 and the output light coupler gate electrode 1306 are both formed from an electrically conductive material such as metal. A first voltage supply 1320 extends between the combined first body contact electrode 118 and the input light coupler gate electrode 1304. A second voltage supply 1322 extends between the combined first body contact electrode 118 and second body contact electrode 122 to the output light coupler gate electrode 1306. The first voltage supply 1320 and the second voltage supply 1322 are individually controlled by the controller 201, and therefore an opposite, or the same, or only one, or neither, polarity voltage can be applied to the input light coupler gate electrode 1304 and the output light coupler gate electrode 1306. The input light coupler gate electrode 1304 and the output light coupler gate electrode 1306 can be individually actuated so that each one of the deflecting prism gate electrodes 1304, 1306 can project a region of changeable propagation constant 190 in the waveguide while the other deflecting prism gate electrode does not. FIGS. 14 and 15 (including FIGS. 15A to 15D) show a shape of an embodiment of first region of changeable propagation constant 190a projected by the input light coupler gate electrode 1304 closely maps that shape of the input light coupler gate electrode shown in FIG. 13. The shape of the FIGS. 14 and 15 (including FIGS. 15A to 15D) embodiment of second region of changeable propagation constant 190b projected by the output light coupler gate electrode 1306 that closely maps that shape of the output light coupler gate electrode 1306 shown in FIG. 13.

The input light coupler gate electrode 1304 has an angled surface 1308 whose contour is defined by apex angle 1312. The output light coupler gate electrode 1306 has an angled surface 1310 whose contour is defined by apex angle 1314. Increasing the voltage applied to either the input light coupler gate electrode 1304 or the output light coupler gate electrode 1306 increases the free carrier distribution in the region of the 2DEG adjacent the respective first region of changeable propagation constant 190b of the waveguide, shown in the embodiment of FIG. 15 (that includes FIG. 15A or 15D). Both regions of changeable propagation constants 190a, 190b are prism (trapezoid) shaped and extend for entire height of the waveguide and can be viewed as horizontally oriented planar prisms located in the waveguide whose shape in the plane parallel to the gate electrode is projected by the respective deflecting prism gate electrodes 1304, 1306. The waveguide volume within either one of the regions of changeable propagation constant 190a, 190b has a raised propagation constant compared to those waveguide regions outside the region of changeable propagation constant 190a, 190b. Additionally, a boundary is formed between each one of the regions of changeable propagation constant 190a, 190b and the remainder of the waveguide. The fact that each one of the regions of changeable propagation constant 190a, 190b has both a raised propagation constant level and a boundary makes the prism-shaped regions of changeable propagation constant 190a, 190b act as, and indeed be functionally equivalent to, optical prisms formed of either semiconductor material or glass.

Figure 15A:
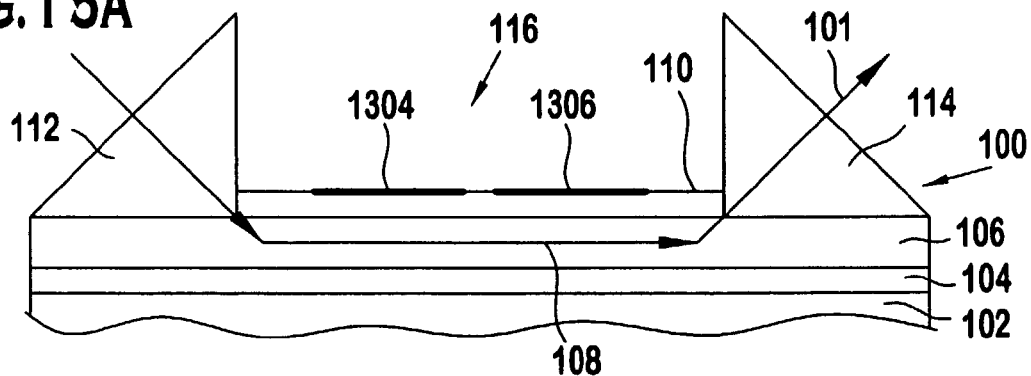
FIGS. 15A to 15D show side cross section views of the optical waveguide device of FIG. 13 or take through sectional lines 15-15 in FIG. 13.

As show n in FIG. 15A, when a level of voltage that is insufficient to alter the carrier concentration is applied to either gate electrode 1304 and 1306, no 2DEG 108 is established between the electric insulator layer 110 and the waveguide 106. Since the 2DEG changes the level of propagation constant in the respective regions of propagation constant 190a, 190b, no region of changeable propagation constant 190a or 190b are established in the waveguide 106. Therefore, the propagation constant of the first region of changeable propagation constant 190a in the waveguide matches the propagation constant level of the remainder of the waveguide 106, and light travelling along paths 1420, 1422 continues to follow their incident direction. Path 1420 is shown with a wavefront 1440 while path 1422 is shown with a wavefront 1442.

Figure 15B:
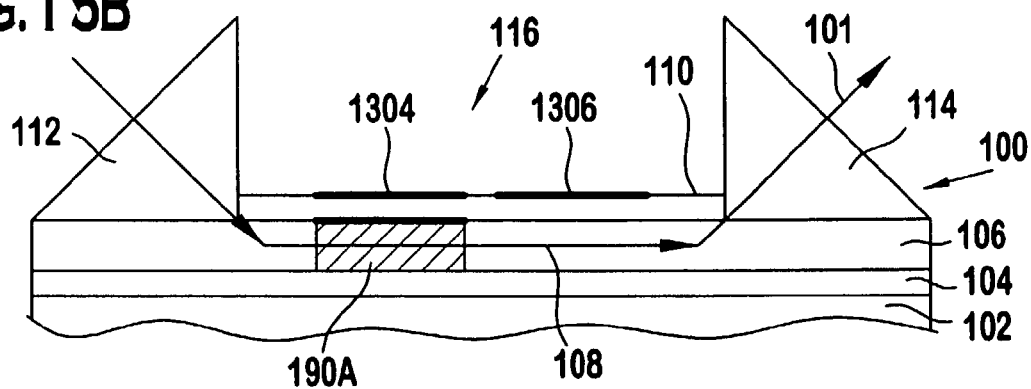

When voltage of a first polarity is applied to the input light coupler gate electrode 1304, the first region of changeable propagation constant 190a is projected in the shape of the input light coupler gate electrode 1304 through the height of the waveguide to form the region of changed propagation constant 190a, as shown in FIG. 15B. The first region of changeable propagation constant 190a thus functions as a variable optical prism that can be selectively turned on and off. The first region of changeable propagation constant 190a is formed in the semiconductor waveguide that deflects the light passing along the waveguide along a path 1430 including wavefronts 1432. Individual beams of the light following path 1430 are reflected with total internal reflectance between an upper and lower surface of the waveguide, but the direction of travel of light within the waveguides remains along the path 1430.

The intensity of the voltage applied to the input light coupler gate electrode 1304 can be reduced to limit the propagation constant level of the region of changed propagation constant, so the light following path 1420 would be deflected, e.g., along path 1436 instead of along path 1430. The polarity of the voltage applied to the input light coupler gate electrode 1304 can also be reversed, and light following path 1420 along the waveguide would be deflected to follow path 1438. Therefore, the deflection of the light within the waveguide 106 can be controlled, and even reversed, by controlling the voltage applied to the input light coupler gate electrode 1304. Changing of the propagation constant within the first region of changeable propagation constant 190a causes such deflection by the input light coupler gate electrode 1304.

When no voltage is applied to the output light coupler gate electrode 1306 as shown in FIGS. 15A and 15B, thereby effectively removing the second region of changeable propagation constant 190b from the waveguide 106. Light following within waveguide 106 along path 1422 is assumed to continue in a direction aligned with the incident light, or in a direction deflected by the input light coupler gate electrode 1304, since the propagation constant is uniform throughout the waveguide.

Figure 15C:
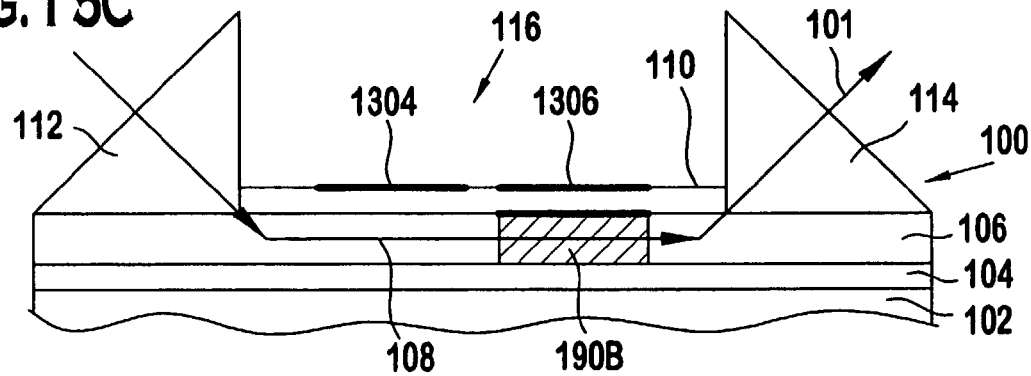
Figure 15D:
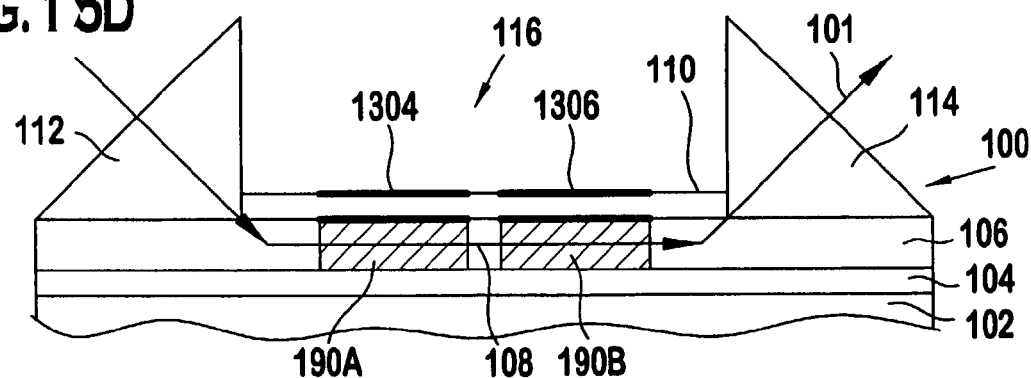

When voltage of a first polarity is applied to the output light coupler gate electrode 1306, the second region of changeable propagation constant 190b having a changed propagation constant level is projected in the waveguide as shown in FIGS. 15C and 15D. The second region of changeable propagation constant 190b may be viewed as an optical prism that projects in the shape of output light coupler gate electrode 1306 to the waveguide, thereby deflecting the light passing along the waveguide along path 1460 with the wavefronts 1462 extending perpendicular to the direction of travel.

The intensity of the voltage applied to the output light coupler gate electrode 1306 shown in FIG. 15C can be reduced, so the light following path 1422 would be deflected at a lesser angle, e.g., along path 1466 instead of along path 1460. Similarly, increasing the voltage applied to the output light coupler gate electrode 1306 increases the angle of deflection. The polarity of the voltage applied to the output light coupler gate electrode 1306 could also be reversed, and light following path 1420 within the waveguide would be deflected in a reversed direction to the original polarity to follow path 1468. Therefore, the deflection of the light within the waveguide 106 can be controlled and even reversed, by controlling the voltage applied to the output light coupler gate electrode 1306. Additionally, the propagation constant in prescribed regions of the waveguide, and the gate resistance, can be calibrated using the techniques describes in FIGS. 7 and 8 using the controller 201, the meter 205, and/or the temperature sensor 240.

The voltage being used to bias the input light coupler gate electrode 1304 and/or the output light coupler gate electrode 1306 have the effect of controllably deflecting the light as desired. The FIG. 14 embodiment of optical waveguide device 100 is structurally very similar to the FIGS. 1 to 3 embodiment of optical waveguide device 100, however, the two embodiments of optical waveguide devices perform the differing functions of modulation and deflection.

Figure 16:
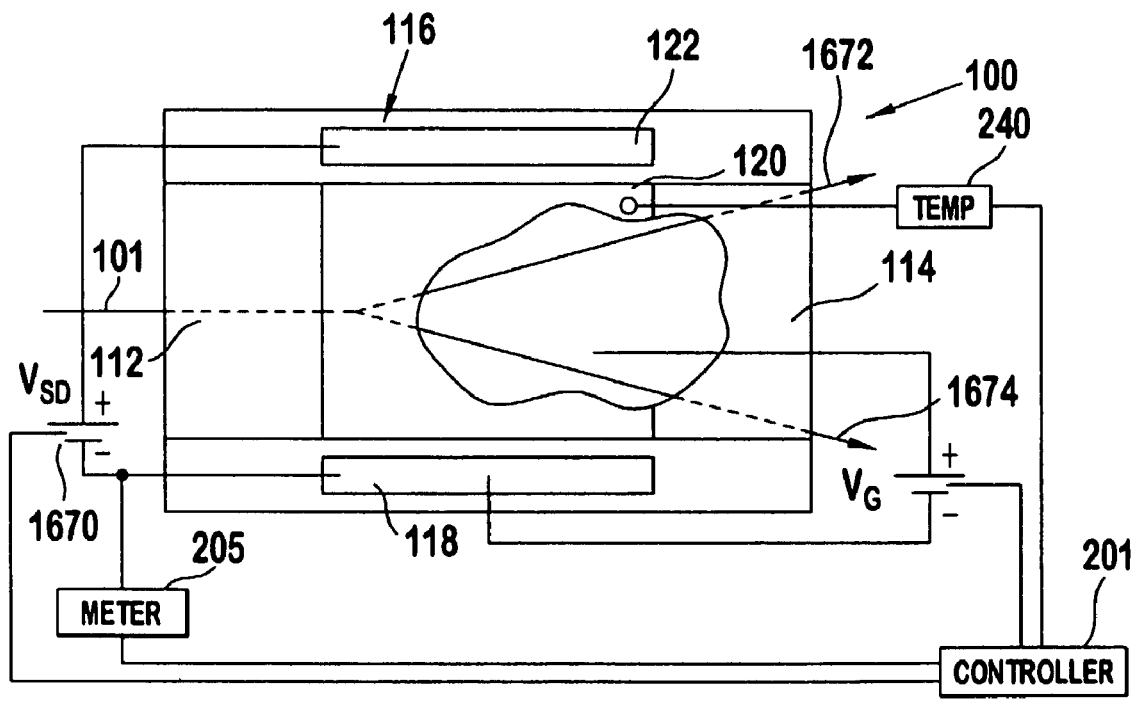
FIG. 16 shows a top view of another embodiment of an optical waveguide device that is similar in structure to the optical waveguide device shown in FIG. 2, with a second voltage source applied from the source electrode to the drain electrode, the gate electrode and electrical insulator is shown partially broken away to indicate the route of an optical wave passing through the waveguide that is deflected from its original path along a variety of paths by application of voltage between the source electrode and gate electrode

In the FIG. 16 embodiment of optical waveguide device, the incident light flowing through the waveguide will be deflected from its incident direction in a direction that is parallel to the axis of the optical waveguide device. Such deflection occurs as result of variable voltage applied between the second body contact electrode 122 and the first body contact electrode 118. In this configuration, an additional voltage source 1670 applies a voltage between the second body contact electrode and the first body contact electrode to provide voltage gradient across the gate electrode. By varying the voltage between the second body contact electrode and the first body contact electrode, the level of propagation constant within the region of changeable propagation constant changes. The voltage level applied to the waveguide thus causes a direction of the propagation of light flowing through the waveguide to be controllably changed, leading to deflection of light within the horizontal plane (e.g., upward and downward along respective paths 1672m 1674 as shown in FIG. 16).

The application of the first body contact-to-second body contact voltage $V_{SD}$ 1670 by the voltage source causes a propagation constant gradient to be established across the 2DEG in the waveguide 106 from the first body contact electrode to the second body contact electrode. Thus, the propagation constant, or the effective mode index, of the waveguide 106, varies. This variation in the propagation constant leads to angled phase fronts from one lateral side of the waveguide to another. That is, the wavefront of the optical light flowing through the FIG. 16 embodiment of waveguide on one lateral side of the wavefront lags the wavefront on the other lateral side. The phase fronts of the light emerging from the gate region will thus be tilted and the emerging beam will be deflected by an angle γ. For a fixed $V_{DS}$ the deflection angle γ increases with the distance z traveled within the waveguide. The angle γ can be calculated by referring to FIG. 16 according to the equation.

$$\gamma = a\tan\left(\frac{\Delta\text{OP}}{L}\right) = a\tan\left(\frac{\Delta\bar{n}W}{L}\right) = a\tan\left(\frac{\bar{n}\cot(\theta)\Delta\theta W}{L}\right).$$

$$\therefore \gamma = \left(\frac{W}{L}\right)10^{-4}$$

Figure 17:
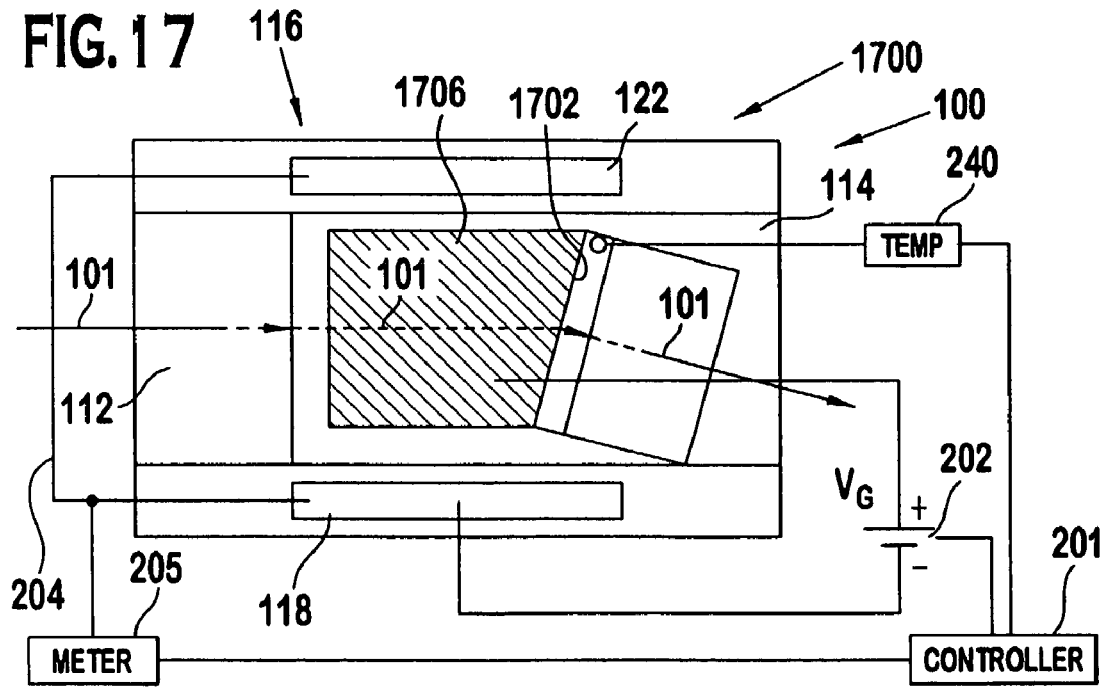
FIG. 17 shows another embodiment of an optical deflector.

Another embodiment of optical deflector 1700 is shown in FIG. 17. The waveguide 1702 is trapezoidal in shape. A gate electrode 1706 (that is shown as hatched to indicate that the gate electrode shares the shape of the waveguide 1702 in this embodiment) may, or may not, approximate the trapezoidal shape of the waveguide. Providing a trapezoidal shaped waveguide in addition to the shaped gate electrode enhances the deflection characteristics of the optical deflector on light. In the optical deflector 1700, if the voltage applied to the gate electrode is removed, deflection occurs due to the shape of the waveguide due to the trapezoidal shape of the waveguide. In this embodiment of optical waveguide device, the waveguide itself may be shaped similarly to the prior-art discrete optical prisms formed from glass.

Figure 18:
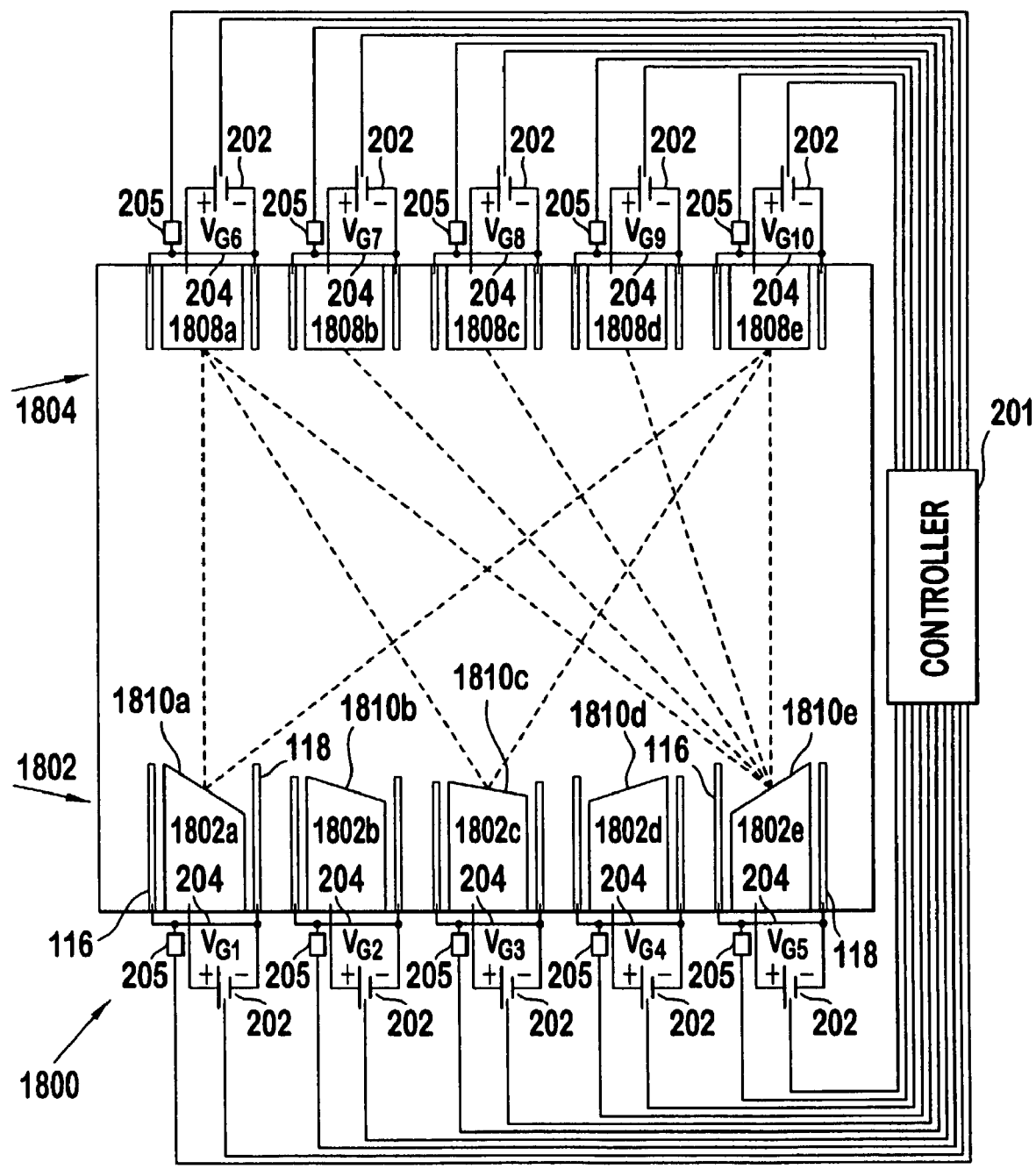
FIG. 18 shows a top view of one embodiment of an optical switch that includes a plurality of the optical deflectors of the embodiments shown in FIG. 14, 15 or 16.

FIG. 18 shows one embodiment of optical switch 1800 including a plurality of optical deflectors that each switches its input light from one or more deflecting prism gate electrodes 1802a through 1802e to one of a plurality of receiver waveguides 1808a to 1808e. The optical switch 1800 includes an input switch portion 1802 and an output switch portion 1804. The input switch portion includes a plurality of the FIG. 18 embodiment of deflecting prism gate electrodes as 1802a to 1802e. The deflecting prism gate electrodes 1802a to 1802e may each be constructed, and operate, as described relative to one of the deflecting prism gate electrodes 1306m 1304 of FIG. 13. Each one of the deflecting prism gate electrodes 1802a to 1802e is optically connected at its input to receive light signals from a separate channel waveguide, not shown in FIG. 18. The output portion 1806 includes a plurality of receiver waveguides 1808a, 1808b, 1808c, 1808d, and 1808e. Each of the receiver waveguides 1808a to 1808e is configured to receive light that is transmitted by each of the deflecting prism gate electrodes 1802a to 1802e.

The optical switch 1800 therefore includes five deflecting prism gate electrodes 1802a to 1802e, in addition to five receiver waveguides 1808a to 1808e. As such, the optical switch can operate as, e.g., a 5×5 switch in which any of the deflecting prism gate electrodes 1802a to 1802e can deflect its output light signal to any, or none, of the receiver waveguides 1808a to 1808e. Each of the deflecting prism gate electrodes 1802a to 1802e includes a gate portion that is configured with a respective angled apex surface 1810a to 1810e. Voltage supplied to any of the deflecting prism gate electrodes 1802a to 1802e results in an increase in the propagation constant within the corresponding region of changeable propagation constant 190 (that forms in the waveguide below the corresponding deflecting prism gate electrodes 1802a to 1802e shown in FIG. 18) associated with that particular deflecting prism's gate electrode.

Although the FIG. 18 embodiment of waveguide operates similarly to the FIG. 15 embodiment of waveguide, if no voltage is applied to any particular deflecting prism gate electrode 1802a to 1802e, then the light travels directly through the waveguide associated with that deflecting prism gate electrode and substantially straight to a respective receiver waveguide 1808a to 1808e located in front of that deflecting prism gate electrode. The apex angles 1810a and 1810e (and/or the angles of the waveguide as shown in the FIG. 17 embodiment) of the outer most deflecting prism gate electrodes 1802a and 1802e are angled at a greater angle than deflecting prism gate electrodes 1802b, 1802c, and 1802d. An increase in the apex angle 1810a and 1810e allows light flowing through the waveguide to be deflected through a greater angle toward the more distant receivers 1808a to 1808e. It may also be desired to minimize the lateral spacing between each successive deflecting prism gate electrode 1802a to 1802e, and the lateral spacing between each respective receiver 1808a to 1808e to minimize the necessary deflection angle for the deflecting prism gate electrodes. The apex angle of those deflecting prism gate electrodes that are generally to the left of an axial centerline of the optical switch (and thus have to deflect their light to the right in most distances) are angled oppositely to the apex angle of those deflecting prism gate electrodes that are to the right of the centerline of that switch that have to deflect their light to the left in most instances. Deflecting prism gates 1802b, 1802c, and 1802d that have other deflecting prism gate electrodes locate to both their right and left should also have receivers located both to their right and left as shown in FIG. 18 and therefore must be adapted to provide for deflection of light to either the left or right. For example, the deflecting prism gate electrode 1802c must cause light traveling through its waveguide to be deflected to the right when transmitting its signal to the receivers 1808d or 1808e. By comparison, the deflecting prism gate electrode 1802c must cause light that is passing through its waveguide to be deflected to its left when deflecting light to receivers 1808a and 1808b.

Optical switch 1800 has the ability to act extremely quickly, partly due to the fact that each deflecting prism gate electrode has no moving parts. Each of the deflecting prism gate electrodes 1802a to 1802e can be adjusted and/or calibrated by controlled the voltage applied to that deflecting prism gate electrode using the techniques described in FIGS. 7 and 8. Applying the voltage to the deflecting prism gate electrodes 1802a to 1802e results in an increase, or decrease (depending on the polarity), of the propagation constant level of the region of changeable propagation constant in the waveguide associated with that deflecting prism gate electrode 1802a to 1802e.

Figure 19:
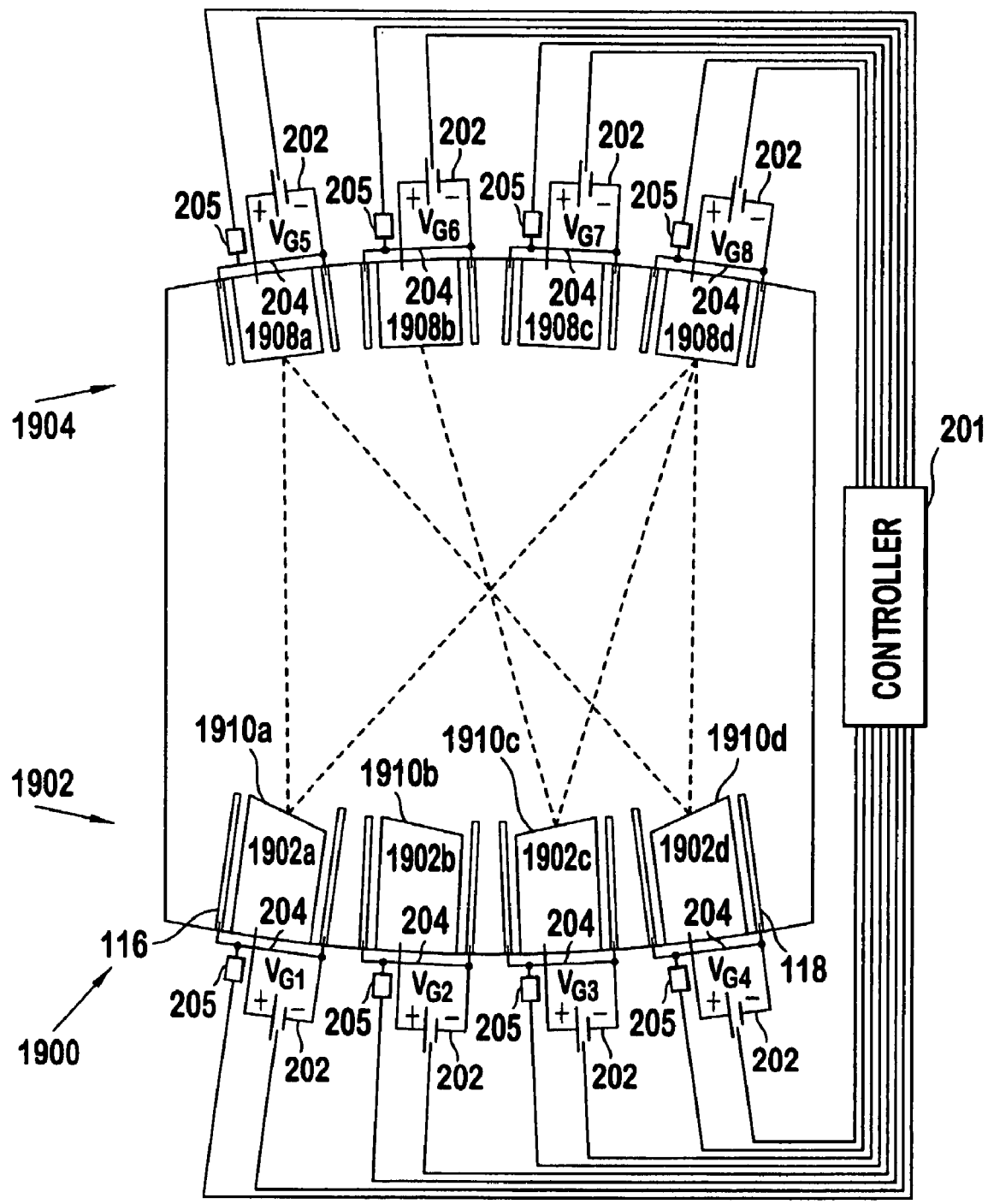
FIG. 19 shows a top view of another embodiment of an optical switch device from that shown in FIG. 18, that may include one embodiment of the optical deflectors shown in FIG. 14, 15, or 16.

FIG. 19 shows another embodiment of optical switch 1900. The optical switch includes a concave input switch portion 1902 and a concave output switch portion 1904. The input switch portion 1902 includes a plurality of deflecting prism gate electrodes 1902a to 1902d (having respective apex angles 191oa to 1910d) that operate similarly to the FIG. 18 embodiment of deflecting prism gate electrodes 1802a to 1802e. Similarly, the concave output switch portion 1902 includes a plurality of receivers 1908a to 1908d. Each one of the receivers 1908a to 1908d operates similarly to the FIG. 18 embodiment of receivers 1808a to 1808e. The purpose of the concavity of the concave input switch deflector portion 1902 and the concave output portion 1904 is to minimize the maximum angle through which any one of the optical deflecting prism gate electrodes has to deflect light to reach any one of the receivers. This is accomplished by mounting each of the optical deflecting prism gate electrodes at an angle that bisects the rays extending to the outermost receivers 1908a to 1908d. The mounting of the optical deflecting gate electrodes also generally enhances the reception of light by the receivers since each receiver is directed at an angle that more closely faces the respective outermost optical deflecting prism gate electrodes. The operation of the embodiment of optical switch 1900 in FIG. 19 relative to the deflecting prism gate electrodes 1902a to 1902d and the receivers 1908a to 1908d is similar to the above-described operation of the optical switch 1800 in FIG. 18 relative to the respective deflecting prism gate electrodes 1802a to 1802e (except for the angle of deflection of the deflecting prism gate electrode).

4C. Optical Gratings

Gratings in the dielectric slab waveguide as well as in fibers are well known to perform various optical functions such as optical filtering, group velocity dispersion control, attenuation, etc. The fundamental principle behind grating is that small, periodic variation in the mode index or the propagation constant leads to resonant condition for diffraction of certain wavelengths.

These wavelengths satisfy the resonant condition for build up of diffracted power along a certain direction. The wavelength selectivity depends on the design of the grating structure. In the case presented here, we envision a grating that is electrically controlled via the effect of 2DEG. There are many ways to produce the undulating pattern in 2DEG. The methods include: undulation in the effective dielectric constant of the gate insulator, patterned gate metal, periodic doping modulation etc. FIG. 20 is one example. In FIG. 20 the gate dielectric is divided into two gate insulators of different dielectric strength.

FIGS. 20 to 22 show a variety of embodiments of optical gratings in which the shape or configuration of the gate electrode 120 of the optical waveguide device 106 is slightly modified. Gratings perform a variety of functions in optical systems involving controllable optical refraction as described below. In the different embodiments of optical gratings, a series of planes of controllable propagation constant (compared to the surrounding volume within the waveguide) are projected into the waveguide 106. The planes of controllable propagation constant may be considered to form one embodiment of a region of changeable propagation constant 190, similar to those shown and described relative to FIG. 1-3, 4, or 5. In the FIG. 20 embodiment of optical grating 2000, the second insulator layer 110 is provided with a corrugated lower surface 2002. The corrugated lower surface includes a plurality of raised lands 2004 that provide a variable thickness of the second insulator layer 110 between different portions of the corrugated lower surface of the second electrical insulator layer or oxide 100 and the gate electrode 120. Each pair of adjacent raised lands 2004 are uniformly spaced for one grating.

A distance T1 represents the distance between the raised lands 2004 of the corrugated surface 2002 and the gate electrode 120. A distance T2 represents the distance from the lower most surface of the corrugated surface 2002 and the gate electrode 120. Since the distance T1 does not equal T2, the electrical field at the insulator/semiconductor interface of the second insulator layer 110 from the gate electrode to the waveguide 106 will vary along the length of the waveguide. For example, a point 2006 in the waveguide that is underneath the location of one of the raised lands 2004 experiences less electrical field at the insulator/semiconductor interface to voltage applied between the gate electrode and the waveguide than point 2008 that is not underneath the location of one of the raised lands. Since the resistance of the second insulator layer 110 in the vertical direction varies along its length, the resistance between the gate electrode and the waveguide (that has the second insulating layer interspersed there between) varies along its length. The strength of the electrical field applied from the gate electrode into the waveguide varies as a function of the thickness of the second insulator layer 110. For example, the projected electrical field within the waveguide at point 2006 exceeds the projected electric field at point 2008. As such, the resultant free carrier charge distribution in the 2DEG above point 2006 exceeds the resultant free carrier charge distribution in the 2DEG above point 2008. Therefore, the resultant propagation constant in the projected region of changeable propagation constant 190 in the waveguide at point 2006 exceeds the resultant propagation constant in the projected region of changeable propagation constant 190 in the waveguide at point 2008.

The raised lands 2004 are typically formed as grooves in the second insulator layer 110 that extend substantially perpendicular to, or angled relative to, the direction of light propagation within the waveguide. The raised lands 2004 may extend at a slight angle as described with respect to FIG. 23 so that reflected light passing through the waveguide may be deflected at an angle to, e.g., another device. A low insulative material 2010 is disposed between the second electrical insulator layer 110 and waveguide 106. The previously described embodiments of optical waveguide devices relied on changes in the planar shape of the gate electrode to produce a variable region of changeable propagation constant 190 across the waveguide. The FIGS. 20 to 22 embodiments of optical waveguide devices rely on variations of thickness (or variation of the electrical resistivity of the material) of the gate electrode, or the use of an insulator under the gate electrode, to produce a variable propagation constant across the waveguide.

Since a variable electromagnetic field is applied from the gate electrode 120 through the second electrical insulator layer or oxide 110 to the waveguide 106, the propagation constant of the waveguide 106 will vary. The carrier density in the 2DE"G 108 will vary between the location in the 2DEG above the point 2006 and above the point 2008. More particularly, the lower resistance of the second electrical insulator layer or oxide at point 2006 that corresponds to distance T1 will result in an increased carrier density compared to the point 2008 on the 2DEG that corresponds to an enhanced distant T2, and resulting in an increased resistance of the 2DEG. Such variation in the propagation constant along the length of the waveguide 106 results only when gate electrode 120 is actuated. When the gate electrode is deactuated, the propagation constant across the waveguide 106 is substantially uniform. In the FIGS. 20 to 22 embodiments of optical gratings, the propagation constant is changed by the thickness of the gate electrode, i.e., the raised lands locations. Therefore, this embodiment of optical waveguide device changes the propagation constant by changing the thickness of the gate electrode to form the gratings, not by changing the shape of the gate electrode.

Such a variation in propagation constant within certain regions at the waveguide 106 will result in some percentage of the light traveling along the waveguide 106 to be reflected. The variation in the propagation constant extends substantially continuously across the length of the FIG. 20 embodiment of waveguide 106. As such, even though a relatively small amount of energy of each light wave following a direction of light travel 101 will be reflected by each plane projected by a single recess, a variable amount of light can be controllably reflected by the total number of planes 2012 in each grating. The distance d in the direction of propagation of light between successive planes within the grating is selected so that the light waves reflected from planes 2012 are in phase, or coherent, with the light reflected from the adjacent planes. The strength of the 2DEG determines the reflectivity or the diffraction efficiency of the grating structure. By varying the strength, we may chose to control the light diffracted by the grating structure. This will be useful in construction of the attenuators, modulators, switches, etc.

The light waves travelling in direction 101 from the adjacent phase planes 2012 will be in phase, or coherent, for a desired light of wavelength λ if the difference in distance between light reflected from successive planes 2012 equals an integer multiple of the wavelength of the selected light. For example, light traveling along the waveguide 106 (in a direction from left to right as indicated by the arrow in waveguide 106) that is reflected at the first plane 2012 (the plane farthest to the left in FIG. 20) is reflected either along the waveguide 106 or at some angle at which the reflected light beam is deflected, and travels some distance shorter than light reflected off the next plane (the first plane to the right of the leftmost plane 2012 in FIG. 20).

Light reflected from the gratings of the waveguide will be in-phase, or coherent when the distance d between recesses taken in a direction parallel to the original direction of propagation of the light in the waveguide is an integer multiple of a selected bandwidth of light. In the FIG. 23 embodiment of grating, light reflected off successive planes 2311 would coherently add where the distance "d" is some integer multiple of the wavelength of the reflected light. The other wavelengths of light interfere destructively, and cannot be detected by a detector.

The FIG. 21 embodiment of grating 2100 includes a plurality of insulators 2102 evenly spaced between the electrical insulator layer 110 and the waveguide 106. The electrical resistance of the insulators 2102 differs from that of the electrical insulator layer 110. Alternatively, inserts could be inserted having a different electrical resistance than the remainder of the electrical insulator layer.

The insulator 2102 limits the number of carriers that are generated in those portions of the 2DEG 108 below the insulators 2102 compared to those locations in the 2DEG that are not below the insulators 2102. As such, the propagation constant in those portions of the waveguide 106 that are below the insulators 2102 will be different than the propagation constant in those portions of the waveguide that are not below the insulators 2102. Planes 2112 that correspond to the regions of changed propagation constant within the waveguide under the insulators that are projected into the waveguide 106. Such planes 2112 are therefore regularly spaced since the location of the projected regions of changeable propagation constant corresponds directly to the location of the insulators 2102. the insulator properties that control the strength of the electric field at the insulator/semiconductor interface are due to its dielectric constant at the modulation frequencies of interest. The insulator may have variable dielectric constant at radio frequencies but is substantially unchanged at the optical frequencies. Thus, optical wave does not "see" the undulation unless induced by 2DEG.

In the FIG. 22 embodiment of optical grating 2200, another shape of regularly shaped patterning, that may take the form of corrugated patterns along the bottom surface of the gate electrode 120, is formed in the gate electrode 120. The optical grating 2200 includes a series of raised lands 2202 formed in the lower surface that of the metal gate electrode 120. These raised lands 2202 may be angled relative to the waveguide for a desired distance. The raised lands 2202 in the gate electrode are configured to vary the electrical field at the insulator/semiconductor interface to the waveguide 106 in a pattern corresponding to the arrangement of the raised lands 2202. For example, the propagation constant will be slightly less in those regions of the waveguide underneath the raised lands 2202 than in adjacent regions of the waveguide since the distance that the raised lands 2202 are separated from the waveguide is greater than the surrounding regions.

In this disclosure, gratings may also be configured using a SAW, or any other similar acoustic or other structure that is configured to project a series of parallel planes 2112 representing regions of changeable propagation constant into the waveguide 106.

The planes 2311 are each angled at an angle α from the direction of propagation of the incident light 2304. As such, a certain amount of light is reflected at each of the planes 2311, resulting in reflected light 2306. The majority of light 2304 continues straight through the waveguide past each plane 2311, with only a relatively minor portion being reflected off each plane to form the reflected light 2306. The difference in distance traveled by each successive plane 2311 that reflects light is indicated, in FIG. 23, by the distance d measured in a direction parallel to the incident light beam 2304. Therefore, distance d is selected to be some multiple of the wavelength of the light that is to be reflected from the FIG. 23 embodiment of optical grating. The selected wavelength λ of light that reflects off successive planes spaced by the distance d must satisfy the equation:

$$2 \sin \alpha = \lambda/d$$

Figure 23:
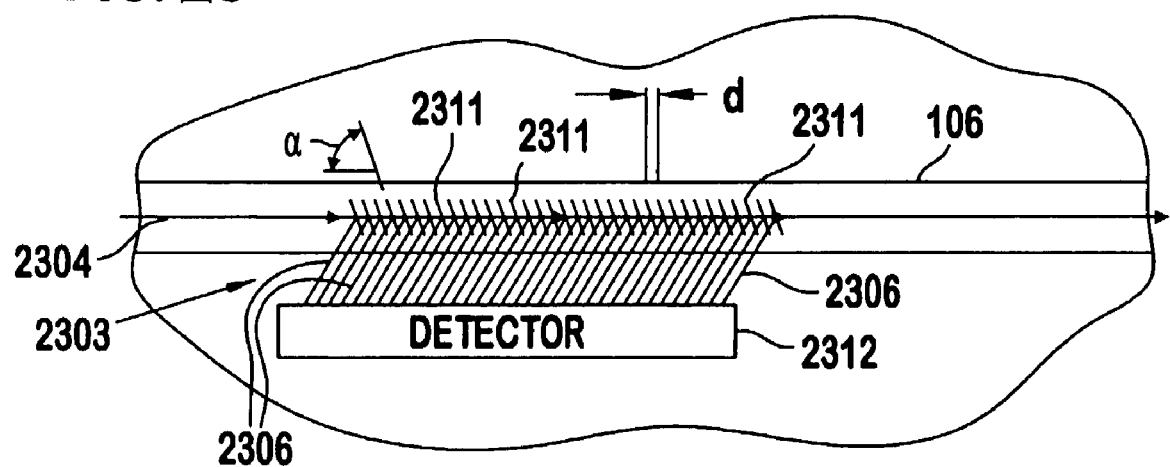
FIG. 23 shows one embodiment of a waveguide having a grating of the type shown in FIGS. 20 to 22 showing a light ray passing through the optical waveguide device, and the passage of reflected light refracting off the grating.

If each reflected light path 2306 varies by an integer multiple of the wavelength of the selected light, the light at that selected wavelength will constructively interfere at a detector 2312 and thus be visible. The detector can be any known type of photodetector. Since the distance d has been selected at a prescribed value, the distance of each ray of reflected light 2306 off each plane travels a slightly greater distance than a corresponding ray of light reflected off the preceding plane (the preceding plane is the plane to the left as shown in FIG. 23). Those wavelengths of light that are not integer multiples of the distance d, will interfere destructively and thus not be able to be sensed by the detector 2312.

The gratings represent one embodiment of a one-dimensional periodic structure. More complicated optical functions may be achieved by using a two dimensional periodic patterns. One embodiment of a two-dimensional periodic structure that corresponds to the grating includes using a "polka dot" pattern, in which the reflectivity of a particular group of wavelengths are unity in all directions in the plane. A "line defect" in the pattern may be provided that results in the effective removal of one or more of these "polka dots" along a line in a manner that causes guiding of light along the line defect. Many geometrical shapes can be used in addition to circles that form the polka dot pattern. All of these can be achieved by generalization of the gratings discussed in detail above to the one-dimensional patterns.

Figure 24:
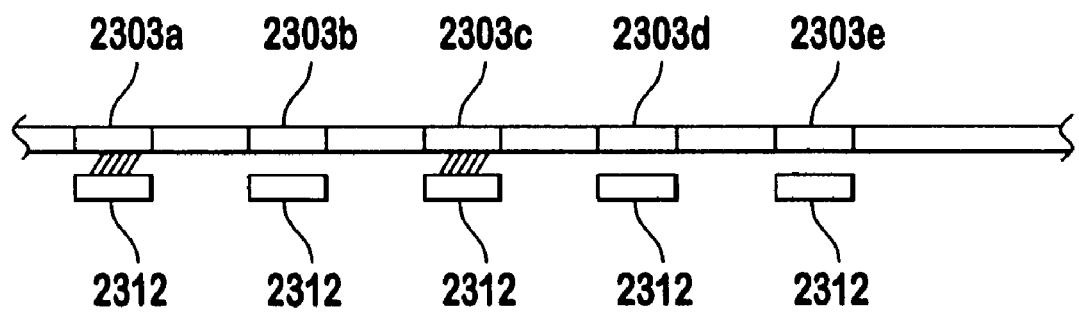
FIG. 24 shows an optical waveguide device including a plurality of gratings of the type shown in FIGS. 20 to 22, where the gratings are arranged in series.

FIG. 23 shows one embodiment of optical grating 2303 that is configured to diffract light. A series of such optical gratings labeled as 2303a to 2303e can be applied to the FIG. 24 embodiment of waveguide. The specific optical grating 2303 relating to a desired wavelength λ of light can be actuated, while the remainder of the optical gratings 2303 are deactuated. One design may provide a plurality of optical gratings 2303 arranged serially along a channel waveguide, with only a minimal difference between the wavelengths % of the reflected light by successive optical gratings 2303a to 2303e. For example, the first optical grating 2303a reflects light having a wavelength $\lambda_1$ that exceeds the wavelength $\lambda_2$ of the light that is diffracted by the second optical grating 2303b. Similarly, the wavelength of light that can be reflected by each optical grating is greater than the wavelength that can be reflected by subsequent gratings. To compensate for physical variations in the waveguide (resulting from variations in temperature, device age, humidity, or vibrations, etc.), a grating that corresponds to a desired wavelength of reflected light may be actuated, and then the reflected light monitored as per wavelength. If multiple optical gratings are provided to allow for adjustment or calibration purposes, then the differences in spacing between successive planes of the different optical gratings is initially selected. If it is found that the actuated grating does not deflect the desired light (the wavelength of the deflected light being too large or too small), then another optical grating (with the next smaller or larger plane spacing) can then be actuated. The selection of the next grating to actuate depends upon whether the desired wavelength of the first actuated optical grating is more or less than the wavelength of the diffracted light. This adjustment or calibration process can be performed either manually or by a computer using a comparison program, and can be performed continually during normal operation of an optical system employing optical gratings.

Figure 25:
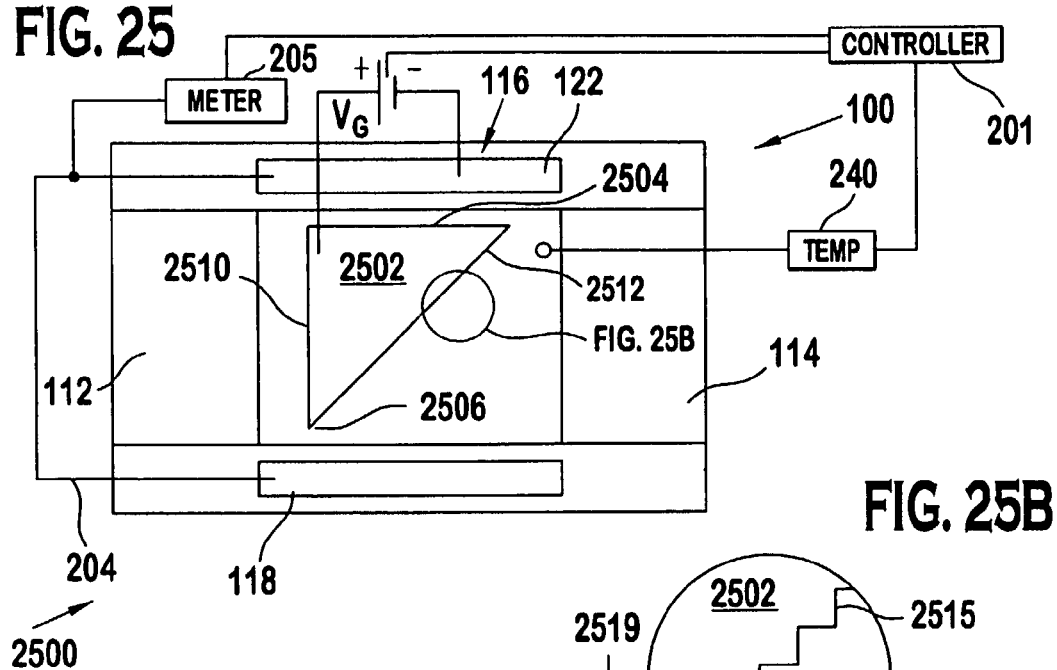
FIG. 25, which is shown expanded in FIG. 25B, shows a respective top view and top expanded view of another embodiment of an optical waveguide device including a gate electrode configured that may be configured as an Echelle diffraction grating or an Echelle lens grating.

FIG. 25 shows one embodiment of Echelle grating 2500. The Echelle grating 2500 may be used alternatively as a diffraction grating or a lens grating depending on the biasing of the gate electrode. The Echelle grating 2500 is altered from the FIGS. 1 to 3 and 5 embodiment of optical waveguide device 100 by replacing the rectangular gate electrode by a triangular-shaped Echelle grating electrode 2502. The Echelle-shaped gate electrode 2502 includes two parallel sides 2504 and 2506 (side 2506 is shown as the point of the triangle, but actually is formed from a length of material shown in FIG. 26 as 2506), a base side 2510 and a planar grooved surface 2512.

Figure 25B:
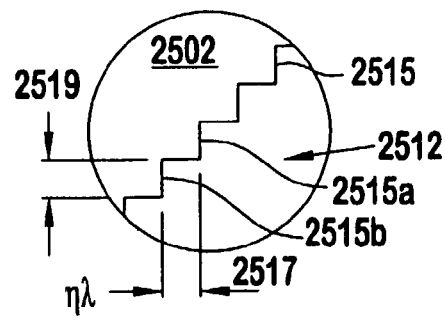

The base surface 2510 extends substantially perpendicular to the incident direction of travel of light (the light indicated by arrows 2606, 2607, and 2609 shown in FIG. 26) entering the Echelle grating. As shown in FIG. 25B, the grooved side 2512 is made of a series of individual grooves 2515 that extend parallel to the side surface, and all of the grooves regularly continue from side 2504 to the other side 2506. Each groove 2515 includes a width portion 2519 and rise portion 2517.

The rise portion 2517 defines the difference in distance that each individual groove rises from its neighbor groove. The rise portion 2517 for all of the individual grooves 2515 are equal, and the rise portion 2517 equals some integer multiple of the wavelength of the light that is to be acted upon by the Echelle grating 2500. Two exemplary adjacent grooves are shown as 2515a and 2515b, so the vertical distance between the grooves 2515a and 2515b equals 2517. The width portion 2519 of the Echelle shape gate electrode 2502 is equal for all of the individual grooves. As such, the distance of the width portion 2519 multiplied by the number of individual grooves 2515 equals the operational width of the entire Echelle shaped gate electrode. Commercially available three dimensional Echelle gratings that are formed from glass or a semiconductor material have a uniform cross section that is similar in contour to the Echelle shaped gate electrode 2502. The projected region of changeable propagation constant 190 can be viewed generally in cross-section as having the shape and dimensions of the gate electrode (including grooves), and extending vertically through the entire thickness of the waveguide 106. The numbers of individual grooves 2515 in the FIG. 25 embodiment of Echelle shaped gate electrode 2502 may approach many thousand, and therefore, the size may become relatively small to provide effective focusing.

Figure 26:
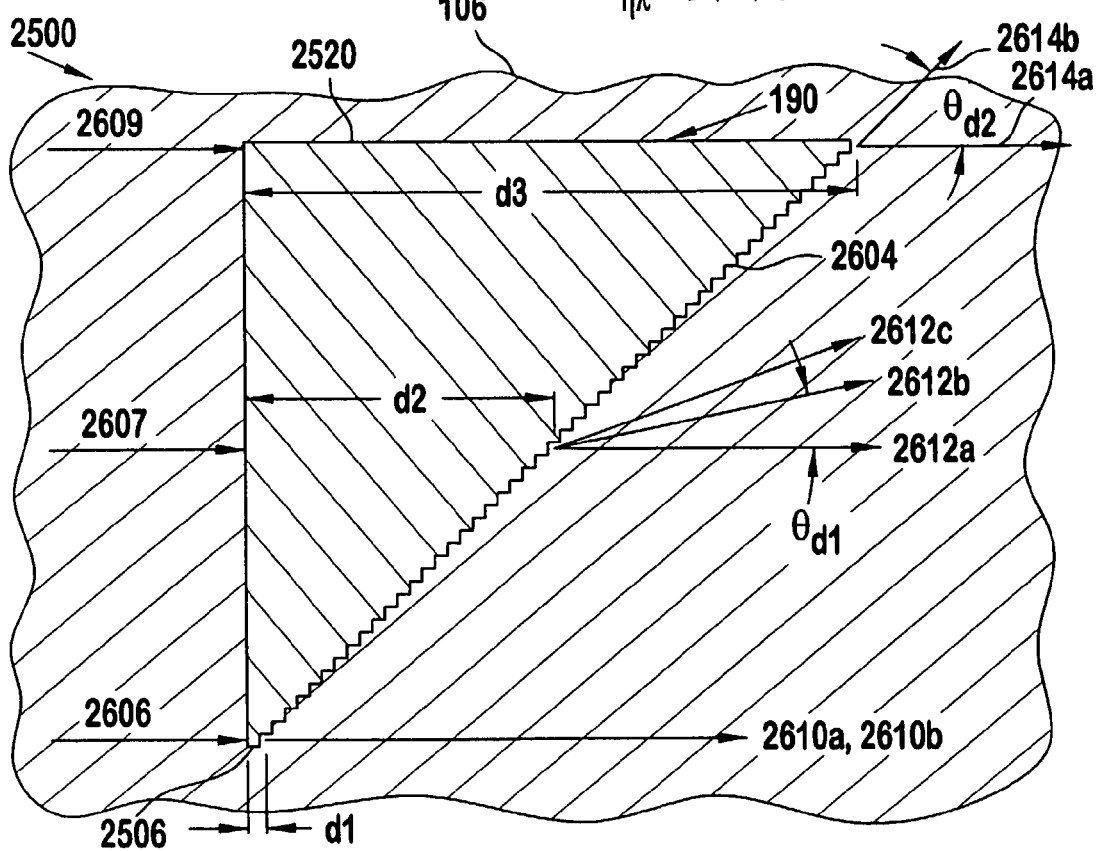
FIG. 26 shows a top cross section view taken within the waveguide of the optical waveguide device illustrating the diffraction of optical paths as light passes through the actuated Echelle diffraction grating shown in FIG. 25, wherein the projected outline of the region of changeable propagation constant from the Echelle diffraction grating is shown.

FIG. 26 shows the top cross sectional view of region of changeable propagation constant 190 shaped as an Echelle grating 2500. The waveguide 106 is envisioned to be a slab waveguide, and is configured to permit the angular diffraction of the beam of light emanating from the Echelle grating 2500. When voltages are applied to the FIG. 25 embodiment of Echelle shaped gate electrode 2502, a projected region of changeable propagation constant 190 of the general shape as shown in FIG. 26 is established within the waveguide 106. Depending upon the polarity of the applied voltage to the Echelle shaped gate electrode in FIG. 25, the propagation constant within the projected region of changeable propagation constant 190 can either exceed, or be less than, the propagation constant within the waveguide outside of the projected region of changeable propagation constant 190. The relative level of propagation constants within the projected region of changeable propagation constant 190 compared to the outside of the projected region of changeable propagation constant determines whether the waveguide 106 acts to diffract light or focus light. In this section, it is assumed that the voltage applied to the gate electrode is biased so the Echelle grating acts to diffract light, although equivalent techniques would apply for focusing light, and are considered a part of this disclosure.

In FIG. 26, three input light beams 2606, 2607, and 2609 extend into the waveguide. The input light beams 2606, 2607, and 2609 are shown as extending substantially parallel to each other, and also substantially parallel to the side surface 2520 of the projected region of changeable propagation constant 190. The projected region of changeable propagation constant 190 as shown in FIG. 26 precisely mirrors the shape and size of the FIG. 25 embodiment of Echelle shaped gate electrode 2502. As such, the projected region of changeable propagation constant 190 can be viewed as extending vertically through the entire thickness of the waveguide 106. The numbers of individual grooves 2515 in the FIG. 25 embodiment of Echelle shaped gate electrode 2502 may approach many thousand to provide effective diffraction, and therefore, individual groove dimensions are relatively small. It is therefore important that the projected region of changeable propagation constant 190 precisely maps from the Echelle shaped gate electrode 2502.

Three input beams in 2606, 2607, and 2609 are shown entering the projected region of changeable propagation constant 190, each containing multiple wavelengths of light. The three input beams 2606, 2607, and 2609 correspond respectively with, and produce, three sets of output beams 2610a or 2610b; 2612a, 2612b; and 2614a, 2614b as shown in FIG. 26. Each diffracted output beam 2610, 2612, and 2614 is shown for a single wavelength of light, and the output beam represents the regions in which light of a specific wavelength that emanates from different grooves 2604 will constructively interfere. In other directions, the light destructively interferes.

The lower input beam 2606 that enters the projected region of changeable propagation constant 190 travels for a very short distance d1 through the projected region of changeable propagation constant 190 (from the left to the right) and exits as output beam 2610a or 2610b. As such, though the region of changeable propagation constant 190 has a different propagation constant then the rest of the waveguide 106, the amount that the output beams 2610a, or 1620b is diffracted is very small when compared to the amount of diffraction of the other output beams 2612, 2614 that have traveled a greater distance through the projected region of changeable propagation constant 190.

The middle input light beam 2607 enters the projected region of changeable propagation constant 190 and travels through s considerable distance d2 before exiting from the Echelle grating. If there is no voltage applied to the gate electrode, then the output light will be unaffected by the region of changeable propagation constant 190 as the light travels the region, and the direction of propagation for light following input path 2607 will be consistent within the waveguide along 2612a. If a voltage level is applied to the FIG. 25 embodiment of gate electrode 2502, then the propagation constant within the region of changeable propagation constant 190 is changed from that outside the region of changeable propagation constant. The propagation constant in the region of changeable propagation constant 190 will thereupon diffract light passing from the input light beam 2607 through an angle $\theta_{d1}$ along path 2612b. If the voltage is increased, the amount of diffraction is also increased to along the path shown at 2612c.

Light corresponding to the input light beam 2609 will continue in a straight along line 2614a when no voltage is applied to the gate electrode. If a prescribed level of voltage is applied to the gate electrode, the output light beam will be diffracted through an output angle θd2 along output light beam 2614b. The output angle $\theta_{d2}$ of output diffracted beam 2614b exceeds the output angle $\theta_{d1}$ of diffracted beam 2612b. The output angle varies linearly from one side surface 2522 to the other side surface 2520, since the output angle is a function of the distance the light is travelling through the projected region of changeable propagation constant 190.

When the Echelle grating diffracts a single wavelength of light through an angle in which the waves are in phase, the waves of that light constructively interfere and that wavelength of light will become visible at that location. Light of a different wavelength will not constructively interfere at that same angle, but will at some other angle. Therefore, in spectrometers, for instance, the location that light appears relates to the specified output diffraction angles of the light, and the respective wavelength of the light within the light beam that entered the spectrometer.

Figure 27:
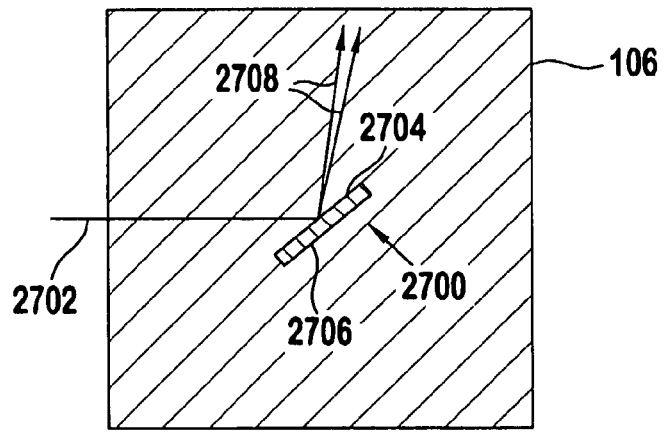
FIG. 27 shows an expanded view of the optical waveguide device biased to operate as an Echelle diffraction grating as shown in FIG. 26.

FIG. 27 shows one embodiment of Echelle grating 2700 that is configured to reflect different wavelengths of light (instead of diffracting light) through an output reflection angle. For instance, an input light beam 2702 of a prescribed wavelength, as it contacts a grating surface 2704 of a projected Echelle grating 2706, will reflect an output light beam 2708 through an angle. The propagation constant of the region of changeable propagation constant 190 will generally have to be higher than that for a diffraction Echelle grating. In addition, the angle at which the grating surface 2704 faces the oncoming input light beam 2702 would probably be lower if the light is refracted, not reflected. Such design modifications can be accomplished by reconfiguring the shape of the gate electrode in the optical waveguide device. Shaping the gate electrodes is relatively inexpensive compared with producing a distinct device.

4D. Optical Lenses

Waveguide lenses are important devices in integrated optical/electronic circuits because they can perform various essential functions such as focusing, expanding, imaging, and planar waveguide Fourier Transforms.

Figure 28:
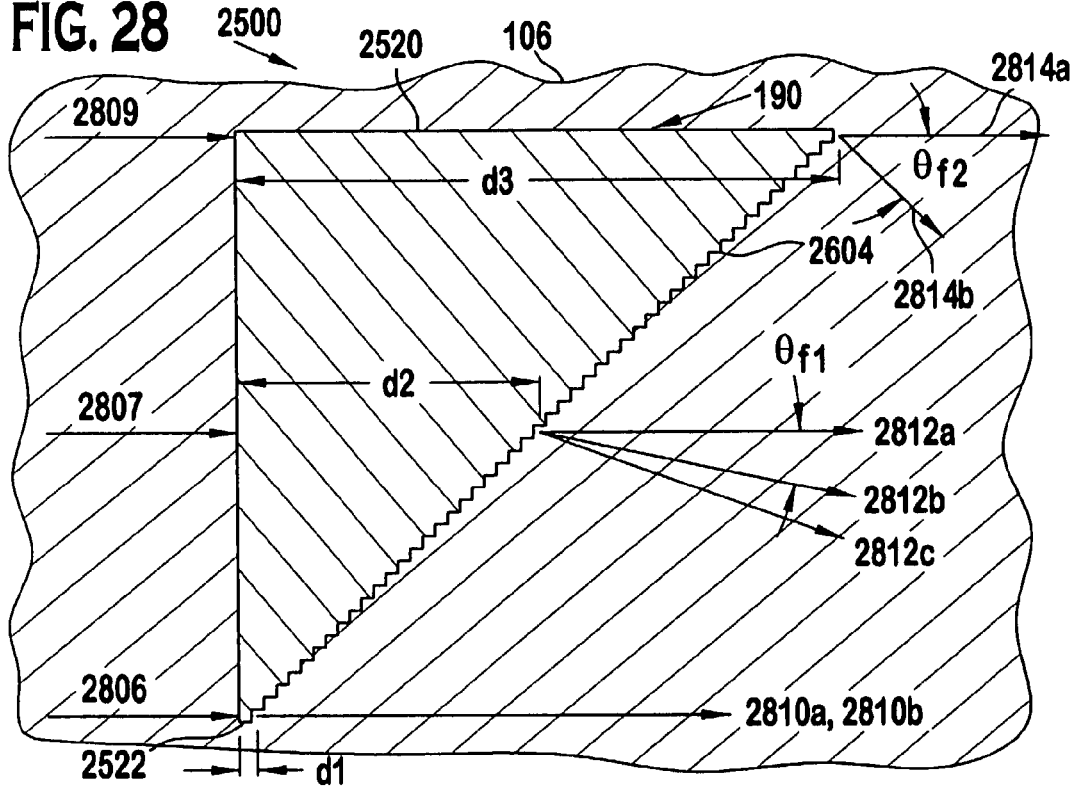
FIG. 28 shows a top cross sectional view taken through the waveguide of the optical waveguide device illustrating the focusing of multiple optical paths as light passes through the actuated Echelle lens grating shown in FIG. 25, illustrating the region of changeable propagation constant resulting from the Echelle lens grating.
Figure 29:
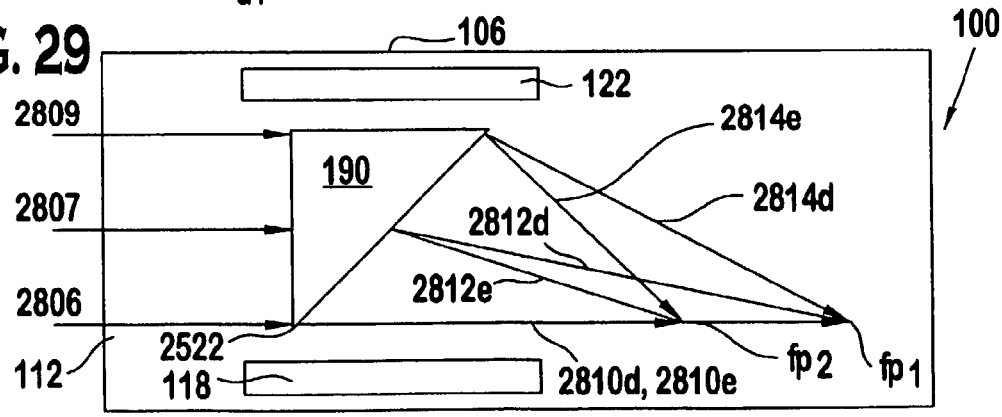
FIG. 29 shows an expanded view of the optical waveguide device biased to operate as an Echelle lens grating as shown in FIG. 28.

The FIG. 25 embodiment of Echelle grating 2500 can be used not only as a diffraction grating as described relative to FIG. 26, but the same structure can also be biased to perform as a lens to focus light. To act as a lens, the polarity of the voltage of the Echelle grating 2500 applied between the gate electrode and the combined first body contact/second body contact electrodes is opposite that shown for the FIG. 26 embodiment of diffraction grating FIGS. 28 and 29 show three input light beams that extend into the region of altered propagation constant 190 in the waveguide are shown as 2806, 2807, and 2809. The input light beams 2806, 2807 and 2809 are shown as extending substantially parallel to each other, and also substantially parallel to the side surfaces 2520, 2522 of the projected region of changeable propagation constant 190. The projected region of changeable propagation constant 190 shown in FIGS. 28 and 29 generally mirrors vertically through the height of the waveguide the shape and size of the FIG. 25 embodiment of Echelle shaped gate electrode 2502.

The light input from the input beams 2806, 2807 and 2809 extend through the region of changeable propagation constant 190 to form, respectively, the three sets of output beams 2810*a* and 2810*b*; 2812*a*, 2812*b* and 2812*c*; and 2814*a* and 2814*b* as shown in FIG. 28. Each focused output beam 2810, 2812 and 2814 is shown for a single wavelength of light, and the output beam represents the direction of travel of a beam of light of a specific wavelength with which that beam of light will constructively interfere. In other directions, the light of the specific wavelength destructively interferes.

The lower input light beam 2806 that enters near the bottom of the projected region of changeable propagation constant 190 travels for a very short distance d1 through the projected region of changeable propagation constant 190 (as shown from the left to the right) and exits as output beam 2810*a* or 2810*b*. As such, though the region of changeable propagation constant 190 has a different propagation constant then the rest of the waveguide 106. The amount that the output beam 2810*a* is focused is very small when compared to the amount of focusing on the other output beams 2812, 2814 that have traveled a greater distance through the region of changeable propagation constant 190.

The middle input light beam 2807 enters the projected region of changeable propagation constant 190 and travels through a considerable distance d2 before exiting from the projected Echelle grating. If there is no voltage applied to the gate electrode, then the output light will be unaffected by the region of changeable propagation constant 190, and light following input path 2807 will continue straight after exiting the waveguide along 2812*a*. If a medium voltage level is applied to the gate electrode, then the propagation constant within the region of changeable propagation constant 190 will not equal that within the surrounding waveguide. The propagation constant in the region of changeable propagation constant 190 will deflect light beam 2807 through an angle $\theta_{f1}$ along path 2812*b*. If the voltage is increased, the amount of deflection for focusing is also increased to the angle shown at 2812*c*.

Light corresponding to the input light beam 2809 will continue straight through the region of changeable propagation constant along line 2814*a* when no voltage is applied to the gate electrode. If a prescribed level of voltage is applied to the gate electrode, the output light beam will be focused through an output angle $\theta_{f2}$ to along output light beam 2814*b*. The output angle $\theta_{f2}$ of output focused beam 2814*b* exceeds the output angle $\theta_{f1}$ of focused beam 2812*b* if the same voltage applied to the gate electrode. The output angle varies linearly from one side surface 2522 to the other side 2520, since the output angle is a function of the distance the light is travelling through the projected region of changeable propagation constant 190.

FIGS. 28 and 29 demonstrate that a voltage can be applied to an Echelle shaped gate electrode 2602, and that it can be biased in a manner to cause the Echelle grating 2500 to act as a focusing device. The level of the voltage can be varied to adjust the focal length. For example, assume that a given projected region of changeable propagation constant 190 results in the output focused beams 2810, 2812, and 2814 converging at focal point $f_{P1}$. Increasing the gate voltage will cause the propagation constant in the projected region of changeable propagation constant 190 to increase, resulting in a corresponding increase in the output focus angle for each of the output focused beams. As such, the output focus beams would converge at a different point, e.g., at focal point $f_{P2}$, thereby, effectively decreasing the focal length of the lens. The FIGS. 28 and 29 embodiment of focusing mechanism can be used in cameras, optical microscopes, copy machines, etc., or any device that requires an optical focus. There are no moving parts in this device, which simplifies the relatively complex auto focus devices that are presently required for mechanical lenses. Such mechanical auto-focus lenses, for example, require precisely displacing adjacent lenses to within a fraction of a wavelength.

Figure 30B:
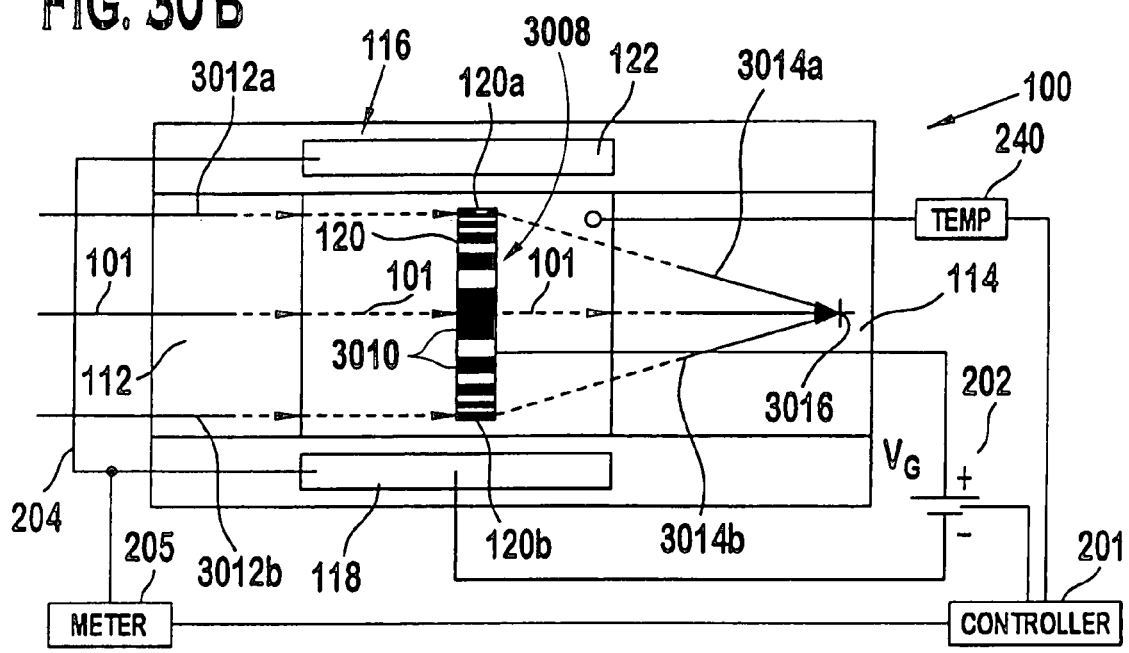
FIG. 30 shows a top view of one embodiment of an optical waveguide device that includes a grating, and is configured to act as an optical lens.
Figure 30A:
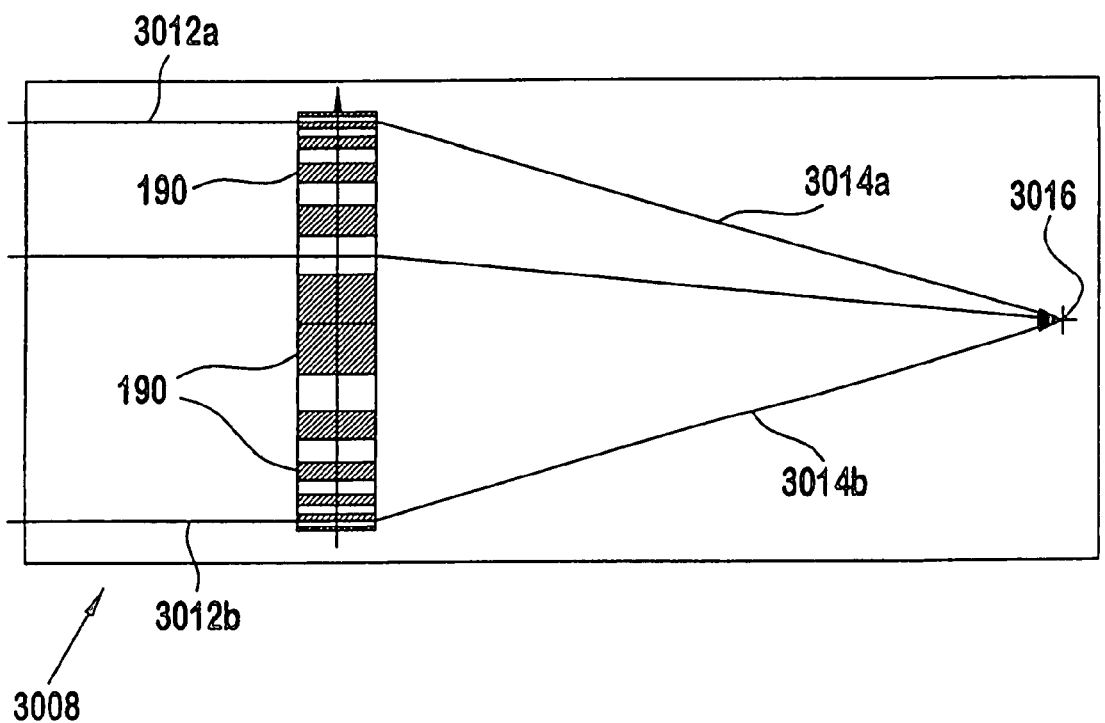

FIG. 30 shows another embodiment of an optical waveguide device 100 including a grating 3008 that is used as a lens to focus light passing through the waveguide. The embodiment of optical waveguide device 100, or more particularly the FIG. 2 embodiment of gate electrode of the optical waveguide device, is modified by replacing the continuous gate electrode (in FIG. 2) with a discontinuous electrode in the shape of a grating (shown in FIG. 30). The grating 3008 is formed with a plurality of etchings 3010 that each substantially parallels the optical path 101 of the optical waveguide device. In the FIG. 30 embodiment of grating 3008, the thickness of the successive etchings 3010 to collectively form gate electrode 120 increases toward the center of the optical waveguide device, and decreases toward the edges 120a, 120b of the gate electrode 120. Therefore, the region of changeable propagation constant 190 in the waveguide is thicker at those regions near the center of the waveguide. Conversely, the region of changeable propagation constant 190 becomes progressively thinner at those regions of the waveguide near edges 120a, 120b. The propagation constant is a factor of both the volume and the shape of the material used to form the gate electrode. The propagation constant is thus higher for those regions of changeable propagation constant closer to the center of the waveguide.

Light is assumed to be entering the waveguide 106 following substantially parallel paths as shown by exemplary paths 3012a and 3012b. paths 3012a and 3012b represent two paths travelling at the outermost positions of the waveguide. The locations between paths 3012a and 3012b are covered by a continuum of paths that follow similar routes. When sufficient voltage is applied to the grating shaped electrode, the light following paths 3012a and 3012b will be deflected to follow output paths 3014a and 3014b, respectively. Output paths 3014a and 3014b, as well as the paths of all the output paths that follow through the waveguide under the energized grating 3008 will be deflected a slightly different amount, all toward a focus point 3016. The FIG. 30 embodiment of optical waveguide device therefore acts as a lens. The grating 3008, though spaces a distance from the waveguide, can be biased to direct the light in a manner similar to a lens.

The reason why the embodiment of grating shown in FIG. 30 acts as a lens is now described. Light travelling within the waveguide requires a longer time to travel across those regions of changeable propagation constant at the center (i.e., taken vertically as shown in FIG. 30) than those regions adjacent the periphery of the lens (i.e., near edges 120a, 120b). This longer time results because the propagation constant is greater for those regions near the center. For light of a given wavelength, light exiting the lens will meet at a particular focal point. The delay imparted on the light passing through the regions of changeable propagation constant nearer the center of the lens will be different from that of the light passing near edges 120a, 120b. The total time required for the light to travel to the focal point is made from the combination of the time to travel through the region of changeable propagation constant 190 added to the time to travel from the region of changeable propagation constant 190 to the focal point. The time to travel through the region of changeable propagation constant 190 is a function of the propagation constant of each region of changeable propagation constant 190. The time to travel from the region of changeable propagation constant 190 to the focal point is a function of the distance from the region of changeable propagation constant 190 to the focal point. As a result of the variation in propagation constant from the center of the waveguide toward the edges 120a, 120b, a given wavelength of light arrives at a focal point simultaneously, and the lens thereby focuses the light.

There has been increasing interest in waveguide lenses such as Fresnel lenses and grating lenses. Such lenses offer limited diffraction performance, and therefore they constitute a very important element in integrated optic devices. Waveguide Fresnel lenses consist of periodic grating structures that cause a spatial phase difference between the input and the output wavefronts. The periodic grating structure gives a wavefront conversion by spatially modulating the grating. Assuming that the phase distribution function of the input and output waves are denoted by $\phi_1$ and $\phi_2$, respectively, the phase difference $\Delta\phi$ in the guided wave structure can be written as:

$$\Delta\phi = \phi_0 - \phi_1.$$

The desired wavefront conversion is achieved by a given phase modulation to the input wavefront equal to $\Delta\phi$. The grating for such phase modulation consists of grating lines described by:

$$\Delta\phi = 2m\pi,$$

where m is an integer, and, for light having a specific wavelength, the light from all of the grating lines will interfere constructively.

The phase difference $\Delta\phi$ for a planar waveguide converging wave follows the expression:

$$\Delta\phi(x) = kn_{eff}(f - \sqrt{x^2 + f^2})$$

where f is the focal length, $n_{eff}$ is the propagation constant of the waveguide and x is the direction of the spatial periodic grating modulation.

Figure 31:
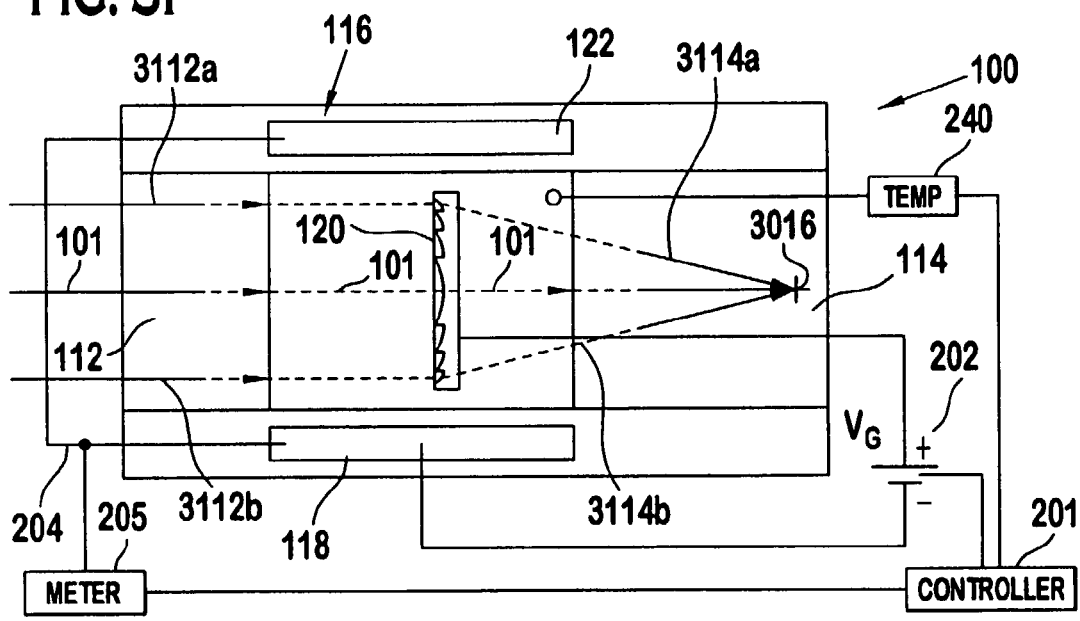
FIG. 31 shows a top view of another embodiment of optical waveguide device that includes a filter grating, and is configured to act as an optical lens.
Figure 31:
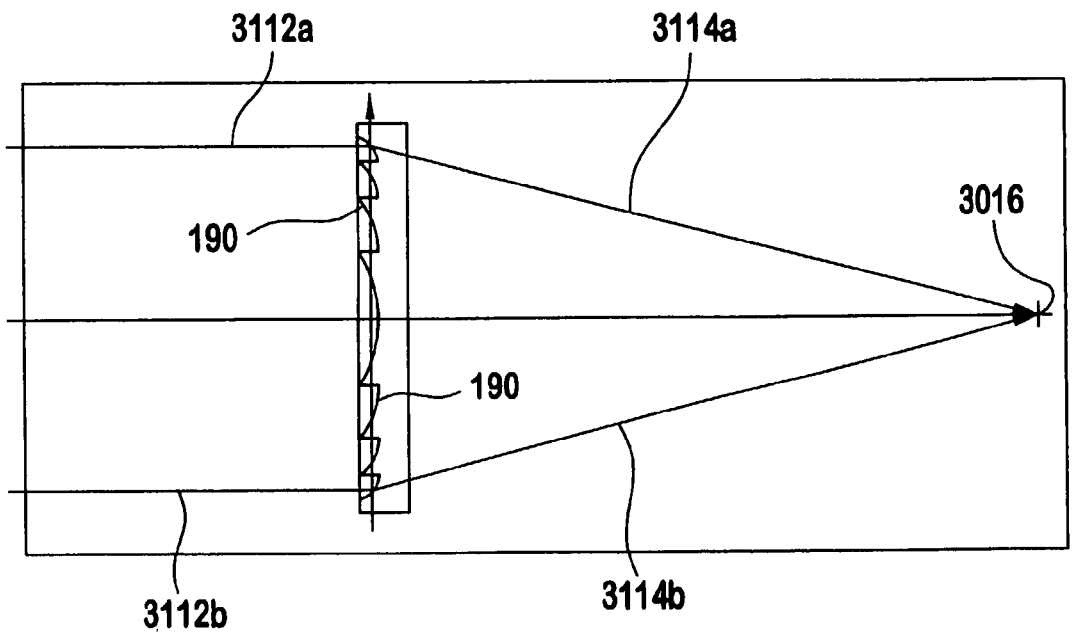

FIGS. 30 and 31 show two embodiments of optical waveguide devices that perform waveguide Fresnel lens functions. The two-dimensional Fresnel lenses follow the phase modulation like their three-dimensional lens counterpart:

$$\phi_F(x) = \Delta\phi(x) + 2m\pi,$$

for $x_m < |x| < x_{m+1}$, the phase modulation $\Delta\phi(x_m) = 2m\pi$, which is obtained by segmenting the modulation into Fresnel zones so that $\phi_F(x)$ has amplitude $2\pi$. Under the thin lens approximation, the phase shift is given by $K\Delta nL$. Therefore, the phase of the wavefront for a specific wavelength can be controlled by the variations of $\Delta n$ and L. If $\Delta n$ is varied as a function of x, where the lens thickness, L, is held constant, as shown in FIG. 30, it is called the GRIN Fresnel lens and is described by:

$$\Delta n(x) = \Delta n_{max}(\phi_F(x)/2\pi + 1).$$

Figure 32:
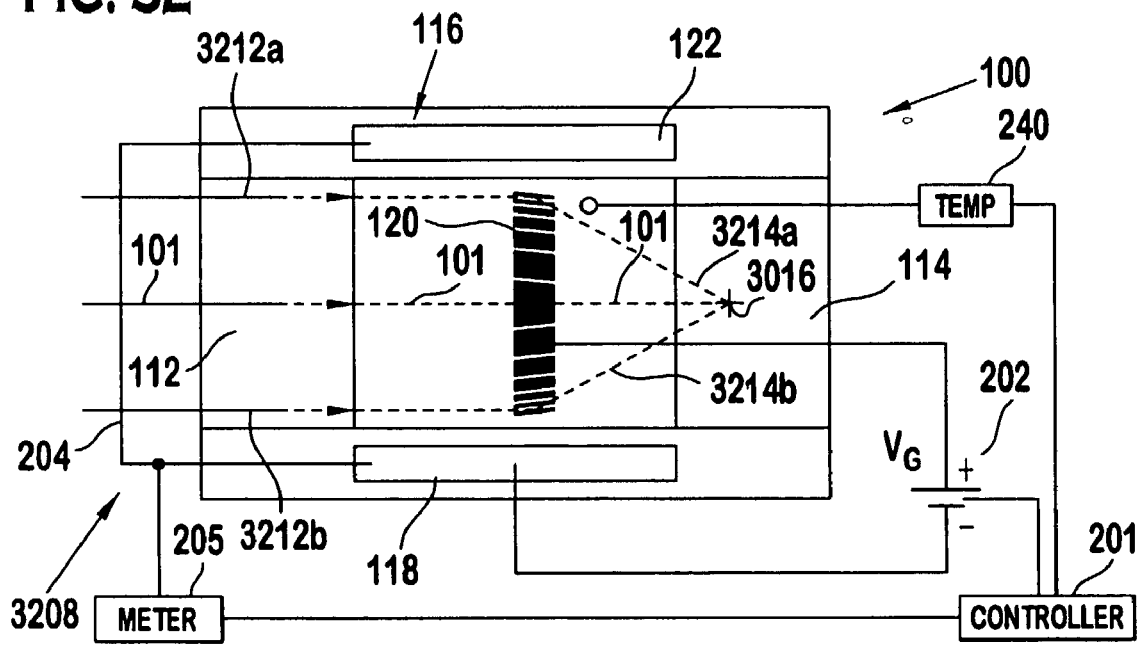
FIG. 32 shows a top view of another embodiment of optical waveguide device that includes a grating, and is configured to act as an optical lens.
Figure 32A:
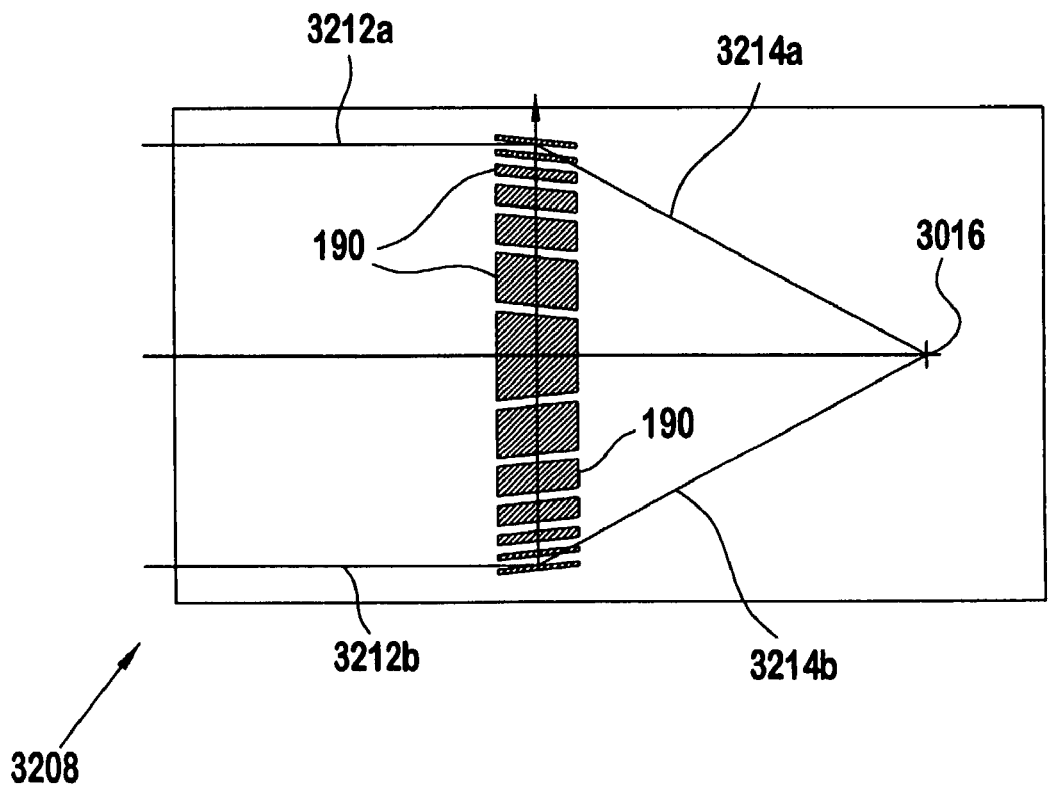
FIG. 32A shows a top cross sectional view taken through the waveguide of the optical waveguide shown in FIG. 32.

FIG. 32 shows one embodiment of optical waveguide device that operates as a gradient-thickness Fresnel lens where $\Delta n$ is held constant. The thickness of the lens L has the following functional form:

$$L(x) = L_{max}(\phi_F(x)/2\pi + 1).$$

To have $2\pi$ phase modulation, in either the FIG. 30 or FIG. 31 embodiment of lens, the modulation amplitude must be optimized. The binary approximation of the phase modulation results in the step-index Fresnel zone lens. The maximum efficiency of 90%, limited only by diffraction, can be obtained in certain lenses.

Another type of optical waveguide device has been designed by spatially changing the K-vector as a function of distance to the central axis using a so-called chirped grating configuration. In chirped grating configurations, the cross sectional areas of the region of changeable propagation constant 190 are thicker near the center of the waveguide than the periphery to provide a greater propagation constant as shown in the embodiment of FIG. 30. Additionally, the output of each region of changeable propagation constant 190 is angled towards the focal point to enhance the deflection of the light toward the deflection point. The architecture of FIG. 32 embodiment of chirped grating waveguide lens results in index modulation according to the equation:

$$\Delta n(x) = \Delta n \cos[\Delta\phi(x)] = \Delta n \cos\{Kn_e[Kn_e(f - \sqrt{x^2 + f^2})]\}$$

Where f=focal length, Δϕ=phase difference; L is the lens thickness of the grating; x is the identifier of the grating line, and n is the refractive index. As required by any device based on grating deflection, the Q parameter needs to be greater than 10 to reach the region in order to have high efficiency. The grating lines need to be slanted according to the expression:

$$\Psi(x) = \tfrac{1}{2}\tan^{-1}(x/f) \approx x/2f$$

so that the grating condition is satisfied over the entire aperture. The condition for maximum efficiency is:

$$kL = \pi \Delta n L/\lambda = \pi/2.$$

In the embodiment of the optical waveguide device as configured in FIG. 32, adjustments may be made to the path length of the light passing through the waveguide by using a gate electrode formed with compensating prism shapes. Such compensating prism shapes are configured so that the voltage taken across the gate electrode (from the side of the gate electrode adjacent the first body contact electrode to the side of the gate electrode adjacent the second body contact electrode) varies. Since the voltage across the gate electrode varies, the regions of changeable propagation constant will similarly vary across the width of the waveguide. Such variation in the voltage will likely result in a greater propagation of the light passing through the waveguide at different locations across the width of the waveguide.

Figure 33:
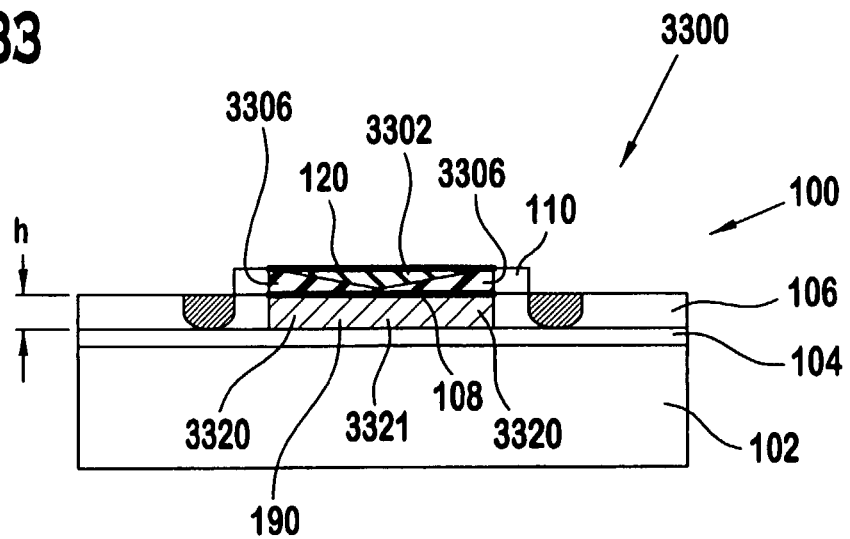
FIG. 33 shows a front view of another embodiment of optical waveguide device from that shown in FIG. 1.

FIG. 33 shows a front view of another embodiment of optical waveguide device from that shown in FIG. 1. The optical waveguide device 100 shown in FIG. 33 is configured to operate as a lens 3300. The depth of the electrical insulator layer 3302 varies from a maximum depth adjacent the periphery of the waveguide to a minimum depth adjacent the center of the waveguide. Due to this configuration, a greater resistance is provided by the electrical insulator 3302 to those portions that are adjacent the periphery of the waveguide and those portions that are the center of the waveguide. The FIG. 33 embodiment of optical lens can establish a propagation constant gradient across the width of the waveguide. The value of the propagation constant will be greater at the center, and lesser at the periphery of the waveguide. This embodiment of lens 3300 may utilize a substantially rectangular gate electrode. It may also be necessary to provide one or more wedge shape spacers 3306 that are made from material having a lower electrical resistance than the electrical insulator 3302 to provide a planer support surface to support the gate electrode. Other embodiment in which the electrical resistance of the electrical insulator is varied to change an electrical field at the insulator/semiconductor interface resulting in a varied propagation constant level are within the scope of the present invention.

4E. Optical Filters

The optical waveguide device 100 can also be modified to provide a variety of optical filter functions. Different embodiments of optical filters that are described therein include an arrayed waveguide (AWG) component that acts as a multiplexer/demultiplexer or linear phase filter in which a light signal can be filtered into distinct bandwidths of light. Two other embodiments of optical filters are a finite-impulse-response (FIR) filter and an infinite-impulse-response (IIR) filter. These embodiments of filters, as may be configured with the optical waveguide device, are now described.

Figure 34:
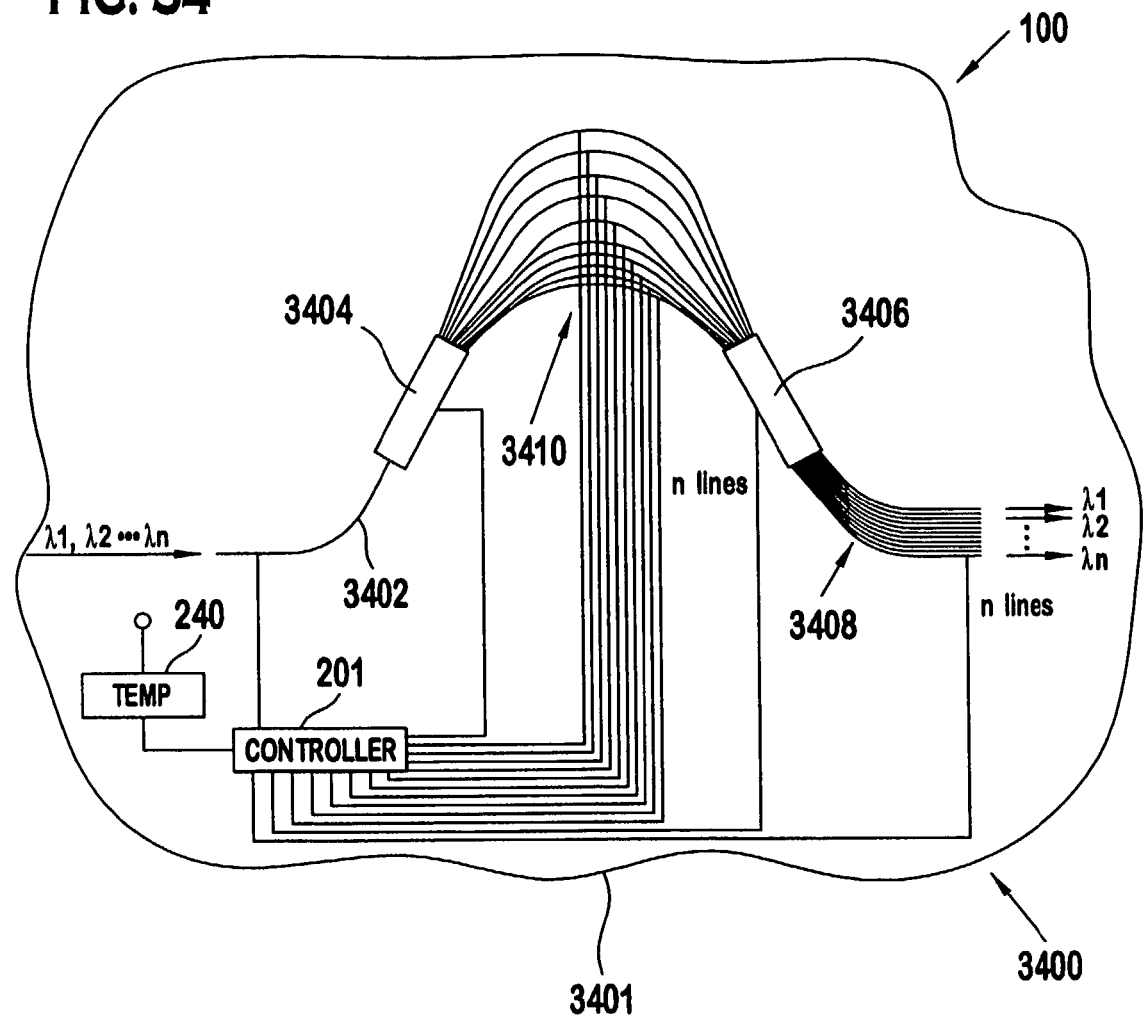
FIG. 34 shows a top view of one embodiment of an arrayed waveguide (AWG) including a plurality of waveguide devices.

FIG. 34 shows one embodiment of an optical waveguide device being configured as an AWG component 3400. The AWG component 3400 may be configured to act as a wavelength multiplexer, wavelength demultiplexer, a linear phase filter, or a router. The AWG component 3400 is formed on a substrate 3401 with a plurality of optical waveguide devices. The AWG component 3400 also includes an input waveguide 3402 (that may be formed from one waveguide or an array of waveguides for more than one input signal), an input slab coupler 3404, a plurality of arrayed waveguide devices 3410, an output slab coupler 3406, and an output waveguide array 3408. The input waveguide 3402 and the output waveguide array 3408 each comprise one or more channel waveguides (as shown in the FIGS. 1 to 3, 4, or 5 embodiments) that are each optically coupled to the input slab coupler 3402. Slab couplers 3404 and 3406 allow the dispersion of light, and each slab coupler 3404 and 3406 may also be configured as in the FIGS. 1 to 3 or 5 embodiments. Each one of the array waveguides 3410 may be configured as in the FIGS. 10 to 11 embodiment of channel waveguide. Controller 201 applies a variable DC voltage $V_g$ to some or all of the waveguide couplers 3402, 3404, 3406, 3408, and 3410 to adjust for variations in temperature, device age and characteristics, or other parameters as discussed above in connection with the FIGS. 7-8. In the embodiment shown, controller 201 does not have to apply an alternating current signal $v_g$ to devices 3402, 3404, 3406, 3408 and 3410.

The input array 3402 and the input slab coupler 3404 interact to direct light flowing through one or more of the input waveguides of the channel waveguides 3410 depending upon the wavelength of the light. Each array waveguide 3410 is a different length, and can be individually modulated in a manner similar to described above. For example, the upper array waveguides, shown with the greater curvature, have a greater light path distance than the lower array waveguides 3410 with lesser curvature. The distance that light travels through each of the array waveguides 3410 differs so that the distance of light exiting the different array waveguides, and the resultant phase of the light exiting from the different array waveguides, differ.

Optical signals pass through the plurality of waveguides (of the channel and slab variety) that form the AWG component 3400. The AWG component 3400 is often used as an optical wavelength division demultiplexer/multiplexer. When the AWG component 3400 acts as an optical wavelength division demultiplexer, one input multi-bandwidth signal formed from a plurality of input component wavelength signals of different wavelengths is separated by the AWG component 3400 into its component plurality of output single-bandwidth signals. The input multi-bandwidth signal is applied to the input waveguide 3402 and the plurality of output single-bandwidth signals exit from the output waveguide array 3408. The AWG component 3400 can also operate as a multiplexer by applying a plurality of input single-bandwidth signals to the output waveguide array 3408 and a single output multi-bandwidth signal exits from the input waveguide 3402.

When the AWG component 3400 is configured as a demultiplexer, the input slab coupler 3404 divides optical power of the input multi-bandwidth signal received over the input waveguide 3402 into a plurality of array signals. In one embodiment, each array signal is identical to each other array signal, and each array signal has similar signal characteristics and shape, but lower power, as the input multi-bandwidth signal. Each array signal is applied to one of the plurality of arrayed waveguide devices 3410. Each one of the plurality of arrayed waveguide devices 3410 is coupled to the output terminal of the input slab coupler 3404. The AWG optical wavelength demultiplexer also includes the output slab coupler 3406 coupled to the output terminal of the plurality of arrayed waveguide devices 3410. Each arrayed waveguide device 3410 is adapted to guide optical signals received from the input slab coupler 3404 so each one of the plurality of arrayed waveguide signals within each of the respective plurality of arrayed waveguide devices (that is about to exit to the output slab coupler) has a consistent phase shift relative to its neighboring arrayed waveguides device 3410. The output slab coupler 3406 separates the wavelengths of each one of the arrayed waveguide signals output from the plurality of arrayed waveguide devices 3410 to obtain a flat spectral response.

Optical signals received in at least one input waveguide 3402 pass through the input slab coupler 3404 and then enter the plurality of arrayed waveguide devices 3410 having a plurality of waveguides with different lengths. The optical signals emerging from the plurality of arrayed waveguide devices 3410 have different phases, respectively. The optical signals of different phases are then incident to the output slab coupler 3406 in which a reinforcement and interference occurs for the optical signals. As a result, the optical signals are focused at one of the output waveguide array 3408. The resultant image is then outputted from the associated output waveguide array 3408.

AWG optical wavelength demultiplexers are implemented by an arrayed waveguide grating configured to vary its wavefront direction depending on a variation in the wavelength of light. In such AWG optical wavelength demultiplexers, a linear dispersion indicative of a variation in the shift of the main peak of an interference pattern on a focal plane (or image plane) depending on a variation in wavelength can be expressed as follows:

$$\frac{d_x}{d\lambda} = \frac{fm}{n_s d},$$

where "f" represents the focal distance of a slab waveguide, "m" represents the order of diffraction, "d" represents the pitch of one of the plurality of arrayed waveguide devices 3410 and "$n_s$" is the effective refractive index of the slab waveguide. In accordance with equation 19, the wavelength distribution of an optical signal incident to the AWG optical wavelength demultiplexer is spatially focused on the image plane of the output slab coupler 3406. Accordingly, where a plurality of output waveguides in array 3408 are coupled to the image plane while being spaced apart from one another by a predetermined distance, it is possible to implement an AWG optical wavelength demultiplexer having a wavelength spacing determined by the location of the output waveguide array 3408.

Optical signals respectively outputted from the arrayed waveguides of the AWG component 3400 while having different phases are subjected to a Fraunhofer diffraction while passing through the output slab coupler 3406. Accordingly, an interference pattern is formed on the image plane corresponding to the spectrum produced by the plurality of output single-bandwidth signals. The Fraunhofer diffraction relates the input optical signals to the diffraction pattern as a Fourier transform. Accordingly, if one of the input multi-bandwidth signals is known, it is then possible to calculate the amplitude and phase of the remaining input multi-bandwidth signals using Fourier transforms.

It is possible to provide phase and/or spatial filters that filter the output single-bandwidth signals that exit from the output waveguide array 3408. U.S. Pat. No. 6,122,419 issued on Sep. 19, 2000 to Kurokawa et al. (incorporated herein by reference) describes different versions of such filtering techniques.

Figure 35:
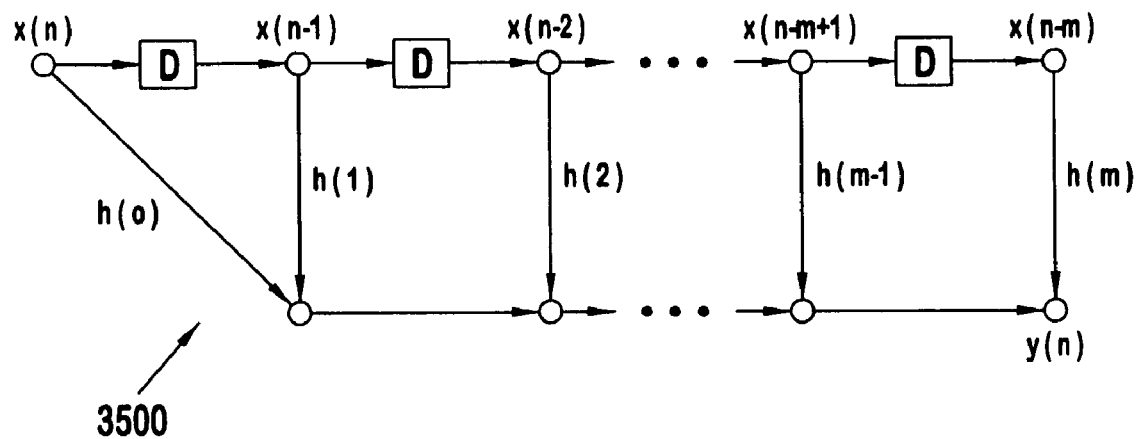
FIG. 35 shows a schematic timing diagram of one embodiment of a finite-impulse-response (FIR) filter.

FIG. 35 shows one embodiment of a finite-impulse-response (FIR) filter 3500. The FIR filter 3500 is characterized by an output in a linear combination of present and past values of inputs. In FIG. 35, x(n) shows the present value of the input, and x(n−1), x(n−2), etc. represent the respective previous values of the input; y(x) represents the present value of the output; and h(1), h(2) represent the filter coefficients of x(n), y(n−1), etc. The D corresponds to the delay. The FIR filter 3500 satisfies equation 20:

$$y = \sum_{k=0}^{M} h(k)\, x(n-k).$$

Figure 36:
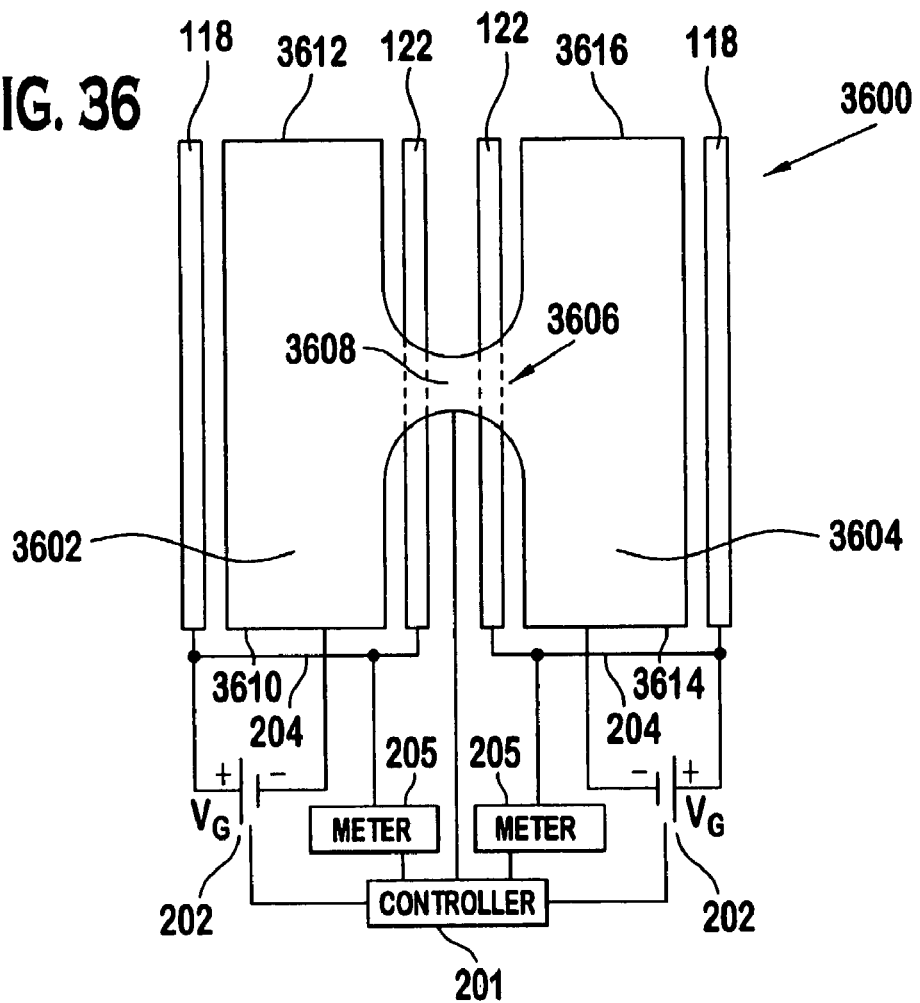
FIG. 36 shows a top view of one embodiment of an FIR filter.

An AWG, for example, is one embodiment of FIR filter in which the present output is a function entirely of past input. One combination of optical waveguide devices, a top view of which is shown in FIG. 36, is a FIR filter 3600 known as a coupled waveguide 3600. The coupled waveguide 3600, in its most basic form, includes a first waveguide 3602, a second waveguide 3604, a coupling 3606, and a light pass grating 3608. The first waveguide 3602 includes a first input 3610 and a first output 3612. The time necessary for light to travel through the first waveguide 3602 and/or the second waveguide 3604 corresponds to the delay D shown in the FIG. 35 model of FIR circuit. The second waveguide 3604 includes a second input 3614 and a second output 3616.

The coupling 3606 allows a portion of the signal strength of the light flowing through the first waveguide 3602 to pass into the second waveguide 3604, and vice versa. The amount of light flowing between the first waveguide 3602 and the second waveguide 3604 via the coupling 3606 corresponds to the filter coefficients h(k) in equation 20. One embodiment of light pass grating 3608 is configured as a grating as shown in FIGS. 20 to 22. Controller 201 varies the gate voltage of the light pass grating to control the amount of light that passes between the first waveguide 3602 and the second waveguide 3604, and compensates for variations in device temperature. An additional coupling 3606 and light pass grating 3608 can be located between each additional pair of waveguides that have a coefficient as per equation 20.

Figure 37:
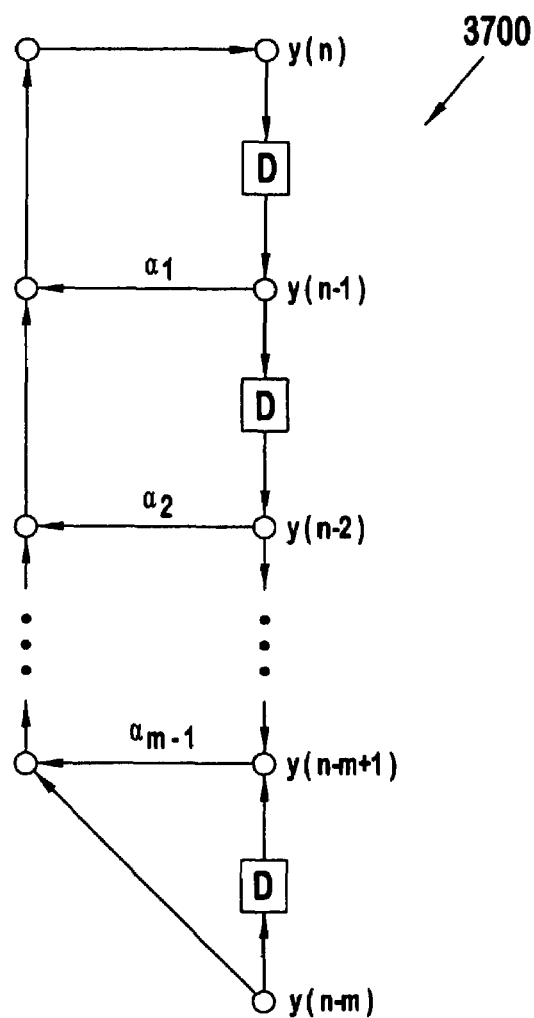
FIG. 37 shows a schematic timing diagram of one embodiment of an infinite-impulse-response (IIR) filter.

FIG. 37 shows one embodiment of a timing model of an infinite-impulse-response (IIR) filter 3700. The FIG. 37 model of IIR filter is characterized by an output that is a linear combination of the present value of the input and past values of the output. The IIR filter satisfies equation 21:

$$y(n) = x(n) + \sum_{k=1}^{M} \alpha_k\, y(n-k).$$

Where x(n) is a present value of the filter input; y(n) is the present value of the filter output; y(n−1), etc. are past values of the filter output; and $\alpha_1, \ldots, \alpha_M$ are the filter coefficients.

Figure 38:
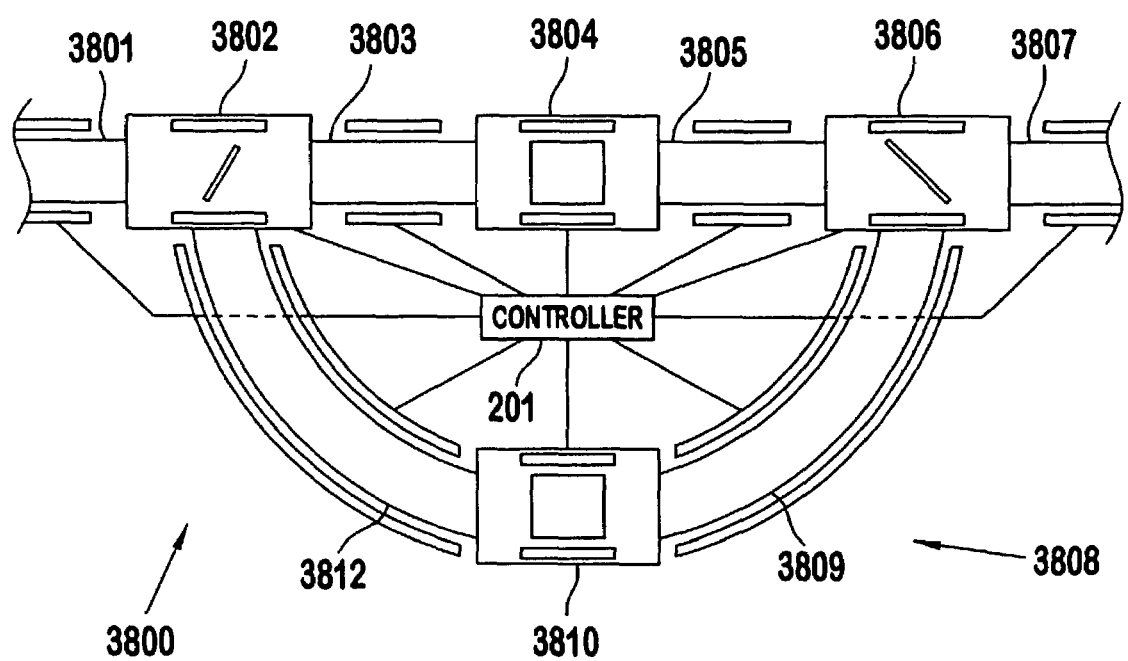
FIG. 38 shows a top view of one embodiment of an IIR filter.

One embodiment of an IIR filter 3800 is shown in FIG. 38. The IIR filter 3800 includes an input waveguide 3801, a combiner 3802, a waveguide 3803, an optical waveguide device 3804, a waveguide 3805, a beam splitter 3806, an output waveguide 3807, and a delay/coefficient portion 3808. The delay/coefficient portion 3808 includes a waveguide 3809, a variable optical attenuator (VOA) 3810, and waveguide 3812. The delay/coefficient portion 3808 is configured to provide a prescribed time delay to the optical signals passing from the beam splitter 3806 to the combiner 3802. In the FIG. 38 embodiment of an IIR filter 3800, the time necessary for light to travel around a loop defined by elements 3802, 3803, 3804, 3805, 3806, 3809, 3810, and 3812 once equals the delay D shown in the FIG. 37 model of IIR circuit. The variable optical attenuator 3810 is configured to provide a prescribed amount of signal attenuation to correspond to the desired coefficient, $\alpha_1$ to $\alpha_M$. An exemplary VOA is described in connection with FIG. 41 below.

Input waveguide 3801 may be configured, for example, as the channel waveguide shown in FIGS. 1 to 3, 4, or 5. Combiner 3802 may be configured, for example, as a grating shown in FIGS. 20 to 22 integrated in a slab waveguide shown in the FIGS. 1 to 3, 4, or 5. The waveguide 3803 may be configured, for example, as the channel waveguide shown in FIGS. 1 to 3, 4, or 5. The waveguide 3805 may be configured, for example, as the channel waveguide shown in FIGS. 1 to 3, 4, or 5. The beam splitter 3806 may be configured, for example, as the beamsplitter shown below in FIG. 46. The waveguide 3809 may be configured, for example, as the channel waveguide shown in FIGS. 1 to 3, 4, or 5. The VOA 3810 may be configured as shown below relative to FIG. 41. The waveguide 3812 may be configured, for example, as the channel waveguide shown in FIGS. 1 to 3, 4, or 5.

Controller 201 applies a variable DC voltage $V_g$ to the respective gate electrodes of the input waveguide 3801, the combiner 3802, the waveguide 3803, the optical waveguide device 3804, the waveguide 3805m the beam splitter 3806, the waveguide 3809, the VOA 3810, and the waveguide 3812 to adjust for variations in temperature, device age, device characteristics, etc. as discussed below in connection with FIGS. 7-8. In addition, controller 201 also varies the gate voltage applied to other components of the IIR to vary their operation, as discussed below.

During operation, an optical signal is input into the waveguide 3801. Virtually the entire signal strength of the input optical signal flows through the combiner 3802. The combiner 3802 is angled to a sufficient degree, and voltage is applied to a sufficient amount so the propagation constant of the waveguide is sufficiently low to allow the light from the waveguide 3801 to pass directly through the combiner 3802 to the waveguide 3803. The majority of the light that passes into waveguide 3803 continues to the optical waveguide device 3804. The optical waveguide device 3804 can perform a variety of functions upon the light, including attenuation and/or modulation. For example, if it is desired to input digital signals, the optical waveguide device 3804 can be pulsed on and off as desired when light is not transmitted to the output waveguide 3807 by varying the gate voltage of waveguide device 3804. If the optical waveguide device 3804 is turned off and is fully attenuating, then a digital null signal will be transmitted to the output waveguide 3807.

The output signal from the output waveguide device 3804 continues through waveguide 3805 into beam splitter 3806. Beam splitter 3806 diverts a prescribed amount of the light into waveguide 3809, and also allows prescribed amount of the light to continue onto the output waveguide 3807. The voltage applied to the gate of the beam splitter 3806 can be changed by controller 201 to control the strength of light that is diverted to waveguide 3809 compared to that that is allowed to pass to output waveguide 3807.

The light that is diverted through waveguide 3809 continues through the variable optical attenuator 3810. The voltage applied to the variable optical attenuator (VOA) 3810 can be adjusted depending upon the desired coefficient. For example, full voltage applied to the gate electrode of the VOA 3810 would fully attenuate the light passing through the waveguide. By comparison, reducing the voltage applied to the gate electrode would allow light to pass through the VOA to the waveguide 3812. Increasing the amount of light passing through the VOA acts to increase the coefficient for the IIR filter corresponding to the delay/coefficient portion 3808. The light that passes through to the waveguide 3812 continues on to the combiner 3802, while it is almost fully deflected into waveguide 3803 to join the light that is presently input from the input waveguide 3801 through the combiner 3802 to the waveguide 3803. However, the light being injected from waveguide 3812 into the combiner 3803 is delayed from the light entering from the input waveguide 3801. A series of these IIR filters 3800 can be arranged serially along a waveguide path.

Figure 39:
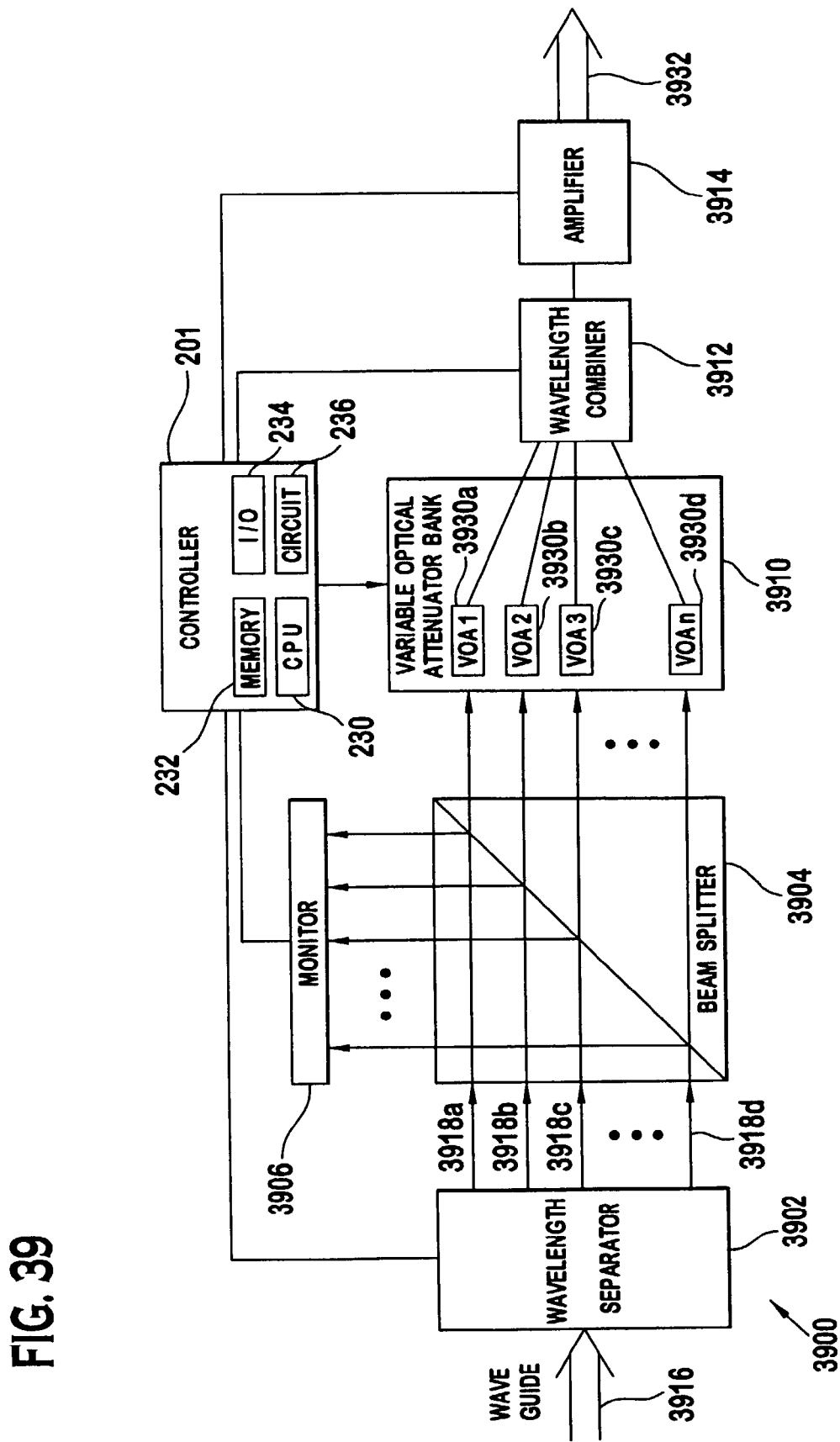
FIG. 39 shows a top view of one embodiment of a dynamic gain equalizer including a plurality of optical waveguide devices.
Figure 40:
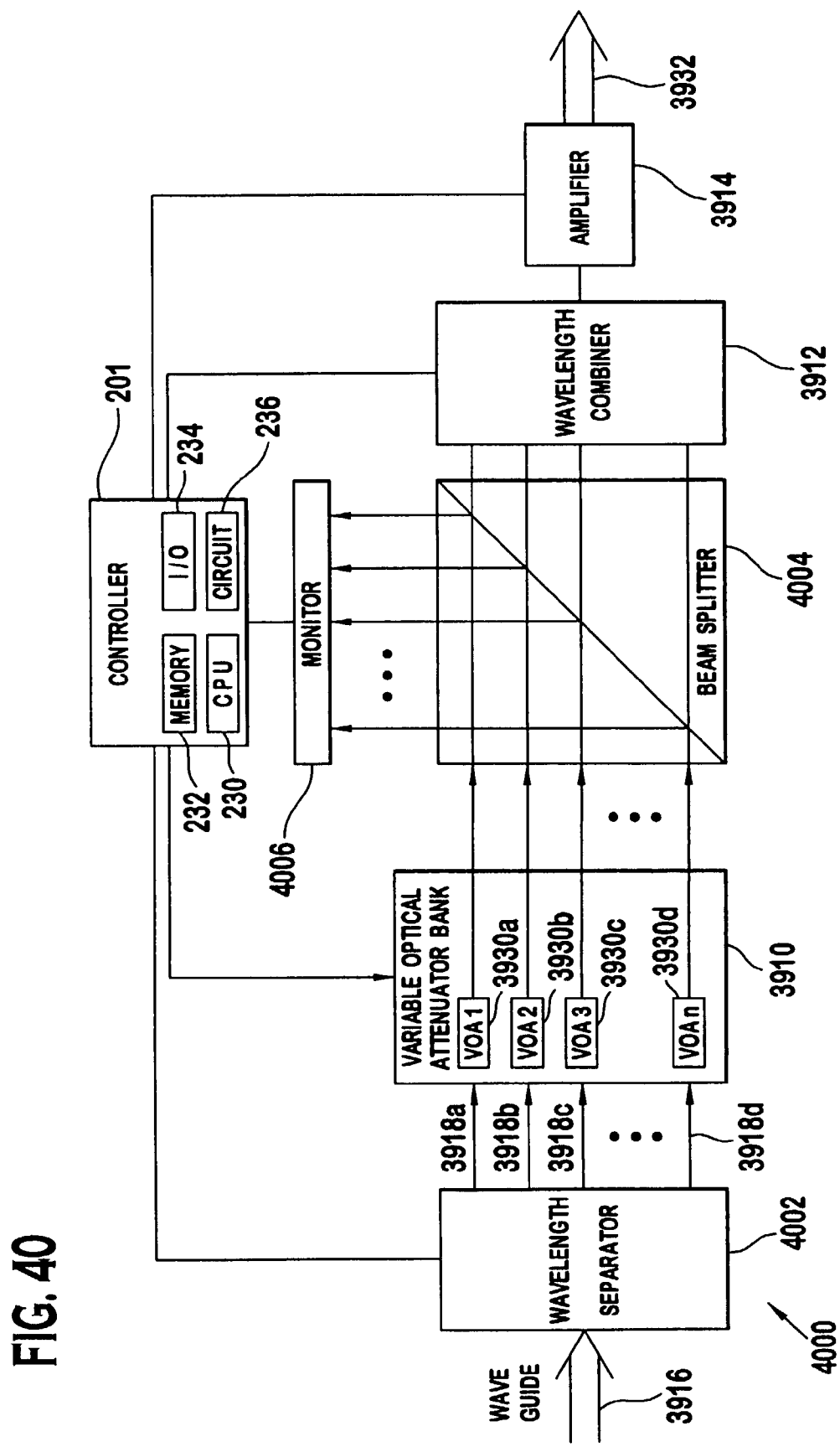
FIG. 40 shows a top view of another embodiment of a dynamic gain equalizer including a plurality of optical waveguide devices.

FIGS. 39 and 40 show two embodiments of a dynamic gain equalizer that acts as a gain flattening filter. The structure and filtering operation of the dynamic gain equalizer is described below.

4F. Variable Optical Attenuators

Figure 41:
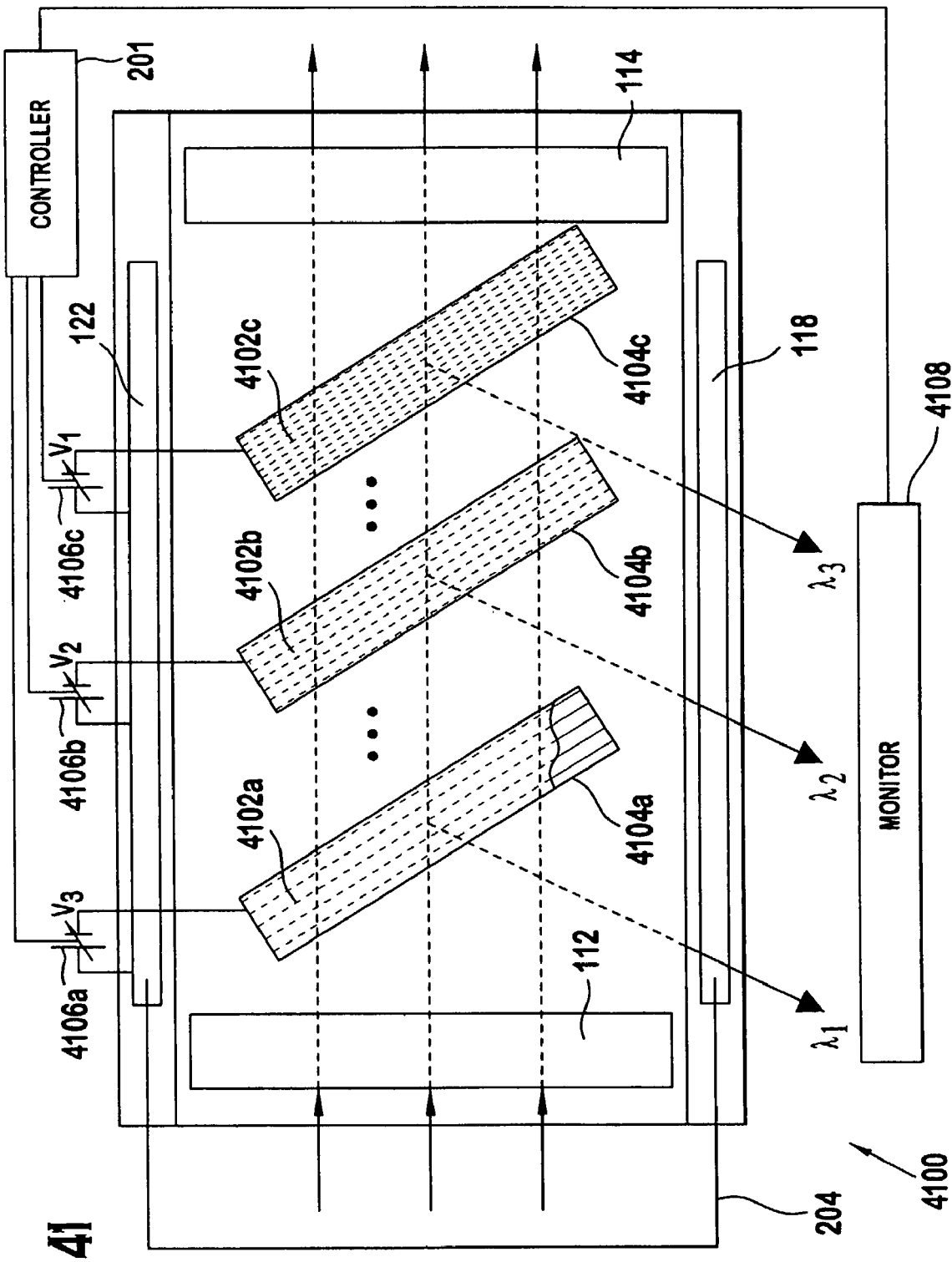
FIG. 41 shows a top view of one embodiment of a variable optical attenuator (VOA)

A variable optical attenuator (VOA) is used to controllably attenuate one or more bandwidths of light. The VOA is an embodiment of optical amplitude modulators, since optical attenuation may be considered a form of amplitude modulation. FIG. 41 shows one embodiment of a VOA 4100 that is modified from the FIGS. 1 to 3 or 5 embodiment of optical waveguide modulators. The VOA 4100 includes multiple sets of patterned gratings 4102a, 4102b, and 4102c, multiple gate electrodes 4104a, 4104b, and 4104c, multiple variable voltage sources 4106a, 4106b, and 4106c, and a monitor 4108. Each individual plane in the patterned gratings 4102a, 4102b, and 4102c are continuous even through they are depicted using dotted lines (since they are located behind, or on the backside of, the respective gate electrodes 4104a, 4104b, and 4104c).

Each of the multiple sets of patterned gratings 4102a, 4102b, and 4102c correspond, for example, to the embodiments of grating shown in FIGS. 20-22, and may be formed in the electrical insulator layer or each respective gate electrode. The respective gate electrode 4104a, 4104b, and 4104c, or some insulative pattern is provided as shown in the FIGS. 20 to 22 embodiments of gratings. In any one of the individual patterned gratings 4102a, 4102b, and 4102c, the spacing between adjacent individual gratings is equal. However, the spacing between individual adjacent gratings the FIG. 41 embodiment of patterned gratings 4102a, 4102b, and 4102c decreases from the light input side to the light output side (left to right). Since the grating size for subsequent patterned gratings 4102a, 4102b, and 4102c decreases, the wavelength of light refracted by each also decreases from input to output.

Each patterned grating 4102a-4102c has a variable voltage source applied between its respective gate electrode 4104a, 4104b, and 4104c and its common voltage first body contact electrode/second body contact electrode. As more voltage is applied between each of the variable voltage sources 4106a, 4106b, and 4106c and the gratings 4102a to 4102c, the propagation constant of that patterned grating increases. Consequently, more light of the respective wavelengths $\lambda_1$, $\lambda_2$, or $\lambda_3$ associated with the spacing of the patterned gratings 4102a to 4102c would be refracted, and interfere constructively. The monitor 4108 can monitor such light that interferes constructively.

Depending upon the intensity of the refracted light at each wavelength, equation 22 applies.

$$P_R(\lambda_1) + P_T(\lambda_1) = P_0(\lambda_1)$$

where $P_R(\lambda_1)$ equals the refracted light, $P_T(\lambda_1)$ equals the transmitted light, and $P_0(\lambda_1)$ equals the output light. In a typical embodiment, a variable optical attenuator 4100 may be arranged with, e.g., 50 combined patterned gratings and gate electrodes (though only three are shown in FIG. 41). As such, light having 50 individual bandwidths could be attenuated from a single light beam using the variable optical attenuator 4100.

4G. Programmable Delay Generators and Optical Resonators

Figure 42:
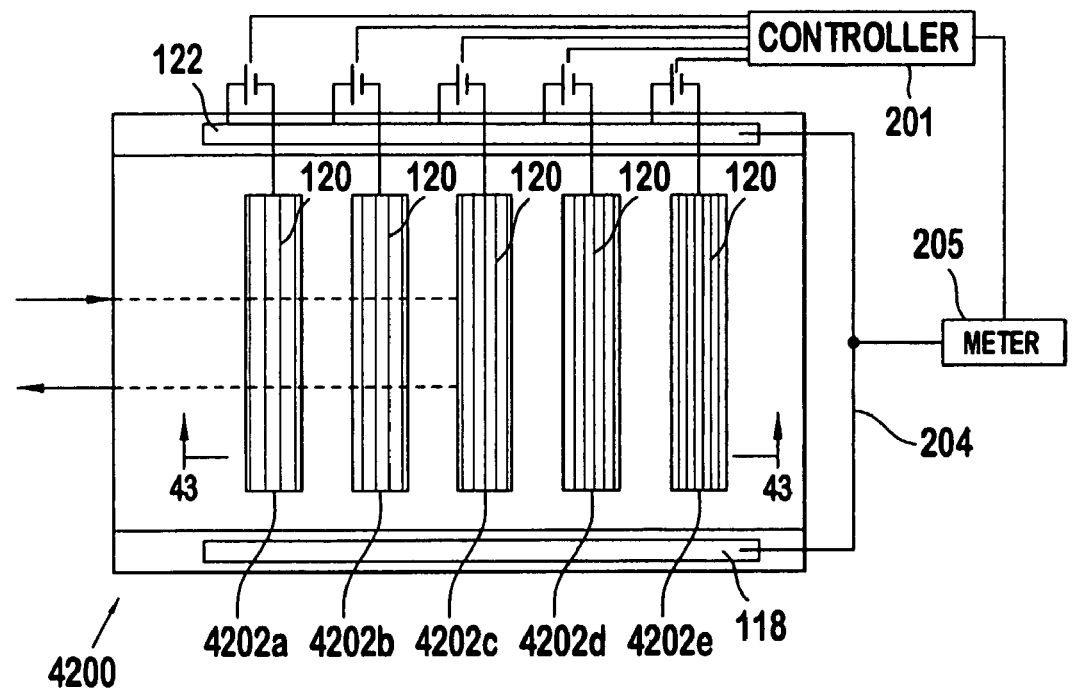
FIG. 42 shows a top view of one embodiment of optical waveguide device including a channel waveguide being configured as a programmable delay generator.
Figure 43:
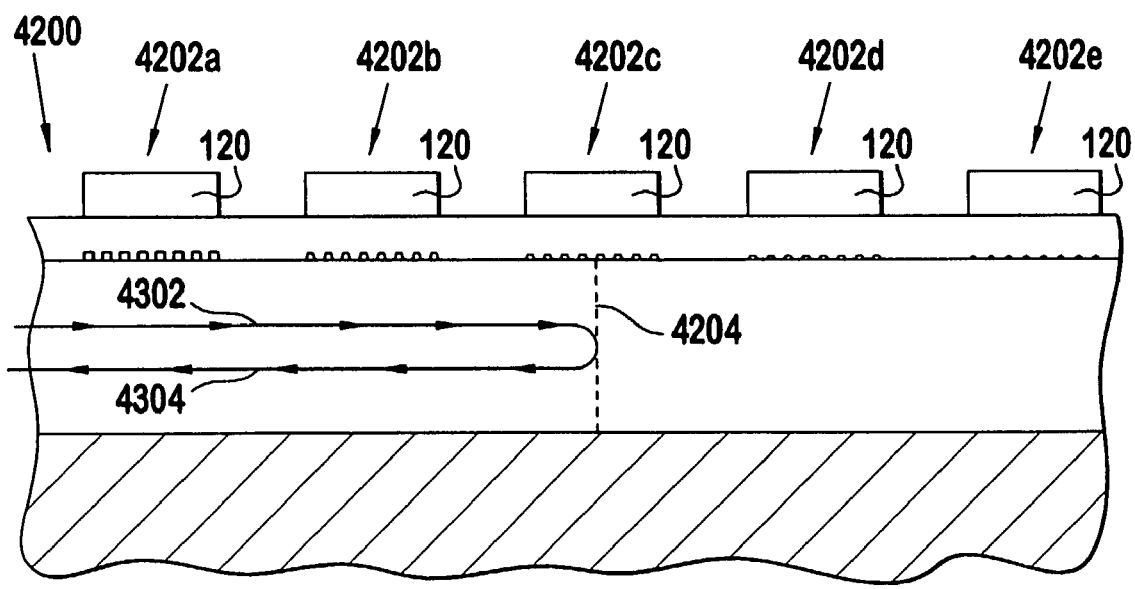
FIG. 43 shows a side cross sectional view of the FIG. 42 embodiment of programmable delay generator.

Programmable delay generators are optical circuits that add a prescribed, and typically controllable, amount of delay to an optical signal. Programmable delay generators are used in such devices as interferometers, polarization control, and optical interference topography that is a technology used to examine eyes. In all of these technologies, at least one optical signal is delayed. FIG. 42 shows a top view of one embodiment of a programmable delay generator 4200. FIG. 43 shows a side cross sectional view of the FIG. 42 embodiment of programmable delay generator 4200. In addition to the standard components of the optical waveguide device shown in the embodiments of FIG. 1-3, 4, or 5, the programmable delay generator 4200 includes a plurality of grating devices 4202*a* to 4202*e* and a plurality of axially arranged gate electrodes 120. The embodiment of gratings devices 4202 shown in FIGS. 42 and 43 are formed in the lower surface of the gate electrode, however, the grating devices may alternatively be formed as shown in the embodiments in FIGS. 20 to 22 as grooves in the lower surface of the electrical insulator as insulator elements having different resistance inserted in the insulator, as grooves formed in the lower surface of the gate electrode, or as some equivalent grating structure such as using surface acoustic waves that, as with the other gratings, project a series of parallel planes 4204*m* representing regions of changeable propagation constant, into the waveguide. The spacing between the individual grooves in the grating equals some multiple of the wavelength of light that to be reflected.

Each axially arranged gate electrode 120 is axially spaced a short distance from the adjacent gate electrodes, and the spacing depends upon the amount by which the time delay of light being reflected within the programmable delay generator 4200 can be adjusted. During operation, a gate voltage is applied to one of the axially arranged gate electrodes 120 sufficient to increase the strength of the corresponding region of changeable propagation constant sufficiently to reflect the light travelling within the optical waveguide device.

As shown in FIG. 43, the gate electrode from grating device 4202*c* is energized, so incident light path 4302 will reflect off the region of changeable propagation constant 190 associated with that gate electrode and return along light path 4304. The delay applied to light travelling within the channel waveguide is therefore a function of the length of the channel waveguide between where light is coupled into and/or removed from the channel waveguide and where the actuated gate electrode projects its series of planes or regions of changeable propagation constant. The light has to travel the length of the incident path and the return path, so the delay provided by the programmable delay generator generally equals twice the incident path length divided by the speed of light. By electronically controlling which of the grating devices 4202*a* to 4202*e* are actuated at any given time, the delay introduced by the delay generator 4200 can be dynamically varied.

In one embodiment of operation for the programmable delay generator 4200, only one axially arranged gate electrode 120 is energized with sufficient strength to reflect all the light since that electrode will reflect all of the light travelling within the waveguide. This embodiment provides a so-called hard reflection since one plane or regions of changeable propagation constant reflects all of the incident light to from the return light.

In another embodiment of operation for the programmable delay generator 4200, a plurality of adjacent, or axially spaced as desired, gate electrodes 120 are energized using some lesser gate voltage level than applied in the prior embodiment to reflect all of the light. The planes or regions of changeable propagation constant associated with each actuated axially arranged gate electrode 120 each reflect some percentage of the incident light to the return light path. The latter embodiment uses "soft" reflection since multiple planes or regions of changeable propagation constant reflect the incident light to from the return light.

Figure 44:
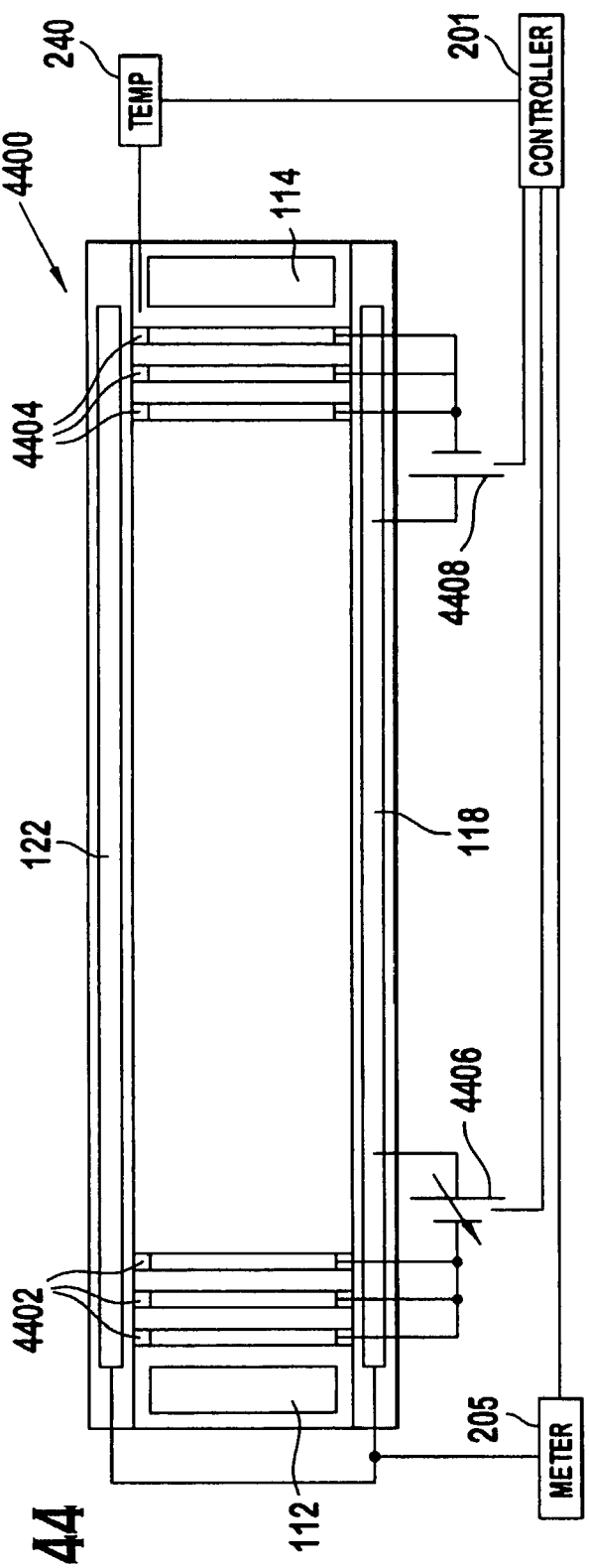
FIG. 44 shows a top view of one embodiment of an optical resonator that includes a plurality of optical waveguide devices that act as optical mirrors.

Optical resonators are used to contain light within a chamber (e.g., the channel waveguide) by having the light reflect between optical mirrors located at the end of that waveguide. The FIG. 44 embodiment of resonator 4400 is configured as a channel waveguide so the light is constrained within two orthogonal axes due to the total internal reflectance (TIR) of the channel waveguide. Light is also constrained along the third axis due to the positioning of TIR mirrors at each longitudinal end of the waveguide. The optical resonator 4400 forms a type of Fabry-Perot resonator. Resonators, also known as optical cavities, can be integrated in such structures as lasers.

Figure 45:
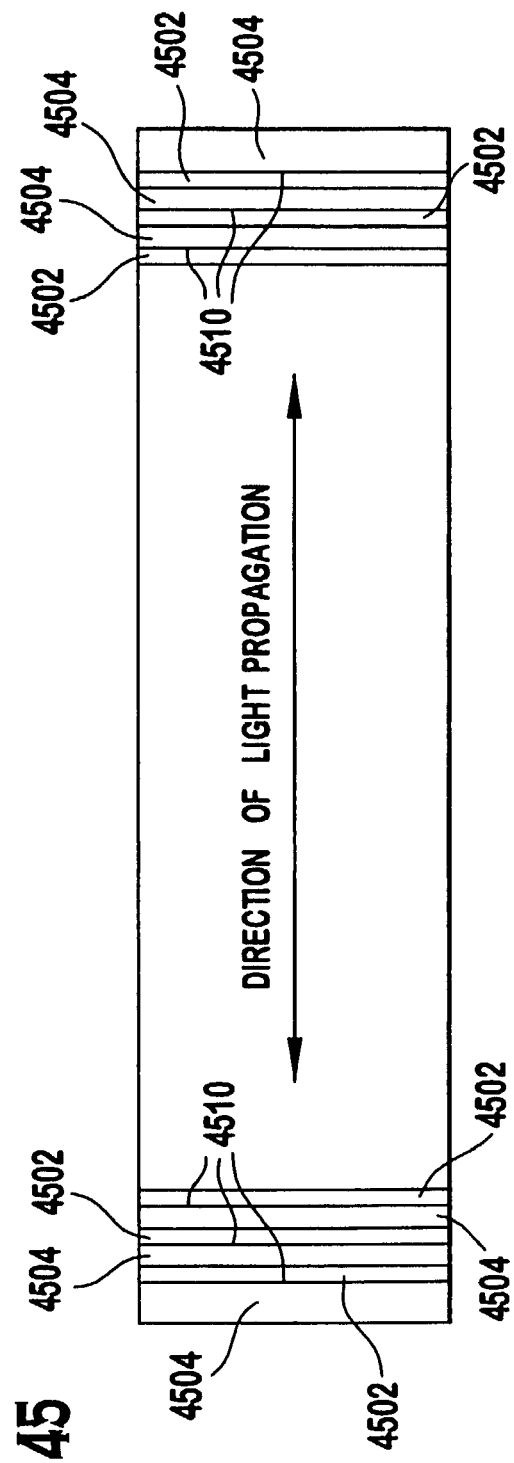
FIG. 45 shows a top cross sectional view taken through the waveguide of the optical resonator shown in FIG. 44.

The resonator 4400 includes a optical waveguide of the channel type, one or more input mirror gate electrodes 4402, one or more output mirror gate electrodes 4404, and controllable voltage sources 4406 and 4408 that apply voltages to the input mirror gate electrodes 4402 and the output mirror gate electrodes 4404, respectively. FIG. 45 shows a top view of the channel waveguide of the resonator 4400 of FIG. 44. The channel waveguide includes, when the voltage sources 4406 and/or 4408 are actuated, am alternating series of high propagation constant bands 4502 and low propagation constant bands 4504.

The high propagation constant bands 4502 correspond to the location of the input mirror gate electrodes 4402 or the output mirror gate electrodes 4404. The low propagation constant bands 4504 correspond to the bands between the input mirror gate electrodes 4402 or the output mirror gate electrodes 4404. The high propagation constant bands 4502 and the low propagation constant bands 4504 extend vertically through the waveguide. The input mirror gate electrodes 4402 and the output mirror gate electrodes 4404 can be shaped to provide, e.g., a concave mirror surface if desired. Additionally, deactuation of the input mirror gate electrodes 4402 or the output mirror gate electrodes 4404 removes any effect of the high propagation constant bands 4502 and low propagation constant bands 4504 from the waveguide of the resonator 4400. Such effects are removed since the propagation constant approaches a uniform level corresponding to 0 volts applied to the gate electrodes 4402, 4404.

As light travels axially within the waveguide of the resonator 4400, some percentage of the light will reflect off any one or one or more junctions 4510 between each high propagation constant band 4502 and the adjacent low propagation band 4504, due to the reduced propagation constant. Reflection off the junction 4510 between high index areas and low index areas forms the basis for much of thin film optical technology. the junction 4510 between each high propagation constant band 4502 and the adjacent low propagation constant band 4504 can be considered analogous to gratings. The greater the number of, and the greater the strength of, such junctions 4510, the more light that will be reflected from the respective input mirror gate electrodes 4402 or the output mirror gate electrodes 4404. Additionally, the greater the voltage applied from the controllable voltage sources 4406 and 4408 to the respective input mirror gate electrode 4402 or the output mirror gate electrodes 4404, the greater the difference in propagation constant between the high propagation constant band 4504 and the adjacent low propagation constant band 4504 for the respective input mirror gate electrodes 4402 or the output mirror gate electrodes 4404.

Figure 46:
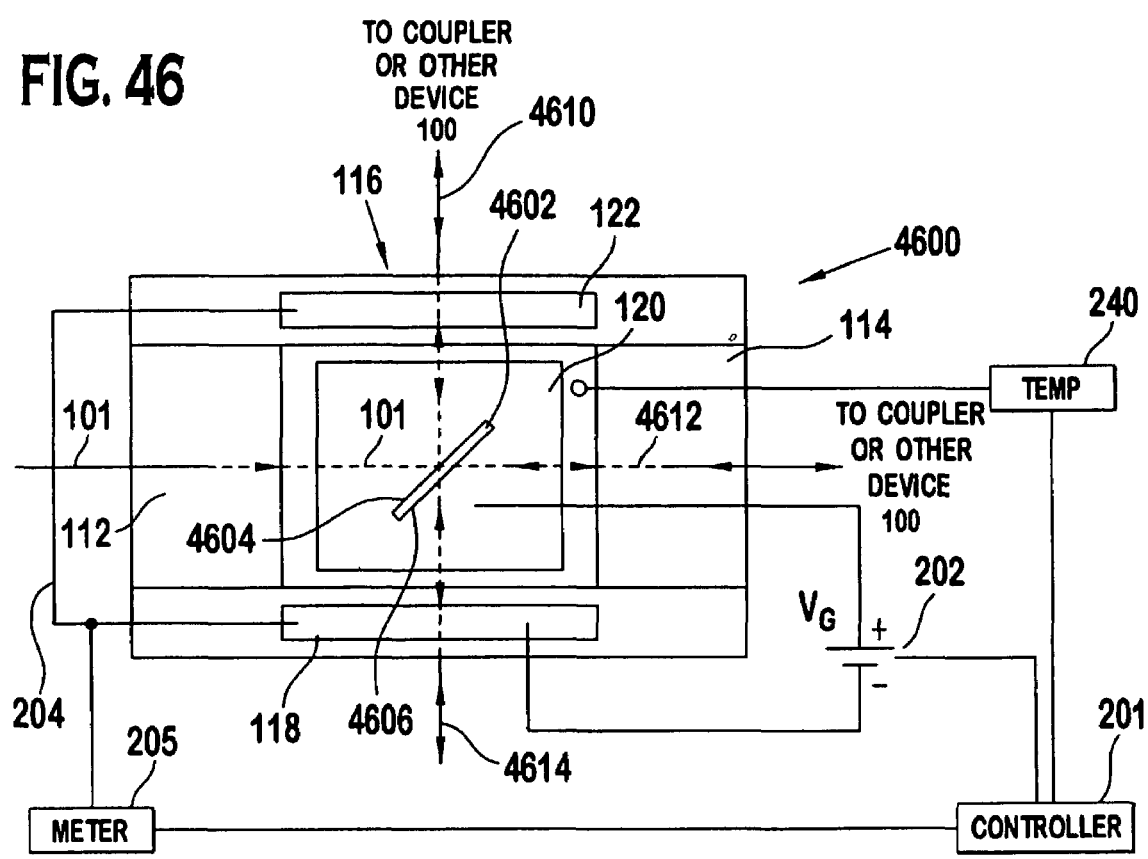
FIG. 46 shows a top view of one embodiment of an optical waveguide device configured as a beamsplitter.

FIG. 46 shows a top view of one embodiment of beamsplitter 4600 that is formed by modifying the optical waveguide device 100 shown in FIG. 46. The beamsplitter includes an input mirror 4602 having a first face 4604 and a second face 4606. The mirror 4602 may be established in the waveguide in a similar manner to a single raised land to provide a varied electrical field at the insulator/semiconductor interface in one of the embodiments of gratings shown in FIGS. 20 to 22. The voltage level applied to the gate electrode 120 is sufficient to establish a relative propagation constant level in the region of changeable propagation constant to reflect desired percentage of light following incident path 101 to follow path 4610. The region of changeable propagation constant takes the form of the mirror 4602. Light following incident path 101 that is not reflected along path 4610 continues through the mirror 4602 to follow the path 4612. Such mirrors 4602 also reflect a certain percentage of return light from path 4612 to follow either paths 4614 or 101. Return light on path 4610 that encounters mirror 4602 will either follow path 101 or 4614. Return light on path 4614 that encounters mirror 4602 will either follow path 4612 or path 4610. The strength of the voltage applied to the gate electrode 120 and the resulting propagation constant level of the region of changeable propagation constant in the waveguide, in addition to the shape and size of the mirror 4602 determine the percentage of light that is reflected by the mirror along the different paths 101, 4610, 4612, and 4614.

4H. Optical Application Specific Integrated Circuits (OASICS)

Slight modifications to the optical functions and devices such as described in FIGS. 16 to 25, taken in combination with free-carrier based active optics, can lead to profound changes in optical design techniques. Such modifications may only involve minor changes to the structure of the gate electrode.

The optical waveguide device may be configured as a variable optical attenuator that changes voltage between the gate electrode, the first body contact electrode, and the second body contact electrode, such that a variable voltage is produced across the width of the waveguide. This configuration results in a variable attenuation of the light flowing through the waveguide across the width of the waveguide.

If a magnetic field is applied to the 2DEG, then the free-carriers exhibit birefringence. The degree of birefringence depends on the magnitude of the magnetic field, the free-carrier or 2DEG density, and the direction of propagation of the optical field relative to the magnetic field. The magnetic field may be generated by traditional means, i.e., from passing of current or from a permanent magnet. The magnetic field induced birefringence can be harnessed to make various optical components including polarization retarders, mode couplers, and isolators.

V. Optical Circuits Including Optical Waveguide Devices

5A. Optical Circuits

The optical functions of the optical waveguide devices described above can be incorporated onto one (or more) chip(s) in much the same way as one currently designs application specific integrated circuits (ASICS) and other specialized electronics, e.g., using standard libraries and spice files from a foundry. The optical functions of the optical waveguide devices described herein can be synthesized and designed in much the same way as electronic functions are, using ASICS. One may use an arithmetic logic unit (ALU) in a similar manner that ASICS are fabricated. This level of abstraction allowed in the design of optical circuits by the use of optical waveguide devices improves the capability of circuit designers to create and fabricate such large scale and innovate designs as have been responsible for many of the semiconductor improvements in the past.

As discussed above, different devices can be constructed by modifying the basic structure described in FIG. 1 by, e.g., changing the shape, configuration, or thickness of the gate electrode. These modified devices can provide the building blocks for more complex circuits, in a similar manner that semiconductor devices from the basic building blocks for more complex integrated circuit structures.

The disclosure now describes a variety of integrated optical/electronic circuits that can be constructed using a plurality of optical waveguide devices of the type described above. The integrated optical/electronic circuits described are illustrative in nature, and not intended to be limiting in scope. Following this description, it becomes evident that the majority of functions that are presently performed by using current integrated circuits can also be formed using integrated optical/electronic circuits. The advantages are potential improvement in operating circuit capability, cost, and power consumption. It is to be understood that certain ones of the functions shown as being performed by an active optical waveguide device in the following integrated optical/electronic circuits may also be performed using a passive device. For example, devices 4708 and 4712 in the embodiment shown in FIG. 47 may be performed by either active devices or passive devices. The embodiment of beamsplitter 4600 shown in FIG. 46 can either be an active or passive device. The selection of whether to use an active or passive device depends, e.g., on the operation of the integrated optical/electronic circuit with respect to each particular optical waveguide device, and the availability of each optical waveguide device in active or passive forms.

It is emphasized that the multiple optical waveguide devices of the types described above relative to FIG. 1-3, 4, or 5 may be combined in different ways to form the following described integrated optical/electronic circuits shown, for example, in the embodiments of FIGS. 18, 19, 34, 36, 38-45, and 47-49. For example, the different integrated optical/electronic circuit embodiments may be formed using a plurality of optical waveguide devices formed on a single substrate. More particularly, the different embodiments of integrated optical/electronic circuits may comprise multiple optical waveguide devices attached to different portions of a single waveguide. Alternatively, the different embodiments of integrated optical/electronic circuits including multiple optical waveguide devices may be formed on a plurality of discrete optical waveguide devices.

5B. Dynamic Gain Equalizer

FIG. 39 shows one embodiment of a dynamic gain equalizer 3900 comprising a plurality of optical waveguide devices. The dynamic gain equalizer 3900 comprises a wavelength separator 3902 (that may be, e.g., an arrayed waveguide or an Echelle grating), a beam splitter 3904, a monitor 3906, the controller 201, a variable optical attenuator bank 3910, a wave length combiner 3912, and an amplified 3914. Dynamic gain equalizers are commonly used to equalize the strength of each one of a plurality of signals that is being transmitted over relatively long distances. For example, dynamic gain equalizers are commonly used in long distance optical telephone cables and a considerable portion of the signal strength is attenuated due to the long transmission distances between e.g., states or countries.

The wavelength separator 3902 acts to filter or modulate the wavelength of an incoming signal over waveguide 3916 into a plurality of light signals. Each of these light signals has a different frequency. Each of a plurality of waveguides 3918a to 3918d contain a light signal of different wavelength $\lambda_1$ to $\lambda_n$, the wavelength of each signal corresponds to a prescribed limited bandwidth. For example, waveguide 3918a carries light having a color corresponding to wavelength $\lambda_i$ while waveguide 3918b carries a light having a color corresponding to wavelength $\lambda_2$, etc.

Each of the waveguides 3918a to 3918d is input into the beam splitter 3904. The beam splitter outputs a portion of its light into a variable optical attenuator 3910, and also deflects a portion of its light to the monitor 3906. The monitor 3906 senses the proportional signal strength that is being carried over waveguide 3918a to 3918d. Both the monitor 3906 and the beam splitter 3908 may be constructed using the techniques for the optical waveguide devices described above. The controller 201 receives a signal from the monitor that indicates the signal strength of each monitored wavelength of light being carried over waveguides 3918a to 3918d.

The controller monitors the ratios of the signal strengths of the different wavelength bands of light carried by waveguides 3918a to 3918d, and causes a corresponding change in the operation of the variable optical attenuator bank 3910. The variable optical attenuator bank 3910 includes a plurality of variable optical attenuators 3930a, 3930b, 3930c, and 3930d that are arranged in series. Each VOA selectively attenuates light that originally passed through one of the respective waveguides 3918a to 3918d. The number of variable optical attenuators 3930a to 3930d in the variable optical attenuator bank 3910, corresponds to the number of light bands that are being monitored over the waveguides 3918a to 3918d. If the signal strength of one certain light band is stronger than another light band, e.g., assume that the light signal travelling through waveguide 3918a is stronger than the light signal travelling through 3918b, then the stronger optical signals will be attenuated by the desired attenuation level by the corresponding attenuator. Such attenuation makes the strength of each optical signal substantially uniform.

As such, all of the signal strengths on the downstream side of the variable optical attenuators 3930a, 3930b, 3930c, and 3930d should be substantially equal, and are fed into a wavelength signal combiner 3912, where all the signals are recombined into a single signal. The optical signal downstream of the waveguide combiner 3912, therefore, is gain equalized (and may be considered as gain flattened). The signal downstream of the wavelength combiner 3912 may still be relatively weak due to a faint original signal or the relative attenuation of each wavelength by the variable optical attenuator. Therefore, the signal is input into the amplifier 3914. The amplifier, that in one embodiment is an Erbium Doped Fiber Amplifier (EDFA), amplifies the strength of the signal uniformly across the different bandwidths (at least from $\lambda_1$ to $\lambda_n$) to a level where it can be transmitted to the next dynamic gain equalizer some distance down output waveguide 3932. Using this embodiment, optical signals can be modulated without being converted into, and from, corresponding electronic signals. The variable optical attenuators 3930a to 3930d and the wave length combiner 3912 can be produced and operated using the techniques described above relating to the optical waveguide devices.

FIG. 40 shows another embodiment of a dynamic gain equalizer 4000. The beam splitter 4004 and the monitor 4006 are components in the FIG. 40 embodiment of dynamic gain equalizer 4000 that are located differently than in the FIG. 39 embodiment of dynamic gain equalizer 3900. The beam splitter 4404 is located between the variable optical attenuator (VOA) bank 3910 and the wavelength combiner 3912. The wavelength combiner 3912 may be fashioned as an arrayed waveguide (AWG) as shown in the embodiment of FIG. 34 (in a wavelength multiplexing orientation). The beam splitter 4004 is preferably configured to reflect a relatively small amount of light from each of the respective VOAs 3930a, 3930b, 3930c, and 3930d. The beam splitter 4004 is configured to reflect a prescribed percentage of the light it receives from each of the VOAs 3930a to 3930d to be transmitted to the monitor 4006. The monitor 4006 converts the received light signals which relate to the strength of the individual light outputs from the VOAs 3930a to 3930d into a signal which is input to the controller 201. The controller 201, which preferably is configured as a digital computer, an application specific integrated-circuit, or perhaps even an on chip controller, determines the strength of the output signals from each of the respective VOAs 3930a to 3930d and balances the signal strengths by selective attenuation. For example, assume that the output signal of VOA2 3930b is stronger than that of VOA3 3930c, as well as the rest of the VOAs. A signal attenuator would be actuated to attenuate the VOA2 3930b signal appropriately. As such the controller 201 selectively controls the attenuation levels of the individual VOAs 3930a to 3930d.

Each output light beam from VOAs 3930a to 3930d that continues straight through the beam splitter 4004 is received by the wavelength combiner 3912, and is combined into a light signal that contains all the different wavelength signals from the combined VOAs 3930a to 3930d. The output of the wavelength 3912 is input into the amplifier, and the amplifier amplifies the signal uniformly to a level wherein it can be transmitted along a transmission waveguide to, for example, the next dynamic gain equalizer 4000.

5C. Self Aligning Modulator

Figure 47:
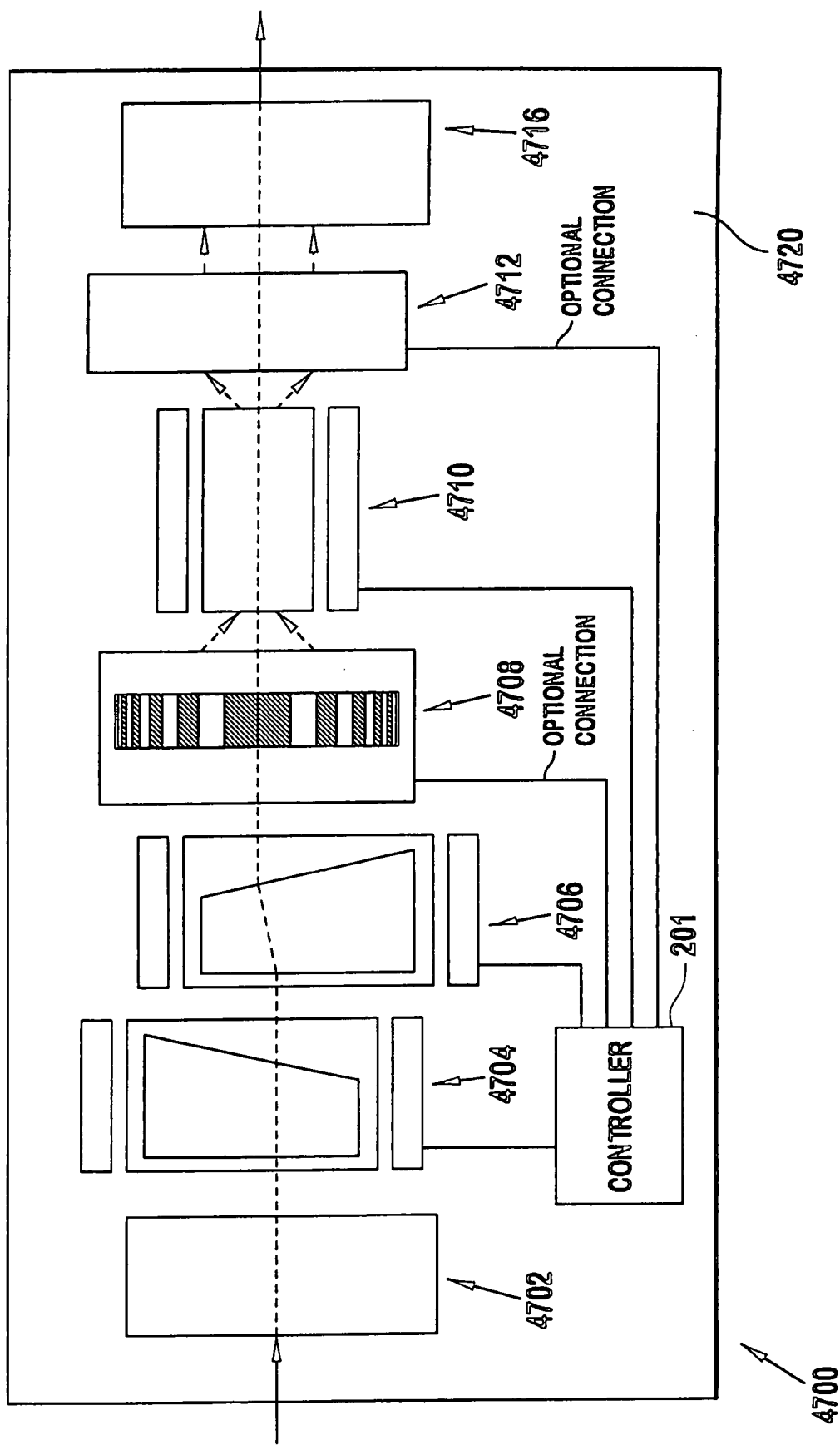
FIG. 47 shows a top view of one embodiment of a self aligning modulator including a plurality of optical waveguide devices.

The FIG. 47 embodiment of self-aligning modulator 4700 is another system that performs an optical function that may include a plurality of optical waveguide devices. the self-aligning modulator 4700 includes an input light coupler 4702m a first deflector 4704, a second deflector 4706, an input two dimensional lens 4708 (shown as a grating type lens), a modulator 4710, an output two dimensional lens 4712 (shown as a grating type lens), an output light coupler 4716, and the controller 201.

The input light coupler 4702 acts to receive input light that is to be modulated by the self-aligning modulator 4700, and may be provided by any type of optical coupler such as an optical prism. The first deflector 4704 and the second deflector 4706 are directed to operate in opposed lateral directions relative to the flow of light through the self-aligning modulator 4700. The input two dimensional lens 4708 acts to focus light that it receives from the deflectors 4704 and 4706 so the light can be directed at the modulator 4710. The modulator 4710 modulates light in the same manner as described above. The modulator may be formed as one of the optical waveguide devices shown in FIGS. 103, 4, and 5. The deflected light applied to the modulator 4710 is both aligned with the modulator and focused. the output two-dimensional lens 4712 receives light output from the modulator 4710, and focuses the light into a substantially parallel path so that non-dispersed light can be directed to the output light coupler 4716. The output light coupler 4716 receives light from the output two-dimensional lens 4712, and transfers the light to the outside of the self-aligning modulator 4700. The controller 201 may be, e.g., a microprocessor formed on a substrate 4720. The controller 201 controls the operation of all the active optical waveguide devices 4704, 4706, 4708, 4710, and 4712 included on the self-aligning modulator 4700.

While the modulator 4710 and the two-dimensional lenses 4708, 4712 are shown as active optical waveguide devices, it is envisioned that one or more passive devices may be substituted while remaining within the scope of the present invention. The two-dimensional lenses 4708, 4712 are optional, and the self-aligning modulator will operate with one or none of these lenses. During operation, the first deflector 4704 and the second deflector 4706 are adjusted to get the maximum output light strength through the output light coupler 4716.

Figure 48:
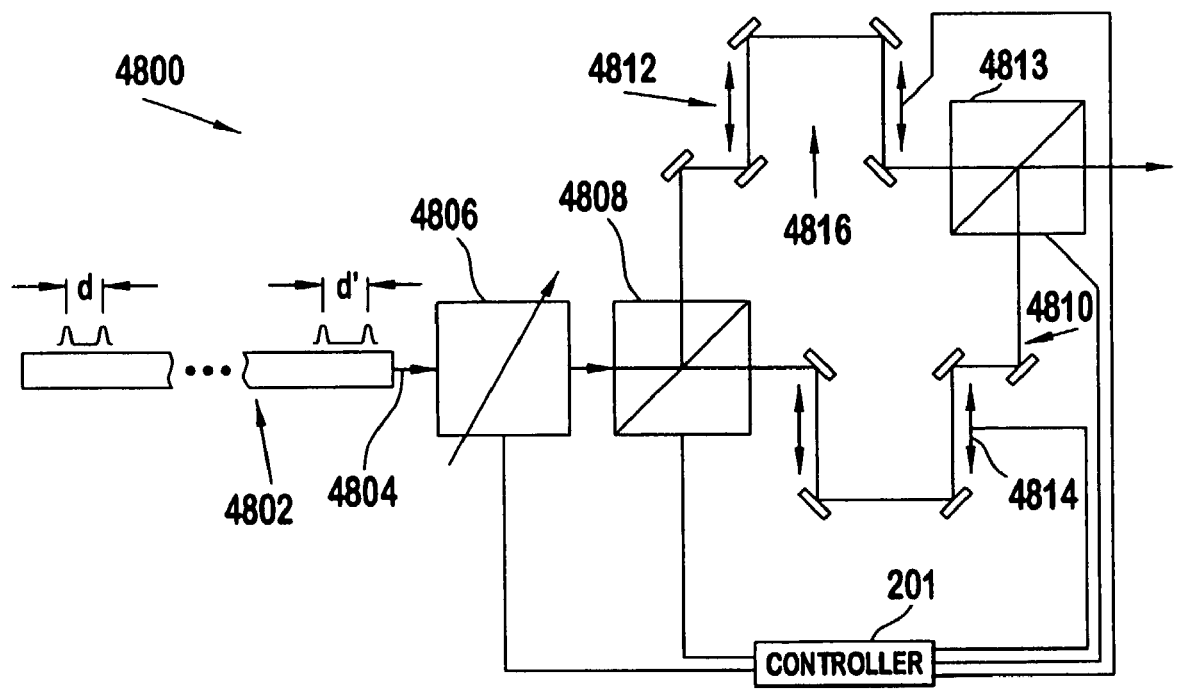
FIG. 48 shows a top view of one embodiment of a polarizing controller including one or more programmable delay generators of the type shown in FIGS. 42 and 43.
Figure 49:
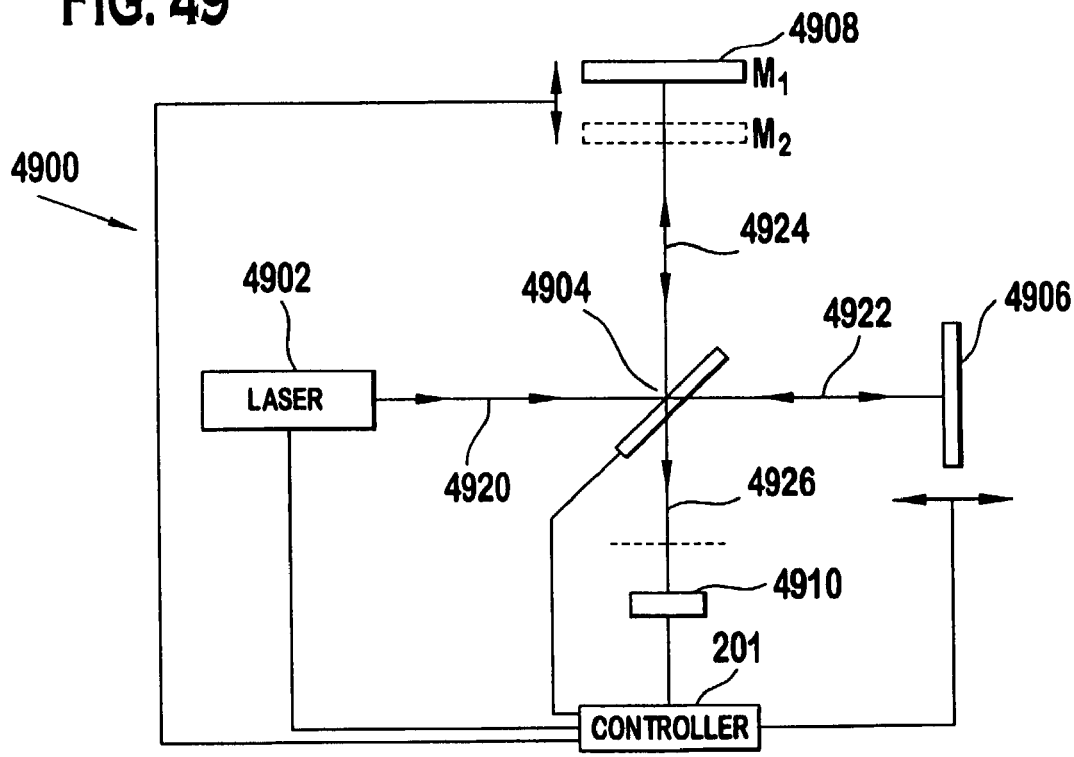
FIG. 49 shows a top view of one embodiment of an interferometer including one or more programmable delay generators of the type shown in FIGS. 42 and 43.

The self-aligning modulator 4700 ensures that a maximum, or specified level, amount of light applied to the input light coupler 4702 is modulated by the modulator 4710 and released to the output light coupler 4716. The performance of the self-aligning modulator system 4700 can also be checked simultaneously. For instance, if light exiting from the output light coupler is reduced, the deflectors, lenses, and the monitor may each be individually varied to determine whether it causes any improvement in operation. other suitable control techniques and algorithms may be used to derive an optimal operation. FIGS. 47, 48, and 49 further demonstrate how a variety of optical waveguide devices may be located on a single substrate or chip.

One or more optical waveguide devices may be configured as a multi-function optical bench that facilitates alignment of a laser to the fiber. In the optical bench configuration, that is structured similarly to the FIG. 47 embodiment of the self-aligning modulator 4700, a plurality of the FIGS. 1 to 3 4, or 5 embodiments of optical waveguide devices are integrated on the substrate. For example, a waveguide can be formed in the substrate so that only the gate electrode, the first body contact electrode, the second body contact electrode, and the electrical insulator layer have to be affixed to the substrate to form the FET portion. The corresponding FET portions are attached to the substrate (the substrate includes the waveguide). As such, it is very easy to produce a wide variety of optical waveguide devices.

5D. Optical Systems Using Delay Components

FIGS. 48 and 49 show several embodiments of systems that may be constructed using one or more of the embodiments of programmable delay generator 4200 shown in FIGS. 42 and 43. FIG. 48 shows one embodiment of a polarization controller. FIG. 49 shows one embodiment of interferometer.

Polarization control is a method used to limit interference between a plurality of different polarizations that occur, for example, when light is transmitted in a fiber for a large distance such as 3,000 kilometers or more. Light that is to be transmitted over the fiber is often split into two polarizations, referred to as P polarization and S polarization. the polarization is received at the other end of the fiber in some arbitrary polarization state since the fiber may encounter different propagation constants for the P polarization signal and the S polarization signal. Therefore, the P polarization signal and the S polarization signal may be modulated within the fiber differently, and may travel at different rates, and may be attenuated differently. For example, the duration between a first polarization and a second polarization may extend from a duration indicated as d to a longer duration shown as d' as the signal is transmitted over a long transmission fiber. When multiple data bits are transmitted, the P polarization signal and the S polarization signal for adjacent bits may overlap due to the different velocities of the polarizations. For example, one polarization of the previous bit is overlapping with the other polarization of the next bit. If a network exceeds a hundred picoseconds at 10 gigahertz, there is a large potential for such overlap. An example of such a network is Network Simplement, a next generation network presently under development in France.

The embodiment of polarization controller 4800 shown in FIG. 48 comprises a transmission fiber 4802, an output 4804, an adjustable polarizer 4806, a beamsplitter 8408, a first path 4810, a second path 4812, and a combiner 4813 that combines the first path and the second path. The first path 4810 includes a programmable delay generator 4814. The second path 4812 comprises a programmable delay generator 4816. The transmission fiber 4802 may be fashioned as a channel waveguide or optical fiber. The adjustable polarizer 4806 may be fashioned as a slab waveguide. The beamsplitter 4808 may be fashioned as the beamsplitter 4600 shown and described relative to FIG. 46. The combiner 4813 may be fashioned as the arrayed waveguide (AWG) shown and described relative to FIG. 34 configured as a multiplexer. The programmable delayed generators 4814 and 4816 may be fashioned as the embodiment of programmable delay generator 4200 shown and described relative to FIG. 42.

During operation, light travelling down the transmission fiber 4802 may be formed from a plurality of temporarily spaced data bits, with each data bit having a P polarization and an S polarization. The temporal separation between a first polarization and a second polarization may separate from a distance shown as d to a distance shown as d'. Approximately every couple thousand miles, or as determined suitable for that particular transmission system, one polarization controller 4800 can be located within the transmission system to limit any adverse overlapping of polarizations.

The polarization controller 4800 acts to adjust the temporal spacing of each signal, and therefor limits the potential that the time between adjacent polarizations from adjacent signals is reduced to the polarizations are in danger of overlapping. As such, as the optical signal is received at the output 4804 of the transmission fiber 4802, it encounters the polarizer 4806 that separates the polarized signals. After the polarized signals are cleanly separated, the signal continues on to the beamsplitter. The beamsplitter 4804 splits the signal into two polarizations, such that a first polarization follows the first path 4810 and the second polarization follows a second path 4812. The programmable delay generator 4814 and 4816 are included respectively in the first path 4810 and the second path 4812 to temporally space the respective first polarization (of the P or S variety) and the second polarization (of the opposed variety) by a desired and controllable period. Providing a temporal delay in the suitable programmable delay generator 4814, 4816 allows the controller 201 to adjust the temporal spacing between the P polarization and the S polarization by a prescribed time period, as dictated by the operating conditions of the network. It is common in long data transmission systems to have the P polarization and the S polarization temporally separated further apart. The polarization controller 4800 readjusts the time between the S polarization and the P polarization. As such, the S polarization or the P polarization will not overlap with the polarizations from adjacent signals.

For a given fiber, each color has its own polarization controller 4800. There might be 80 colors being used in a typical optical fiber, so there have to be a large number of distinct polarization controllers to handle all the colors in a fiber. A central office for a telephone network may be terminating a large number of fibers (e.g., 100). As such, a central office may need 8000 polarization controllers at a central office to deal with the dispersion problem on all of their fibers. As such, expense and effectiveness of operation of each polarization controller are important.

Figure 50:
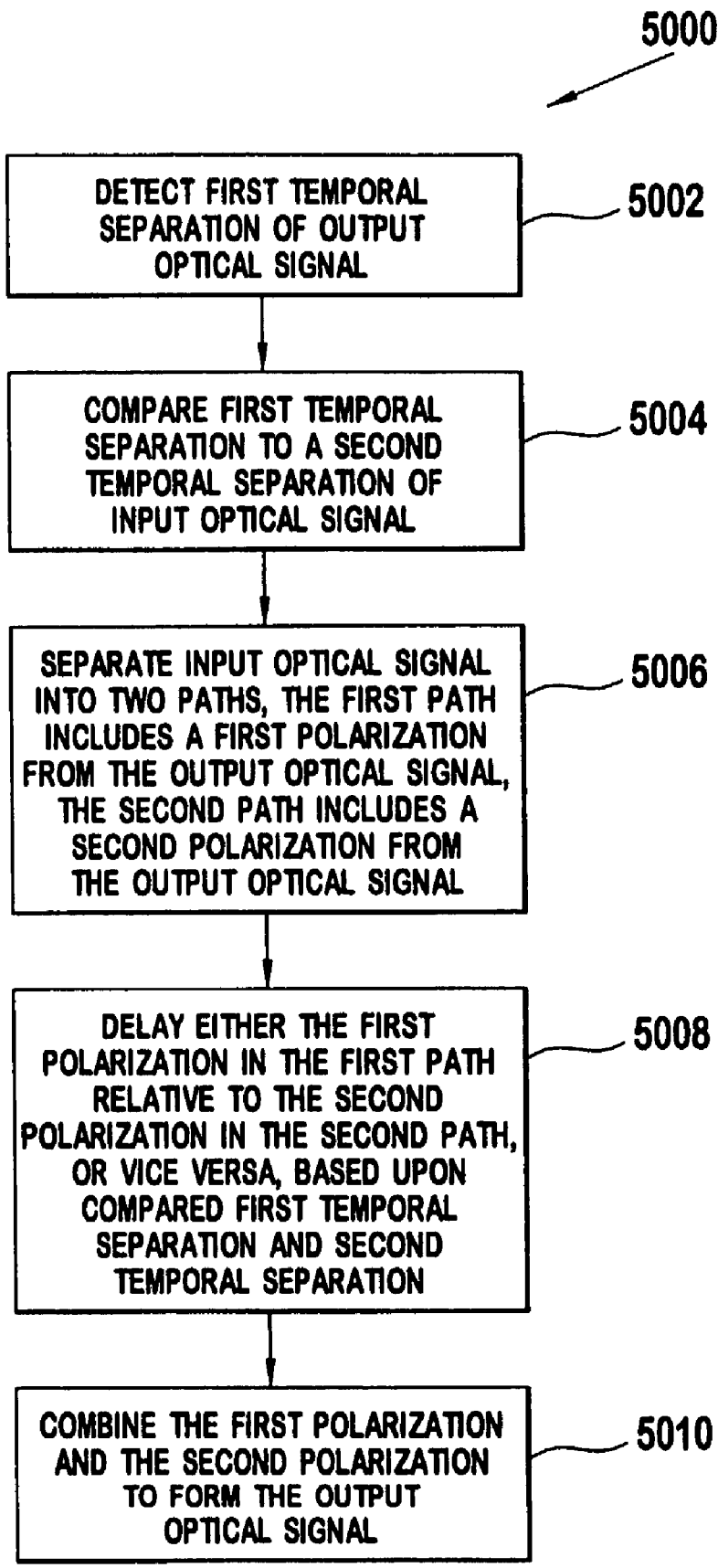
FIG. 50 shows a flow chart of method performed by the polarization controller shown in FIG. 48.

FIG. 50 shows one embodiment of a method 5000 that can performed by the controller 201 in maintaining the temporal separation of a first polarization and a second polarization between an input optical signal and an output optical system. The method 5000 starts with block 5002 in which the controller detects the first temporal separation of a first polarization and a second polarization in the output optical signal. The output optical signal may be considered to be that signal which is applied to the input 4804 in FIG. 48, as referenced by the character d.

The method 5000 continues to block 5004 in which the controller 201 compares the first temporal separation of the output optical signal to a second temporal separation of an input optical signal. The input optical signal is that signal which is initially applied to the transmission fiber, and is indicated by the reference character d in FIG. 48. The controller 201 typically stores, or can determine, the value of the second temporal separation between the first polarization and the second polarization. For example, a transmitter, or transmission system, that generates the signal using two polarizations may typically provide a fixed delay d between all first polarizations and the corresponding second polarizations in the input optical signal. Alternatively, the controller 201 may sense whether the temporal separation distance d' between first polarization and the second polarization of the output optical signal are becoming too far apart. In both cases it is desired to reduce the second temporal separation.

The method 5000 continues to step 5006 in which the controller 201 separates the input optical signals into two paths, indicated as the first path 4810 and the second path 4812 in FIG. 48. The separated first polarization from the output optical signal is transmitted along the first path 4810. The separated second polarization from the output optical signal is transmitted along the second path 4812.

The method continues to step 5008 in which the controller, using either the first programmable delay generator 4814 or the second programmable delay generator 4816 that are located respectively in the first path 4810 and the second pth 4812, delay the light flowing through their respective paths. Such a delay of the light along each respective path 4810, 4812 corresponds to the respective first polarization or the second polarization travelling through each respective path. One embodiment of the delay of the light in the respective programmable delay generators 4814, 4816 is provided in a similar manner as described in the embodiments of programmable delay generator 4200 shown in FIGS. 42 and 43. The method 5000 continues to block 5010 in which the first polarization that travels over the first path 4810 and the second polarization that travels over the second path 4812 are combined (and include the respective delays for each polarization). Combining these signals form an output optical signal having its temporal spacing between the first polarization and the second polarization modified. This output optical signal having modified temporal spacing may be input as an input optical signal to a new length of transmission fiber, or may be transmitted to the end user.

FIG. 49 shows one embodiment of an interferometer that may be constructed using optical waveguide devices, including one or more programmable delay generators 4200. The interferometer 4900 (e.g., a Michelson interferometer) comprises a laser 4902, a beamsplitter 4904, a first programmable delay generator 4906, a second programmable delay generator 4908 and an interference detector 4910. In the interferometer 4900, one or both of the first programmable delay generator 4906 and the second programmable delay generator 4908 must be provided. If only one of the two programmable delay generators is provided, then a mirror is substituted at the location of the missing programmable delay generator.

During operation, coherent light is applied from the laser 4902. The coherent light follows path 4920 and encounters the beamsplitter 4904. The beamsplitter splits the coherent light from the laser into to follow either path 4922 or path 4924. Light following path 4922 will encounter the first programmable delay generator 4906 and will be reflected back toward the beamsplitter. Light following path 4924 will encounter the second programmable delay generator 4908 and will be reflected back toward the beamsplitter 4904. As a return path of light from travelling along path 4924 and 4922 encounters the beamsplitter, a certain proportion of the return light following both paths 4924 and 4922 will be reflected to follow path 4926.

Based upon the position of the first and second programmable delay generators 4906, 4908, the light travelling along paths 4922 and 4924 will travel a different distance (the distance traveled include the original path and the return path from the programmable delay generator). These differences in distances will be indicated by the interference pattern in the signal following path 4926. Depending on the wavelength of light used in the Michelson interferometer, the Michelson interferometer may be used to measure differences in distance between path 4922 and 4924. In one embodiment, one or more of the programmable delay generator shown as 4906, 4908 is replaced by a mirror or a like device. For example, a modified Michelson interferometer may be used as in optical interference topography in which the position of the retina, relative to the eye, is measured to determine the state of the eye. The retina acts as a mirror, and focuses some of the light out of the eye. Therefore, an interferometer, or more specifically an optical interference topography device can detect light reflected off the retina. As such, in the Michelson interferometer, one of the programmable delay generators 4906 or 4908 can be replaced by the eye of the examined patient. The other one of the programmable delay generators 4908, 4906 can be used to measure distances within the eye.

The embodiment of the methods shown in FIGS. 7 and 8 may be used to adjust or calibrate the voltage applied to an electrode of an optical waveguide devices based on variations in such parameters as device age and temperature. These methods rely on such inputs as the temperature sensor 240 measuring the temperature of the optical waveguide device and the meter 205 measuring the resistance of the gate electrode, as well as the controller 201 controlling the operation of the optical waveguide device and controlling the methods performed by FIGS. 7 and 8. The methods may be applied to systems including a large number of optical waveguide devices as well as to a single optical waveguide device. As such, the optical waveguide system, in general, is highly stable and highly scalable.

VI. Generalization of Active Optical Devices in SOI

So far, this disclosure has described many embodiments of active devices in which the 2DEG layer is "patterned" and its strength (i.e. number of free carriers) is modified to achieve various optical functions such as modulation, deflection, etc.

Other simple electronic devices will also server the same purpose in SOI. For example, a diode (p-n junction) in forward bias (see FIG. 81) will result in a large number of free carriers in region 8114 which will then modify an optical beam passing through that region. In reverse bias, the free carriers are removed from the region 8114.

Another example of an electronic device that may not use such a 2DEG layer is a field plated diode (FIG. 90) where the characteristic of the p-n diode are modified by application of "gate voltage" varying the free carrier distribution and thus its effect on the optical beam. In this case, the gate pattern may be used in a similar manner as in 2DEG structures. Yet another example is a simple Schottky diode.

In all of the above, changes in the free carrier distribution, with respect to the electromagnetic field profile in the waveguide will cause various optical functions to be attained. It is intended that this disclosure relate all of these embodiments.

VII. Input/Output Coupling Embodiments

This section describes a variety of embodiments of input/output light couplers 112 that may be used to apply light into, or receive light from, a waveguide included in an integrated optical/electronic circuit 103. Coupler efficiency of the input/output light couplers 112 is a very important consideration for optical waveguide devices since regardless of how effective the design of the various optical waveguide devices, each optical waveguide device depends on the application of light into or out of the optical waveguide device using the input/output light couplers 112.

There are a considerable number of aspects described herein associated with the concept of combing electronic aspects and optical concepts into an integrated optical/electronic circuit 103. This section describes a variety of different operations of, and embodiments of, input/output light couplers 112 included in an integrated optical/electronic circuit 103. The optical functions may use footprints on the integrated optical/electronic circuit 103 that are not used for electronics functions, and otherwise represent wasted space in the integrated optical/electronic circuit 103. The integrated optical/electronic circuit 103 provides a common fabrication/manufacturing platform for optics and electronic circuits and provides common design techniques for building optical and electronic functions.

FIG. 51 shows a side cross section view, and FIG. 52 shows a top view, of one embodiment of the integrated optical/electronic circuit 103 including a plurality of input/output light couplers 112 and an on-chip electronics portion 5101. The on-chip electronics portion 5101 as well as the plurality of input/output light couplers 112 are mounted relative to one of the embodiments on a silicon-on-insulator (SOI) slab waveguide 5100 as shown in FIGS. 53 to 58. The (SOI) slab waveguide 5100 includes the substrate 102, the first electrical insulator layer 104, and the waveguide 106.

Each input/output light coupler 112 includes an evanescent coupling region 5106 and a light coupling portion 5110. The evanescent coupling region 5106 is defined using the upper surface of the waveguide 106 and the lower surface of the light coupling portion 5110. For example, the evanescent coupling configured as a tapered gap portion 51076 may be produced by an angled lower surface of the light coupling portion 5110. A constant gap 5106 may be produced using a level lower surface of the light coupling portion 5110. Each input/output light coupler 112 may at any point in time act as either an input coupler, an output coupler, or both an input and output coupler simultaneously. For those input/output light couplers 112 that are acting as an input coupler, the light enters the light coupling portion 5110, and enters the waveguide 106 through the evanescent coupling region 5106. For those input/output light couplers 112 that are acting as an output coupler, the light passes from the waveguide to the evanescent coupling region 5106, and exits the light coupling portion 5110.

FIG. 51 illustrates certain optical principles of concern to an integrated optical/electronic circuit 103 design. The waveguide 106 has a refractive index of $n_{si}$ while the light coupling portion 5110 has a refractive index of $n_i$. The angle at which light in the light coupling portion 5110 contacts the gap portion 5106 is $\theta_i$. By comparison, the angle at which the light enters the waveguide 106 is the mode angle, $\theta_m$. The mode angle $\theta_m$ varies for each mode of light traveling within the waveguide. Therefore, if the waveguide 106 can support one or more waveguide modes, there will be a plurality of mode angles $\theta_{m1}$, $\theta_{m2}$, and $\theta_{mx}$ depending on the number of modes. For example, a region of the waveguide 106 in one embodiment has a height of 0.2μ formed from silicon that is surrounded by the evanescent coupling region 5106 and the first electrical insulator layer 104 (both of which are formed from glass), supports only a single TE mode angle $\theta_m$ of approximately 56 degrees. The requirements for incident light is that the incident angle $\theta_i$ satisfies equation 23:

$$n_i \sin \theta_i = n_{si} \sin \theta_m,$$

where $\theta_m$ is the mode angle of any particular mode of light.

There are specific requirements for the index of the evanescent coupling region 5106, also known as the gap region. The refractive index of the evanescent coupling region 5106 has to be very close to that of the upper cladding of the waveguide 106. In general, the upper cladding of the waveguide 106 will be one of the often-used materials such as glass, polyamide, or other insulators used in construction of active electronics. The evanescent coupling region 5106 may be made from the same material, air, or filled with a polymer-based adhesive that has a similar refractive index. It is desired for the waveguide to have very close to the same effective mode index in the regions adjacent the evanescent coupling region 5106 as in regions remote from the evanescent coupling region 5106.

The purpose of the on-chip electronics portion 5101 is to apply electricity to any of the desired components adjacent to the waveguide, or to perform other electrical signal processing on the chip. This on-chip electronics portion 5101 is formed using SOI fabrication techniques that include such techniques as metal deposition, etching, metalization, masking, ion implantation, and application of photoresist. The on-chip electronics portion 5101 may be formed in a similar manner as typical SOI electronic chips such as used in the CPU for the Power PC™. The electrical conductors of the on-chip electronics portion 5101 form a complex multi-level array of generally horizontally extending metallic interconnects 5120 and generally vertically extending vias 5121, the latter of which extend between multiple metallic interconnect layers at different vertical levels. The metallic vias 5121 that extend to the lower surface of the on-chip electronics portion 5101 typically contact a metalized portion on the upper surface of the waveguide 106 to controllably apply electrical signals thereto. For instance, in the embodiment of optical waveguide device shown in FIG. 2, the electricity applied via the voltage source 202 and the substantially constant potential conductor 204 are selectively applied via the electrical connections comprising a maze of generally vertically extending metallic vias 5121 and generally horizontally extending metallic interconnects 5120. The substantially constant potential conductor 204 acts to the voltage level of the first body contact electrode 118 to the voltage level of the second body contact electrode 122. Although a particular configuration of metallic vias 5121 and horizontally extending metallic interconnects 5120 within the on-chip electronics portion 5101 is shown in FIG. 51, other configurations of on-chip vias and interconnects are possible, and are considered within the scope of the present invention.

The electronics portion 5101 may be considered as controlling the operation of the active optical circuits, as shown, e.g., in FIGS. 1 through 5, 9-19, etc. Opto-electric functions can therefore be performed on a single chip, such as a silicon-on-insulator (SOI) type chip. As such, planar lithography and/or projection lithography techniques can be used to form the integrated optical/electronic circuits of the present invention in a manner wherein optical components (e.g., waveguides and passive prisms and lens) and electrical components (e.g., transistors, diodes, conductors, contacts, etc.) can be formed and fabricated simultaneously on the same substrate. The electrical components can be used to control the function of the electrical devices, or the function of optical components (e.g., to make a passive optical device into active optical device) to perform other signal processing on the chip.

It is envisioned that the levels of silicon layers of the on-chip electronics portion 5101 are formed simultaneously with the one or more layers of the evanescent coupling region 5106, (or the gap portion), and/or the light coupling portion 5110 of the input/output light coupler 112. In other words, any pair of vertically separated layers on the on-chip electronics portion 5101 may be formed simultaneously with any portion of optical elements 5106, 5110 that is substantially the same vertical level using, for example, planar lithography or projection lithography techniques. Therefore, any one of the one or more layers of the evanescent coupling region 5106 and/or the light coupling portion 5110 that are at generally the same vertical height as the layers on the electronics portion 5101 will be formed simultaneously, although the different portions will undergo different doping, masking, ion implantation, or other processes to provide the desired optical and/or electronic characteristics. As such, technology, know how, processing time, and equipment that has been developed relative to the fabrication of electronic circuits (e.g., techniques for fabricating thin SOI semiconductor chips) can be used to construct optical and electronic circuits simultaneously on the same substrate.

Different embodiments of the evanescent coupling region 5106 include a raised evanescent coupling region, a lowered evanescent coupling region, a lack of an evanescent coupling region 5106, or an angled evanescent coupling region (an evanescent coupling region is formed with a tapered gap portion 5106, and as such is provided the same reference number since they are likely the same structural component). Different embodiments of the evanescent coupling region 5106 can be formed from air, an optically clean polymer (that can be configured to act as an adhesive to secure the input/output light coupler 112), or a glass. It is envisioned that certain embodiments of evanescent coupling region 5106 in which light is coupled to, or from, the waveguide 106, have a thickness in the order of 0.1µ to 0.5µ. The material of the evanescent coupling region 5106 can be deposited to its desired thickness simultaneously with the deposition of the on-chip electronics portion 103.

Certain embodiments of the input/output light coupler 112 include a gap portion 5106 that is tapered, while other embodiments of the input/output light coupler 112 include a gap portion 5106 that has a uniform height thickness. In one embodiment, the gap portion 5106 is tapered to support one edge of the light coupling portion 5110 at a height of less than 100 microns (and typically only a few microns) above the other edge of the gap portion 5106. Certain embodiments of evanescent coupling region 5106 are formed from an optically transparent material that can secure the light coupling portion 5110. Certain embodiments of the evanescent coupling region 5106 include a gap portion 5106 while in other embodiments, the gap portion 5106 is missing. Certain embodiments of the gap portion 5106 act to support the light coupling portion 5110. Other embodiments of gap portion include a distinct ledge 5502 that is formed during manufacture which supports the light coupling portion 5110 but only act to suitably direct the light beam at a desired mode angle to enter the waveguide 106. Different embodiments of the light coupling portion 5110 include a prism coupling or a grating portion. It is envisioned that certain embodiments of the light coupling portion 5110 are formed either from silicon or polysilicon.

FIGS. 53 to 58 illustrate an exemplary variety of embodiments of input/output light coupler 112. In one embodiment of input/output light coupler 112, the light coupling portion 5110 (e.g., a prism or grating formed on a wafer) is formed as a separate portion from the element that forms the gap portion 5106 as described relative to the embodiments shown in FIGS. 59 and 60. Additional material may be built-up to allow for some or all of the built-up material to act as sacrificial material that may be partially removed to form, for example, portions of the light coupling portion 5110. In another embodiment of input/output light coupler 112 as described relative to FIG. 56, at least some of the components that form the light coupling portion 5110 are formed simultaneously with the elements that form the combined gap portion 5106. In this disclosure, the term "sacrificial material" generally relates to material that is applied during the processing of the integrated optical/electronic circuit 103, but is not intended to remain in the final integrated optical/electronic circuit 103. The sacrificial material as well as certain portions of the integrated optical/electronic circuit can be formed from materials well known in the art such as polysilicon polyamide, glass, and may be removed using such etching techniques as Chemical Mechanical Polishing (CMP).

In the embodiment of input/output light coupler 112 shown in FIG. 53, the gap portion 5106 formed in the evanescent coupling region 5106 has substantially constant thickness. Any light coupling portion 5110 (e.g., prism or grating) that is mounted on the gap portion 5106, that has a constant thickness, and a base that is substantially parallel to the waveguide 106. The thickness of the evanescent coupling region 5106 is selected to position the base of the light coupling portion 5110 relative to the on-chip electronics portions 5101 such as, e.g., at the same level. Light rays 5120 passing through the embodiment of input/output light coupler 112 shown in FIG. 53 must satisfy the basic principles described relative to FIG. 51, e.g., equation 23.

The light rays 5120 in each of the embodiments of input/output light couplers 112 shown in FIGS. 53 to 58 follow considerably different paths through the different elements to or from the waveguide. The illustrated paths of the light rays 5120 in each of these embodiments of input/output light coupler 112 are intended to be illustrative of possible light paths determined as described relative to FIG. 51, and not limiting in scope.

The embodiment of input/output light coupler 112 shown in FIG. 54 is similar to the embodiment shown in FIG. 53, except that the evanescent coupling region 5106 can be formed considerably thinner etched away, or even entirely removed. In the embodiment of input/output light coupler 112 shown in FIG. 54, the light coupler 112 is mounted directly to the waveguide 106. Light passing through the embodiment of input/output light coupler 112 shown in FIG. 54 must satisfy the basic principles described relative to FIG. 51, e.g., equation 23.

Figure 55:
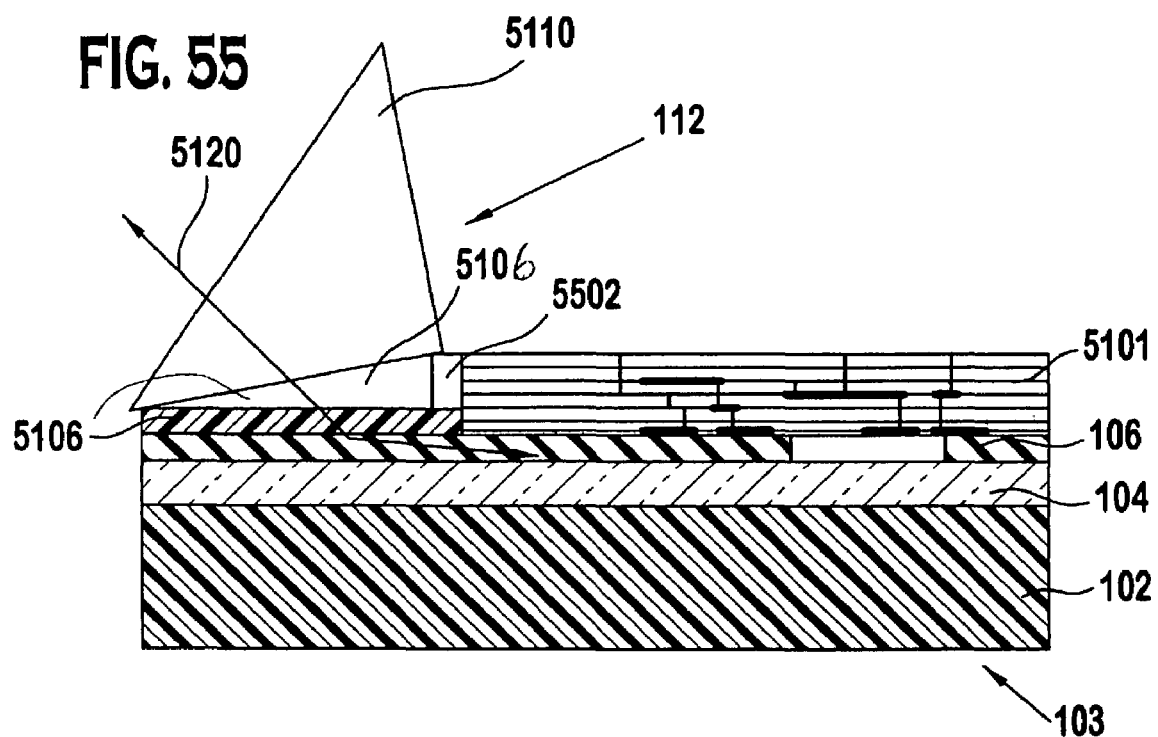
FIG. 55 shows yet another cross-sectional view of yet another alternate embodiment of integrated optical/electronic circuit.

The embodiment of input/output light coupler 112 shown in FIG. 55 includes a ledge 5502 that forms a support base for one edge of the light coupling portion 5110 (e.g., a prism or grating). The ledge 5502 may have thickness that provides the desired angle of the base of the input/output coupler 112. The ledge 5502 is preferably formed by removing sacrificial material at the optical I/O location using an etching process, and the base of the light coupling portion 5110 is angled at a slight angle by resulting it on the ledge 5502. In certain embodiments, the height of the ledge 5502 is in the range of under fifty microns, and may actually be in the range of one or a couple of microns. The gap portion 5106 may be filled with such optically clear polymer or glass material that provides the desired optical characteristics to the light entering into, or exiting from, the waveguide. Light rays 5120 passing through the embodiment of input/output light coupler 112, shown in the embodiment of FIG. 55, must satisfy the basic principles described relative to FIG. 51, e.g., equation 23.

Figure 56:
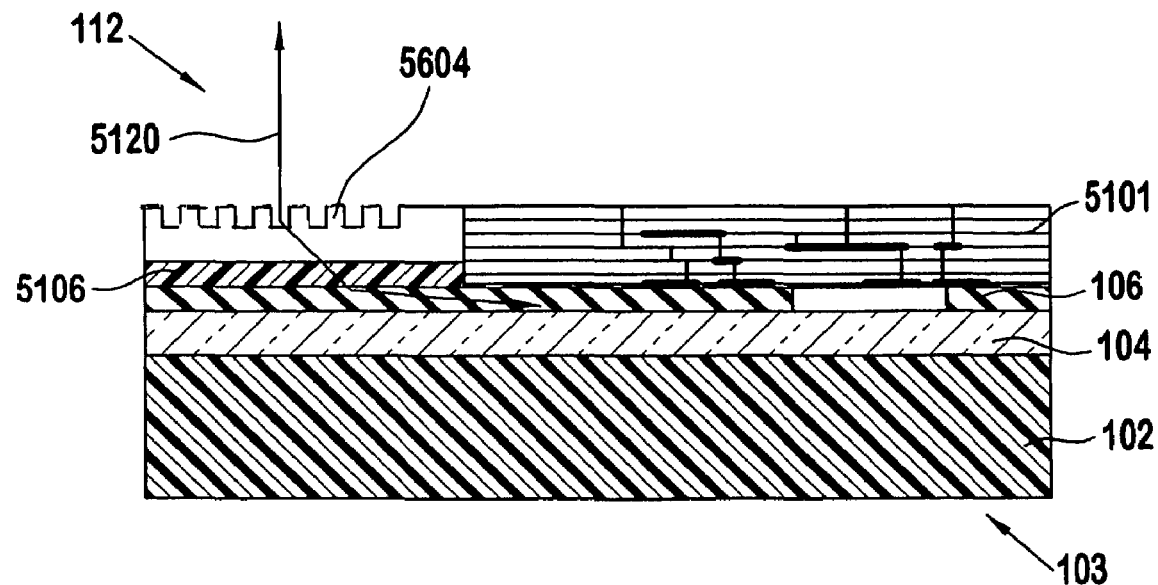
FIG. 56 shows a cross-sectional view of yet another alternate embodiment of integrated optical/electronic circuit.

The embodiment of input/output light coupler 112 shown in FIG. 56 includes a grating 5604 formed on an upper surface of the evanescent coupling region 5106 that may include a tapered or constant thickness gap portion 5106. The grating 5604 may be, e.g., a surface grating formed using the known etching techniques. Light rays 5120 passing through the embodiment of input/output light coupler 112 shown in FIG. 56 must satisfy the basic principles described relative to FIG. 51, e.g., equation 23. The grating can be replaced in general by a diffraction optical element (DOE) causing both a change in the light direction and the spatial extent (e.g., for focusing) to match the expected spatial profile at the base of the light coupling region 5110.

Figure 57:
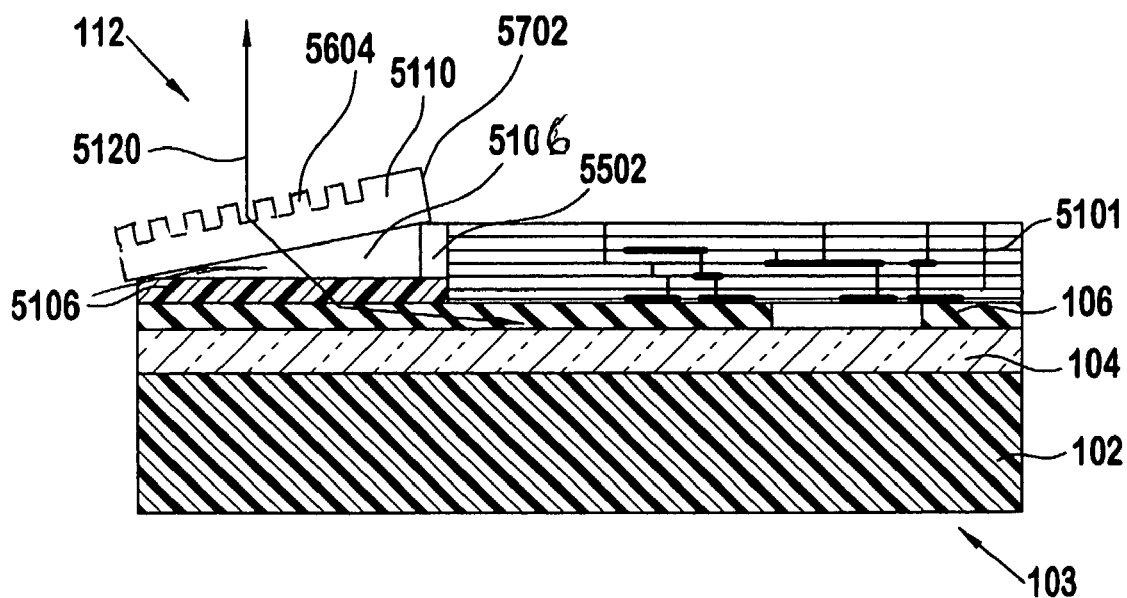
FIG. 57 shows a cross-sectional view of another alternate embodiment of integrated optical/electronic circuit.

The embodiment of input/output light coupler 112 shown in FIG. 57 includes the ledge 5502 that forms a base for one edge of the light coupling portion 5110. The light coupling portion, in this embodiment, includes a wafer 5702 having a grating 5604 formed on an upper surface of the wafer. The ledge may be the desired thickness to provide the desired angle of the light coupling portion, such as in the range of under ten microns in certain embodiments. The ledge 5502 is preferably formed by sacrificial material at the optical I/O location being removed using an etching process, and the base of the wafer 5702 being angled at a slight angle to rest on the ledge. The region between the base of the light coupling portion 5110 and the upper surface of the waveguide 106 is filled with such taper gap material as an optically clear polymer that includes an adhesive or a glass. Light rays 5120 passing through the embodiment of input/output light coupler 112 shown in FIG. 57 must satisfy the basic principles described relative to FIG. 51, e.g., equation 23.

Figure 58:
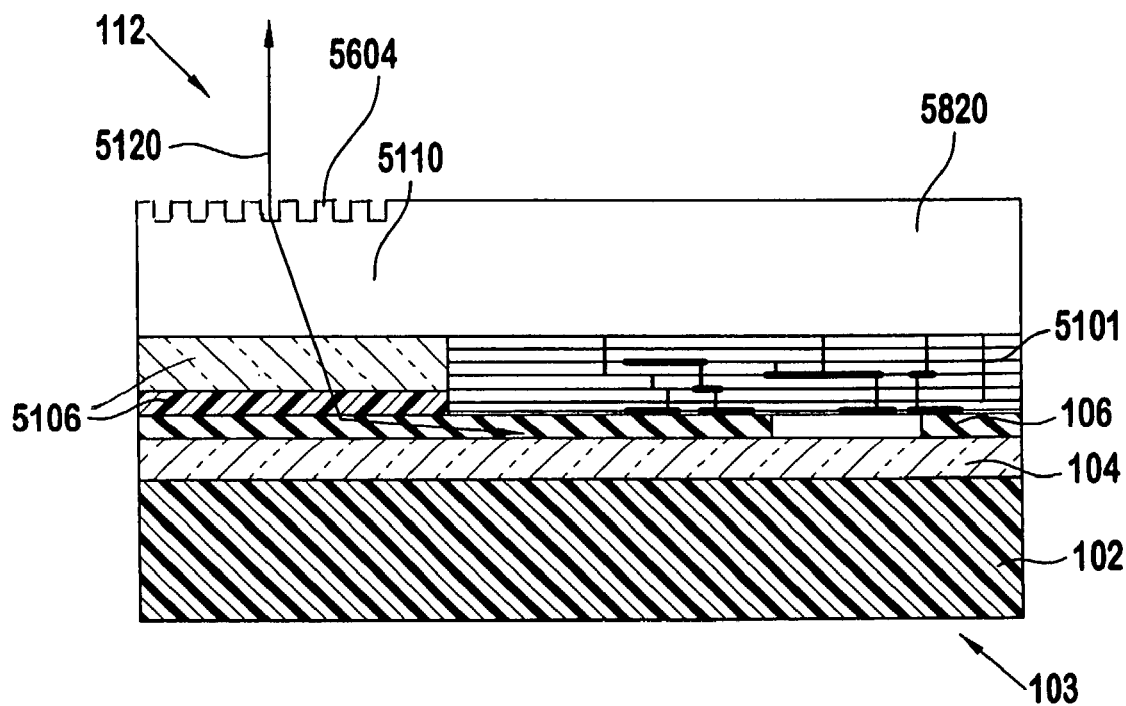
FIG. 58 shows a cross-sectional view of yet another alternate embodiment of integrated optical/electronic circuit.

The embodiment of integrated optical/electronic circuit 103 shown in FIG. 58 further includes a wafer 5820 layered above the electronics portion 5101 and the evanescent coupling region 5106. The wafer 5820 may be fabricated as a distinct component that is later combined with the portion of the integrated optical/electronic circuit 103 including the evanescent coupling region 5106 and the electronics portion 5101, or alternatively wafer 5820 may be deposited as an additional layer on top of the portion of the integrated optical/electronic circuit 103 including the evanescent coupling region 5106 and the electronics portion 5101. The wafer 5820 is alternatively formed from semiconductor materials such as silicon or silica.

The region of the wafer 5820 physically located adjacent and above the evanescent coupling region 5106 acts as the input/output light coupler 112. Since the grating 5604 is formed on the upper surface of the light coupling portion 5110, light that is applied to the grating will be diffracted within the light coupling portion 5110 to the angle $\theta_i$, which is then applied to gap portion 5106. Based on the configuration of the light coupling portion 5110, the evanescent coupling region 5106, and the waveguide 106, the light applied to the grating 5604 can be applied at a controllable angle so that the coupling efficiency of the light input into the input/output light coupler 112 is improved considerably. Light rays 5120 passing through the embodiment of input/output light coupler 112 shown in FIG. 58 must satisfy the basic principal described relative to FIG. 51, e.g., equation 23.

By viewing the embodiments of input/output light couplers 112 shown in FIGS. 51 to 58, it appears that the light coupling portion 5110 may be applied as a distinct component as positioned relative to the remainder of the integrated optical/electronic circuit 103. The alignment is necessary between the light coupling portion 5110 relative to the remainder of the integrated optical/electronic circuit 103 where discrete light coupling portions 5110 are used, except in the most simple integrated optical/electronic circuits.

This portion of disclosure therefore discloses a different embodiment of integrated optical/electronic circuit 103 including discreet light coupling portions 5110. The light coupling portions 5110 may be fabricated as a distinct component from the remainder of the integrated optical/electronic circuit 103 or simultaneously with the remainder of the integrated optical/electronic circuit 103. In actuality, FIG. 58 shows one embodiment of an integrated optical/electronic circuit 103 in which all of the material forming the input/output light coupler 112 may be deposited using such processes as physical vapor deposition (PVD), chemical vapor deposition (CVD), and/or electrochemical deposition. These same processing steps may be used to deposit different layers of the integrated optical/electronic circuit. Processes such as CMP are used to planarize the wafer, and various photoresists used in combination with etchants are used to etch patterns.

The application of deposition and etching processes is well known to such circuits as SOI circuits including such electronic circuits as the electronics portion 5101. However, it is further emphasized that the deposition and layering of the material of the input/output light coupler 112 may use similar techniques, in which the optical characteristics of the waveguide and the coupling region are altered relative to their neighboring opto-electronic components by selecting different masked configurations as part of a sequence to build the opto-electronic circuit.

Alignment of any input/output light coupler 112 relative to the remainder of the integrated optical/electronic circuit 103 is important to achieve desired coupling efficiencies. A later displacement of the input/output light coupler 112 relative to the remainder of the integrated optical/electronic circuit 103 by a distance as small as one micron may significantly reduce the percentage of light that can be coupled via the input/output light coupler 112 to, or from, the waveguide 106. Light beams that are applied to the input/output light coupler 112 usually can be modeled as a Gaussian-intensity curve in cross section. For example, the center of the light beams have a stronger intensity than the periphery of the light beams, and the intensity across the width of the light beam varies as a Gaussian function.

The characteristics of the optical beam required for best coupling efficiency depends on the nature of the gap portion 5106. Furthermore, the tolerance on the required beam position, beam diameter, and its intensity distribution also depends on the gap 5106. Tapered gaps generally have superior coupling efficiency and are more tolerant to variations in beam position, diameter, etc. as compared to constant gaps. They are also more suitable to Gaussian beams since the expected optimum beam profile for optimum efficiency is close to Gaussian.

Figure 64:
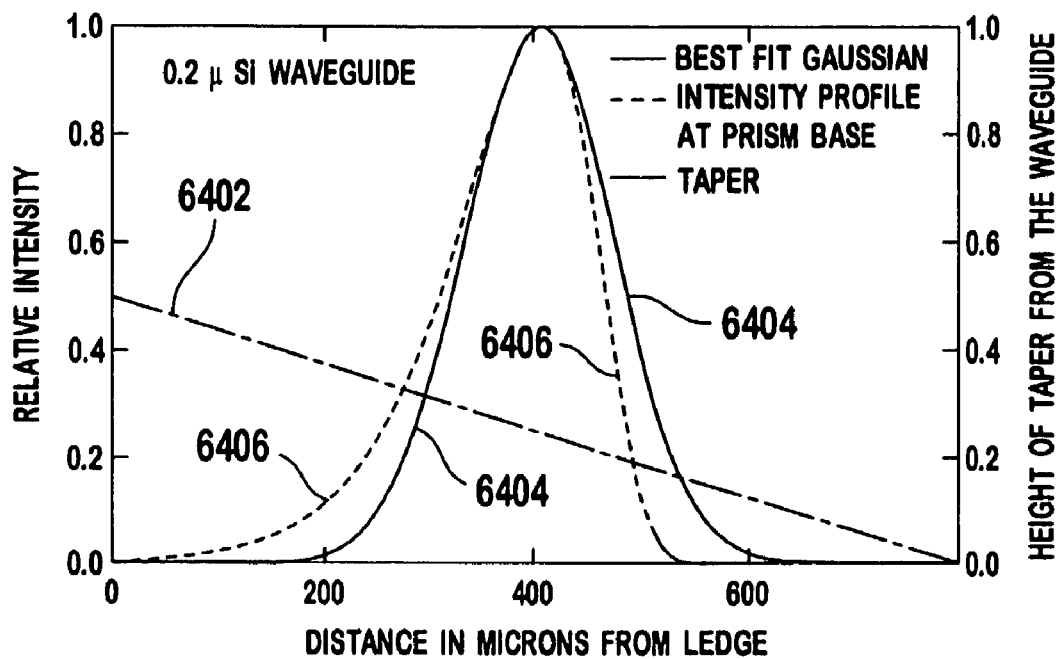
FIG. 64 shows a plot of intensity versus distance from a ledge of one embodiment of input/output light coupler 112 including a tapered gap portion.
Figure 65:
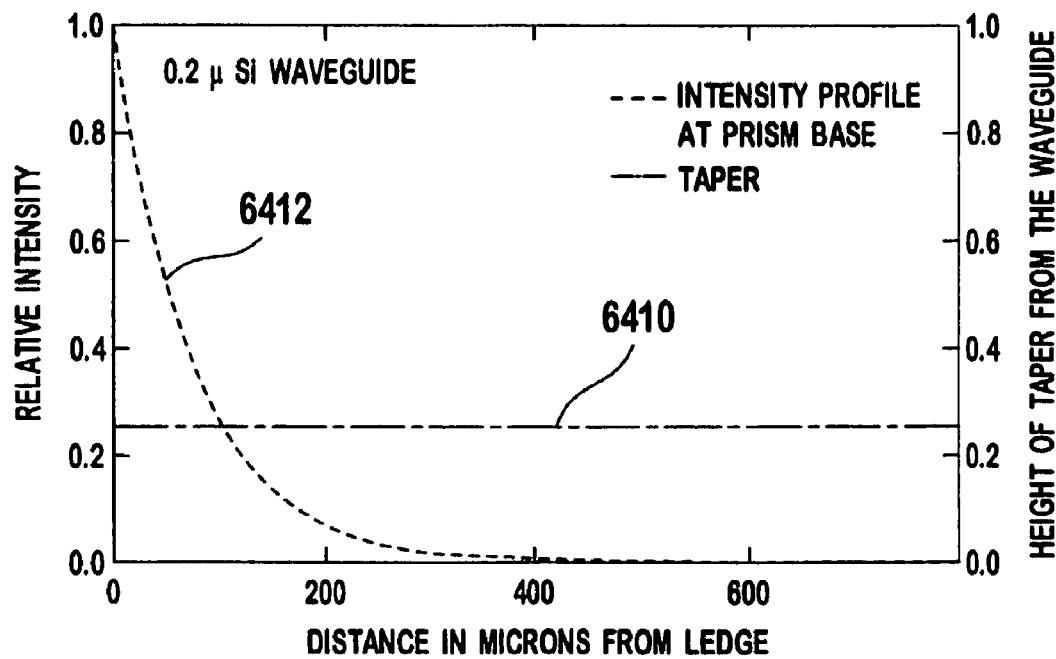
FIG. 65 shows another plot of intensity at a prism base for another embodiment of input/output light coupler having a prism, but without a tapered gap portion.

As light is exiting the output coupler from the waveguide, wherein the waveguide is carrying substantially uniform intensity of light across the cross-sectional area of the waveguide, it may be desired to once again convert the light exiting the output coupler into a light beam that has a Gaussian intensity profile. Evanescent couplings configured as a tapered gap portion 5106 as illustrated particularly in FIGS. 55 and 57, result in a closer fit to a Gaussian profile than without the taper gap portion. For example, FIG. 64 shows the calculations for a 0.2 micron silicon waveguide formed with the taper. The tapered gap portion is illustrated by line 6402 in FIG. 64, and the height of the taper from the waveguide is illustrated along the right ordinate of FIG. 64. An intensity profile curve 6406 is plotted to indicate the intensity profile at the base of the input/output light coupling device. The relative intensity value is plotted as the left ordinate in FIG. 64. The abscissa measured the distance from a ledge (an arbitrary measuring point) in microns. A best fit Gaussian curve 6404 is plotted proximate the intensity profile 6406, to illustrate how effectively the output light from the output coupler models the Gaussian curve. FIG. 65 shows a similar curve as FIG. 64, except FIG. 65 models a constant thickness gap, as indicated by the fact that the taper curve 6410 is level in FIG. 65. Curve 6412 of FIG. 65 measures the intensity profile for an output beam of light that is not Gaussian, but instead exponential.

While it is easy enough to align one or a few input/output light couplers 112 relative to their respective integrated optical/electronic circuit, it is to be understood that in dealing with extremely large and complex optical and/or electronic circuits, the alignment is a non-trivial task. Even if it takes a matter of a few seconds to align any given input/output light coupler 112, considering the large number of input/output light couplers 112 on any given circuit, manually aligning the needed number of input/output light couplers to any one integrated optical/electronic circuit 103 may require an extremely large number of hours to perform. As such, in order to practically align a large number of input/output light couplers 112 relative to a relatively complex integrated optical/electronic circuit 103, very large scale integrated circuits (VLSI) or ultra-large scale integrated circuits (ULSI) processing techniques that are well known in electronic chip circuit production should be used.

FIGS. 59 to 60 show expanded views of two embodiments of integrated optical/electronic circuits 103 that each include silicon insulator (SOI) flip chip portion 5904 and an optical/electronic I/O flip chip portion 5902. The SOI flip chip portion 5904 is formed, preferably using flip chip technology in which the waveguide is preferably a thin waveguide. It is also envisioned that any substrate, using either SOI technology or traditionally substrates, is within the scope of the present invention. Both of the embodiments of optical electronic I/O flip chip portions 5902 shown in FIGS. 59 and 60 include the electronic portion 5101, as described in FIG. 51. Additionally, each embodiment of optical/electronic I/O flip chip portions 5902 includes a light coupling portion 5110 and an evanescent coupling region 5106 that may be configured as a tapered gap portion or a constant thickness gap portion. In the embodiment of optical/electronic I/O flip chip portion 5902 shown in FIG. 59, however, the light coupling portion 5110 is configured as a grating 5604, similar to that described relative to, FIGS. 56, 57 and 58.

In the embodiment of optical/electronic I/O flip chip portion 5902 shown in FIG. 60, the light coupling portion 5110 includes a prism. The gratings shown in the integrated optical/electronic circuit of FIG. 59 may be formed using known etching techniques, in which gratings or DOE are formed by etching away thin strips of material. The prisms formed in the optical/electronic I/O flip chip portion 5902 in FIG. 60 maybe formed using anisotropic etching. Anisotropic etching is a known technology by which a crystalline material is etched at different rates based on the crystalline orientation of the material. The alignment of the crystalline material determines the etch rate. For instance, in an anisotropic material, the silicon will be etched at a different rate along the 001 crystalline plane compared to the 010 atomic plane. Such configurations as V-grooves and/or angled surfaces can be formed in different regions within the optical/electronic I/O flip chip portion 5902 using anisotropic etching.

Both the SOI flip chip portion 5904 and the optical/electronic I/O flip chip portion 5902 may be formed in either the orientation shown in FIGS. 59 and 60, or some alternate orientation such as inverted from that shown in FIGS. 59 and 60. Regions within the embodiments of optical/electronic I/O flip chip portions shown in either FIG. 59 or 60 as being etched away to form the respective etchings or prisms, may be controllable formed using masking technology. Masks are used to determine where photoresist is being applied on the flip chip portion.

Alignment of the various components of the integrated optical/electronic circuits 103 is provided by proper spacing of the devices. Spacing of the devices, as provided by the lithography masking technique, is a significant advantage of the integrated optical/electronic circuits 103 compared to having to align each discrete component. In the embodiments of integrated optical/electronic circuits 103 shown in FIGS. 59 and 60, a plurality of light coupling portions 5110 are arranged in a pattern within the optical/electronic I/O flip chip portions 5902. A vertical axis 5958 may be considered as passing through each light coupling portion 5110. The patterning of the light coupling portions 5110 within the optical/electronic I/O flip chip portions 5902 is partially defined by the horizontal distance, indicated by arrow 5960, between each pair of the plurality of vertical axes 5958 on the optical/electronic I/O flip chip portion 5902. The pattern of the light coupling portion 5110 within the optical/electronic I/O flip chip portions 5902 is also partially defined by the angle $\alpha_1$ between all of the arrows 5960 that extend from any given vertical axis 5958 (the vertical axis defining the position of one light coupling portions 5110) and all other vertical axes 5958 located on the optical/electronic I/O flip chip portion 5902.

There is also a patterning of the evanescent coupling region 5106 on the SOI flip chip portion 5904 in the embodiments of integrated optical/electronic circuits 103 shown in FIGS. 59 and 60. To achieve such patterning on the SOI flip chip portion 5904, consider that a vertical axis 5962 may be considered as passing through all of the evanescent coupling regions 5106. The patterning of the evanescent coupling regions 5106 within the SOI flip chip portion 5904 is partially defined by the horizontal distance, indicated by arrow 5964, between each pair of the plurality of vertical axes 5962 on the SOI flip chip portion 5904. The patterning of the evanescent coupling regions 5106 within the SOI flip chip portion 5904 is also partially defined by the angle $\alpha_2$ between all of the arrows 5964 that extend from any given vertical axis 5962 (the vertical axis defining the position of one evanescent coupling region 5106) and all other vertical axes 5962 located on the SOI flip chip portion 5904.

To allow for alignment in the optical/electronic I/O flip chip portion 5902, the patterning (of light coupling portions 5110) on the SOI flip chip portion 5904 matches the patterning (of evanescent coupling regions 5106) on the optical/electronic I/O flip chip portions 5902. If the patterning between the I/O flip chip portion 5902 and the optical/electronic I/O flip chip portions 5902 match, then alignment is achieved by aligning any two light coupling portions 5110 with any two respective evanescent coupling regions 5106. Using this type of alignment, all light coupling portions 5110 on the SOI flip chip portion 5904 will be aligned with all evanescent coupling regions 5106 on the optical/electronic I/O flip chip portions 5902. Securing the SOI flip chip portion 5904 and the optical/electronic I/O flip chip portions 5902 in their aligned position allows for a technique of fabricating properly aligned integrated optical/electronic circuits 103.

The electronic portion 5101 includes a variety of interconnects and vias, depending upon the desired configuration and operation of the integrated optical/electronic circuit 103. The uppermost layer of the electronic portion 5101 is in electrical communication with solder balls 5930. The solder balls 5930 are used, when inverted, to solder the integrated optical/electronic circuit 103 to, e.g., a motherboard or some other printed circuit board to which the integrated optical/electronic circuit 103 is being secured. The solder balls 5930 also provide the electrical connection between the electrical circuits on the printed circuit board and the electrical circuits in the electronic portions 5101 of the integrated optical/electric circuit 103.

A modulator as described relative to FIG. 1, and the other optical waveguide devices may thus be considered as a hybrid active integrated optical/electronic circuit. The etching and deposition processing can be performed simultaneously for both the optics portions and the electronic portions. To provide a circuit layout for the integrated optical/electronics circuit, a radius can initially be drawn around the active optical circuits and the light coupling portion 5110 to indicate where the electronic devices related to the electronics portion 5101 are not to be located. The electronics can be located everywhere else on the optical/electronics flip chip portion 5902 that do not conflict with the light coupling portion 5110 as shown in FIGS. 59 and 60.

In the optical portion of an integrated optical/electronic circuit, photons are made to travel within the different embodiments of optical waveguide devices as dictated by the passive optical structure and the effect of the active optical structures. Active electronic transistors and other devices such as transistors work by controlling the concentration of electrons and holes by application of potentials. These devices alter the number of electrons and holes rapidly in a given region. This change in the concentration of electrons and holes results in the transistor gain as well as the transistor switching action. In the active optical regions of the integrated optical/electrical circuit, the photons are made to travel through the same region as where these free-carriers are located. Therefore, in the integrated optical/electrical circuit, electronic actions have a result in the optics portions of the circuit. The free carriers are used for both electronic portions and photonic portions.

In one embodiment, the mask that defines the optic portions (active and/or passive) and the mask that defines the electronic portions (active and/or passive) are essentially combined in production. In other words, without close examination, a person could not be certain as to whether a feature in a mask relates to an electronic or optical portion of the integrated optical/electric circuit. In such an embodiment, there will be no clear cut delineation between a mask for forming only electronic components or a mask for forming only optical components on the substrate.

A lens is used to project the shape of a mask onto the photoresist to define the shapes formed on the substrate during each processing step. The depth of focus (DOF) is an important consideration in projecting the features of the mask. All the features in a mask have to lie within the depth of focus or they do not print well using a lithographic process since the feature will be out of focus. Chemical Mechanical Polishing (CMP) has become an important process because following etching or deposition of silicon, the topography of the upper surface of the substrate has minute waves. A second level of metal cannot be imaged on such a wavy surface and thus cannot be deposited on the wavy surface. The surface waves can be planarized by CMP. Since a typical microprocessor has six to seven levels of metal, the time necessary to process such a device is considerable.

One embodiment of the integrated optical/electronic circuit on this SOI uses planar lithography manufacturing techniques. The active electronics are included as waveguides in the silicon level of the integrated optical/electronic circuit. The metal levels can be deposited in the electronics portion interspaced with material such as glass or polyamide to fill in the surface irregularities. The interspacing material has to be leveled before the next metal layer is deposited. This process is repeated for each layer. With planar lithography, each imaging photoresist exposure requires a very flat wafer consistent with minimum feature size and DOF requirements.

Projection lithography is therefore used to project an image on photoresist which is used to determine the pattern on a wafer such as a SOI wafer. In a typical lithography, the aspect ratio of horizontal to vertical features is preferably close to 1 to 1. The uneven, etched portions are filled with glass/polyamide, then planarized before the next photoresist/exposure step. The wafer is absolutely plate-like and has a very uniform layer of the photoresist, which when exposed with light etches certain selective regions during planar lithography. Once a substantially uniform photoresist layer is deposited, the mask is used to develop a pattern on the wafer. The projection lithography process is repeated for multiple photolithography cycles to provide the desired electronic portions 5101 and optical portion on the wafer.

The general rule of the thumb is that the minimum feature size (MFS) is given by equation 24:

$$MFS = (0.6 \text{ times } \lambda)/NA \qquad \text{(equation 24)}$$

The 0.6 constant generally replaces the semiconductor constant k1 that depends on the quality of the lens and other such factors. The 0.6 constant is an approximation for a very strong lens, and is not exact. NA is the numerical aperture of the lens, which is a function of the speed of the lens. A popular wavelength for such a lens is 248 nm. The minimum feature size is the smallest size that can be printed using traditional lithography. Once the minimum feature size for a given NA is determined, the depth of focus can be determined as $DOF = \lambda/(NA)^2$. The minimum feature size and the depth of focus are therefore fundamentally related.

There are curves that indicate the relationship between the depth of focus and the minimum feature size. Optical scientists have attempted many techniques to overcome this relationship. The result of this relationship is that when the chip is brought into focus for planar lithography, the entire image has to be in focus.

Building the integrated optical/electrical circuit 103 necessitates multiple steps of exposure on photoresist that is layered on the uppermost layer of the substrate. To expose the photoresist, the photoresist must be initially evenly applied.

Spinning the whole wafer produces a substantially uniform layer using centrifugal force. If there are a variety of big structures, the structures act like little dams that limit the radially outward flow of the photoresist. Even a rise in topography by 50 nm causes such photoresist build-up problems in the lithography. The photoresist is not going to be uniform following the spinning. As described herein, photoresist must be uniform before it can be exposed.

Figure 63A:
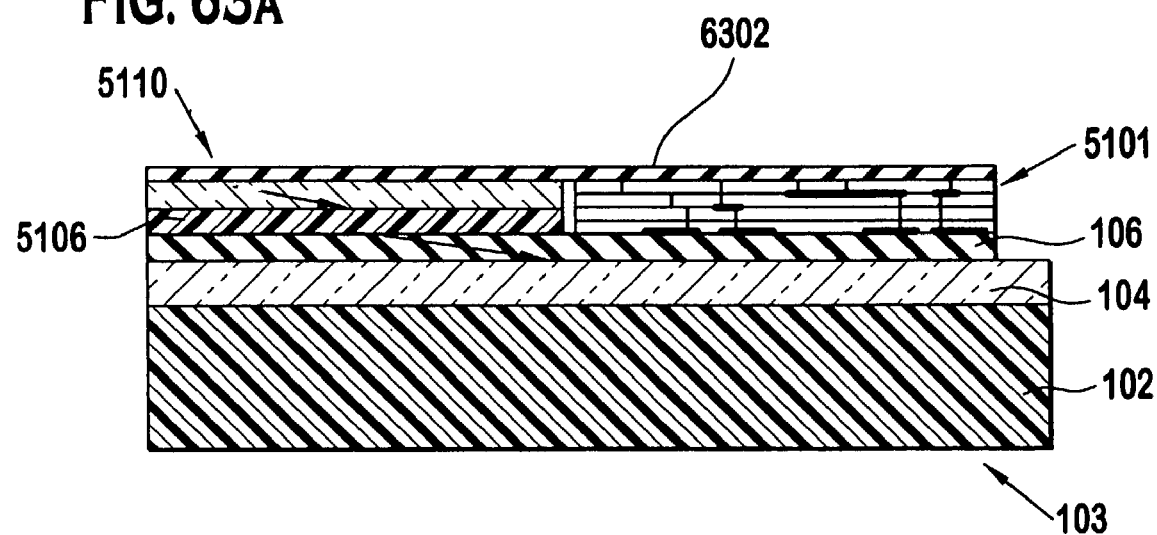
FIGS. 63A to 63D show a method of fabricating the partially completed integrated optical/electronic circuit of FIG. 51.

FIGS. 63A to 63D show a process of simultaneously depositing silica, other suitable dielectric, polysilicon, etc. layer on both the light coupling portion 5110 and the electronic portion 5101. Initially, a silicon layer 6302 is deposited somewhat uniformly across the entire integrated optical/electrical circuit 103, including both the electronics portion 5101 and the light coupling portion 5110. Both the embodiments of the light coupling portion that may include prisms, as well as gratings, rely upon homogeneous build up of silica throughout the entire light coupling portion. By comparison, the electronics portion 5101 is formed using a series of silica layers, interspersed with metallic interconnects through which metallic vias vertically extend. Therefore, a series of additional metalization and other steps are necessary between successive depositions of silica. By comparison, since the light coupling portion is homogeneous, relatively little processing will occur between the various silica deposition steps. In FIG. 63A, the layer of silicon 6302 is deposited on the upper surface of the integrated optical/electrical circuit 103 using known silicon deposition techniques, such as chemical vapor deposition and sputtering.

Figure 63B:
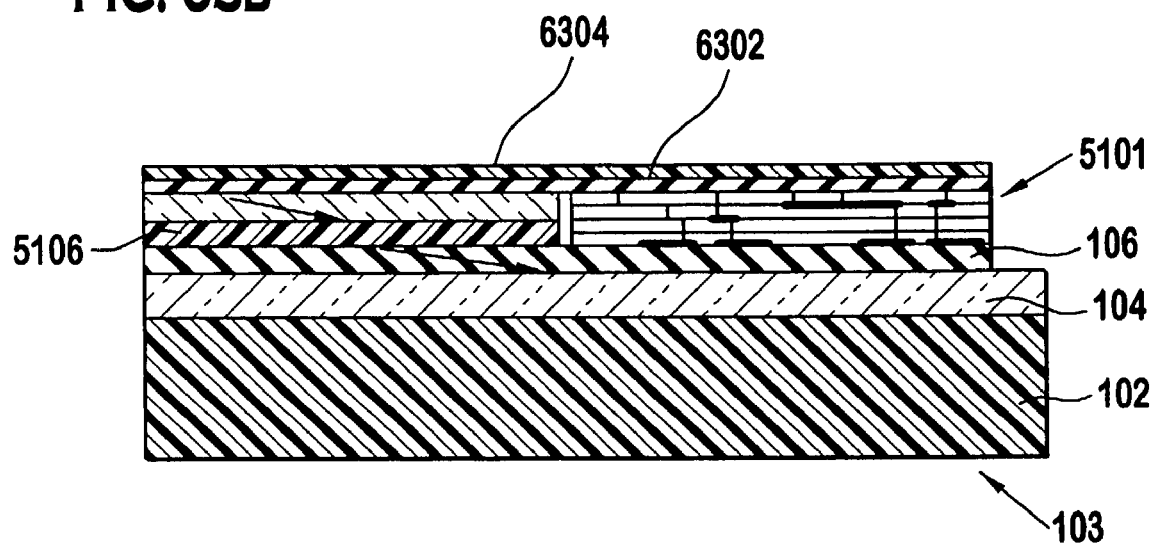
Figure 63C:
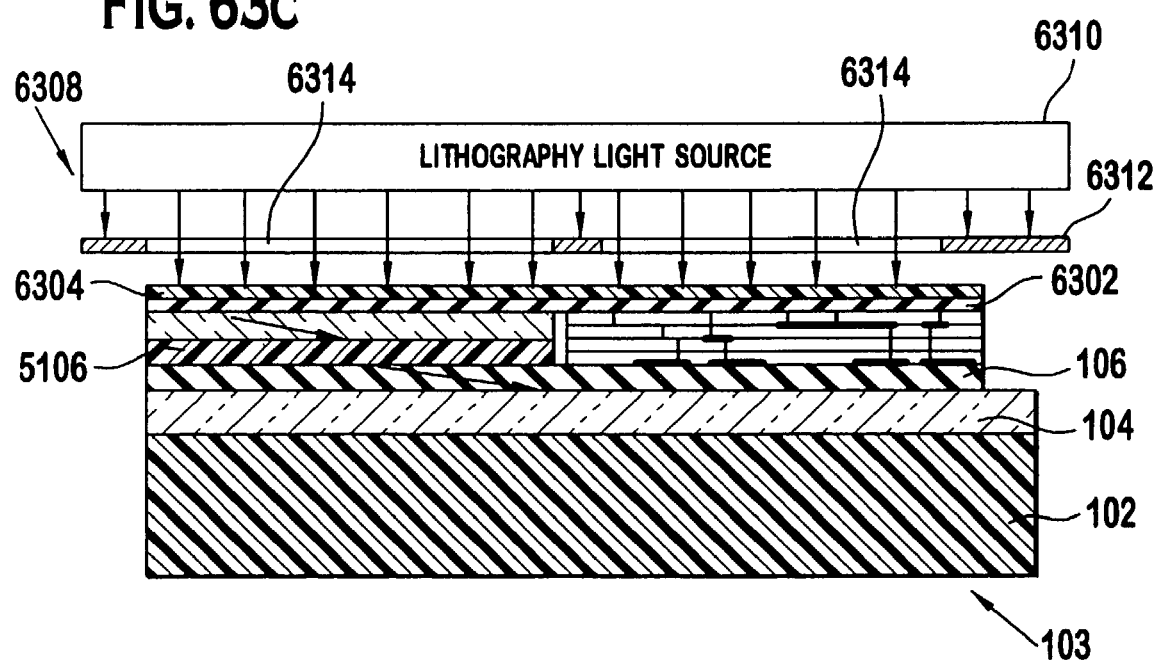
Figure 63D:
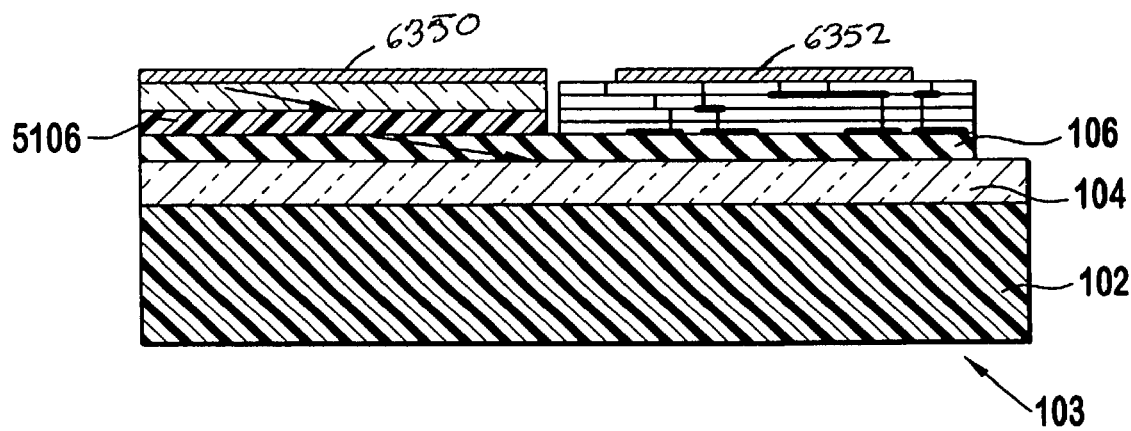

The planar lithography method continues in FIG. 63B in which a photoresist layer 6304 is deposited on the upper surface of the deposited silicon layer 6302. Photoresist may be applied, and then the substrate 102 typically spun so that the photoresist layer is extended under the influence of centrifugal force to a substantially uniform thickness. In FIG. 63C, the lithography portion 6308 selectively applies light to the upper surface of the photoresist layer 6304, thereby acting to develop certain regions of the photoresist layer. Depending upon the type of photoresist, the photoresist may harden either if light is applied to it, or will not harden if light is not applied. The lithography portion 6308 includes a lithography light source 6310 and a lithography mask 6312.

The lithography mask 6312 includes openings 6314 that define, and are aligned with, those areas of the photoresist layers 6304 at which it is desired to apply light. The lithography light source 6310 generates the light in a downwardly, substantially parallel, fashion toward the lithography mask 6312. Those portions of the lithography mask 6312 that have an opening allow the light to extend to the photoresist layer 6304 as shown in FIG. 63C. Applying light from the lithography portion 6308 acts to develop certain portions of the photoresist layer 6304.

The photoresist layer 6304 is then washed, in which the undeveloped portions of the photoresist are substantially washed away while the developed portions of the photoresist layer remain as deposited. The developed, and thereby remaining portions of the photoresist layer thereupon cover the silicon thereby allowing for selected portions of the silicon layer to be etched. The etching acts on those uncovered portions of the silicon layers 6302 that correspond to the undeveloped regions of the photoresist layer. During etching, the developed portions of the photoresist layer 6304 cover, and protect, the covered portions of the silicon layer 6302, and protect the covered portions of the silicon layer 6302 from the etchant. Following the etching, respective structures 6350 and 6352 remain that are ultimately used to form part of the respective optical (e.g., the input/output light coupler 112) and electronic (e.g., electronic portion 5101) portions.

The well known process of metal deposition, doping, and selective etching is used in the semiconductor processing of electronic devices and circuits. This disclosure, however, applies innovated circuit processing techniques, involving etching and deposition, to optical devices and circuits as well as electronic devices and circuits, so both types of devices and circuits can be simultaneously fabricated on the same substrate.

Processors like the PowerPC require a large number of processing steps to fabricate. Therefore, a mask is used to define one pattern. The pattern is developed, then the part is removed. Another part that is to be doped and anti-doped is used, which requires two different mask sets. One mask set is used to expose the p-type photoresist. The next mask set exposes the n-type photoresist.

Thus, as can be seen from the above description, light coupling regions are processed along with the remainder of the circuit and special properties in these regions are imparted as part of the circuit built using planar lithography techniques.

VIII. Hybrid Active Electronic and Optical Circuits

This portion of the disclosure concerns the operation of and fabrication of hybrid active electronic and optical circuits. Passive optical circuits are considered those optical circuits in which the characteristics of light flowing through it are determined during fabrication. By comparison, the active electronic components are those components whose characteristics change by application of potentials at its terminals. Active optical elements are essentially analogous to active electronic components except that photons are allowed to pass through the active optical elements to achieve optical functions as has been described relative to e.g., FIGS. 1-5, and 9-49. For example, diodes, transistors, and the like are examples of active electronic components. In this disclosure, each layer of active electronic components is formed simultaneously as a simultaneous layer of optical components formed on the same hybrid active electronic and optical circuit. As such, certain embodiments of hybrid active electronic and optical circuits are integrated optical/electronic circuits, and vice versa. Note that an optical circuit may include a combination of active and passive portions, in a similar manner that an electronic circuit may consist of active components such as a diode and a transistor and passive components such as a resistor.

Figure 66:
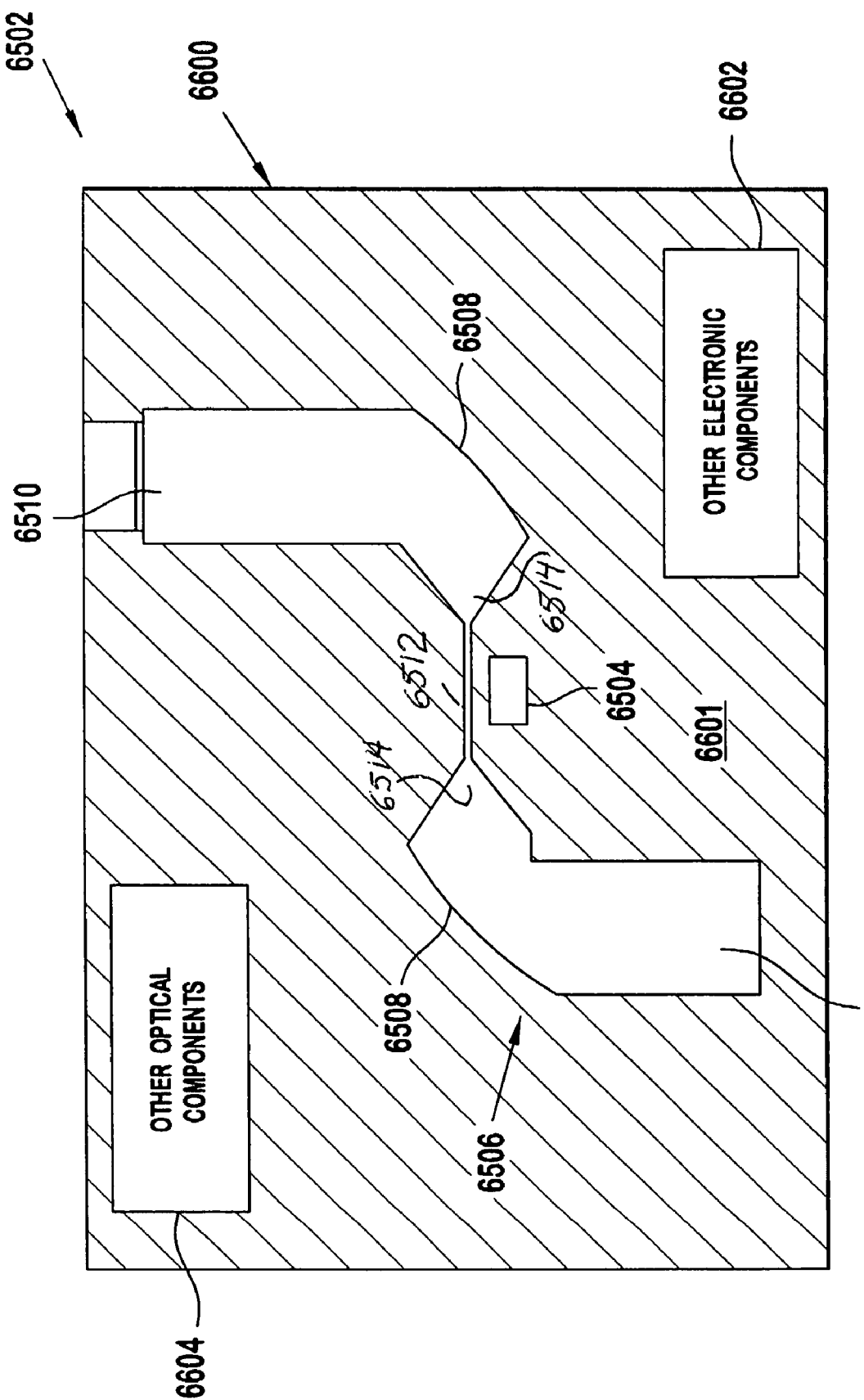
FIG. 66 shows one embodiment of hybrid active electronic and optical circuit that is configured as a J-coupler.

FIG. 66 shows one embodiment of hybrid active electronic and optical circuit 6502. The hybrid active electronic and optical circuit 6502 includes an active electronic component 6504 and a passive optical component 6506. The passive optical portion 6506 includes an input/output light coupler 112 (not shown), light mirror of 6508, input region 6507, an output region 6510, and a channel portion 6512 that connects the input region 6507 to the output region 6510. The light mirror 6508 directs light input from the input/output light coupler 112 to the throat 6514 of the channel portion 6512. In an alternate embodiment, throat 6514 need not be tapered, and the configuration of other components shown may be changed in any manner that allows light to efficiently pass through channel 6512. Light that is applied by the input/output light coupler 112 travels in a parallel direction within the input region 6507 until it reaches the light mirror 6508. Thereupon, the light mirror 6508 directs all reflective light toward the throat portion 6514. As such, one embodiment of the light mirror 6508 is suitably aligned to reflect as much light as possible towards the throat 6514.

Light follows through the channel portion 6512 in a manner to be acted upon by any desired active opto-electronic portion 6504. After the light has exited the channel portion 6512, light enters the output region 6510 and is directed toward the light mirror 6508 that is located in the output region 6510. Light directed toward the light mirror 6508 from the channel portion 6512 is reflected toward the input/output light coupler 112 in optical communication with the output region 6510. In one embodiment, the components in a configuration associated with the input region 6507 are mirrored by the components and configuration of the output region 6510. For example, the light mirror 6508 can be designed as having an identical inverse curvature in the output region 6510 from the input region 6507. Similarly, the input/output light couplers 112 may be structurally and operationally identical between the input region 6507 and the output region 6510. In actuality, the use of the term input and output is arbitrary, since either the input side can be used either for input or output, simultaneously or non-simultaneously. The combination of the input region 6507, light mirror 6508, the channel portion 6512, and the output region 6510 maybe referred to as a J-Coupler, whose name is derived from the direction of travel of light within the device.

The active electronics portion 6504 may include a modulator, a deflector, a diode, a transistor, or any other electronic circuit in which electricity can be selectively applied to a region outside of the channeled portion 6512 to control the electromagnetic state of the circuit or device. The passive optical portion 6506 and the active electronic portion 6504 can be fabricated simultaneously to form for any given processing layer the hybrid active electronic and optical circuit 6502. A large variety of confinement structures and waveguide mirrors can be produced utilizing concepts disclosed in hybrid electronic and passive optical circuit 6502. The hybrid active electronic and optical circuit 6502 represents one embodiment of the integrated optical/electronic device. A list of passive optical elements includes, but is not limited to, lens, lenses, mirrors, two dimensional evanescent couplers, beam splitters, Echelle gratings, grating structures, two dimensional adiabatic taper structures (thin film analog structures). Passive waveguide portions are defined by geometrically patterning the silicon layer to modify the local effective mode index of the slab waveguide. In some embodiments, portions of the waveguide layer in the silicon-on-insulator (SOI) devices are completely removed, and replaced by some material such as glass, polyamide, or polysilicon to produce total internal reflection so light is contained in a region of the waveguide. Partial removal or addition of other materials including polysilicon is used to define optical properties within the waveguide.

All modifications to the passive waveguide elements are carried out by a set of math using well understood silicon processing steps (e.g., SOI processing). In one embodiment, the channel portion 6512 can be an active optical portion for, e.g., modulation or detection. The light mirror 6508 may be configured as an off-axis paraboloid or any other one of a variety of shapes that are generally known and described relative to the optical mirror arts. Additionally, certain mirrors can be configured as beamsplitters to separate a single incident beam into a plurality of output beams that can each be directed to an individual port, detector, or other device.

FIG. 68 shows a side view of the hybrid active electronic and optical circuit 6502 shown in FIG. 66, during processing. The hybrid active electronic and optical circuit 6502 is formed on top of an SOI wafer 6600. The SOI wafer 6600 is initially formed with a planar upper surface. A photoresist layer 6804 is initially applied to the upper surface of the SOI wafer 6600. A photolithography mask is applied to the upper surface of the SOI wafer 6600 and the light is applied to the photolithography mask.

The purpose of the etching process using photolithography is to remove necessary portions of the upper most silicon layer in order to provide function of the passive optical component 6506, the active electronics portion 6504, the other electronic components 6602, and the other optical components 6604. The shape of the active electronic portion 6504, the other electronic components 6602, and the other optical components 6604 are shown in FIG. 66.

It is also envisioned that portions of the active electronic portion 6504, the other electronic component 6602, and the other optical component 6604 as well as a passive optical component 6506 can be etched, as desired, to provide the desired circuit. Additionally, the portions 6504, 6506, 6604 and 6602 can be partially etched, to a lower surface in the original upper surface of the silicon layer on the SOI wafer 6600. As such, the etched portions of the silicon layer of the SOI wafer 6600 are shown by the cross-hatching in FIG. 66.

Following the etching of the upper silicon layer of the SOI wafer 6600, its portion is refilled using a glass or polysilicon material deposited in the etched portion. Again, this is important for planarization so that the glass layer or polysilicon is at substantially the same level as the non-etched portions, including the passive optical component 6506, the active electronic portion 6504, other optical component 6604, and other electronic component 6606. The use of glass, polysilicon, or polyamide is selected based on optical insulation and other material characteristics.

The light that is traveling within the passive optical portion 6506 that contacts a boundary of the input region 6507 or output region 6510 of the passive optical component 6506 will experience total internal reflection. The boundaries at which total internal reflection occurs include the sidewalls of the input region 6507, the output region 6510, and the channel 6512. The boundaries at which total internal reflection occurs also includes the insulator layers (such as glass, polyamide, polysilicon, etc.) that are layered above and below the layer of the SOI wafer 6600 on which the passive optical component 6506 is formed. This total internal reflection is utilized by the light mirrors 6508, included in the input region 6507 and the output region 6510, to provide their reflectory characteristics. Total internal reflection is also used by the channel portion 6512 that is configured to act as a waveguide to maintain the light traveling therein within a relatively narrow region.

Following the deposition of the glass and/or polysilicon on the etched portions of the silicon layer of the SOI wafer 6600, the upper surface of the glass or polysilicon may be planarized to limit any waviness or surface irregularities that form therein. Following the planarization of the surface, another layer of polysilicon, polyamide, or glass may be deposited on the upper silicon/glass layer on the SOI wafer 6600. The other layers consisting of polysilicon, glass, polyamide and/or other material may be used to construct optical circuit elements since the waveguide properties are altered by the presence or absence of these materials.

Figure 67:
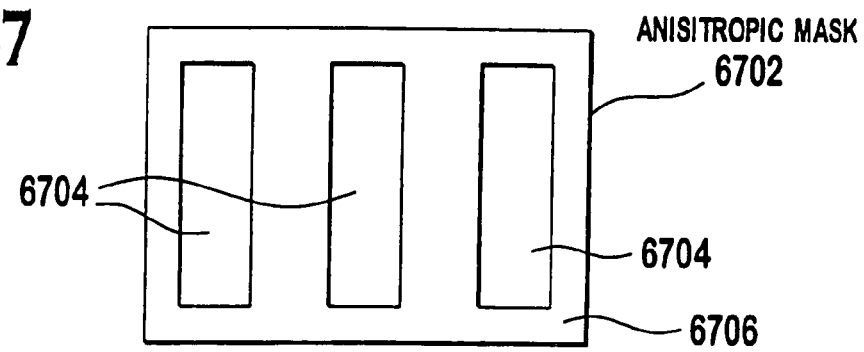
FIG. 67 illustrates one embodiment of a mask used to anisotropically etch regions of a hybrid active electronic and optical circuit.
Figure 68A:
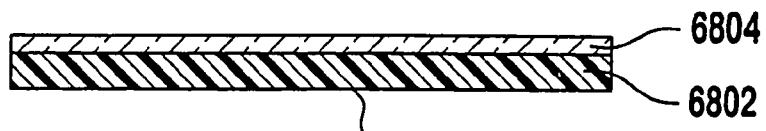
FIGS. 68A to 68D shows one embodiment of a method of anisotropically etching using a mask.
Figure 68B:
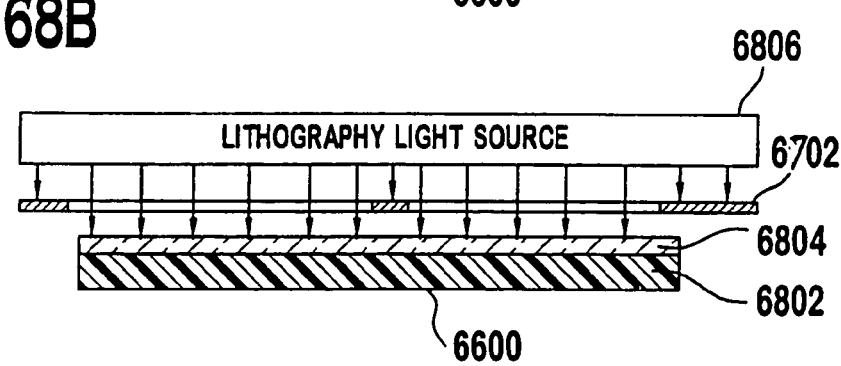

FIG. 67 shows one embodiment of a mask 6702 as used during the process of anisotropic etching. The mask 6702 includes one or more recesses 6704 formed in a masked body 6706. The mask 6702 can be used to form optical I/O ports such as prisms 6010, shown in the optical/electronic I/O flip chip portion 5902 in FIG. 60, from KOH etching. The photoresist layer 6804 is substantially uniformly applied to the upper surface of the silicon substrate 6802 as shown in FIG. 68A. In FIG. 68B, the mask 6702 is maintained over, and proximate, the photoresist layer 6804, and a lithography light source 6806 applies light above the mask 6702. The photoresist 6804 in this embodiment is a negative photoresist and, as such, light being applied by the lithography light source 6806 upon a region of photoresist will not tend to harden the photoresist, but by comparison, the darkened region of the photoresist covered by portion of the mask 6702 will develop.

Following the lithography process shown in FIG. 68B, the silicon substrate 6802 is washed, thereby removing the undeveloped etching from the upper surface of the silicon substrate 6802 while allowing those developed regions 6810 of the photoresist to remain on the upper surface of the silicon substrate 6802. The anisotropic etchant 6812 is then applied to the upper surface of the etchant, and due to known anisotropic etching principles, the silicon substrate will etch at faster rates along certain crystalline planes than others.

More particularly, the silicon substrate can be maintained in a generally known manner to etch the silicon substrate 6802 to form beveled cases 6814 in the silicon substrate 6802. The silicon substrate can continue to be etched as much as desired, perhaps leaving a connection portion 6816 between the beveled faces 6814. This anisotropic etching process as shown in FIGS. 68A to 68D can be performed on a large variety of silicon substrates to form prisms, gratings and other such devices in silica and/or silicon. A large number of prisms with (or without), can be produced using anisotropic etching. Anisotropic etching is an affordable technique to produce a large number of prisms. Anisotropic etching will not produce prisms having the traditional 45-45-90 degree cross-sectional prism configuration. By comparison, anisotropic etching produces prisms that have closer to 60-30-90 degree cross-sectional prism configuration. The use of such anisotropically-etched prisms is effective in virtually all known applications, but certain users may prefer to use a cut and polish technique to produce 45-45-90 degree cross-sectional prisms.

The known cut and polish technique that is used to form prisms may be more costly and require more time than anisotropically etched prisms. There are therefore a large variety of techniques that can be used to produce prisms that each have certain benefits and disadvantages. The description of anisotropic etching and cut and polish is not intended to be limiting, and any etching technique that provides prisms, gratings, or other input/output light couplers is within the intended scope of the invention.

Figure 68C:
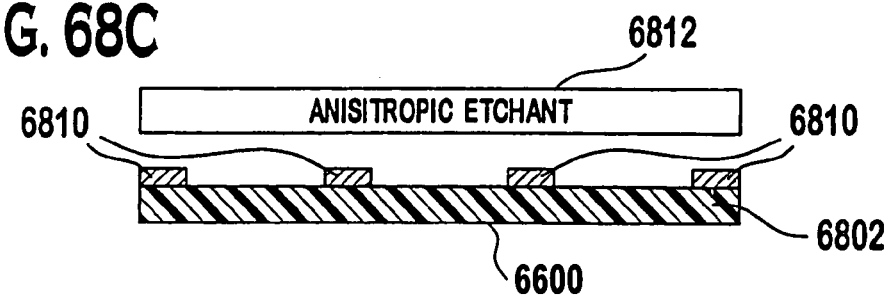

To form an integrated optical/electronic circuit, the electronic portion can initially be formed in the substrate using known processing techniques. In one embodiment, the substrate being processed can be an SOI substrate. The electronics portion is formed in the substrate. Following the formation of the electronics portion, the electronics portion can be coated with the hardened photoresist as shown in FIG. 68C, and the other portions of the silicon substrate in which it is not desired to anisotropically etch can be similarly coated with the hardened photoresist. The only region remaining on the coated surface that is not coated with the hardened photoresist therefore defines those regions that will be etched to form the prism or other device. Gratings can also be formed using anisotropic etching, however the masks used to form gratings may need finer resolution than those used to etch the prisms.

Figure 68D:
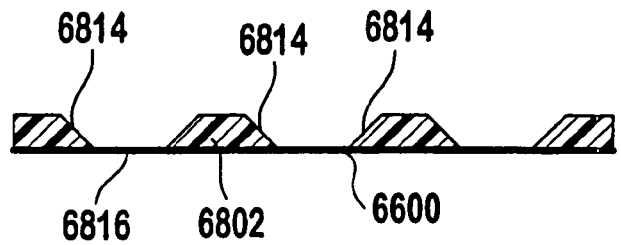

One advantage of the silicon substrate being etched in a manner with the beveled faces is shown in FIG. 68D is that since connecting portion 6816 may be relatively thin, a fair amount of flexibility may be provided by the connecting portions. Therefore, force can be applied similar to the prism surface, in a generally lateral direction, in a manner that would deform the connecting portions to angle the beveled face somewhat form its flat configuration. Such angling of the beveled faces associated with the prisms have the same result as providing a tapered gap underneath the prism. The tapered gap an then be filled with some optically clear material that hardens to maintain a tapered gap. In an alternate embodiment, the pressure can be maintained on the prism itself to maintain the tapered gap.

In alternate embodiment, the thickness of the connecting portions 6816 can be increased. For example, an entire wafer or substrate can be formed using such anisotropical etching techniques with only an upper region of the wafer or substrate being etched. The lower portion, for example, can include electronic components that might, or might not, relate to the optical device associated with the input/output light couplers.

The alignment techniques described above relative to FIGS. 59 and 60 (where the patterning of the light coupling portions 5110 on the SOI flip chip portion 5904 matches the patterning of evanescent coupling regions 5106 on the optical/electronic I/O flip chip portions 5902) may utilize the etched device as shown in FIG. 68D. Masks that define the spacing, and angles, between the plurality of light coupling portions 5110 on the SOI flip chip portion 5904 provides the patterning thereof. It is also emphasized that the etching can be performed on the upper surface of a single substrate including the evanescent coupling regions 5106. As such, the light coupling portions 5110 and the SOI flip chip portion 5904 can be formed on a single substrate, with each respective light coupling portions 5110 being aligned relative to each respective evanescent coupling regions 5106. It is further emphasized that the etching processes used to etch such an aligned hybrid active electronic and optical circuits 6502 and/or integrated optical/electronic circuits 103 may include anisotropic etching, cut and polish etching, and any other type of etching that may be used to etch prisms, gratings, and other light coupling portions 5110.

Figure 69:
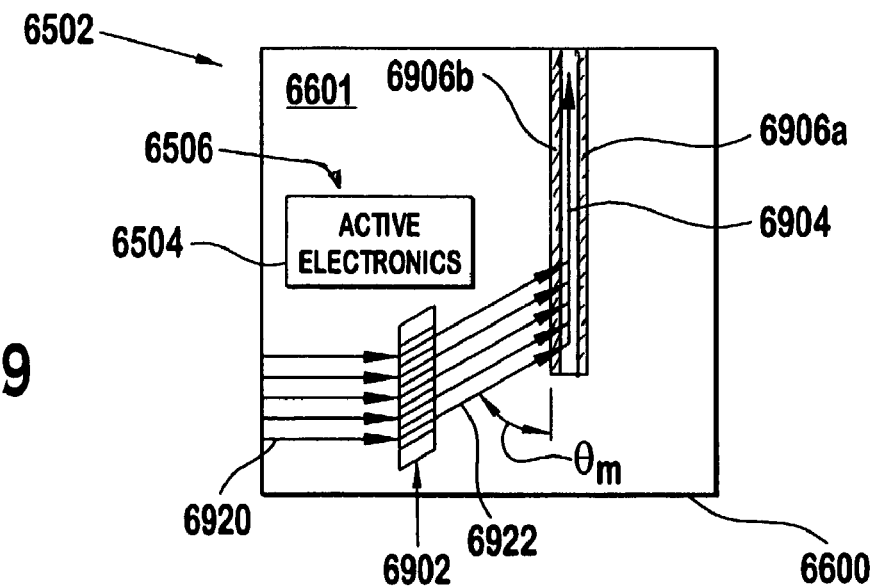
FIG. 69 shows a top view of one embodiment of hybrid active electronic and optical circuit that is configured as a two dimensional taper.
Figure 70:
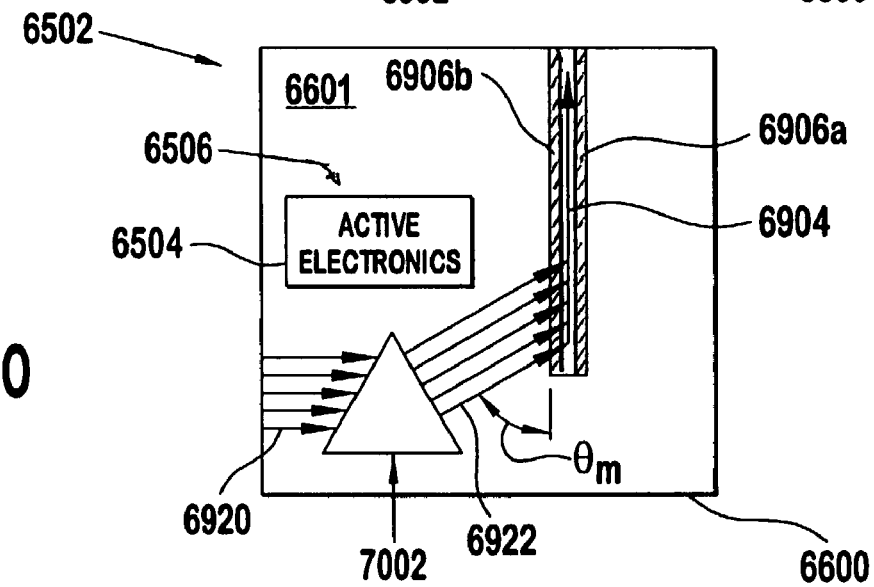
FIG. 70 shows a top view of another embodiment of hybrid active electronic and optical circuit that is configured as a two dimensional taper.
Figure 71:
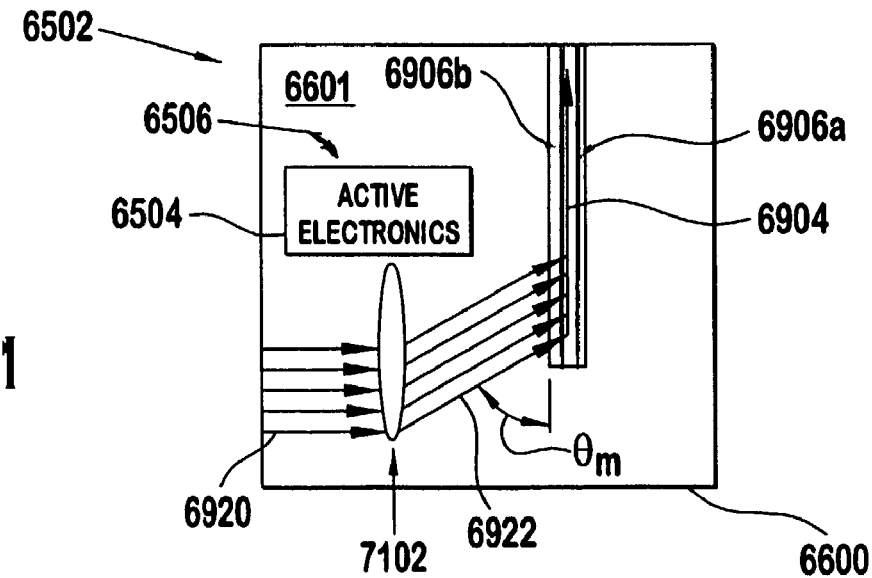
FIG. 71 shows a top view of yet another embodiment of hybrid active electronic and optical circuit that is configured as a two dimensional taper.

FIGS. 69, 70, and 71 show three other embodiments of hybrid active electronic and optical circuits 6502. FIGS. 69, 70, and 71 are each top views of their respective devices. The basic purpose of each of the hybrid active electronic and optical circuits 6502 shown in FIGS. 69, 70, and 71 is to couple light into a waveguide 6904. The tapered gap region is used to evanescently couple light into waveguide 6904. The three FIGS. 69, 70, and 71 show three different techniques to accomplish the task of changing the direction of incident light to an angle suitable for evanescent coupling. These angles can be computed using computational tools such as FDTD.

In the embodiment of FIG. 69, deviation is due to a grating being integrated into the Si layer during manufacture. In the case of FIG. 70, a waveguide prism created by altering the effective mode index in the shape of a prism is created. In the embodiment of FIG. 71, a waveguide lens is used. The waveguide 6904 may contain an active optical device.

During (or before/after) the deposition of the desired silicon and electrical insulators in the active electronic portions 6504, the optical insulator materials are deposited in the insulator strip 6906a and 6906b. Similarly, the etching of the silicon material for, and deposition of the desired material to form, the active electronic portion 6504 can occur simultaneously with the corresponding etching and deposition of the materials to form the passive optical portion 6506. The waveguide 6904 may additionally be considered as a passive optical portion.

The embodiment of hybrid active electronic and optical circuit 6502 as shown in FIG. 69 includes a waveguide grating 6902 to couple impinging light to the waveguide 6904. The waveguide grating 6902 is configured such that impinging light 6920 $i8s$ deflected at a suitable angle so the deflected light 6922 enters the waveguide 6904 at a suitable mode angle $\theta_M$. The waveguide grating 6902 is a passive optical portion 6506, and can be controlled by active electronics 6504 to control the angle of deflection, as described herein. Alternatively, the waveguide grating 6902 can be configured as a purely passive device that deflects the light being applied to the waveguide 6904 to the mode angle.

FIG. 70 shows another embodiment of hybrid active electronic and optical circuit 6502 shown in FIG. 69, except that the waveguide prism 7002 has been incorporated in place of the waveguide grating 6902. Similarly, the waveguide prism 7002 is a passive device, that deflects the light being applied to the waveguide 6904 in a mode angle $\theta_M$. The use of the active electronic component 6504 allows adjustability of the light flowing through the waveguide prism 7002, thereby allowing light flowing through the waveguide prism 7002 to be controllably directed at a desired controllable angle to the waveguide 6904.

The material of the waveguide prism 7002, the active electronic portion 6504, and the insulator strip 6906a and 6906b can all be etched, and the corresponding layers deposited, simultaneously. Different photoresist and masks may allow different materials to be deposited in each of the areas being etched, however, a sequence of all the deposition steps and etching steps that comprise all the processes performed on all of the optical portions and electronic portions may be performed simultaneously. If a specific material is being deposited on one portion (but not another), or etched on one portion (but not another), then the corresponding masks and etching or deposition tools will be configured accordingly. FIG. 71 shows another embodiment of hybrid active electronic and optical circuit 6502 in which full waveguide lens 7102 is formed in the upper most silicon layer of the SOI wafer 6600 in place of the waveguide prism 7002 shown in the embodiment of FIG. 70.

Figure 72:
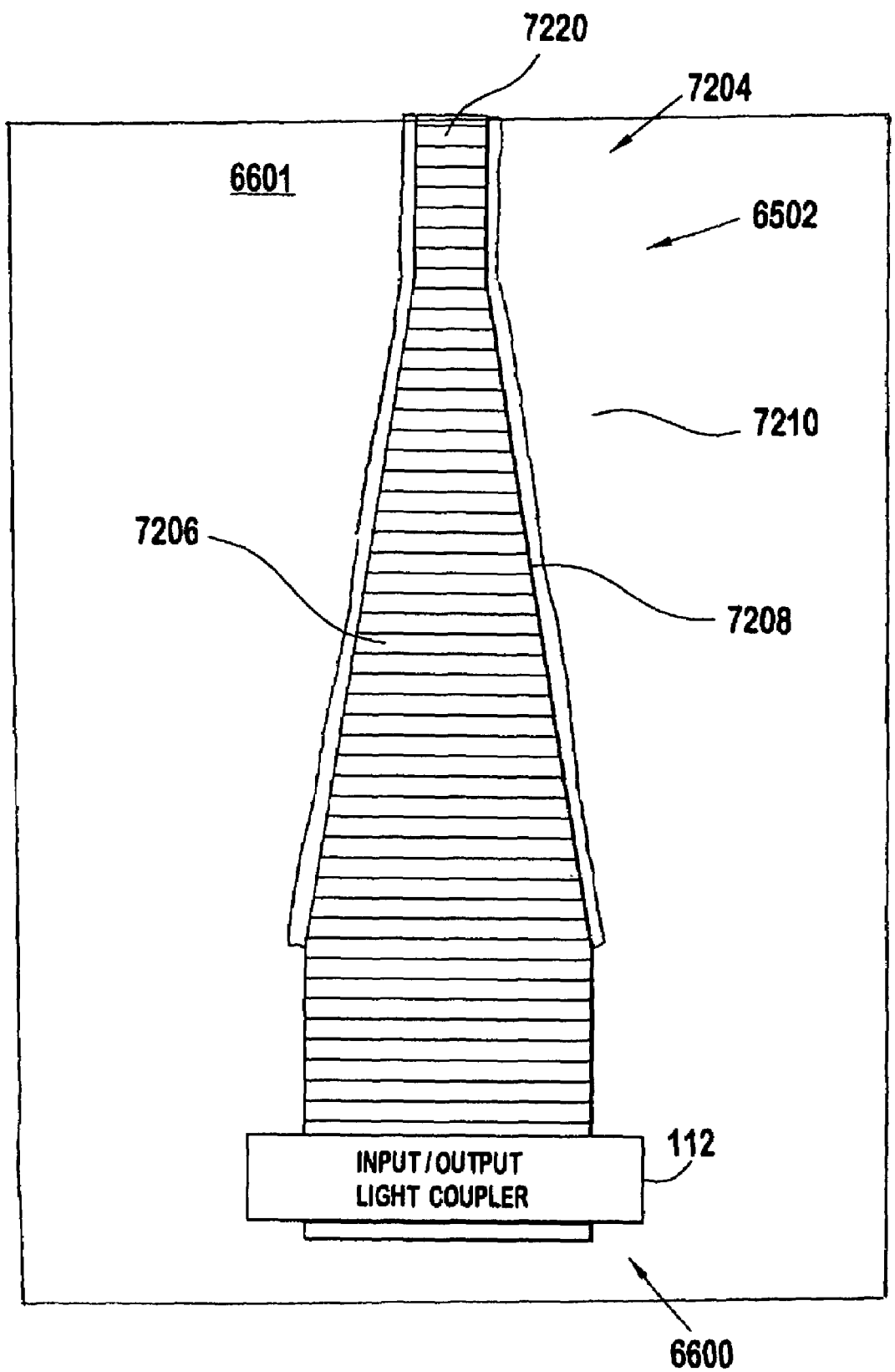
FIG. 72 shows a top view of an embodiment of hybrid active electronic and optical circuit that is configured as an adiabatic taper.

FIG. 72 shows a top view of another embodiment of hybrid active electronic and optical circuit 6502 as formed on the silicon layer 6601 of an SOI wafer 6600 which acts as an adiabatic taper 7204. The adiabatic taper 7204 includes in the silicon layer 6601a taper waveguide 7206, a taper insulator 7208, and an outer portion 7210. Outer portion 7210 represents silicon on which other devices can be formed. The taper insulator 7208 can be formed by initially etching away a considerable portion of the silicon located between the taper waveguide 7206 and the outer portion 7210, and depositing the glass or polysilicon insulator material defining the taper insulator 7208 therein. The taper insulator 7208 is positioned adjacent to taper waveguide 7206 which results in total internal reflection of light traveling within the taper waveguide 7206. The input/output light coupler 112 may be a prism, grating, or other coupling device which inputs light into the taper waveguide 7206. Light within the taper waveguide 7206 is channeled down into the channel portion 7220. As such, the adiabatic taper is configured to reduce the cross-sectional width of the waveguide in which light is passing. FIGS. 73 and 74 show two other embodiments of hybrid active electronic and optical circuits 6502. FIG. 73 shows one embodiment of simple Fabry-Perot cavity 7302. FIG. 74 shows another embodiment of coupled Fabry-Perot cavity 7402.

The Fabry-Perot cavity 7302 as shown in FIG. 73 represents another hybrid active electronic and optical circuit that may be formed on the silicon layer or an SOI wafer, and includes a plurality of passive optical portions 6506 and an active opto-electronic portion 6504. The passive optical portion 6506 includes a waveguide 7310 and a plurality of gratings 7312. The gratings 7312 may be configured in a similar manner as Bragg gratings, surface gratings or other known types of gratings. This Fabry-Perot waveguide operates similar to the well understood Fabry-Perot cavities used in optics. The reflectivity of mirrors (in this embodiment, the gratings act as mirrors) and the cavity optical length determine the reflection/transmission profile of the device.

A constructed Fabry-Perot cavity of this type resonates at specific wavelengths as given by equation 25:

$$2dn_{eff} + \phi_{mirrors} = m\lambda \qquad \text{(equation 25)}$$

Where D is the cavity length, $n_{eff}$ is the effective mode index of the waveguide 7310, and $\phi_{mirrors}$ is the phase shift on reflection. The active electronic portion 6504 maybe considered as an active electronic circuit, such as a MOSCAP, MOSFET, etc. that is used to change the optical characteristic of a cavity by changing the effective mode index within the waveguide. Thus, the Fabry-Perot cavity can be switched between different operating states by controlling the voltage applied to the active electronic portion.

Multiple simple Fabry-Perot cavities 7302 may be axially spaced along a single waveguide 7310 to form a coupled Fabry-Perot cavity 7402 as shown in FIG. 74. The coupled Fabry-Perot cavities 7402 may be considered as a plurality of simple Fabry-Perot cavities 7302 that are axially aligned, in order to use specific optical characteristics gained by coupling the cavities such as narrow transmission resonances inside a broad band reflector. The Fabry-Perot structure in this embodiment is used as an active optical device where the characteristic of the entire structure is controlled by application of potential and change in free-carriers.

A cross section of one of the embodiments of gratings 7304 is shown in FIG. 75. The gratings 7304 include a plurality of raised lands 7502 interspaced with plurality of lower lands 7504 to extend along a top surface of the waveguide 7310. The area within the waveguide 7310 just below the raised lands has a greater effective mode index than the area within the waveguide underneath the lower lands 7504. As such, this regularly repeating pattern of changing effective mode index within the waveguide 7310 acts to reflect a portion of the light that is travelling within the waveguide 7310. The reflectivity and wavelength response is governed by the magnitude of the change in the effective mode index, spacings, and number of lines. Many methods, such as Finite Difference Time Domain (FDTD), exist to compute the reflection/transmission spectrum of such a structure. Thus, the repeating pattern acts as a mirror for the Fabry-Perot cavity, but may be used as a waveguide mirror in its own right. For example, such a mirror may be used with a special curvature instead of the mirror shown in FIG. 66.

The embodiment of grating 7304 shown in FIG. 75 is a passive device. In the Fabry-Perot cavity 7302 and the coupled Fabry-Perot cavity 7402 shown respectively in FIGS. 73 and 74, the respective active opto-electronic portion 6504 is positioned between adjacent gratings 7304. It may be desired to provide a grating structure that is an active device. As such, the wavelengths of light that each grating could reflect or deflect could be controlled. FIGS. 77 and 76 show two alternate embodiments of active gratings 7602. The embodiments of gratings 7602 shown in FIGS. 76 and 77 thus are configured as hybrid active electronic and optical circuits 6502.

The active electronic portion 6504 in the gratings 7602 shown on FIG. 76 is provided by providing electrical conductive layer on the upper surface of the raised lands 7502. By comparison, in the embodiment of gratings 7602 shown in FIG. 77, the active electronic portion 6504 is provided by a metalized surface on the lowered lands 7504. By applying electric current to the active electronic portion 6504 in the embodiment of gratings 7602 shown in FIGS. 76 and 77, the respective regions within the active electronic portion 6504 will change their effective mode index. By varying the polarity and voltage or current applied to the active electronic portion 6504, the effective mode index of the regions underneath the active electronic portions 6504 can be controlled.

Fabricating the embodiments of gratings 7602 in the embodiments shown in FIG. 76 or 77 that include the active electronic portion 6504 and the passive optical portion 6506 can be performed using a variety of techniques. In one embodiment, the material of the gratings 7602 formed above the level of the lower lands 7504 can be deposited on the upper layer 6601 of the SOI wafer 6600 to build the gratings up to the level of the raised lands 7502. In an alternative embodiment, the material between the alternating gratings 7602 can be etched away to form the regions of the gratings that extend from the level of the raised lands down to the level of the lowered lands 7504. In either of these configurations, the metal layer forming the active electronic portion 6504 can be added to the raised lands 7502 or the lowered lands 7504 at the time of fabrication when the gratings are being formed. The material 7620 in the embodiment of gratings 7602 shown in FIG. 76 is preferably added on top of the upper layers 6601 of the SOI wafer 6600.

The upper silicon layer 6601 can be built up to the height equal to the raised lands 7502. Following this uniform build up of the upper silicon layer 6601, a uniform metalization layer can be applied across the entire upper surface of the upper silicon layer. At this time, the upper silicon layer will be thickened by the addition of silicon, and coated by a metal layer corresponding to the active electronic portion 6504. Those portions of the upper layers 6601 that do not correspond to the raised lands 7502 can have the upper middle layer etched away using known metal etching techniques. Following the etching away of the middle layer, the region of the upper silicon layers 6601 that are not coated by the remaining portions of the etched metal, i.e., the silicon areas corresponding to the lowered lands 7504, can be etched away using known silicon etching techniques. The etching of both the metal areas and the silicon layers utilizes masks that have openings, the regions of the openings corresponding either to the areas that are going to be etched or the areas that are not going to be etched.

In those embodiments of gratings 7602 in which silicon material 7620 is not added to the original upper silicon layer 6601, a metalized layer is added to the upper surface of the upper silicon layer 6601. The depth of the metal layer corresponds to the desired depth of the active electronic portion 6504. The techniques of etching away the metal layer of the active electronic portion 6504 and the underlying sacrificial silicon material of the upper silicon layer 6601 are similar to that described with respect to the removal of the metal and silicon portions where silicon has been added.

To fabricate the embodiment of the grating 7602 shown in FIG. 77, the entire upper silicon layer 6601 is built up to the desired height of the raised lands 7502. If the upper silicon layers are higher than the desired height of the raised lands 7502, then the entire upper silicon layer is etched uniformly down to the level of the raised lands 7502. Following the etching or metal deposition, it may be necessary to level the upper surface of the upper silicon layers using such means as, e.g., a chemical, mechanical polisher (CMP). Following the CMP processing, a photoresist is added to the upper surface of the upper silicon layer 6601.

Masks are used to define which area, depending upon the type of photoresist, are going to be etched away and light is applied through the apertures in the masks to the upper surface of the upper silicon layer 6601 to develop the photoresist, if necessary, to define which regions will be etched. Etching is then performed on the uncovered portions of the upper surface of the upper silicon layer 6601, until those uncovered portions are lowered to the level to the lower lands 7504. The upper surface of the lower lands 7504 are then coated with the metal layer corresponding to the active electronic portion 6504 of the grating. The deposition of the metal on the upper surface of the lower lands 7504 can be performed using a mask whose opening corresponds to the regions of the upper silicon layers 6601 that have been etched down to the lower lands 7504.

Figure 78:
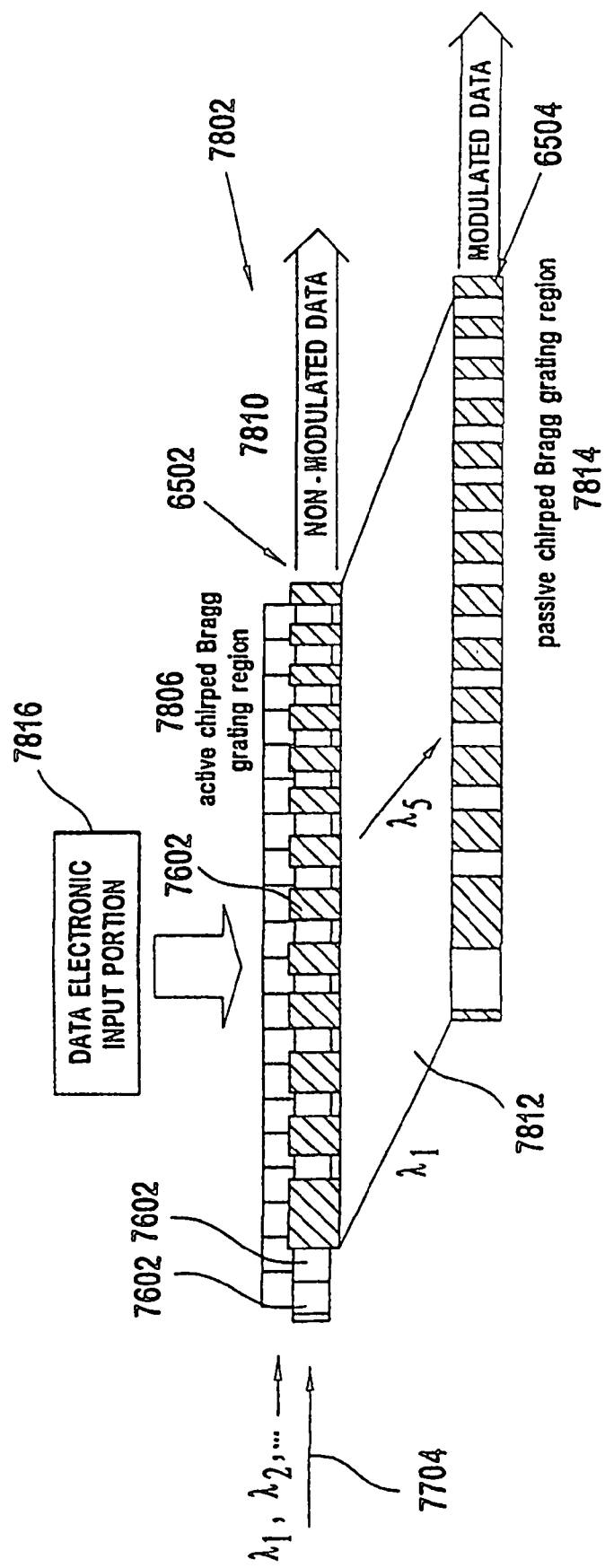
FIG. 78 shows a top view of another embodiment of hybrid active electronic and optical circuit that is configured as a wavelength division multiplexer modulator.

FIG. 78 discloses an embodiment of a wavelength division multiplexer modulator 7802 that includes active gratings such as depicted in FIGS. 20, 21 and 22. Light, of several wavelengths, is inputted into an active chirped grating region 7806. Depending upon the state of each of the gratings 7602 in the active chirped grating region 7806, wavelengths corresponding to each grating may be allowed to continue along the path through the active chirp grating region 7806 as modulated data on output 7810. Alternatively, if any of the gratings 7602 are actuated in the active chirped grating regions 7806, then corresponding wavelengths of light will be deflected across a deflection region 7812, and will thereupon enter is passive chirped grating region 7814.

The active chirped grating region 7806 is a hybrid active electronic and optical circuit 6502 and may include another type of grating such as that shown in either FIG. 76 or 77. The passive chirped grating region 7814, by comparison, does not require any active components, and may include a plurality of gratings shown in the embodiments in FIG. 75. Gratings can act to receive light, and thereby apply the light to a waveguide, as well as to deflect a light from a waveguide. In an alternate embodiment, the active chirped grating region 7806 may be formed from a plurality of the active wavelength specific grating structures as shown in FIG. 41. The active grating region 7806 is created by patterning the free carrier concentration in the waveguide by the application of electricity to the grating, depending upon the specific configuration of the active grating region 7806. The passive chirped grating region 7814 is created at the time of manufacturing by patterning the waveguide, and is configured to receive light at specific mode angles $\theta_M$. Gratings can be applied to those waveguides that receive light as well as those waveguides that emit light.

FIG. 78 shows two gratings of the active chirped grating regions 7806 being actuated, thereby diverting optical signals having wavelengths $\lambda_1$ and $\lambda_5$ to the passive chirped grating region 7814. Light having different wavelengths can thus be used to contain distinct data transmitted as optical signals. Data signals from the data electronic input portion 7816 may be applied to control the individual components of the active chirped grating region 7806. The data electronic input portion 7816 can be fabricated at the same time, on the chip, as the active electronic portions 6504 and the passive optical portion 6502 shown in the embodiments of FIGS. 76, 77 and 75, respectively. As such, the embodiment of wavelength division multiplexer modulator 7802 shown in FIG. 78 can be considered as an embodiment of hybrid active electronic and optical circuit 7602.

Figure 79:
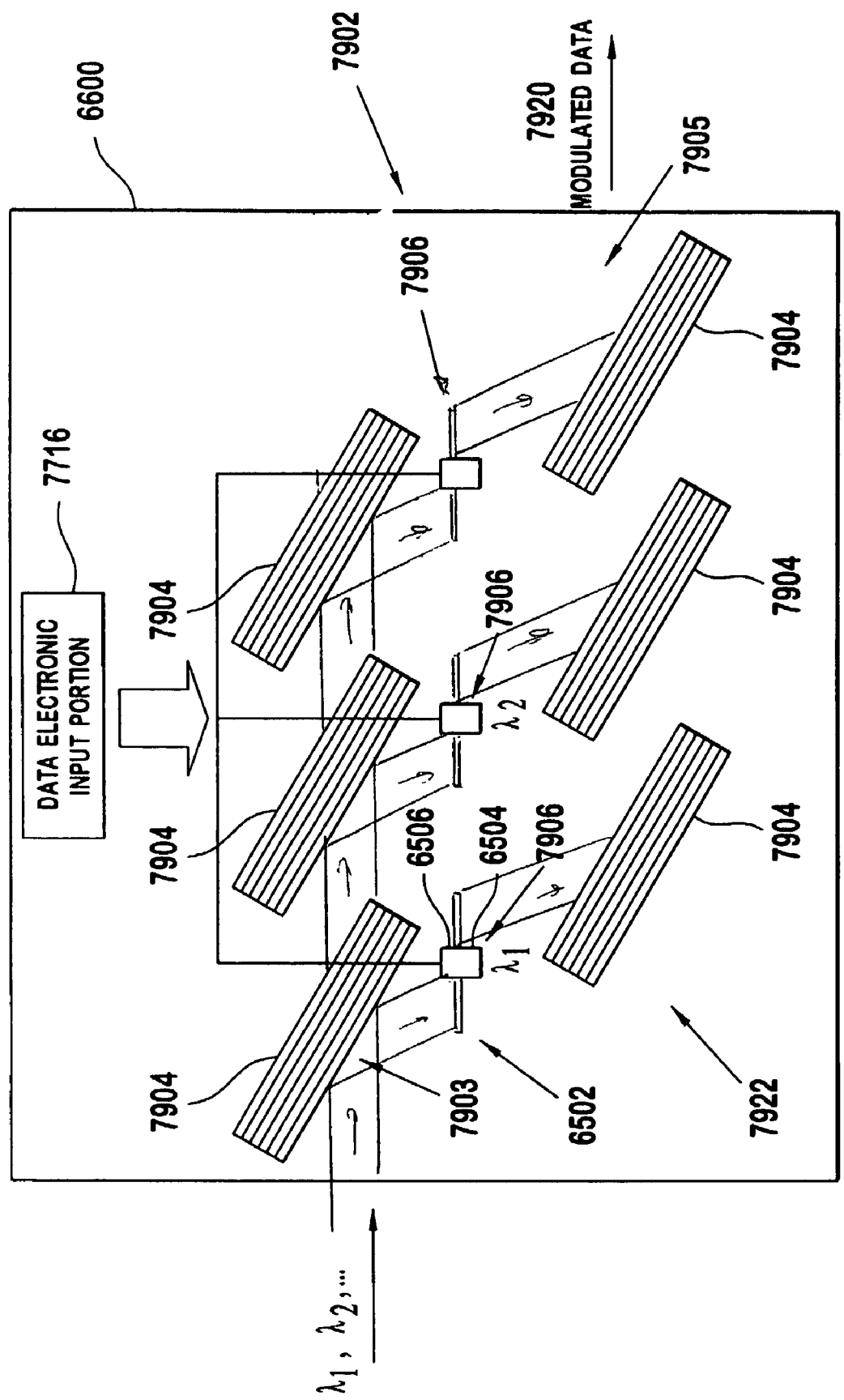
FIG. 79 shows a top view of yet another embodiment of hybrid active electronic and optical circuit that is configured as a wavelength division multiplexer modulator.

FIG. 79 shows an alternate embodiment of wavelength division multiplexer modulator 7902. The embodiment of wavelength division multiplexer modulator 7902 in FIG. 79 includes an input light portion 7903, an output light portion 7905, and a plurality of evanescent couplers 7906 that optically couple light from the input light portion 7903 to the output light portion 7905. The embodiment of FIG. 79, as well as the embodiments in FIGS. 69 to 71, represent an illustrative, but not exhaustive, group of optical devices. The input light portion 7903 includes a plurality of gratings 7904, configured to deflect light to their respective evanescent couplers 7906. The evanescent couplers 7906 each are configured as hybrid active electronic and optical circuits 6502 since they include a plurality of tapered gap regions 7920 and an active electronic portion 7922. The tapered gap region may be configured as embodiments of the hybrid active electronic and optical circuits shown in FIGS. 69, 70, and 71. As such, depending upon the data applied from the data of electronic input portion to each respective evanescent couplers 7906, optical beams input wavelength division multiplexer modulator 7902 will either continue to the grating 7904 located in the output light portion 7905, or alternatively, the optical beam will be reflected by the evanescent coupler 7906, and return to the grating on the input light portion 7903. Only the light portion that continues to the gratings 7904 located in the output light portion 7905 is included as modulated data 7920.

The passive optical portion 6506 as well as the active electronic portion 6504 of each evanescent coupler 7906 can be formed simultaneously on the upper silicon layer 7922 of the SOI wafer 6600. The etching, deposition, and metalization processes can be performed using similar steps to form all of the passive optical, active optical, passive electronic, and active electronic circuits in the upper silicon layer 7922 of the SOI wafer 6600.

Figure 80:
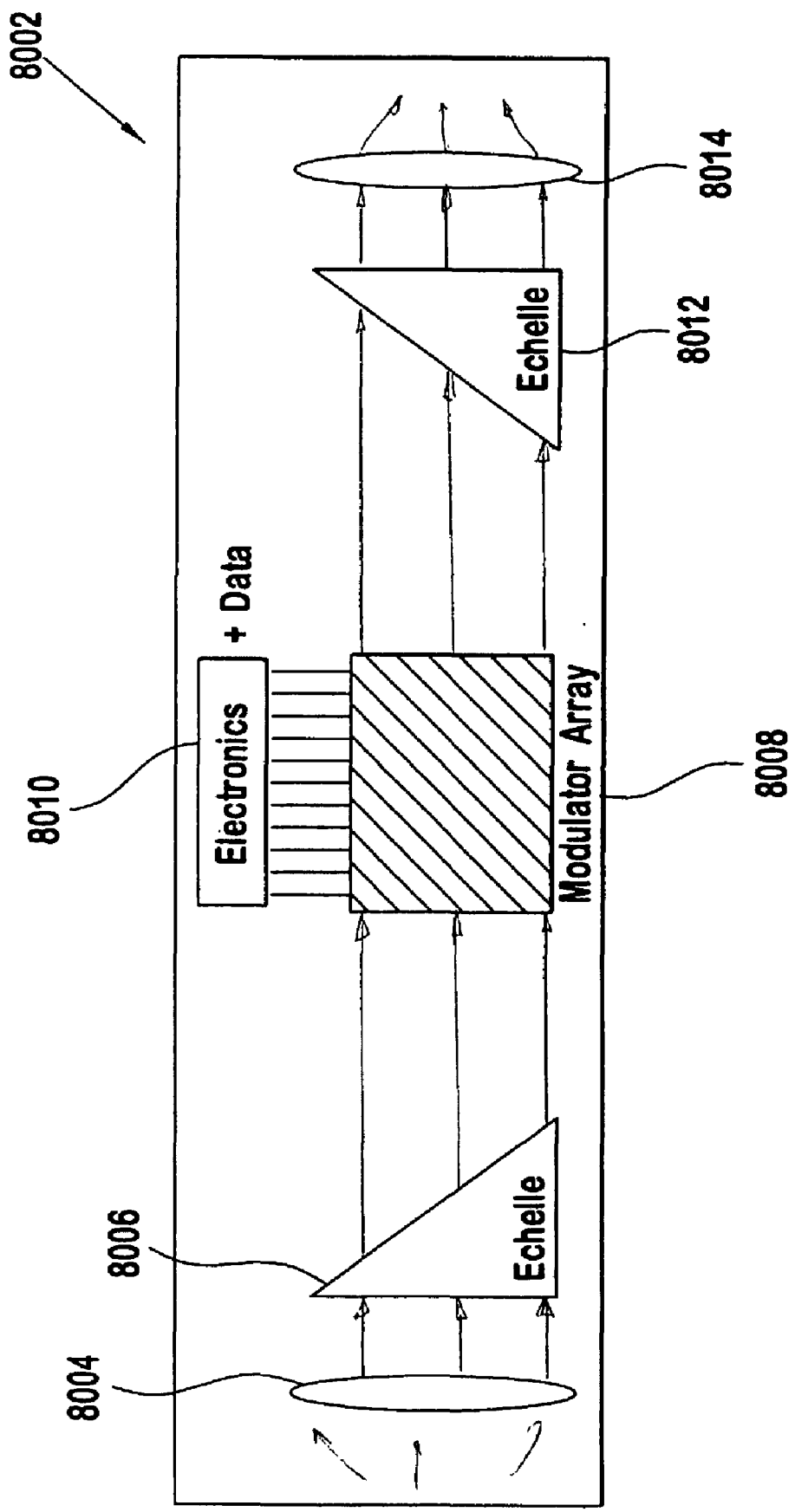
FIG. 80 shows a top view of another embodiment of hybrid active electronic and optical circuit in addition to multiple Echelle gratings and multiple lens that is configured as a wavelength division multiplexer modulator.

FIG. 80 shows another embodiment of wavelength division multiplexer modulator 8002. The wavelength division multiplexer modulator 8002 includes an input lens 8004, an input Echelle grating 8006, a modulator array 8008, and electronics and data portion 8010, an output Echelle grating 8012, and an output lens 8014. The input lens 8004, the input Echelle grating 8006, the output Echelle grating 8012, and the output lens 8014 are each configured alternatively as a passive device or an active device. For example, the lens and Echelle gratings can each be formed by shaping a pattern in the upper surface of the silicon layer defining the waveguide that alters the effective mode index in the region of the waveguide under the shaped pattern. Additionally, an embodiment of Echelle gratings 8006, 8012 can be formed as an active device as shown in FIG. 25B.

Additionally, in one embodiment, the lenses 8004, 8014 can be configured as active devices as shown in FIG. 28 or 30. Additionally, the modulator array 8008 is configured to block the frequencies that are not going to be in the modulated output, while allowing those frequencies that are within the modulated output to pass to the output Echelle grating 8012. All of the elements 8004, 8006, 8008, 8010, 8012, and 8014 can be formed using planar lithography techniques using a series of masking steps on the SOI substrate, as described above. The wavelength division multiplexer therefore has passive waveguide elements, traditional electronics, and active waveguide element formed on the same substrate.

Figure 81:
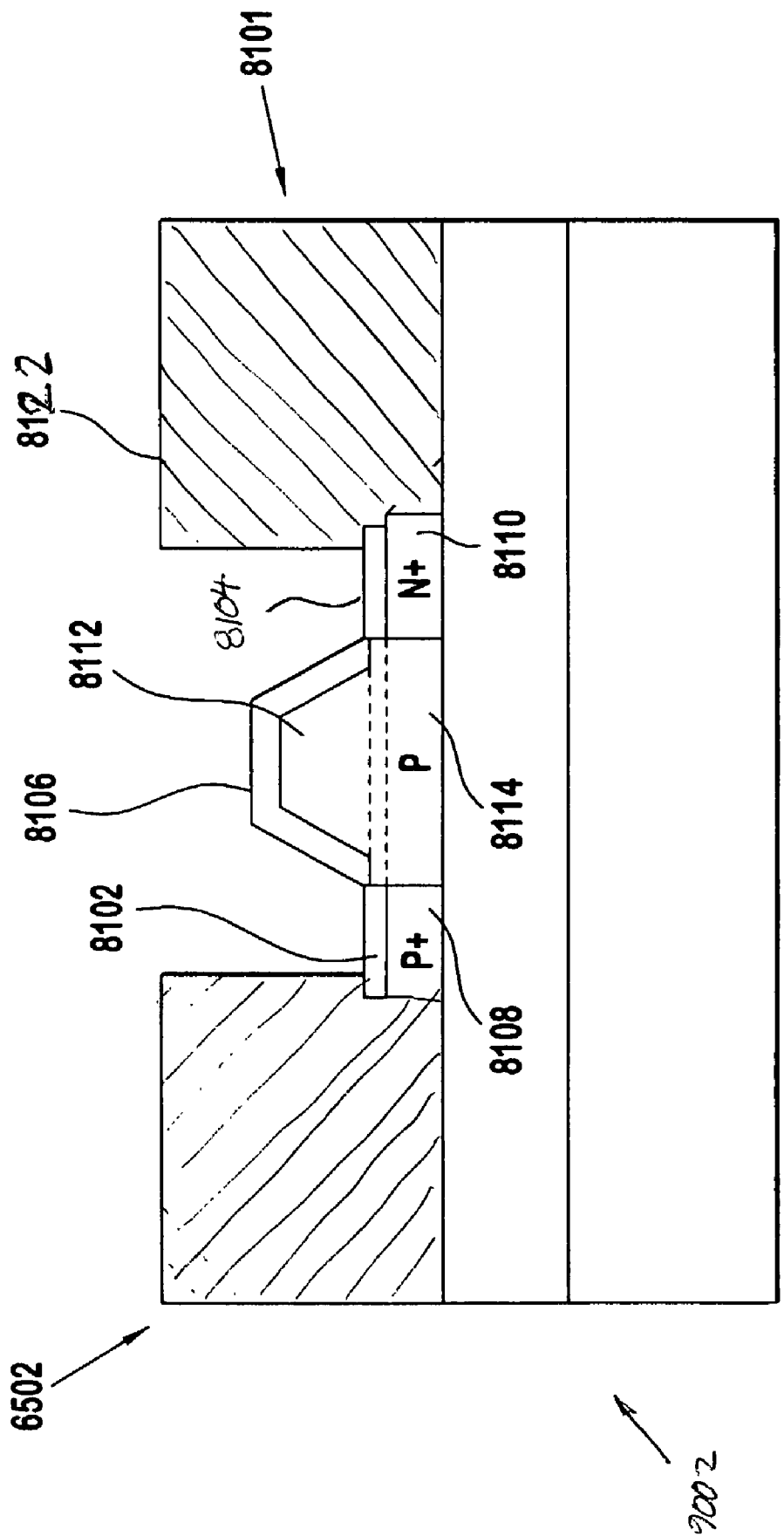
FIG. 81 shows a top view of another embodiment of hybrid active electronic and optical circuit that is configured as a simple diode.

FIG. 81 shows another embodiment of hybrid active electronic and optical circuit 6502 that is configured either as a diode or as a field effect transistor. The field effect transistor 8101 is configured with the source contact 8102, a drain contact 8104, and a gate contact 8106. Underneath the source contact 8102, there is a P$^+$ region 8108 that is biased by electric voltage being applied to the source 8102. Underneath the drain 8104, there is a N$^+$ region 8110 that is biased by a voltage applied to the drain 8104. Underneath the gate 8106, there is a loaded optical structure 8112, and below the loaded optical structure 8112 there is a P region 8114. Light beams are modulated by passing current via the source 8102 and the drain 8104 through a p-n junction established in the diode. Thus, free carriers from the injected current are used to change the effective mode index in the loaded optical structure 8112 and the P region 8114, that together acts as a waveguide. The phase and/or amplitude of light in the waveguide can thus be varied based on the applied voltage. An electrical conductor 8122 is electrically coupled to drain 8104. The use of a specific doping is illustrative, but not limiting in scope. For example, an inversely doped device will operate similarly provided that the polarities are reversed, as such, the simple diode 6502 would operation similarly if the region 8108 was doped N$^+$, region 8114 was doped N, the region 8110 was doped P$^+$ while the polarity of electrical conductors 8120 and 8122 were reversed from their present state. If the source 8112 and the drain 8104 are electrically connected together, then the hybrid active electronic and optical circuit device 6502 acts a diode instead of a field effect transistor.

Figure 90:
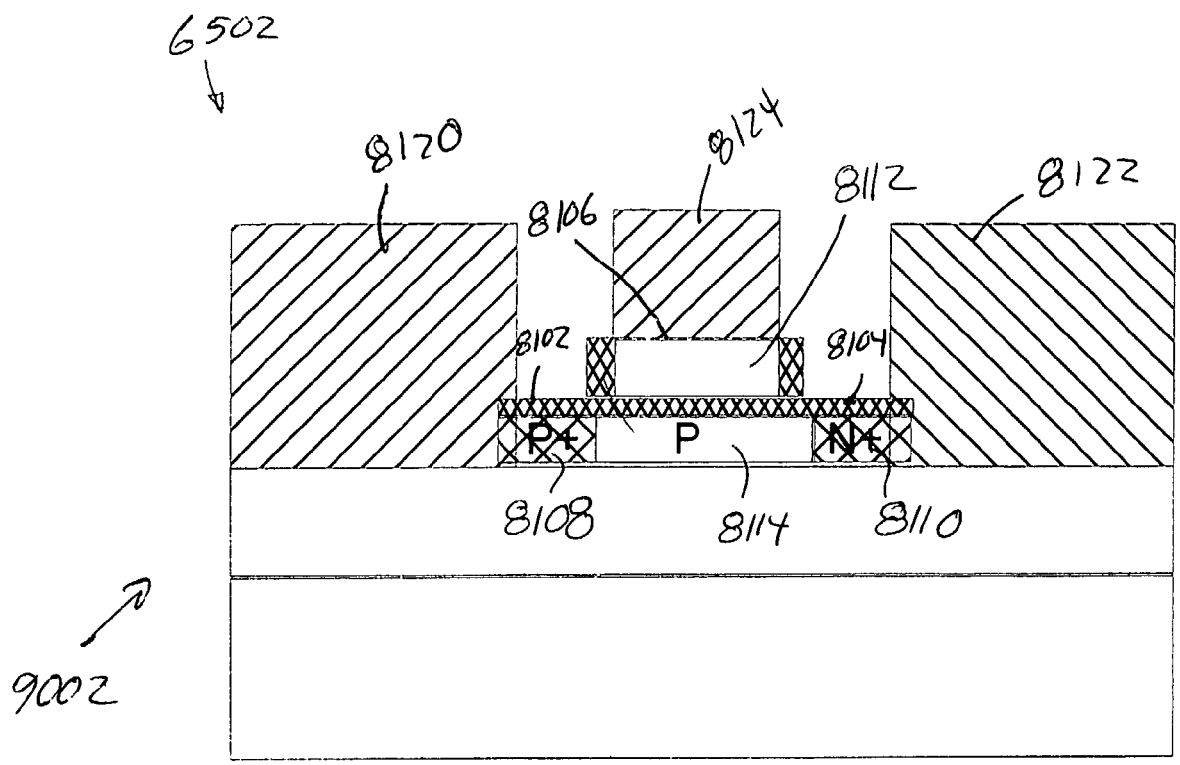
FIG. 90 shows another embodiment of hybrid active electronic optical circuit from that shown in FIG. 81.
Figure 91:
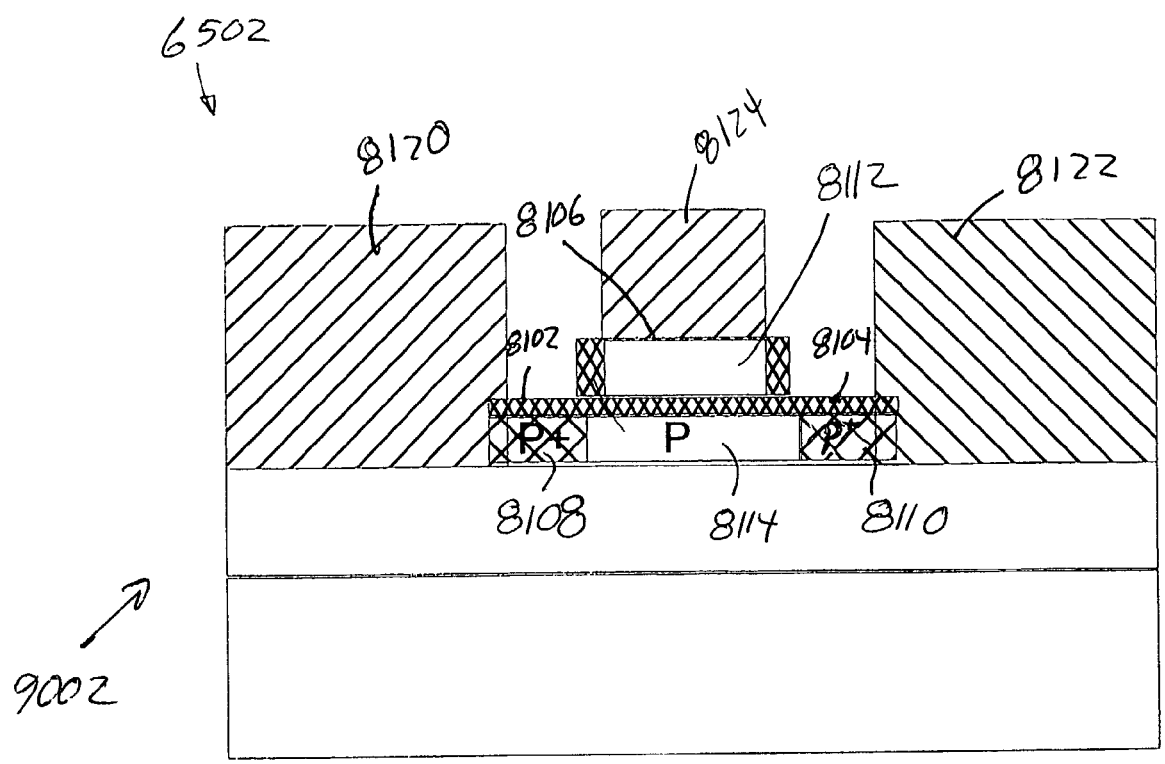
FIG. 91 shows another embodiment of hybrid active electronic optical circuit from that shown in FIG. 90.

FIG. 90 shows one embodiment of field-plated diode 9002 that differs from the embodiment of diode shown in FIG. 81 primarily by the addition of an additional electrical conductor 8124 that is electrically connected to the gate 8106. The field-plated diode 9002 free carrier characteristics can be altered by applying a potential to the gate 8106 via the electrical conductor. Light can therefore be modulated. The gate 8106 can be configured as viewed from above in a similar manner as the embodiments of active optical waveguide devices shown in FIGS. 1-5, and 9-49 by appropriately shaping the gate electrode. A large variety of transistor/diode devices can therefore be utilized as the active electronic portion of one embodiment of the hybrid active electronic and optical circuit by similarly slight modifications. For example, FIG. 91 shows one embodiment of a MOSFET 9101 (and if the source and drain are electrically connected, a MOSCAP). Note that the doping of region 8110 is the only structural difference between FIGS. 90 and 91. Such devices are within the intended scope of the present invention.

Optically, light is guided perpendicular to the plane of the taper in FIG. 81, in a loaded optical structure 8112. The structure of glass and polysilicon shown is an example in which the hybrid active electronic and optical circuit 6502 create a higher mode index in the center of the loaded optical structure 8112, in order to ease lateral confinement of the light flowing within the waveguide defined by the loaded optical structure 8112. This represents one embodiment of a lower waveguide. There are a large variety of diodes and transistors that FIG. 81 represents an illustration of the operation thereof.

IX. Photonic Band Gap Device

This section describes certain aspects of shallow photonic band gap devices. Whereas traditional photonic bandgap devices extend substantially through the entire vertical height of the waveguide, the shallow photonic band gap devices extend through some percentage of the waveguide. The inclusion of the shallow photonic band structure alters the effective mode index in those regions of the waveguide that are below the shallow photonic band gap compared to those portions of the regions of the waveguide that are not below the shallow photonic band gap. Depending on the gradient of the effective mode index within the waveguide, the shallow photonic band gap devices provide an efficient and affordable optical device. It is envisioned that the shallow photonic band gap devices can be used as a hybrid active electronic and optical circuit 6502 as described herein by applying metal to either within the shallow photonic band gap devices or outside of the shallow photonic band gap devices, and applying a controllable electric current to the shallow photonic band gap devices. By applying an electric voltage to the shallow photonic band gap devices, the effective mode index within the region of the waveguide that is positioned adjacent to the metalized portion can be controlled.

Figure 82:
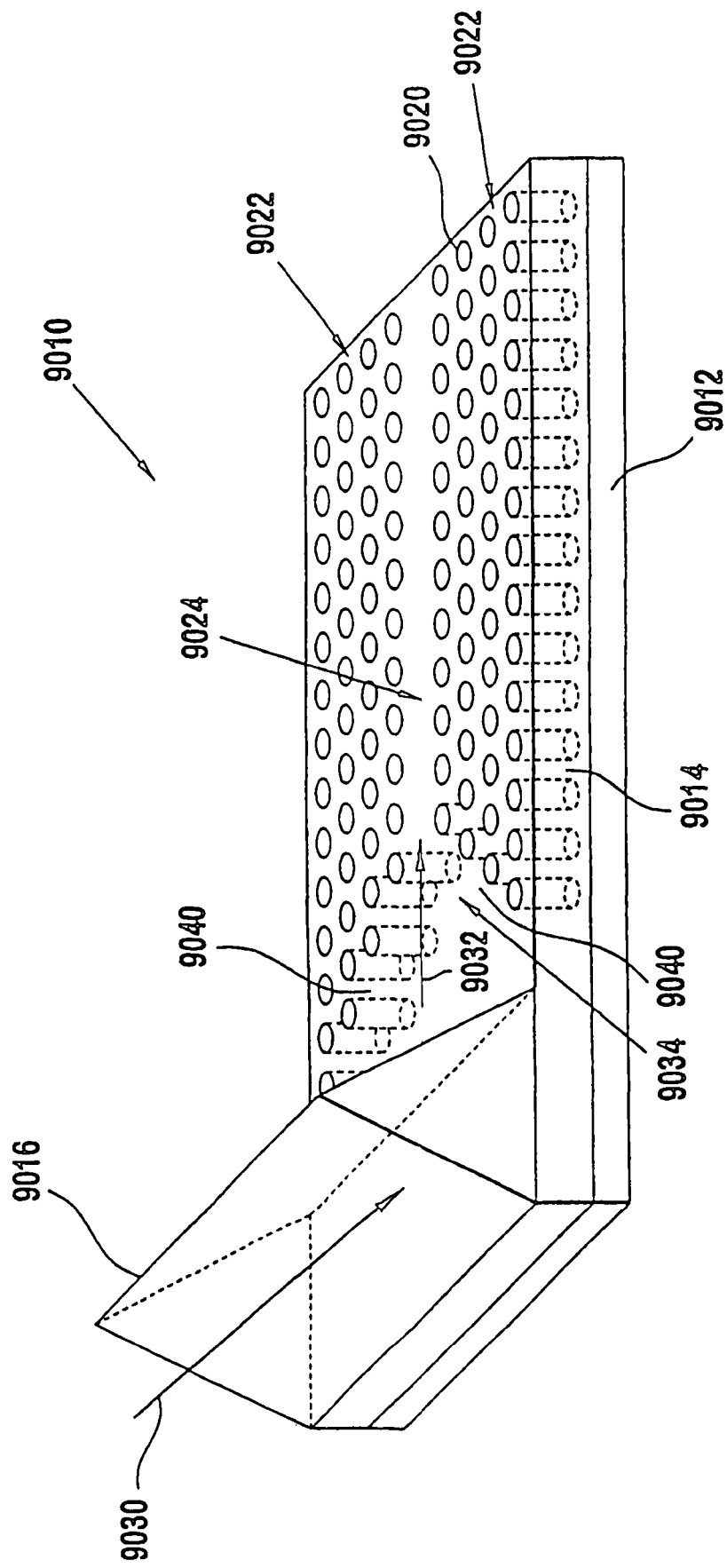
FIG. 82 shows a perspective view of one embodiment of prior art photonic band gap device.

The photonic band gap device 9010 of FIGS. 82 to 85 is used to control and direct the flow of light. FIG. 82 shows one embodiment of a two-dimensional embodiment of a photonic band gap device 9010 including a substrate 9012, a waveguide 9014, a coupling prism 9016, and a plurality of regions of photonic crystals 9022. The photonic band gap device 9010 may be fashioned as a one-dimensional device (one embodiment shown in FIG. 84), a two-dimensional device (one embodiment shown in FIG. 85), or a three-dimensional device (one embodiment shown in FIG. 87). The substrate 9012 is optional, and may not be provided in certain embodiments. In most SOI configurations, however, it is envisioned that the substrate 9012 will exist. In those embodiments in which the substrate is not provided, the waveguide 9014 is designed with sufficient strength and rigidity to sustain the physical forces that the circuit would normally be expected to encounter.

The photonic band gap device may using prisms, gratings or other such coupling devices to input/output light to the waveguide. The coupling injects light into, or removes light from within, the waveguide. One embodiment of coupling a fiber to a photonic band gap device involves abutting a fiber directly in contact with a fact of the waveguide to allow light to travel directly from the fiber into the waveguide.

The waveguide 9014 may include one or more channels 9024 that provide for the closely guided passage of light. Therefore, as shown in FIG. 82, light is applied from an incident field 9030 through a coupling prism 9016, and thereby flows through the waveguide as indicated by arrow 9032 to be directed toward the channel 9024. The horn 9034, in addition to the channel 9024, defines another region within the waveguide (in addition to the channel) in which no regions of photonic crystals (i.e. no pillars 9020) exist and light of the wavelength associated with the region of photonic crystals is free to propagate. The horn 9034 is configured with one or more ramping sides 9040, that direct light within the waveguide as shown by arrow 9032 through the horn portion 9034 into the channel 9024 that has much lesser thickness than that of the coupling prism 9016.

Another aspect of coupling involves how one directs the light into a channel formed in the waveguide. The horn 9034 (shown in FIGS. 82 and 83) is used for this latter photonic band gap device coupling. The region of photonic crystals 9022 is shaped to define the horn 9034. The first and second coupling aspects can be considered independently. Irrespective of how light is injected into or removed from the waveguide, however, the horn like structure can be used to direct the light that is within the waveguide into a channel.

Figure 83:
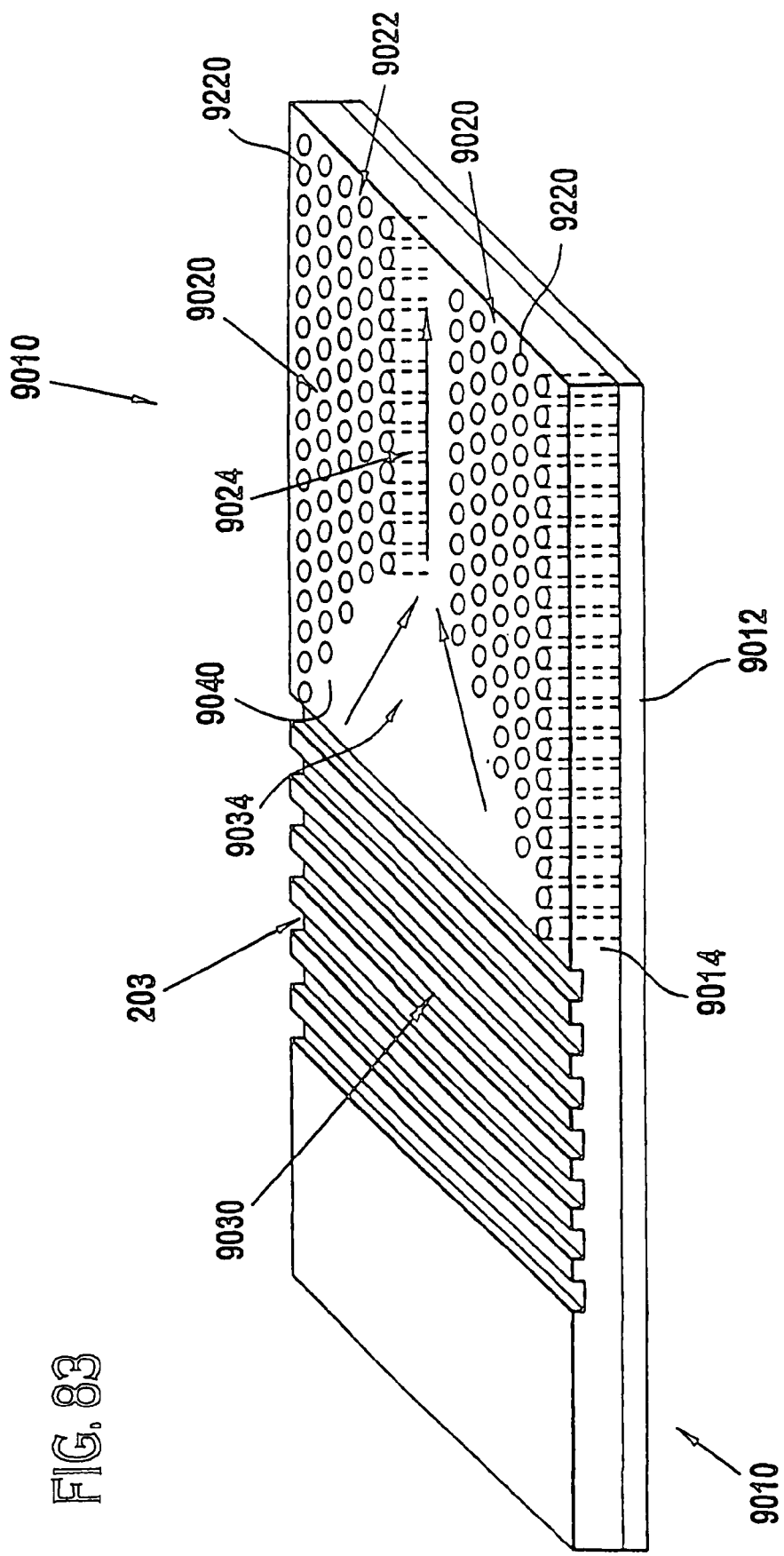
FIG. 83 shows a perspective view of one embodiment of a photonic band gap device.
Figure 84:
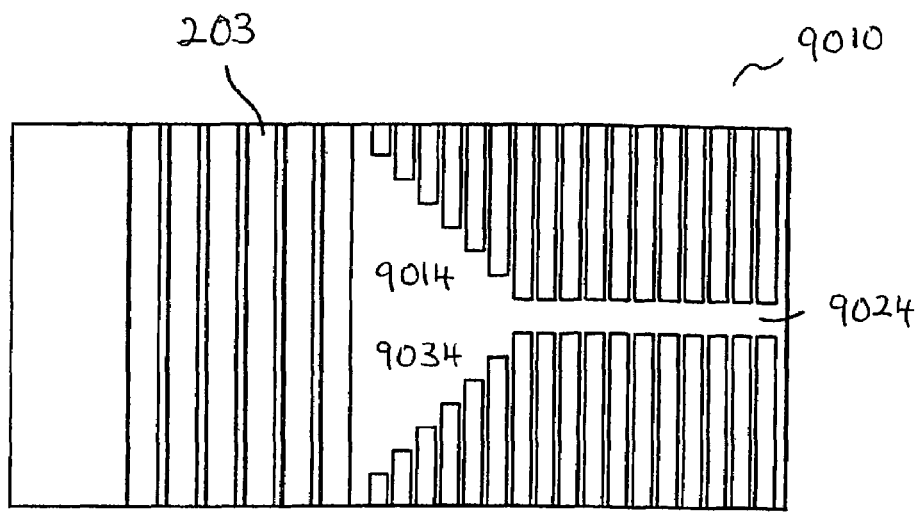
FIG. 84 shows a top view of one embodiment of optical waveguide device.

In one embodiment of one-dimensional waveguide 9014 shown in FIG. 83, the two regions of photonic crystals 9022 are arranged on opposing sides of the channel 9024. Each region of photonic crystals 9022 is arranged as a series of regularly spaced pillars 9220 formed of a material having similar dielectric constants. The dielectric constant of pillars 9220 differs from the region of the waveguide surrounding the pillar. The region of photonic crystals 9022 extends across the entire waveguide except for the regions required for the horn 9034 and the channel 9024. The one-dimensional regions of photonic crystals 9022 may be viewed as gratings in which alternating planes of different propagation constant (i.e. resulting from a varied effective mode index) are provided across which light traversing the waveguide passes.

In the embodiment of two-dimensional configuration shown in FIGS. 82 and 83, the waveguide 9014 is formed with photonic crystals defines by the plurality of shallow pillars 9020 that do not extend through the vertical height of the waveguide 9014. The cross sectional shape of the shallow pillars is applied to the region under pillars. Photonic crystals are defined by, and include, the pillars in the photonic band gap device as well as the region underneath the pillars in which the dielectric constant of the material is varied by the pillars. The pillars 9020 are arranged to define one or more regions of photonic crystals 9022, and the spatial density of the pillars 9020 and the associated projected photonic crystals within the region of photonic crystals 9022 is sufficient to limit the passage of certain wavelengths of light through each of the region of photonic crystals 9022. The pillars 9020 in different embodiments of the photonic band gap device 9010 may be left empty or filled with certain materials to allow for a variation in the propagation constant or effective index of the material outside of the photonic crystals 9022 compared to the material within each one of the photonic crystals. The pillars 9020 may be formed by actual machining (such as removal of the material within the region of photonic crystals considered to form the pillar) or some other technique to alter the dielectric constant of the material within the pillar compared within the material outside of the pillar. The pillars may be entirely physically formed or partially physically formed and partially projected or entirely projected.

Figure 85:
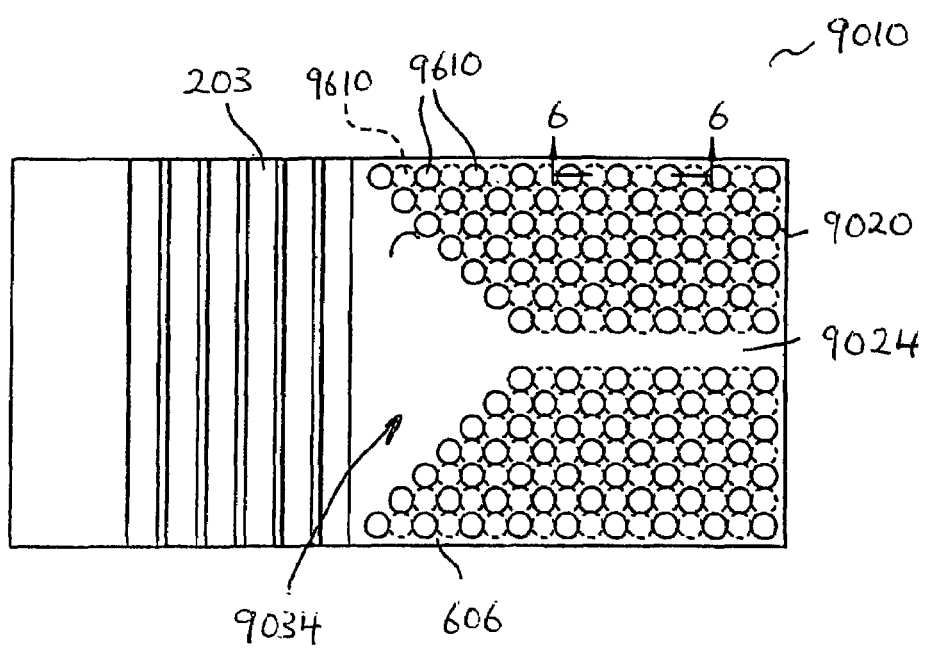
FIG. 85 shows a top view of another embodiment of photonic band gap device.
Figure 86:
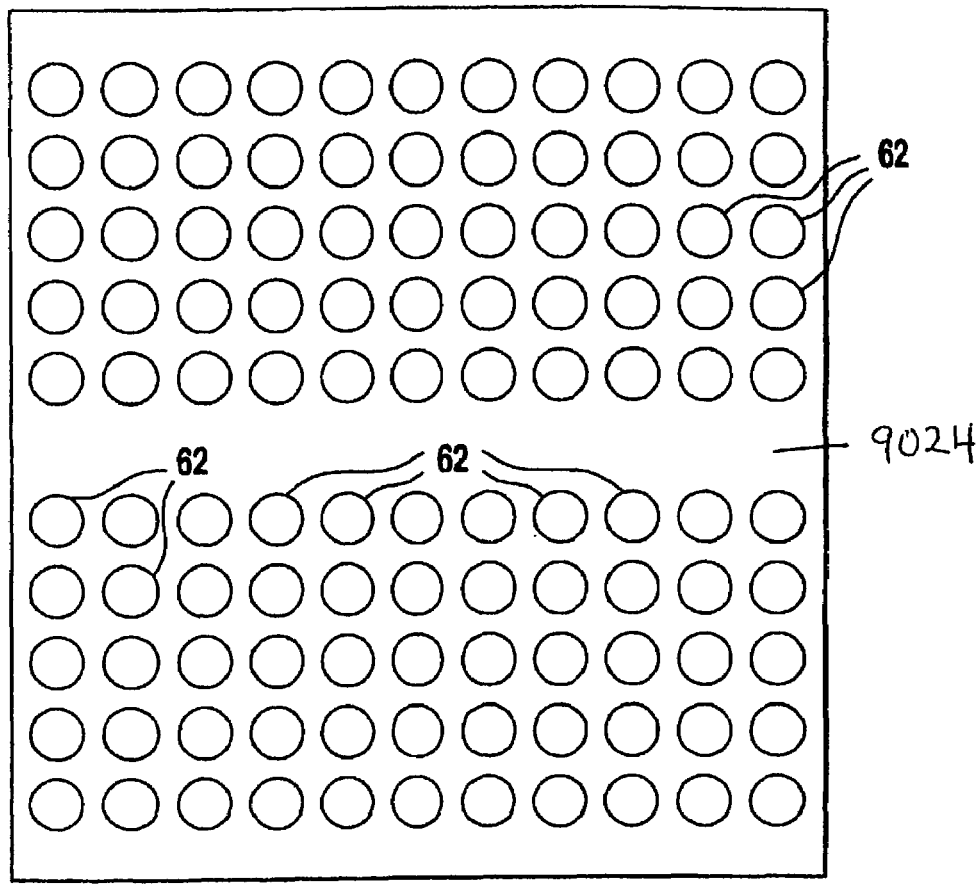
FIG. 86 shows a top view of an array of photonic crystals used in a photonic waveguide device.
Figure 87:
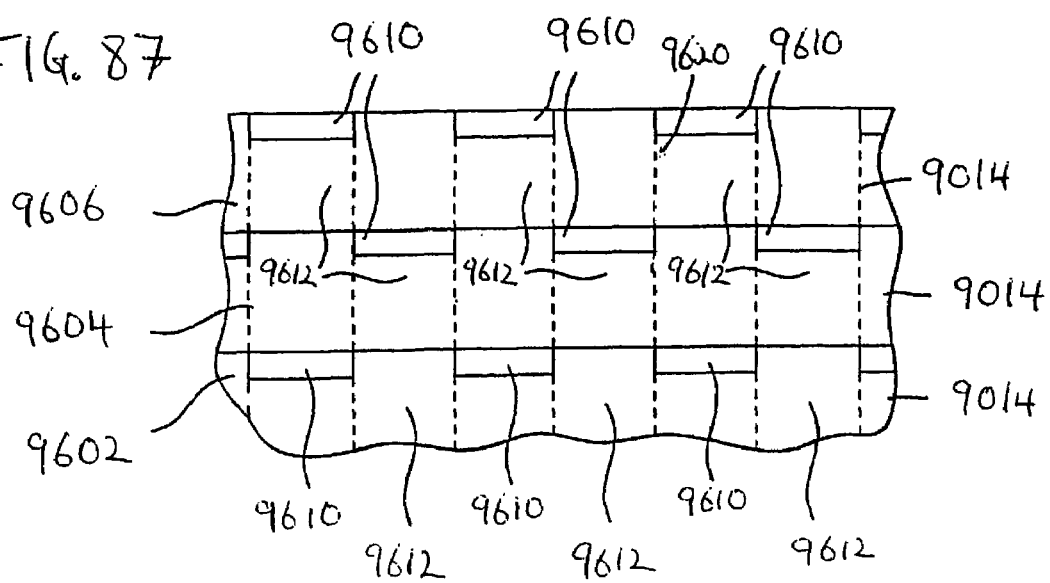
FIG. 87 shows a side view of one embodiment of a multi-level photonic waveguide device.

One embodiment of three-dimensional waveguide 9014 is shown in FIG. 87, and in top view in FIG. 85. The three-dimensional waveguide is formed from a plurality of alternating layers 9602, 9604 and 9606 that are secured to one another. Shallow pillars 9610 are provided one of the alternating layers 9602 that alter the dielectric constant of a photonic crystal formed by the shallow pillars 9610. From above, the shallow pillars 9602 are formed in an array configuration similar to as shown in FIG. 86. The layer 9604 positioned above layer 9602 includes another array of shallow pillars 9610 that produce an array of photonic crystals 9612 in layer 9604 similar as described above relative to the array of shallow pillars 9610 in layer 9602. This staggering occurs in a planer fashion as viewed from above. The staggering of the shallow pillars enhances the structural rigidity of the three-dimensional photonic band gap device. The array of shallow pillars 9610 in each layer 9602, 9604, 9606 is staggered relative to the array of shallow pillars in the respective layer above and below that layer. This staggering of the pillars 9602, 9604 provides for structural rigidity using a honeycomb like structure. Each layer is formed using regularly alternating dielectric patterns between the pillars, and the material between the pillars. The material of each layer 9602, 9604, 9606 may be individually selected based upon its dielectric characteristics to provide a variety of operations.

The waveguide in the photonic band gap device is mounted to the substrate. the substrate provides protection, rigidity, and support for the waveguide in this embodiment. However, in other embodiments, no substrate is provided. In effect, the waveguide becomes a freestanding structure. Therefore, any waveguide configuration that provides for either free standing waveguides or waveguides mounted to, or affixed to, some sort of substrate is within the intended scope of the present invention.

The different embodiment of photonic band gap devices of the present invention may be fashioned as either active or passive devices. Passive photonic band gap devices are considered to be those photonic band gap devices that do not have an input (e.g., a voltage, current, optical, or any other signal) that controls the operation of the photonic band gap device.

There are multiple embodiments of traditional photonic band gap devices described herein that are within the scope of the present invention.

FIG. 83 shows one embodiment of passive photonic band gap device (referred to as a shallow passive photonic band gap device 9010) whose region of photonic crystals is delineated by shallow pillars which do not extend through the entire vertical height of the waveguide. In one embodiment, the shallow passive pillars extend from the upper surface for a height h, but do not extend fully through the waveguide. Each one of the shallow passive pillars 9220 can be biased to control the relative dielectric constants of those areas of waveguide material set forth under the shallow passive pillars. In certain embodiments of shallow passive photonic band gap devices, the pillars are formed as wells, recesses, or indentations in the upper surface of the waveguide. FIG. 85 shows a top view of one embodiment of circular recesses that define the shape of the pillars. The pillars can also be defined by the square, rectangular, or some other regularly repeated shape, as opposed to circular holes.

If the holes of the shallow passive pillars are not filled (and therefore may be considered to be filled with air) the structure which includes the holes is not as structurally sound as solid waveguide devices. Since the holes or gratings in the traditional photonic band gap device extend vertically through the entire waveguide, the shallow passive photonic band gap structure is structurally considerably stronger than the traditional photonic band gap device.

Once the voids are formed, they can be filled with some other material. In one embodiment, the hole can be filled with some photo resistant glass, metal, etc., and the uneven surface of the glass provided by the deposition process is polished so the upper surface of the waveguide is level again. This results in a photonic band gap device formed as a solid slab (without shallow pillars filled with air). The structure of this photonic band gap device is almost as strong as the original waveguide before the shallow pillars were formed.

The shallow passive photonic band gap device 9010 is configured with an array of wells or recesses that are formed which, for example, prevent certain colors of light from propagating at the location of the wells in the shallow passive photonic band gap device 9010. The wells or recesses area referred to as "shallow passive pillars". The defects include the missing shallow passive pillars, rows of pillars, or gratings. The missing shallow pillars can be formed by not providing any shallow pillars, or alternatively filling shallow pillars with a material that shares the dielectric constant with the remainder of the waveguide. An aspect ratio of rod-shaped region of altered propagation constant that extends below the shallow passive pillars is defined by the configuration of the shallow passive pillars (the aspect ratio is characterized by the height of the geometry divided by the diameter of the circle) and/or the state of the gate electrodes as discussed above. the present embodiment of shallow passive pillars may be drilled using lithography techniques to provide approximately a 1:1 aspect ratio. The aspect ratio is achievable and can be performed by most semiconductor fabs to provide this type of fabrication.

The contrast of the refractive index of the material in the shallow passive pillars compared to the material in the remainder of the waveguide is large, which is typical for shallow passive photonic band gap devices (for example, the refractive index between silicon and air is on the order of index of 3.5). When the contrast of the refractive index is large, certain wavelengths of light are not allowed to propagate inside this material. If a light of such a wavelength (colors) were allowed to propagate in the medium, the light would be reflected. Such light can be diffracted by contacting regions of altered propagation constant (effective index) produced by the waveguides shallow passive pillars extending into the waveguide.

Providing that the regions of altered propagation constant formed by the shallow passive pillars are formed in a funneling configuration, then the light of the appropriate wavelength is funneled into the channel. Light is guided essentially by the ramped walls. This process only works over a certain range of colors. Certain colors (wavelengths) of light scatter in such a way that that colors get reflected back out from the photonic band gap device.

In photonic band gap devices, certain wavelengths of color are allowed to travel undeflected through the regions of altered propagation constant within the photonic band gap device. The selection of light that passes through the regions of altered propagation constant defined in the waveguide beneath the shallow passive pillars are characterized by Maxwell's equation. When the equation is solved, the certain colors which are allowed to propagate through the regions of altered propagation constant associated with each shallow passive pillar can be determined. The size of the shallow passive pillars are thus designed to act as a filter to restrict/pass certain wavelengths of light that correspond to certain set of colors of interest. If a row or couple of rows of these shallow passive pillars were deleted, then light could travel within the channel.

The channels between the regions of the shallow passive pillars 9220 are configured to be on the order of $\lambda/2$. The precise dimension depends on the index contrast and all kinds of other things, but say that its of the order of 500 nm. It may be challenging to focus a light beam, so the efficiency of actually sending a light beam from some external source into this channel is reduced. Much of the light hits the side walls, and reflects back. Only the part of the beam that is near a particular region will go through. However, the horn takes a very broad beam of light and slowly focuses it into the channel to get a very high coupling into the channel. There are multiple embodiments of couplers including a prism, a grating, a butt coupling, and tapers.

Almost all of the light that enters a channel 9024 formed in a passive photonic band gap device will exit the channel. The light passing through the channel appears as a little wire of light traveling along the channel. There will be come limited scattering and losses provided by the channel which means that the photonic crystals produced by these pillars do not perfectly reflect light but instead the photonic crystals scatter some negligible amount of light. Practically, the photonic crystals defined by the pillars can be considered to be perfectly smooth and fully reflecting, and based upon the shape of the array of photonic crystals, virtually all of the light is kept in the channel.

Figure 88:
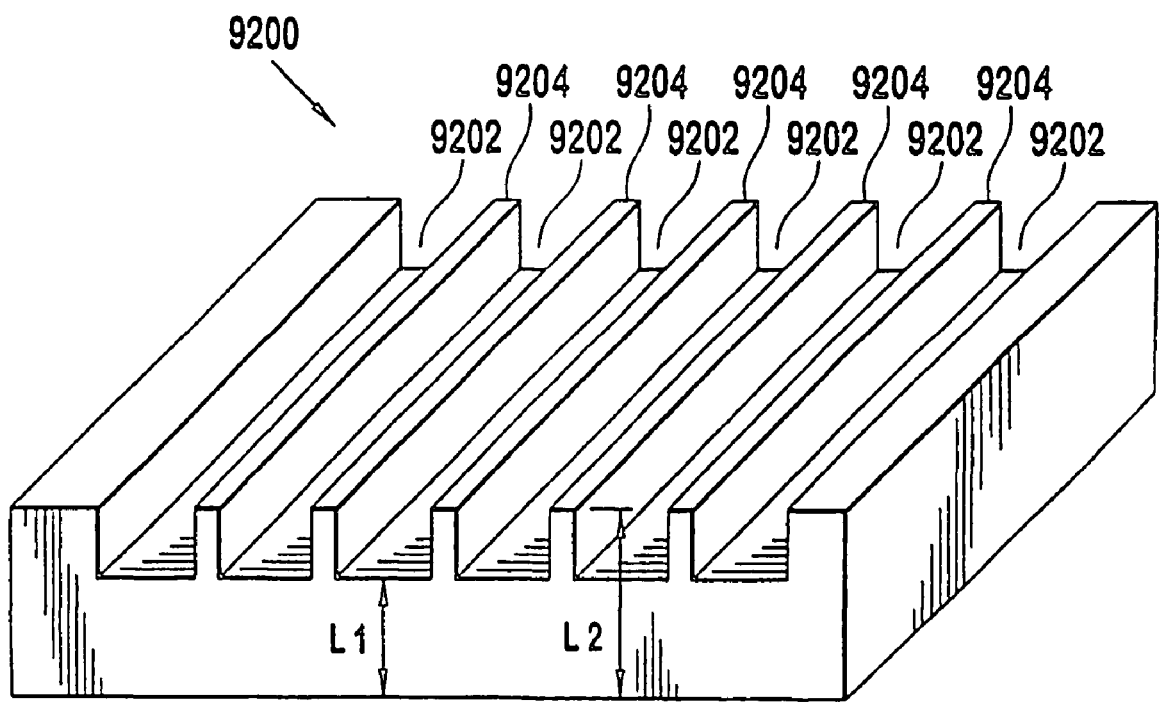
FIG. 88 shows a side view of another embodiment of a photonic waveguide device.

One embodiment of shallow passive photonic band gap device that is configured as a one-dimensional device, taken in perspective view, is shown as 9200 in FIG. 88. This embodiment includes a grating structure formed by a plurality of longitudinally extending lower lands 9202 alternating with a plurality of longitudinally extending raised lands 9204. The grating may be considered as a one dimensional version of the shallow pillars 9220 shown in FIG. 83. In the grating, light travelling in the waveguide passes through regions of altered propagation constant defined by the areas under the pillars as the light flows through the waveguide. The pillars can extend a variety of distances across the width of the waveguide. For example, the pillars can form the region of photonic crystals shown in FIG. 83.

Figure 89:
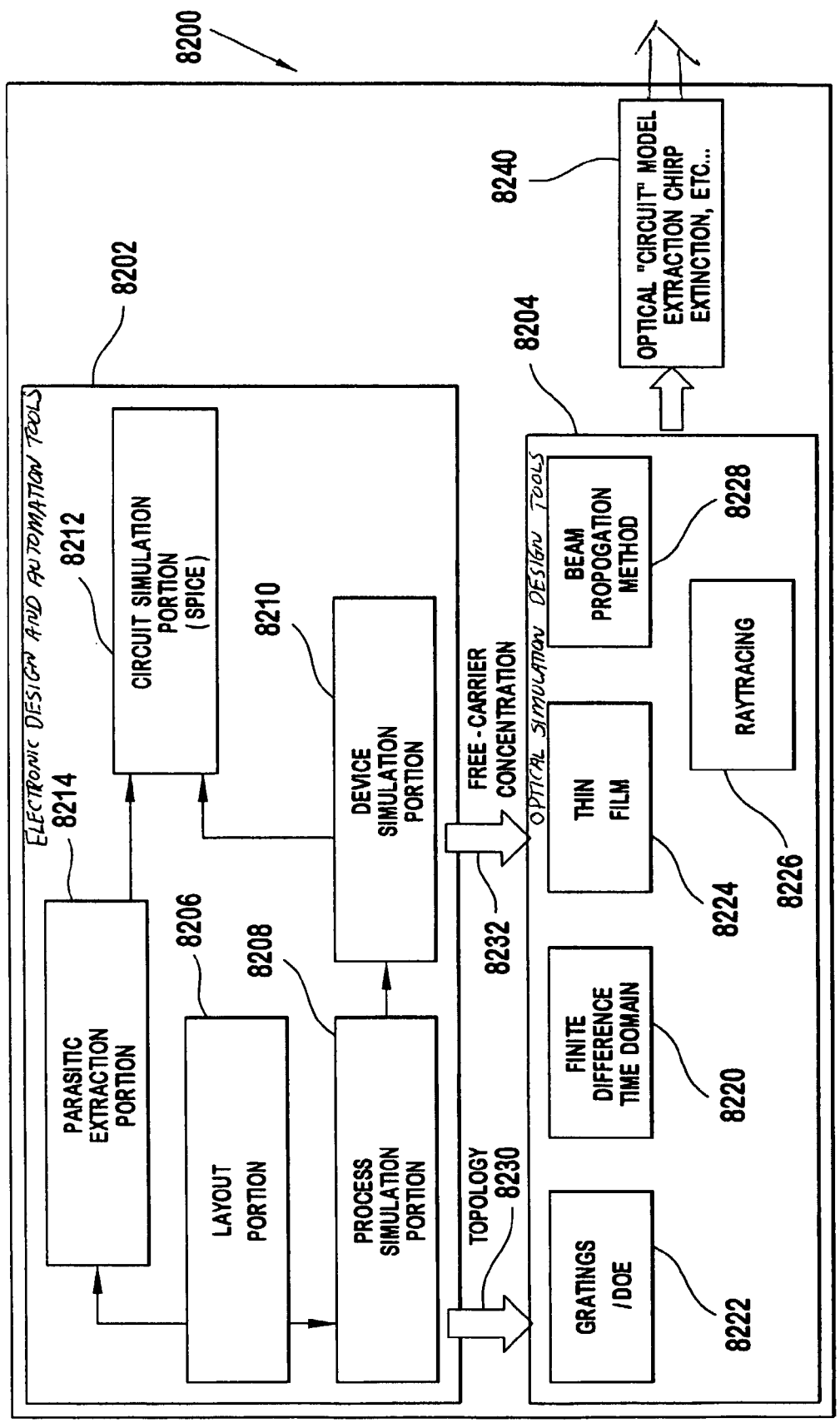
FIG. 89 shows one embodiment of a computer program used to simulate integrated optical/electronic circuits.

The photonic band gap device can be configured in a one dimensional configuration, a two dimensional configuration, and a three dimensional configuration. One embodiment of one dimensional configuration of the photonic band gap device is formed as a grating as shown in FIGS. 88 and 89. Gratings have been disclosed herein in a variety of embodiments of integrated photonic/electronic circuits, it is envisioned that the term may be applied to surface gratings or gratings. FIG. 88 shows a side view of the grating shown in FIG. 88. The grating is shown by a plurality of alternating lower lands 9202 and a plurality of raised lands 9204. The height of the lower lands 9202 defines a surface having a thickness L1, and the raised land surface 9204, defines a surface defined by a thickness L2. Since l1 does not equal L2, the propagation constant (or effective index) varies as indicated by $n_1$ and $n_2$. This propagation constant $n_1$ and $n_2$ extends throughout the entire region under each respective lower land 9202 and each raised land 9204. Therefore, a slight variation in the depth of the surface corrugation of the waveguide can provide a considerable difference in the effective index (the propagation constant) throughout the waveguide. This is true for one, two, or three dimensional shallow passive photonic band gap devices. In this embodiment of photonic band gap device, it is desired to use a single mode waveguide. The depth of the gratings can be precisely controlled. The corrugations of the gratings act to provide a variation of the effective mode index in the waveguide, as described above. As such, gratings are often used to diffract or reflect light within a waveguide.

In one embodiment of grating, the corregations 2008 defined by the area above each lower land 9202 that is below the level of the raised land 9204 and are filled only with air. In another embodiment, the corregations are filled with, e.g., metal, glass, or other desired materials that alter the propagation constant as indicated by filled metal portion 2020 shown as the right-most corregation 2008. This structure forms a one dimensional version of a shallow passive photonic band gap. Light travelling within the waveguide sees all the corregations until the light sees the same index as the index of the band gap material. The depths of the corrugations 1008 can be controlled to effect the relative propagation constant of the material inside the waveguide under the corrugations.

There can also be a three dimensional structure as shown in FIG. 86 made by layering the two dimensional shallow passive photonic band gap structures one on top of another. For each layer, each shallow passive pillar goes only part of the way through each respective layer. The pillars in the three dimensional photonic band gap form what appears to be a honeycomb structure. It is desired to vertically stagger the locations of the shallow passive photonic band gap device so the structurally weakest location of each layer is staggered to enhance the rigidity of the photonic band gap device in each one of the three dimension. Another shallow passive pillar goes part of the way through the second layer. Since any shallow passive pillars do not extend all the way through its waveguide, and since each shallow passive waveguide in certain embodiments is filled with a material such as metal, glass, etc., the resulting three dimensional photonic band gap device can be constructed to be structurally sound. The device is scalable since multiple layers can be provided to increase the depth of the structure.

Complex light paths can be provided by light passing through the different channels or paths. In one-dimensional shallow passive photonic band gap devices, the channels can be curved within zero, one, or two planes. The resulting regions of shallow passive photonic crystals and channels can be configured in three dimensional shallow passive photonic band gap devices to provide complex routes. In adjacent layers, light can be made to turn off and be directed from one level to another level. Some complex structures can be built to provide complex light motion.

In some embodiments of photonic band gap devices, the light travelling through the channel is very tightly confined within the channel. In certain cases, the light will not be that tightly confined depending on the configuration and dimensions of the channel and the waveguide. The light will actually "spread out" perhaps to a width of three or four or five lattices. The light will still be guided, but will not be confined as precisely.

X. Simulation Program For Hybrid Active Electronic and Optical Circuits

FIG. 89 shows one embodiment of simulation program for optical/electronics circuits 8200. Simulation is vital for both complex electronic circuits and complex optical circuits since actually fabricating such circuits is extremely expensive and trial and error is prohibitively costly. The simulation program for optical/electronic circuits 8200 includes an Electronic Design and Automation Tool (EDA) portion 8202 and an optical simulation design tool portion 8204. The EDA portion 8202 is used to simulate and design the operation of electronic devices and circuits. The optical simulation design tool portion 8204 is sued to design and simulate the operation of optical devices and circuits. The EDA portion and the optical simulation design tool portions largely relies upon computer-based process, device, and circuit modeling programs.

In the embodiment shown in FIG. 89, the EDA portion 8202 includes a layout portion 8206, a process simulation portion 8208, a device simulation portion 8210, a circuit simulation portion 8212, and a parasitic extraction portion 8214. These electronic portions are intended to be illustrative in nature, but not limiting in scope. The specific tools that are included in the EDA portion 8202 are a design choice. Any suitable one or more computer program or electronic simulation engine may be included in the EDA portion 8202, and remain within the scope of the present invention. Similarly, the embodiment of optical simulation design tool portion 8204 includes a gratings/DOE portion 8222, a finite different time domain (FDTD) portion 8220, a thin film portion 8224, a raytracing portion 8226, and a beam propagation method portion 8228. These optical portions are intended to be illustrative in nature, but not limiting in scope. The specific tools that are included in the optical simulation design tool portion 8204 are a design choice. Any suitable one or more computer program or electronic simulation engine may be included in the optical simulation design tool portion 8204, and remain within the scope of the present invention.

The EDA portion 8202 is commonly used in the semiconductor industry. It is possible to use such EDA tools to design very complex electronic integrated circuits on a computer. All circuit design from functional description to circuit layout to circuit analysis can be performed based on detailed modeling of actual transistors modeled from topology dopant profiles generated by "virtual" process simulators, and semiconductor device physics simulators.

Similarly, many optical tools exist to compute waveguide properties for a given topology, material, and index profile. The embodiment of FIG. 89 specifically ties the two "separate" computational engines in which output from the EDA portion 8202 are fed into optical simulation design tool portion 8204 to predict optical behavior.

For example, detailed topology, dopant profile and index profile can be generated for passive SOI waveguide structures and thus can be fed into the optical simulation design tool portion 8204 to be used to model optical passives. In order to model active opto-electronic devices, a device physics simulator is also used to compute free carrier concentration in Si as a function of voltage applied to vacuum electrodes. This time dependent and space dependent concentration (and therefore the ability to derive effective mode index) is fed into, for example, PDTD to produce spatial and temporal behavior of optical beams. This optical behavior can then be used to extract "top-level" optical parameters such as phase, extraction, chirp, extinction, and/or other such parameters. It is emphasized that there are a wide variety of electronics engines and optical engines that may be utilized in the EDA portion 8202 and optical simulation portions.

While the principles of the invention have been described above in connection with the specific apparatus and associated method, it is to be clearly understood that this description is made only by way of example and not as a limitation on the scope of the invention.

What is claimed is:

1. A method of operating a computer processor, the computer processor using computer software, the computer software being configured to simulate both the electrical characteristics and the optical characteristics of a silicon-on-insulator an (SOI)-based integrated optical/electronic circuit, the method comprising:
   a) simulating operation of at least certain electronic circuit components of said SOI-based integrated optical/electronic circuit using an electronic design portion of the computer concentration software to generate as outputs dopant profiles, topology information and free-carrier concentration information and time-dependent variations in the free-carrier concentration as a function of applied voltage;
   b) applying, the output information from the electronic design portion of the computer software as inputs to an optical design portion of the computer software to extract top-level optical parameters Such as optical loss, optical phase and extinction; and
   c) simulating both the electrical and optical behavior of said integrated optical/electronic circuit through said electrical and optical computational engines to predict the optical behavior of said SOI-based integrated optical/electronic circuit.

2. The method of claim 1, wherein the electronic design portion of the computer software includes at least one of the group consisting of a process simulation portion, a device simulation portion, a layout portion, a parasitic extraction portion, and a circuit simulation portion.

3. The method of claim 1, wherein said optical design portion of the computer software further comprises at least one of the group consisting of: a finite difference time domain (FDTD) portion, a beam propagation method portion, and a raytracing portion.

4. The method of claim 1, wherein the optical design portion of the computer software partially models a waveguide included in said at least certain optical circuit components of the SOI-based integrated optical/electronic circuit.

5. The method of claim 4, wherein the SOI circuit includes a substrate layer, and wherein the waveguide at least partially extends within said substrate layer.

6. The method of claim 1, wherein the electronic design portion of the computer software simulates at least one electronic circuit component from the group of a p-n device, a field device, an avalanche photodiode, a Schottky device, a MOSCAP, and a MOSFET.

* * * * *